(12) United States Patent
Jeong et al.

(10) Patent No.: US 9,276,687 B1
(45) Date of Patent: Mar. 1, 2016

(54) APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

(71) Applicant: LG ELECTRONICS INC., Seoul (KR)

(72) Inventors: Byeongkook Jeong, Seoul (KR); Woosuk Ko, Seoul (KR); Youngjin Hong, Seoul (KR); Sungryong Hong, Seoul (KR); Jaeho Hwang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/551,800

(22) Filed: Nov. 24, 2014

Related U.S. Application Data

(60) Provisional application No. 61/908,728, filed on Nov. 25, 2013, provisional application No. 61/908,729, filed on Nov. 25, 2013, provisional application No. 61/908,730, filed on Nov. 26, 2013, provisional (Continued)

(51) Int. Cl.
| | |
|---|---|
| *H04L 27/00* | (2006.01) |
| *H04L 27/36* | (2006.01) |
| *H03K 9/02* | (2006.01) |
| *H03D 1/24* | (2006.01) |
| *H04H 20/71* | (2008.01) |

(Continued)

(52) U.S. Cl.
CPC ............ *H04H 20/71* (2013.01); *H04B 7/0413* (2013.01); *H04B 7/0615* (2013.01); *H04L 27/2627* (2013.01)

(58) Field of Classification Search
USPC ......... 375/219, 220, 222, 295, 300, 298, 299, 375/301, 302, 303, 308, 309, 316, 320, 322, 375/324, 323, 325, 326, 329, 330, 332, 334, 375/346
See application file for complete search history.

(56) References Cited

U.S. PATENT DOCUMENTS

| | | | | |
|---|---|---|---|---|
| 2013/0308505 | A1* | 11/2013 | Hong et al. | .................. 370/310 |
| 2015/0049844 | A1* | 2/2015 | Stott | ............................. 375/298 |

FOREIGN PATENT DOCUMENTS

| | | |
|---|---|---|
| WO | 2010-032119 A1 | 3/2010 |
| WO | 2010-090375 A1 | 8/2010 |
| WO | 2013-117883 A1 | 8/2013 |

OTHER PUBLICATIONS

Hugo Meric et al., 'Trade-off between spectrum efficiency and link unavailability for hierarchical modulation in DVB-S2 systems', 2013 IEEE 77th Vehicular Technology Conference(VTC Spring), Jun. 5, 2013.

*Primary Examiner* — Linda Wong
(74) *Attorney, Agent, or Firm* — Dentons US LLP

(57) ABSTRACT

The present invention provides a method of transmitting broadcast signals. The method includes, processing input streams into plural PLPs; encoding data of the each PLPs according to code rates, wherein the encoding data of the each PLPs further includes, encoding data of at least one PLP with LDPC codes, bit interleaving the LDPC encoded data of the PLP, mapping the bit interleaved data onto a set of constellations according to the code rate, MIMO encoding the mapped data, and time interleaving the MIMO encoded data; building at least one signal frame by mapping the encoded data of the each PLPs; and modulating data in the built signal frame by OFDM method and transmitting the broadcast signals having the modulated data, wherein the bit interelaved data of each PLPs are mapped by using either QAM, NUQ, or NUC.

24 Claims, 127 Drawing Sheets

Related U.S. Application Data application No. 61/908,731, filed on Nov. 26, 2013, provisional application No. 61/908,732, filed on Nov. 26, 2013, provisional application No. 61/908,734, filed on Nov. 26, 2013, provisional application No. 61/908,736, filed on Nov. 26, 2013, provisional application No. 61/908,738, filed on Nov. 26, 2013, provisional application No. 61/908,739, filed on Nov. 26, 2013, provisional application No. 61/908,741, filed on Nov. 26, 2013.

(51) Int. Cl.
*H04L 27/26* (2006.01)
*H04B 7/06* (2006.01)
*H04B 7/04* (2006.01)

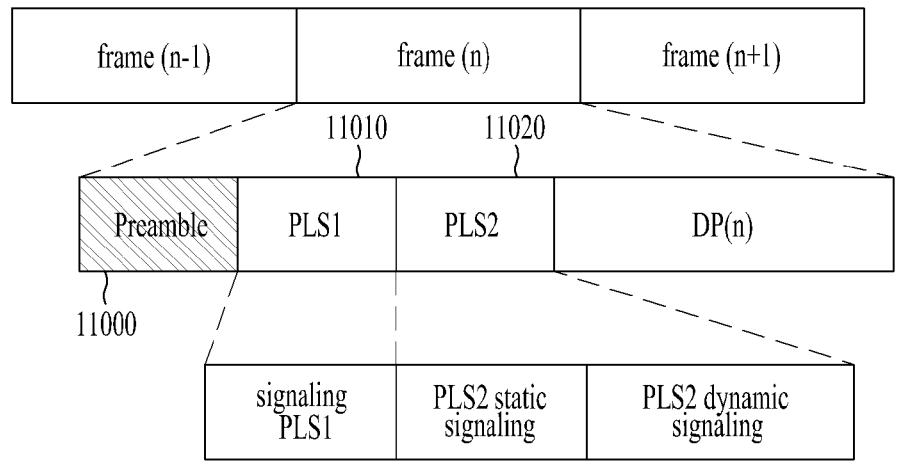

FIG. 13

| Content | Bits |
|---|---|
| PREAMBLE_DATA | 20 |
| NUM_FRAME_FRU | 2 |
| PAYLOAD_TYPE | 3 |
| NUM_FSS | 2 |
| SYSTEM_VERSION | 8 |
| CELL_ID | 16 |
| NETWORK_ID | 16 |
| SYSTEM_ID | 16 |
| for i = 0:3 | |
|     FRU_PHY_PROFILE | 3 |
|     FRU_FRAME_LENGTH | 2 |
|     FRU_GI_FRACTION | 3 |
|     RESERVED | 4 |
| end | |
| PLS2_FEC_TYPE | 2 |
| PLS2_MOD | 3 |
| PLS2_SIZE_CELL | 15 |
| PLS2_STAT_SIZE_BIT | 14 |
| PLS2_SYN_SIZE_BIT | 14 |
| PLS2_REP_FLAG | 1 |
| PLS2_REP_SIZE_CELL | 15 |
| PLS2_NEXT_FEC_TYPE | 2 |
| PLS2_NEXT_MODE | 3 |
| PLS2_NEXT_REP_FLAG | 1 |
| PLS2_NEXT_REP_SIZE_CELL | 15 |
| PLS2_NEXT_REP_STAT_SIZE_BIT | 14 |
| PLS2_NEXT_REP_DYN_SIZE_BIT | 14 |
| PLS2_AP_MODE | 2 |
| PLS2_AP_SIZE_CELL | 15 |
| PLS2_NEXT_AP_MODE | 2 |
| PLS2_NEXT_AP_SIZE_CELL | 15 |
| RESERVED | 32 |
| CRC 32 | 32 |

FIG. 14

| Content | Bits |
|---|---|
| FIC_FLAG | 1 |
| AUX_FLAG | 1 |
| NUM_DP | 6 |
| for i = 1: NUM_DP | |
|     DP_ID | 6 |
|     DP_TYPE | 3 |
|     DP_GROUP_ID | 8 |
|     BASE_DP_ID | 6 |
|     DP_FEC_TYPE | 2 |
|     DP_COD | 4 |
|     DP_MOD | 4 |
|     DP_SSD_FLAG | 1 |
|     if PHY_PROFILE = '010' | |
|         DP_MIMO | 3 |
|     end | |
|     DP_TI_TYPE | 1 |
|     DP_TI_LENGTH | 2 |
|     DP_TI_BYPASS | 1 |
|     DP_FRAME_INTERVAL | 2 |
|     DP_FIRST_FRAME_IDX | 5 |
|     DP_NUM_BLOCK_MAX | 10 |
|     DP_PAYLOAD_TYPE | 2 |
|     DP_INBAND_MODE | 2 |
|     DP_PROTOCOL_TYPE | 2 |
|     DP_CRC_MODE | 2 |
| | |
|     if DP_PAYLOAD_TYPE == TS('00') | |
|         DNP_MODE | 2 |
|         ISSY_MODE | 2 |
|         HC_MODE_TS | 2 |
|         if HC_MODE_TS == '01' or '10' | |
|             PID | 13 |
|         end | |
|     if DP_PAYLOAD_TYPE == IP('01') | |
|         HC_MODE_IP | 2 |
|     end | |
|     RESERVED | 8 |
| end | |
| if FIC_FLAG == 1 | |
|     FIC_VERSION | 8 |
|     FIC_LENGTH_BYTE | 13 |
|     RESERVED | 8 |
| end | |
| if AUX_FLAG == 1 | |
|     NUM_AUX | 4 |
|     AUX_CONFIG_RFU | 8 |
|     for - 1: NUM_AUX | |
|         AUX_STREAM_TYPE | 4 |
|         AUX_PRIVATE_CONF | 28 |
|     end | |
| end | |

| Content | | Bit |
|---|---|---|
| FRAME_INDEX | | 5 |
| PLS_CHANGE_COUNTER | | 4 |
| FIC_CHANGE_COUNTER | | 4 |
| RESERVED | | 16 |
| for i = 1: NUM_DP | | |
| | DP_ID | 6 |
| | DP_START | 15 (or13) |
| | DP_NUM_BLOCK | 10 |
| end | RESERVED | 8 |
| EAC_FLAG | | 1 |
| EAS_WAKE_UP_VERSION_NUM | | 8 |
| if EAC_FLAG == 1 | | |
| | EAC_LENGTH_BYTE | 12 |
| else | | |
| | EAC_COUNTER | 12 |
| end | | |
| for i=1:NUM_AUX | | |
| | AUX_PRIVATE_DYN | 48 |
| end | | |
| CRC 32 | | 32 |

FIG. 29

$$LOC = \begin{vmatrix} r_n \exp j\left[\dfrac{\pi}{4}+A_n\right] & , \text{if } b_0b_1=00. \\ r_n \exp j\left[\dfrac{3\pi}{4}-A_n\right] & , \text{if } b_0b_1=01. \\ r_n \exp j\left[\dfrac{5\pi}{4}+A_n\right] & , \text{if } b_0b_1=11. \\ r_n \exp j\left[\dfrac{7\pi}{4}-A_n\right] & , \text{if } b_0b_1=10. \end{vmatrix}$$

$$A_n = (-1)^{m_0}\theta_{n,0} + (-1)^{m_1}\theta_{n,1} + \cdots + (-1)^{m_{k-1}}\theta_{n,k-1}.$$

FIG. 36

| SNR(dB) | $r_0$ | $r_1$ | $\theta_{0,0}$ (°) | $\theta_{1,0}$ (°) | cap.(bps/Hz) |
|---|---|---|---|---|---|
| 0.0 | 1.000000 | 1.000000 | 0.000000 | 0.000000 | 0.971925 |
| 0.5 | 1.000000 | 1.000000 | 0.000000 | 0.000000 | 1.047780 |
| 1.0 | 1.000000 | 1.000000 | 0.000000 | 0.000000 | 1.125607 |
| 1.5 | 0.905357 | 1.086429 | 4.749999 | 5.499982 | 1.204812 |
| 2.0 | 0.713912 | 1.220790 | 10.500033 | 14.999996 | 1.293642 |
| 2.5 | 0.640125 | 1.261047 | 11.750031 | 17.749973 | 1.392438 |
| 3.0 | 0.594144 | 1.283352 | 12.499948 | 19.250010 | 1.498432 |
| 3.5 | 0.563884 | 1.296933 | 13.000013 | 20.249988 | 1.610215 |
| 4.0 | 0.543928 | 1.305428 | 13.499972 | 21.000019 | 1.726663 |
| 4.5 | 0.532564 | 1.310105 | 13.749981 | 21.500006 | 1.846773 |
| 5.0 | 0.527043 | 1.312336 | 14.250034 | 21.749987 | 1.969666 |
| 5.5 | 0.525226 | 1.313064 | 14.500030 | 22.000003 | 2.094518 |
| 6.0 | 0.528871 | 1.311600 | 14.999968 | 22.250007 | 2.220566 |
| 6.5 | 0.532563 | 1.310106 | 15.499947 | 22.499992 | 2.347043 |
| 7.0 | 0.538191 | 1.307804 | 15.999993 | 22.499991 | 2.473150 |
| 7.5 | 0.545866 | 1.304619 | 16.749995 | 22.750012 | 2.598086 |
| 8.0 | 0.553743 | 1.301295 | 17.750043 | 22.749978 | 2.721000 |
| 8.5 | 0.563883 | 1.296933 | 19.000018 | 22.749995 | 2.841076 |
| 9.0 | 0.572242 | 1.293267 | 19.999977 | 22.749990 | 2.957477 |
| 9.5 | 0.580826 | 1.289435 | 20.750013 | 22.749986 | 3.069329 |
| 10.0 | 0.587417 | 1.286445 | 21.500011 | 22.749985 | 3.175796 |
| 10.5 | 0.596417 | 1.282297 | 21.999982 | 22.499993 | 3.276209 |
| 11.0 | 0.605666 | 1.277954 | 22.249980 | 22.500000 | 3.370078 |
| 11.5 | 0.612771 | 1.274563 | 22.250022 | 22.500012 | 3.457200 |
| 12.0 | 0.620025 | 1.271051 | 22.500011 | 22.500007 | 3.537529 |
| 12.5 | 0.629935 | 1.266168 | 22.499972 | 22.499985 | 3.611105 |
| 13.0 | 0.637551 | 1.262351 | 22.500006 | 22.499988 | 3.677943 |
| 13.5 | 0.642718 | 1.259727 | 22.499961 | 22.499986 | 3.738015 |
| 14.0 | 0.650606 | 1.255671 | 22.500026 | 22.499983 | 3.791238 |
| 14.5 | 0.655960 | 1.252883 | 22.500001 | 22.249984 | 3.837545 |
| 15.0 | 0.661389 | 1.250026 | 22.250044 | 25.500005 | 3.877076 |
| 15.5 | 0.666897 | 1.247096 | 22.750044 | 18.250010 | 3.909980 |
| 16.0 | 0.669680 | 1.245604 | 22.750033 | 17.499992 | 3.936428 |
| 16.5 | 0.675306 | 1.242563 | 22.749973 | 16.750015 | 3.956895 |
| 17.0 | 0.678150 | 1.241013 | 22.750034 | 16.250006 | 3.972062 |
| 17.5 | 0.681013 | 1.239444 | 22.749968 | 16.000012 | 3.982782 |
| 18.0 | 0.683898 | 1.237855 | 22.749993 | 15.499995 | 3.989971 |
| 18.5 | 0.686803 | 1.236245 | 22.750001 | 15.250020 | 3.994515 |
| 19.0 | 0.689729 | 1.234615 | 22.749991 | 14.749990 | 3.997205 |
| 19.5 | 0.692676 | 1.232964 | 22.749995 | 14.500027 | 3.998684 |
| 20.0 | 0.692676 | 1.232964 | 22.749995 | 14.249995 | 3.999434 |

FIG. 37
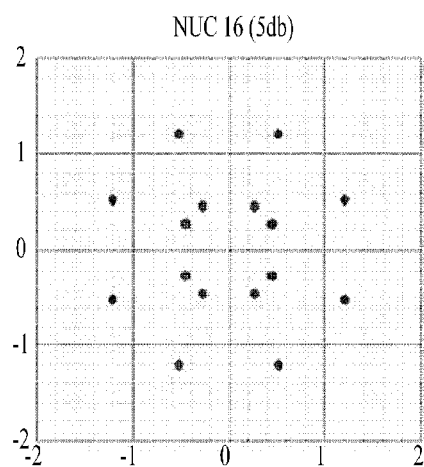
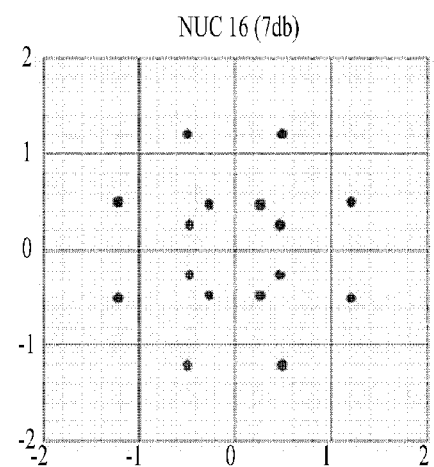
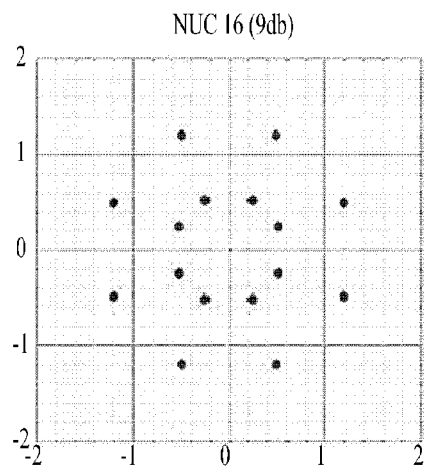
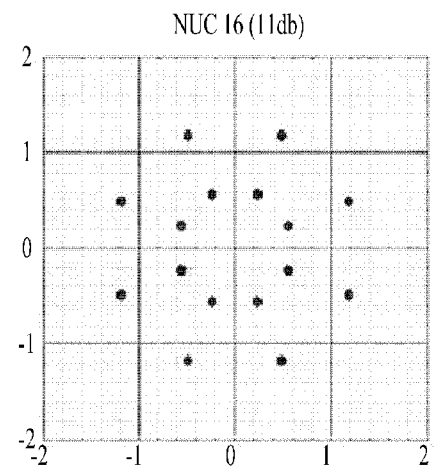

FIG. 39

| SNR(dB) | $r_0$ | $r_1$ | $r_2$ | $r_3$ | $\theta_{0,0}(°)$ | $\theta_{0,1}(°)$ | $\theta_{1,0}(°)$ | $\theta_{1,1}(°)$ | $\theta_{2,0}(°)$ | $\theta_{2,1}(°)$ | $\theta_{3,0}(°)$ | $\theta_{3,1}(°)$ | cap.(bps/Hz) |
|---|---|---|---|---|---|---|---|---|---|---|---|---|---|
| 0.0 | 0.991374 | 0.995461 | 1.006926 | 1.006148 | 0.350533 | 0.087891 | 0.350533 | 0.087891 | 0.350533 | 0.087891 | 0.350533 | 0.087891 | 0.971911 |
| 0.5 | 0.992891 | 0.992665 | 1.008236 | 1.006103 | 0.350533 | 0.087891 | 0.350533 | 0.087891 | 0.350533 | 0.087891 | 0.350533 | 0.087891 | 1.047767 |
| 1.0 | 0.992603 | 0.992194 | 1.007759 | 1.007330 | 0.525627 | 0.087891 | 0.525627 | 0.087891 | 0.525627 | 0.087891 | 0.525627 | 0.087891 | 1.125595 |
| 1.5 | 0.869429 | 0.969189 | 1.113107 | 1.015177 | 4.202614 | 0.087891 | 4.377708 | 0.087891 | 4.902992 | 0.087891 | 4.552803 | 0.087891 | 1.204801 |
| 2.0 | 0.697524 | 0.708466 | 1.243433 | 1.210542 | 10.330925 | 0.087891 | 10.506020 | 0.087891 | 15.233574 | 0.087891 | 15.058479 | 0.087891 | 1.293592 |
| 2.5 | 0.645748 | 0.633426 | 1.251581 | 1.269956 | 11.906776 | 0.087891 | 11.731682 | 0.087891 | 17.684898 | 0.087891 | 17.859993 | 0.087891 | 1.39242 |
| 3.0 | 0.603611 | 1.264405 | 1.284240 | 0.622626 | 12.607155 | 0.087891 | 19.260750 | 0.087891 | 19.260750 | 0.087891 | 12.957344 | 0.087891 | 1.498177 |
| 3.5 | 0.567630 | 0.568848 | 1.290796 | 1.299252 | 13.132439 | 0.087891 | 13.132439 | 0.087891 | 20.311317 | 0.087891 | 20.311317 | 0.087891 | 1.610198 |
| 4.0 | 0.541200 | 0.540776 | 1.301546 | 1.311601 | 13.482628 | 0.087891 | 13.482628 | 0.087891 | 21.011696 | 0.087891 | 21.011696 | 0.087891 | 1.726649 |
| 4.5 | 0.527043 | 0.527043 | 1.312336 | 1.312336 | 13.798828 | 0.087891 | 13.832817 | 0.087891 | 21.536980 | 0.087891 | 21.361885 | 0.087891 | 1.846753 |
| 5.0 | 0.527043 | 0.525226 | 1.312336 | 1.313064 | 14.183006 | 0.087891 | 14.183006 | 0.087891 | 21.884766 | 0.087891 | 21.712074 | 0.087891 | 1.969667 |
| 5.5 | 0.525226 | 0.528871 | 1.313064 | 1.311600 | 14.533195 | 0.087891 | 14.533195 | 0.087891 | 22.062263 | 0.087891 | 22.062263 | 0.087891 | 2.094522 |
| 6.0 | 0.528871 | 0.528871 | 1.311600 | 1.311600 | 15.000000 | 0.000000 | 15.000000 | 0.000000 | 22.237358 | 0.087891 | 22.237358 | 0.087891 | 2.220567 |
| 6.5 | 0.527043 | 0.527043 | 1.312336 | 1.312336 | 15.250000 | 0.500000 | 15.250000 | 0.500000 | 22.424805 | 0.087891 | 22.424805 | 0.087891 | 2.347194 |
| 7.0 | 0.527043 | 0.528871 | 1.312336 | 1.311600 | 15.575523 | 1.142578 | 15.575523 | 1.142578 | 22.438545 | 3.251955 | 22.438545 | 3.251953 | 2.476683 |
| 7.5 | 0.481113 | 0.562902 | 1.424094 | 1.193159 | 15.241814 | 1.142578 | 16.722908 | 1.669922 | 22.325935 | 7.646484 | 22.500000 | 6.767578 | 2.61006 |
| 8.0 | 0.447471 | 0.588189 | 1.140020 | 1.467705 | 15.518532 | 0.966797 | 17.979469 | 2.197266 | 22.443359 | 7.998047 | 22.500000 | 9.000000 | 2.748402 |
| 8.5 | 0.417948 | 0.614464 | 1.107561 | 1.490323 | 15.854988 | 0.966797 | 19.032857 | 2.724609 | 22.444336 | 8.173828 | 22.500000 | 10.000000 | 2.891147 |
| 9.0 | 0.387040 | 0.637365 | 1.081546 | 1.508053 | 16.023216 | 0.966797 | 20.041466 | 3.427734 | 22.500000 | 8.250000 | 22.500000 | 10.500000 | 3.038004 |
| 9.5 | 0.367650 | 0.657469 | 1.066399 | 1.515045 | 16.191444 | 0.966797 | 20.706139 | 4.130859 | 22.500000 | 8.500000 | 22.412109 | 11.000000 | 3.187969 |
| 10.0 | 0.353209 | 0.672992 | 1.056024 | 1.518927 | 16.409798 | 1.142578 | 21.326866 | 4.833984 | 22.500000 | 8.500000 | 22.500000 | 11.162109 | 3.339998 |
| 10.5 | 0.348470 | 0.688788 | 1.050368 | 1.516861 | 16.956367 | 1.318359 | 21.771126 | 5.537109 | 22.449219 | 9.000000 | 22.500000 | 11.250000 | 3.492918 |
| 11.0 | 0.347596 | 0.699552 | 1.047733 | 1.513955 | 17.332031 | 1.494141 | 22.065010 | 6.591797 | 22.500000 | 9.404297 | 22.500000 | 11.250000 | 3.645912 |
| 11.5 | 0.340153 | 0.712369 | 1.046532 | 1.510495 | 17.535583 | 1.669922 | 22.321815 | 7.470703 | 22.500000 | 10.000000 | 22.500000 | 11.250000 | 3.798249 |
| 12.0 | 0.343329 | 0.719021 | 1.047987 | 1.505609 | 18.260307 | 2.021484 | 22.443352 | 8.173828 | 22.500000 | 10.750000 | 22.500000 | 11.250000 | 3.94913 |

FIG. 40

| SNR(dB) | $r_0$ | $r_1$ | $r_2$ | $r_3$ | $\theta_{0,0}(°)$ | $\theta_{0,1}(°)$ | $\theta_{1,0}(°)$ | $\theta_{1,1}(°)$ | $\theta_{2,0}(°)$ | $\theta_{2,1}(°)$ | $\theta_{3,0}(°)$ | $\theta_{3,1}(°)$ | cap.(bps/Hz) |
|---|---|---|---|---|---|---|---|---|---|---|---|---|---|
| 12.5 | 0.348372 | 0.722188 | 1.050073 | 1.501475 | 19.119301 | 2.373047 | 22.446289 | 8.701172 | 22.500000 | 11.000000 | 22.500000 | 11.250000 | 4.097945 |
| 13.0 | 0.349178 | 0.726697 | 1.052502 | 1.497407 | 19.772301 | 2.548828 | 22.448242 | 9.228516 | 22.500000 | 11.250000 | 22.500000 | 11.250000 | 4.244042 |
| 13.5 | 0.355899 | 0.729594 | 1.057021 | 1.491219 | 20.585976 | 2.900391 | 22.449532 | 9.755859 | 22.500000 | 11.250000 | 22.500000 | 11.250000 | 4.386886 |
| 14.0 | 0.356036 | 0.729874 | 1.060987 | 1.488230 | 21.210136 | 3.076172 | 22.446289 | 10.107422 | 22.411423 | 11.162109 | 22.500000 | 11.250000 | 4.525895 |
| 14.5 | 0.359805 | 0.734003 | 1.065024 | 1.482398 | 21.672935 | 3.251953 | 22.406250 | 10.458984 | 22.500000 | 11.250000 | 22.500000 | 11.250000 | 4.660509 |
| 15.0 | 0.362322 | 0.735514 | 1.068851 | 1.478275 | 21.980469 | 3.427734 | 22.500000 | 10.750000 | 22.500000 | 11.250000 | 22.500000 | 11.250000 | 4.789849 |
| 15.5 | 0.367318 | 0.738310 | 1.071993 | 1.473365 | 22.280273 | 3.779297 | 22.500000 | 11.000000 | 22.500000 | 11.250000 | 22.500000 | 11.250000 | 4.913187 |
| 16.0 | 0.374479 | 0.741468 | 1.074754 | 1.467956 | 22.428711 | 4.306641 | 22.500000 | 11.250000 | 22.500000 | 11.250000 | 22.500000 | 11.250000 | 5.029839 |
| 16.5 | 0.384785 | 0.744259 | 1.075628 | 1.463230 | 22.433739 | 5.537109 | 22.500000 | 11.250000 | 22.500000 | 11.250000 | 22.500000 | 11.250000 | 5.139339 |
| 17.0 | 0.399651 | 0.749800 | 1.076537 | 1.455729 | 22.441978 | 7.646484 | 22.500000 | 11.250000 | 22.500000 | 11.250000 | 22.500000 | 11.250000 | 5.242065 |
| 17.5 | 0.420450 | 0.756810 | 1.076353 | 1.446349 | 22.500000 | 9.750000 | 22.500000 | 11.250000 | 22.500000 | 11.250000 | 22.500000 | 11.250000 | 5.339087 |
| 18.0 | 0.434330 | 0.764421 | 1.077139 | 1.437633 | 22.500000 | 10.500000 | 22.500000 | 11.250000 | 22.500000 | 11.250000 | 22.500000 | 11.250000 | 5.429712 |
| 18.5 | 0.447141 | 0.768395 | 1.079083 | 1.430110 | 22.500000 | 11.000000 | 22.500000 | 11.250000 | 22.500000 | 11.250000 | 19.456100 | 9.931641 | 5.514055 |
| 19.0 | 0.460701 | 0.773978 | 1.078041 | 1.423566 | 22.412109 | 11.162109 | 22.500000 | 11.250000 | 22.500000 | 11.500000 | 19.413528 | 9.755859 | 5.590822 |
| 19.5 | 0.475875 | 0.780435 | 1.078041 | 1.413494 | 22.500000 | 11.250000 | 22.500000 | 11.250000 | 22.500000 | 12.000000 | 19.177734 | 9.228516 | 5.660294 |
| 20.0 | 0.492031 | 0.787249 | 1.080236 | 1.413349 | 22.500000 | 11.250000 | 22.500000 | 11.162109 | 22.500000 | 11.162109 | 16.805992 | 8.876953 | 5.723567 |
| 20.5 | 0.507149 | 0.795645 | 1.086262 | 1.399350 | 22.500000 | 11.250000 | 22.421875 | 11.162109 | 22.500000 | 11.162109 | 16.516914 | 8.701172 | 5.778626 |
| 21.0 | 0.519262 | 0.804856 | 1.085723 | 1.389988 | 22.500000 | 11.250000 | 22.427734 | 11.162109 | 22.500000 | 13.750000 | 22.500000 | 7.500000 | 5.824991 |
| 21.5 | 0.530943 | 0.812343 | 1.090449 | 1.376043 | 22.500000 | 11.250000 | 22.411423 | 11.000000 | 22.500000 | 14.000000 | 22.500000 | 7.250000 | 5.86668 |
| 22.0 | 0.542117 | 0.818597 | 1.093743 | 1.364524 | 22.500000 | 11.250000 | 22.500000 | 11.000000 | 22.439919 | 14.250000 | 22.500000 | 7.119141 | 5.901433 |
| 22.5 | 0.555800 | 0.828142 | 1.095076 | 1.355292 | 22.500000 | 11.250000 | 22.408676 | 10.810547 | 22.500000 | 14.750000 | 22.500000 | 6.750000 | 5.929587 |
| 23.0 | 0.563217 | 0.833561 | 1.100484 | 1.339478 | 22.500000 | 11.250000 | 22.500000 | 10.750000 | 22.500000 | 15.000000 | 22.500000 | 6.750000 | 5.951551 |
| 23.5 | 0.575681 | 0.840494 | 1.098274 | 1.334825 | 22.500000 | 11.250000 | 22.500000 | 10.500000 | 22.437500 | 15.000000 | 22.500000 | 6.591797 | 5.968127 |
| 24.0 | 0.582662 | 0.844860 | 1.099550 | 1.324066 | 22.500000 | 11.250000 | 22.500000 | 10.250000 | 22.500000 | 15.250000 | 22.500000 | 6.500000 | 5.980048 |
| 24.5 | 0.585846 | 0.849476 | 1.101390 | 1.312294 | 22.500000 | 11.250000 | 22.500000 | 9.750000 | 22.500000 | 15.250000 | 22.312500 | 6.416016 | 5.988147 |

FIG. 41
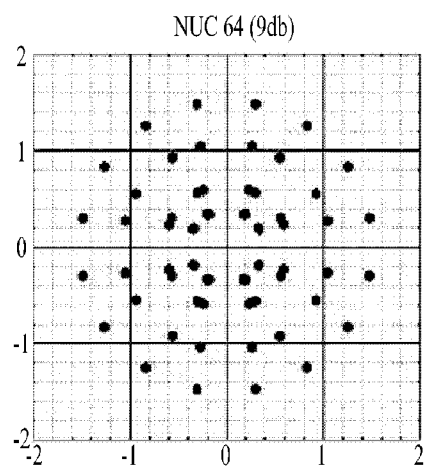
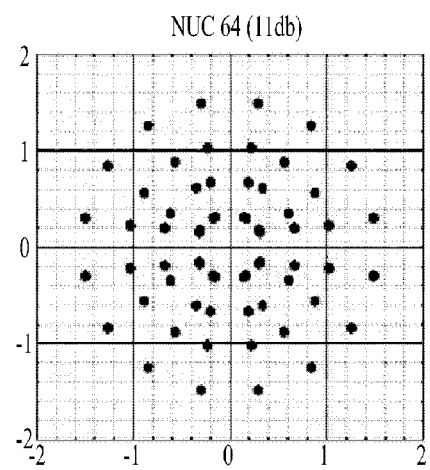
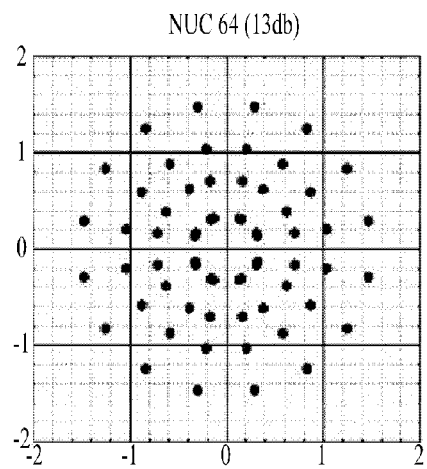
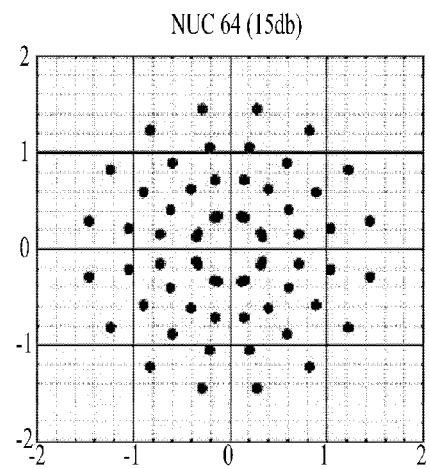

FIG. 43

| SNR(dB) | $r_0$ | $r_1$ | $r_2$ | $r_3$ | $r_4$ | $r_5$ | $r_6$ | $r_7$ |
|---|---|---|---|---|---|---|---|---|
| 7.0 | 0.526164 | 0.526025 | 0.526914 | 0.527106 | 1.310628 | 1.311773 | 1.314449 | 1.313278 |
| 7.5 | 0.446324 | 0.516147 | 0.585258 | 0.516145 | 1.241806 | 1.136092 | 1.242062 | 1.596857 |
| 8.0 | 0.432435 | 0.515045 | 0.598066 | 0.515952 | 1.224222 | 1.121640 | 1.225418 | 1.632603 |
| 8.5 | 0.423218 | 0.511643 | 0.609530 | 0.522140 | 1.207468 | 1.114128 | 1.222887 | 1.649314 |
| 9.0 | 0.389793 | 0.404079 | 0.636171 | 0.615130 | 1.085404 | 1.087451 | 1.382487 | 1.621654 |
| 9.5 | 0.366756 | 0.370348 | 0.658527 | 0.646903 | 1.058468 | 1.071186 | 1.425260 | 1.605313 |
| 10.0 | 0.353604 | 0.353609 | 0.675029 | 0.666124 | 1.043839 | 1.062313 | 1.434940 | 1.604175 |
| 10.5 | 0.347367 | 0.344721 | 0.685333 | 0.677697 | 1.031527 | 1.058852 | 1.423811 | 1.618361 |
| 11.0 | 0.344310 | 0.339872 | 0.693713 | 0.687035 | 1.020882 | 1.057411 | 1.411959 | 1.630563 |
| 11.5 | 0.343143 | 0.337284 | 0.698703 | 0.694007 | 1.010414 | 1.057556 | 1.398888 | 1.643902 |
| 12.0 | 0.339356 | 0.331846 | 0.693606 | 0.691581 | 0.987020 | 1.052846 | 1.379869 | 1.681847 |
| 12.5 | 0.337469 | 0.330152 | 0.690984 | 0.692788 | 0.975180 | 1.050517 | 1.373168 | 1.696923 |
| 13.0 | 0.335824 | 0.331206 | 0.688236 | 0.694565 | 0.967941 | 1.049980 | 1.368888 | 1.705348 |
| 13.5 | 0.333895 | 0.333184 | 0.684474 | 0.695774 | 0.963420 | 1.050122 | 1.366683 | 1.710597 |
| 14.0 | 0.330432 | 0.336952 | 0.679908 | 0.697270 | 0.961322 | 1.051782 | 1.365253 | 1.713043 |
| 14.5 | 0.322345 | 0.344964 | 0.673528 | 0.700289 | 0.960762 | 1.056689 | 1.364254 | 1.712368 |
| 15.0 | 0.298539 | 0.369572 | 0.662472 | 0.711194 | 0.959897 | 1.067350 | 1.361020 | 1.707808 |
| 15.5 | 0.263024 | 0.405831 | 0.648400 | 0.733183 | 0.957682 | 1.086644 | 1.356584 | 1.694069 |
| 16.0 | 0.244384 | 0.424909 | 0.636808 | 0.749837 | 0.955951 | 1.101661 | 1.353539 | 1.682968 |
| 16.5 | 0.234791 | 0.435554 | 0.628029 | 0.762054 | 0.954141 | 1.113056 | 1.352718 | 1.673588 |
| 17.0 | 0.230192 | 0.442716 | 0.622837 | 0.771567 | 0.953418 | 1.120462 | 1.352373 | 1.665658 |
| 17.5 | 0.229184 | 0.447729 | 0.620902 | 0.778458 | 0.953122 | 1.126205 | 1.352848 | 1.657866 |
| 18.0 | 0.229969 | 0.451947 | 0.622836 | 0.785917 | 0.955154 | 1.130702 | 1.352387 | 1.648488 |
| 18.5 | 0.231013 | 0.454275 | 0.626260 | 0.790885 | 0.957240 | 1.134304 | 1.352792 | 1.639990 |
| 19.0 | 0.232699 | 0.455642 | 0.629632 | 0.794597 | 0.959651 | 1.138142 | 1.353364 | 1.631726 |
| 19.5 | 0.234383 | 0.456144 | 0.633168 | 0.797495 | 0.962627 | 1.141672 | 1.354047 | 1.623757 |
| 20.0 | 0.238152 | 0.458338 | 0.637912 | 0.801885 | 0.966171 | 1.144586 | 1.353429 | 1.614906 |
| 20.5 | 0.242213 | 0.458921 | 0.639655 | 0.804084 | 0.969212 | 1.147627 | 1.353613 | 1.608206 |
| 21.0 | 0.253088 | 0.464401 | 0.644034 | 0.807902 | 0.973185 | 1.149970 | 1.352378 | 1.598233 |
| 21.5 | 0.265560 | 0.472084 | 0.648846 | 0.812378 | 0.976147 | 1.151312 | 1.349786 | 1.589136 |
| 22.0 | 0.276051 | 0.479152 | 0.652904 | 0.815771 | 0.979080 | 1.152843 | 1.348072 | 1.580348 |
| 22.5 | 0.287374 | 0.487894 | 0.658763 | 0.819960 | 0.981806 | 1.153575 | 1.345463 | 1.571027 |
| 23.0 | 0.297906 | 0.495053 | 0.664288 | 0.824438 | 0.985523 | 1.155500 | 1.342604 | 1.560826 |
| 23.5 | 0.309508 | 0.503489 | 0.670270 | 0.828247 | 0.987599 | 1.156262 | 1.341406 | 1.550414 |
| 24.0 | 0.322171 | 0.512289 | 0.677580 | 0.834905 | 0.993776 | 1.159386 | 1.337988 | 1.534799 |
| 24.5 | 0.347386 | 0.526862 | 0.684866 | 0.838263 | 0.994977 | 1.158343 | 1.333774 | 1.522932 |

FIG. 44

| SNR(dB) | $\theta_{0,0}(°)$ | $\theta_{0,1}(°)$ | $\theta_{0,2}(°)$ | $\theta_{1,0}(°)$ | $\theta_{1,1}(°)$ | $\theta_{1,2}(°)$ |
|---|---|---|---|---|---|---|
| 7.0 | 15.557917 | 1.131042 | 0.005493 | 15.557917 | 1.131042 | 0.005493 |
| 7.5 | 14.705354 | 0.878480 | 0.005493 | 16.080213 | 1.339680 | 0.005493 |
| 8.0 | 15.163589 | 0.922404 | 0.005493 | 16.784874 | 1.537338 | 0.005493 |
| 8.5 | 15.847564 | 0.988289 | 0.005493 | 17.543091 | 1.713033 | 0.005493 |
| 9.0 | 15.988499 | 0.933385 | 0.005493 | 16.322255 | 1.032213 | 0.005493 |
| 9.5 | 16.208684 | 0.966327 | 0.005493 | 16.299111 | 0.988289 | 0.005493 |
| 10.0 | 16.491771 | 1.076137 | 0.005493 | 16.491771 | 1.076137 | 0.005493 |
| 10.5 | 16.849309 | 1.240852 | 0.005493 | 16.781139 | 1.218890 | 0.005493 |
| 11.0 | 17.241852 | 1.482433 | 0.005493 | 17.135532 | 1.427528 | 0.005493 |
| 11.5 | 17.700377 | 1.734995 | 0.005493 | 17.560517 | 1.658128 | 0.005493 |
| 12.0 | 18.122235 | 1.954614 | 0.005493 | 17.947588 | 1.844805 | 0.005493 |
| 12.5 | 18.642424 | 2.185214 | 0.005493 | 18.481983 | 2.064424 | 0.005493 |
| 13.0 | 19.272704 | 2.404834 | 0.005493 | 19.181580 | 2.327967 | 0.005493 |
| 13.5 | 19.926082 | 2.602491 | 0.005493 | 19.923240 | 2.591510 | 0.005493 |
| 14.0 | 20.503859 | 2.734263 | 0.005493 | 20.631078 | 2.877015 | 0.005493 |
| 14.5 | 20.949172 | 2.756225 | 0.005493 | 21.289228 | 3.283311 | 0.005493 |
| 15.0 | 20.988683 | 2.525624 | 0.005493 | 21.903213 | 4.241396 | 0.027466 |
| 15.5 | 20.404885 | 2.349929 | 0.005493 | 22.250403 | 5.939079 | 0.071411 |
| 16.0 | 20.085022 | 2.459739 | 0.005493 | 22.418484 | 7.185844 | 0.137329 |
| 16.5 | 20.108860 | 2.657396 | 0.005493 | 22.493090 | 8.133131 | 0.225220 |
| 17.0 | 20.421389 | 2.877015 | 0.005493 | 22.493506 | 8.875963 | 0.335083 |
| 17.5 | 20.901109 | 3.107615 | 0.005493 | 22.493868 | 9.444045 | 0.466919 |
| 18.0 | 21.406249 | 3.349197 | 0.005493 | 22.494166 | 9.908549 | 0.642700 |
| 18.5 | 21.807598 | 3.576321 | 0.016479 | 22.494455 | 10.281237 | 0.862427 |
| 19.0 | 22.090504 | 3.846854 | 0.027466 | 22.494733 | 10.587596 | 1.126099 |
| 19.5 | 22.276467 | 4.160667 | 0.038452 | 22.494991 | 10.818138 | 1.422729 |
| 20.0 | 22.387528 | 4.709999 | 0.060425 | 22.490502 | 11.000152 | 1.763306 |
| 20.5 | 22.442876 | 5.671743 | 0.093384 | 22.491026 | 11.134585 | 2.125854 |
| 21.0 | 22.478722 | 7.803820 | 0.170288 | 22.491618 | 11.241626 | 2.675171 |
| 21.5 | 22.493882 | 9.702009 | 0.280151 | 22.492402 | 11.242409 | 3.466187 |
| 22.0 | 22.494394 | 10.628953 | 0.379028 | 22.493121 | 11.243128 | 4.213257 |
| 22.5 | 22.494645 | 11.045077 | 0.477905 | 22.493744 | 11.243750 | 4.850464 |
| 23.0 | 22.494760 | 11.192673 | 0.587769 | 22.494088 | 11.244094 | 5.202026 |
| 23.5 | 22.474282 | 11.224345 | 0.741577 | 22.494292 | 11.244298 | 5.410767 |
| 24.0 | 22.470350 | 11.220437 | 1.148071 | 22.494399 | 11.244405 | 5.509644 |
| 24.5 | 22.492735 | 11.242742 | 3.817749 | 22.494475 | 11.244480 | 5.608521 |

FIG. 45

| SNR(dB) | $\theta_{2,0}(°)$ | $\theta_{2,1}(°)$ | $\theta_{2,2}(°)$ | $\theta_{3,0}(°)$ | $\theta_{3,1}(°)$ | $\theta_{3,2}(°)$ | $\theta_{4,0}(°)$ | $\theta_{4,1}(°)$ | $\theta_{4,2}(°)$ |
|---|---|---|---|---|---|---|---|---|---|
| 7.0  | 15.568348 | 1.131042  | 0.005493 | 15.578780 | 1.131042  | 0.005493 | 22.446272 | 6.775257  | 0.005493 |
| 7.5  | 17.192603 | 1.888728  | 0.005493 | 16.069883 | 1.339680  | 0.005493 | 22.420997 | 7.785506  | 0.005493 |
| 8.0  | 18.054192 | 2.306005  | 0.005493 | 16.798096 | 1.548319  | 0.005493 | 22.493123 | 8.422402  | 0.005493 |
| 8.5  | 18.941661 | 2.745244  | 0.005493 | 17.718148 | 1.811862  | 0.005493 | 22.493392 | 8.927526  | 0.005493 |
| 9.0  | 19.917948 | 3.404101  | 0.005493 | 19.712200 | 3.140558  | 0.005493 | 22.493113 | 8.378478  | 0.005493 |
| 9.5  | 20.714379 | 4.128845  | 0.005493 | 20.627057 | 3.975112  | 0.005493 | 22.493172 | 8.510250  | 0.005493 |
| 10.0 | 21.288488 | 4.897512  | 0.005493 | 21.244790 | 4.765741  | 0.005493 | 22.493322 | 8.817717  | 0.005493 |
| 10.5 | 21.700875 | 5.622256  | 0.005493 | 21.680682 | 5.545389  | 0.005493 | 22.493531 | 9.245974  | 0.005493 |
| 11.0 | 22.023296 | 6.500733  | 0.005493 | 22.004288 | 6.379943  | 0.005493 | 22.493767 | 9.729137  | 0.005493 |
| 11.5 | 22.239055 | 7.236458  | 0.005493 | 22.237553 | 7.148610  | 0.005493 | 22.493981 | 10.157394 | 0.005493 |
| 12.0 | 22.350167 | 7.772433  | 0.104370 | 22.363831 | 7.718011  | 0.104370 | 22.494423 | 10.436001 | 0.631714 |
| 12.5 | 22.438278 | 8.295694  | 0.148315 | 22.452031 | 8.306536  | 0.148315 | 22.494648 | 10.744149 | 0.785522 |
| 13.0 | 22.493387 | 8.760929  | 0.192261 | 22.493439 | 8.849705  | 0.203247 | 22.494861 | 11.013882 | 0.961304 |
| 13.5 | 22.493614 | 9.162198  | 0.258179 | 22.493711 | 9.337775  | 0.280151 | 22.490149 | 11.220533 | 1.192017 |
| 14.0 | 22.493837 | 9.530288  | 0.346069 | 22.493981 | 9.772036  | 0.390015 | 22.490480 | 11.240489 | 1.499634 |
| 14.5 | 22.494054 | 9.854728  | 0.466919 | 22.494266 | 10.180536 | 0.565796 | 22.490941 | 11.240950 | 1.972046 |
| 15.0 | 22.494239 | 10.081026 | 0.609741 | 22.494618 | 10.615322 | 0.840454 | 22.491564 | 11.241572 | 2.598267 |
| 15.5 | 22.494407 | 10.292497 | 0.763550 | 22.490094 | 11.065212 | 1.290894 | 22.492198 | 11.242206 | 3.257446 |
| 16.0 | 22.494614 | 10.530066 | 0.928345 | 22.490748 | 11.240757 | 1.774292 | 22.492724 | 11.242731 | 3.795776 |
| 16.5 | 22.494847 | 10.786842 | 1.148071 | 22.491296 | 11.241304 | 2.323608 | 22.493175 | 11.243182 | 4.257202 |
| 17.0 | 22.490191 | 11.010613 | 1.444702 | 22.491865 | 11.241873 | 2.927856 | 22.493615 | 11.243622 | 4.685669 |
| 17.5 | 22.490705 | 11.185375 | 1.807251 | 22.492499 | 11.242506 | 3.532104 | 22.493938 | 11.243944 | 5.048218 |
| 18.0 | 22.491221 | 11.241229 | 2.257690 | 22.493057 | 11.243064 | 4.136353 | 22.494228 | 11.244233 | 5.333862 |
| 18.5 | 22.491725 | 11.241733 | 2.785034 | 22.493605 | 11.243611 | 4.641724 | 22.494400 | 11.244405 | 5.509644 |
| 19.0 | 22.492273 | 11.242281 | 3.334351 | 22.493938 | 11.243944 | 5.037231 | 22.494496 | 11.244501 | 5.608521 |
| 19.5 | 22.492821 | 11.242828 | 3.894653 | 22.494217 | 11.244223 | 5.322876 | 22.494496 | 11.244501 | 5.619507 |
| 20.0 | 22.493336 | 11.243343 | 4.421997 | 22.494389 | 11.244394 | 5.509644 | 22.494496 | 11.244501 | 5.619507 |
| 20.5 | 22.493734 | 11.243740 | 4.839478 | 22.494496 | 11.244501 | 5.597534 | 22.494496 | 11.244501 | 5.619507 |
| 21.0 | 22.494067 | 11.244072 | 5.169067 | 22.494496 | 11.244501 | 5.619507 | 22.494496 | 11.244501 | 5.619507 |
| 21.5 | 22.494303 | 11.244308 | 5.421753 | 22.494496 | 11.244501 | 5.619507 | 22.494496 | 11.244501 | 5.619507 |
| 22.0 | 22.494432 | 11.244437 | 5.553589 | 22.494496 | 11.244501 | 5.619507 | 22.494496 | 11.244501 | 5.619507 |
| 22.5 | 22.494485 | 11.244491 | 5.608521 | 22.494496 | 11.244501 | 5.619507 | 22.494496 | 11.244501 | 5.619507 |
| 23.0 | 22.494629 | 11.244629 | 5.619507 | 22.494496 | 11.244501 | 5.619507 | 22.494496 | 11.244501 | 5.619507 |
| 23.5 | 22.483489 | 11.244501 | 5.619507 | 22.494496 | 11.244501 | 5.619507 | 22.494496 | 11.244501 | 5.619507 |
| 24.0 | 22.483456 | 11.233504 | 5.619507 | 22.494496 | 11.244501 | 5.619507 | 22.494496 | 11.244501 | 5.619507 |
| 24.5 | 22.483424 | 11.222507 | 5.619507 | 22.494496 | 11.244501 | 5.619507 | 22.494496 | 11.244501 | 5.619507 |

FIG. 46

| SNR(dB) | $\theta_{5,0}(°)$ | $\theta_{5,1}(°)$ | $\theta_{5,2}(°)$ | $\theta_{6,0}(°)$ | $\theta_{6,1}(°)$ | $\theta_{6,2}(°)$ | $\theta_{7,0}(°)$ | $\theta_{7,1}(°)$ | $\theta_{7,2}(°)$ | cap.(bps/Hz) |
|---|---|---|---|---|---|---|---|---|---|---|
| 7.0 | 22.430970 | 6.775257 | 0.005493 | 22.431066 | 6.797219 | 0.005493 | 22.446310 | 6.786238 | 0.005493 | 2.476685 |
| 7.5 | 22.325439 | 6.950953 | 0.005493 | 22.421056 | 7.796487 | 0.005493 | 22.493821 | 9.838946 | 0.005493 | 2.612725 |
| 8.0 | 22.478100 | 7.532944 | 0.005493 | 22.493134 | 8.433383 | 0.005493 | 22.494212 | 10.640557 | 0.005493 | 2.752232 |
| 8.5 | 22.492973 | 8.092973 | 0.005493 | 22.493440 | 9.057336 | 0.005493 | 22.494416 | 11.057833 | 0.005493 | 2.893711 |
| 9.0 | 22.493097 | 8.345535 | 0.005493 | 22.494105 | 10.420937 | 0.005493 | 22.494507 | 11.233529 | 0.005493 | 3.038945 |
| 9.5 | 22.493236 | 8.631040 | 0.005493 | 22.494362 | 10.937043 | 0.005493 | 22.494507 | 11.244510 | 0.005493 | 3.188474 |
| 10.0 | 22.493445 | 9.059298 | 0.005493 | 22.494507 | 11.244510 | 0.005493 | 22.494507 | 11.244510 | 0.005493 | 3.340518 |
| 10.5 | 22.493681 | 9.553441 | 0.005493 | 22.500000 | 11.250000 | 0.000000 | 22.494507 | 11.244510 | 0.005493 | 3.493866 |
| 11.0 | 22.493938 | 10.069546 | 0.005493 | 22.500000 | 11.250000 | 0.000000 | 22.494507 | 11.244510 | 0.005493 | 3.647822 |
| 11.5 | 22.494153 | 10.519766 | 0.005493 | 22.500000 | 11.250000 | 0.000000 | 22.494507 | 11.244510 | 0.005493 | 3.801901 |
| 12.0 | 22.494712 | 10.818419 | 0.862427 | 22.491543 | 11.241551 | 2.598267 | 22.493100 | 11.243107 | 4.191284 | 3.958940 |
| 12.5 | 22.494954 | 11.041930 | 1.104126 | 22.492090 | 11.242098 | 3.147583 | 22.493798 | 11.243804 | 4.905396 | 4.117529 |
| 13.0 | 22.490792 | 11.201693 | 1.367798 | 22.492542 | 11.242549 | 3.609009 | 22.494174 | 11.244180 | 5.289917 | 4.276682 |
| 13.5 | 22.490662 | 11.240671 | 1.697388 | 22.492993 | 11.242999 | 4.081421 | 22.494378 | 11.244383 | 5.498657 | 4.435679 |
| 14.0 | 22.491081 | 11.241090 | 2.103882 | 22.493454 | 11.243461 | 4.542847 | 22.494475 | 11.244480 | 5.586548 | 4.594028 |
| 14.5 | 22.491639 | 11.241648 | 2.686157 | 22.493873 | 11.243879 | 4.971313 | 22.494496 | 11.244501 | 5.619507 | 4.751384 |
| 15.0 | 22.492380 | 11.242388 | 3.444214 | 22.494195 | 11.244201 | 5.300903 | 22.494496 | 11.244501 | 5.619507 | 4.907900 |
| 15.5 | 22.493186 | 11.243193 | 4.268188 | 22.494399 | 11.244405 | 5.509644 | 22.494496 | 11.244501 | 5.619507 | 5.065829 |
| 16.0 | 22.493755 | 11.243761 | 4.850464 | 22.494485 | 11.244491 | 5.608521 | 22.494496 | 11.244501 | 5.619507 | 5.226209 |
| 16.5 | 22.494142 | 11.244147 | 5.245972 | 22.494496 | 11.244501 | 5.619507 | 22.494496 | 11.244501 | 5.619507 | 5.387719 |
| 17.0 | 22.494367 | 11.244373 | 5.476685 | 22.494496 | 11.244501 | 5.619507 | 22.494496 | 11.244501 | 5.619507 | 5.548959 |
| 17.5 | 22.494485 | 11.244491 | 5.597534 | 22.494496 | 11.244501 | 5.619507 | 22.494496 | 11.244501 | 5.619507 | 5.708786 |
| 18.0 | 22.494496 | 11.244501 | 5.619507 | 22.494496 | 11.244501 | 5.619507 | 22.494496 | 11.244501 | 5.619507 | 5.866327 |
| 18.5 | 22.494496 | 11.244501 | 5.619507 | 22.494496 | 11.244501 | 5.619507 | 22.494496 | 11.244501 | 5.619507 | 6.020896 |
| 19.0 | 22.494496 | 11.244501 | 5.619507 | 22.494496 | 11.244501 | 5.619507 | 22.494496 | 11.244501 | 5.619507 | 6.171975 |
| 19.5 | 22.494496 | 11.244501 | 5.619507 | 22.494496 | 11.244501 | 5.619507 | 22.494496 | 11.244501 | 5.619507 | 6.319094 |
| 20.0 | 22.494496 | 11.244501 | 5.619507 | 22.494496 | 11.244501 | 5.619507 | 22.494496 | 11.244501 | 5.619507 | 6.461741 |
| 20.5 | 22.494496 | 11.244501 | 5.619507 | 22.494496 | 11.244501 | 5.619507 | 22.494496 | 11.244501 | 5.619507 | 6.599447 |
| 21.0 | 22.494496 | 11.244501 | 5.619507 | 22.494496 | 11.244501 | 5.619507 | 22.494496 | 11.244501 | 5.619507 | 6.731861 |
| 21.5 | 22.494496 | 11.244501 | 5.619507 | 22.494496 | 11.244501 | 5.619507 | 22.494496 | 11.244501 | 5.619507 | 6.859088 |
| 22.0 | 22.494496 | 11.244501 | 5.619507 | 22.494496 | 11.244501 | 5.619507 | 22.494496 | 11.244501 | 5.619507 | 6.980626 |
| 22.5 | 22.483488 | 11.244501 | 5.619507 | 22.494496 | 11.244501 | 5.619507 | 22.494496 | 11.244501 | 5.619507 | 7.095708 |
| 23.0 | 22.472481 | 11.244501 | 5.619507 | 22.484629 | 11.244629 | 5.619507 | 22.494496 | 10.442317 | 5.619507 | 7.203614 |
| 23.5 | 22.338826 | 11.211360 | 5.597534 | 22.500000 | 11.250000 | 5.750000 | 20.792580 | 10.442317 | 5.213013 | 7.304421 |
| 24.0 | 20.887074 | 10.700120 | 5.333862 | 22.500000 | 11.250000 | 5.750000 | 19.496762 | 10.131857 | 4.993286 | 7.397826 |
| 24.5 | 20.863734 | 10.639985 | 5.311890 | 22.500000 | 11.250000 | 5.750000 | 19.236294 | 10.097385 | 4.938354 | 7.483272 |

FIG. 49

| SNR(dB) | $r_0$ | $r_1$ | $r_2$ | $r_3$ | $r_4$ | $r_5$ | $r_6$ | $r_7$ |
|---|---|---|---|---|---|---|---|---|
| 10.0 | 0.358186 | 0.357887 | 0.357525 | 0.357855 | 0.659311 | 0.666838 | 0.659406 | 0.652604 |
| 10.5 | 0.349358 | 0.346871 | 0.344438 | 0.346882 | 0.673206 | 0.678676 | 0.673262 | 0.668285 |
| 11.0 | 0.344480 | 0.341140 | 0.337761 | 0.340975 | 0.683715 | 0.687671 | 0.683818 | 0.680157 |
| 11.5 | 0.342218 | 0.338709 | 0.335207 | 0.338710 | 0.692436 | 0.694597 | 0.692247 | 0.690055 |
| 12.0 | 0.338967 | 0.335508 | 0.331943 | 0.335395 | 0.692777 | 0.693595 | 0.692823 | 0.692110 |
| 12.5 | 0.337924 | 0.336559 | 0.332212 | 0.333593 | 0.694365 | 0.693148 | 0.693766 | 0.694957 |
| 13.0 | 0.335459 | 0.335435 | 0.331218 | 0.331259 | 0.688840 | 0.687525 | 0.691742 | 0.693032 |
| 13.5 | 0.333039 | 0.333303 | 0.332087 | 0.331744 | 0.683405 | 0.682609 | 0.691333 | 0.691974 |
| 14.0 | 0.329367 | 0.329554 | 0.333756 | 0.333715 | 0.676710 | 0.676890 | 0.690954 | 0.690959 |
| 14.5 | 0.323016 | 0.321973 | 0.338243 | 0.339207 | 0.668302 | 0.669935 | 0.691781 | 0.690348 |
| 15.0 | 0.306568 | 0.303010 | 0.353765 | 0.355931 | 0.656895 | 0.659661 | 0.697571 | 0.694664 |
| 15.5 | 0.268635 | 0.266975 | 0.391131 | 0.391841 | 0.641951 | 0.643913 | 0.715527 | 0.713727 |
| 16.0 | 0.245356 | 0.245035 | 0.413543 | 0.413707 | 0.629678 | 0.630958 | 0.732664 | 0.731177 |
| 16.5 | 0.233192 | 0.232928 | 0.424513 | 0.424749 | 0.619031 | 0.619728 | 0.744225 | 0.743050 |
| 17.0 | 0.226865 | 0.226844 | 0.431439 | 0.431444 | 0.611453 | 0.611924 | 0.752691 | 0.751556 |
| 17.5 | 0.224351 | 0.224027 | 0.435867 | 0.435808 | 0.607325 | 0.607490 | 0.758682 | 0.757793 |
| 18.0 | 0.223790 | 0.223794 | 0.439253 | 0.439339 | 0.606291 | 0.606263 | 0.763257 | 0.762468 |
| 18.5 | 0.223979 | 0.224244 | 0.440729 | 0.440785 | 0.607048 | 0.606910 | 0.766623 | 0.766012 |
| 19.0 | 0.224090 | 0.225155 | 0.441230 | 0.441198 | 0.608891 | 0.608766 | 0.768827 | 0.768578 |
| 19.5 | 0.270439 | 0.186171 | 0.459140 | 0.436787 | 0.616705 | 0.613197 | 0.771268 | 0.771594 |
| 20.0 | 0.286250 | 0.174519 | 0.470143 | 0.437417 | 0.623513 | 0.617250 | 0.773502 | 0.774099 |
| 20.5 | 0.294576 | 0.168049 | 0.477488 | 0.437414 | 0.628344 | 0.619092 | 0.774689 | 0.775464 |
| 21.0 | 0.164152 | 0.299863 | 0.436834 | 0.483260 | 0.618882 | 0.632195 | 0.772512 | 0.778592 |
| 21.5 | 0.304015 | 0.162092 | 0.489172 | 0.435992 | 0.636547 | 0.618246 | 0.781924 | 0.771475 |
| 22.0 | 0.305402 | 0.160697 | 0.493082 | 0.432646 | 0.640410 | 0.615353 | 0.785771 | 0.768150 |
| 22.5 | 0.308869 | 0.161726 | 0.498040 | 0.435317 | 0.641522 | 0.620856 | 0.775592 | 0.781182 |
| 23.0 | 0.309256 | 0.162313 | 0.502101 | 0.431313 | 0.646008 | 0.619990 | 0.776198 | 0.783171 |
| 23.5 | 0.308633 | 0.163405 | 0.506579 | 0.427063 | 0.651411 | 0.619686 | 0.777774 | 0.786801 |
| 24.0 | 0.307908 | 0.165700 | 0.510768 | 0.423249 | 0.659173 | 0.617659 | 0.782079 | 0.790972 |
| 24.5 | 0.307457 | 0.169715 | 0.511559 | 0.419858 | 0.664286 | 0.611744 | 0.783870 | 0.792285 |
| 25.0 | 0.306904 | 0.173788 | 0.509416 | 0.416331 | 0.667889 | 0.603194 | 0.785705 | 0.790351 |
| 25.5 | 0.307804 | 0.178168 | 0.508067 | 0.414546 | 0.671566 | 0.598573 | 0.788184 | 0.790512 |
| 26.0 | 0.304539 | 0.178586 | 0.499372 | 0.407964 | 0.664855 | 0.584705 | 0.813140 | 0.747215 |
| 26.5 | 0.305344 | 0.182198 | 0.498908 | 0.407402 | 0.664249 | 0.584032 | 0.816372 | 0.744332 |
| 27.0 | 0.307502 | 0.186860 | 0.499998 | 0.408435 | 0.664143 | 0.584511 | 0.818446 | 0.743521 |
| 27.5 | 0.308684 | 0.191365 | 0.501602 | 0.408972 | 0.666172 | 0.586361 | 0.823075 | 0.745856 |
| 28.0 | 0.310102 | 0.196788 | 0.502032 | 0.409419 | 0.665619 | 0.585990 | 0.825978 | 0.746600 |
| 28.5 | 0.313420 | 0.203452 | 0.511501 | 0.414598 | 0.688309 | 0.603355 | 0.848004 | 0.768893 |
| 29.0 | 0.314724 | 0.208944 | 0.513042 | 0.415803 | 0.691344 | 0.606090 | 0.849688 | 0.771670 |
| 29.5 | 0.315306 | 0.212058 | 0.514966 | 0.416567 | 0.696573 | 0.609439 | 0.853988 | 0.776707 |
| 30.0 | 0.314210 | 0.213317 | 0.515229 | 0.415536 | 0.698101 | 0.611109 | 0.855119 | 0.777851 |

FIG. 50

| SNR(dB) | $r_8$ | $r_9$ | $r_{10}$ | $r_{11}$ | $r_{12}$ | $r_{13}$ | $r_{14}$ | $r_{15}$ |
|---|---|---|---|---|---|---|---|---|
| 10.0 | 1.029669 | 1.051427 | 1.072064 | 1.051387 | 1.457754 | 1.381534 | 1.457720 | 1.780051 |
| 10.5 | 1.015588 | 1.040765 | 1.066208 | 1.040765 | 1.457116 | 1.387099 | 1.457081 | 1.788868 |
| 11.0 | 1.006411 | 1.033645 | 1.062316 | 1.033679 | 1.453432 | 1.389357 | 1.453526 | 1.797282 |
| 11.5 | 1.000427 | 1.028453 | 1.059789 | 1.028657 | 1.448483 | 1.389998 | 1.449602 | 1.803430 |
| 12.0 | 0.990707 | 1.018733 | 1.052149 | 1.019129 | 1.440900 | 1.390347 | 1.442203 | 1.837298 |
| 12.5 | 0.985061 | 1.000474 | 1.048661 | 1.027495 | 1.392175 | 1.389337 | 1.496595 | 1.840945 |
| 13.0 | 0.973181 | 0.976834 | 1.043606 | 1.034427 | 1.353464 | 1.383372 | 1.554382 | 1.851323 |
| 13.5 | 0.965679 | 0.964594 | 1.039576 | 1.037326 | 1.337826 | 1.379963 | 1.577956 | 1.861216 |
| 14.0 | 0.959908 | 0.955718 | 1.036330 | 1.040440 | 1.326406 | 1.377435 | 1.592301 | 1.872371 |
| 14.5 | 0.955555 | 0.949090 | 1.034816 | 1.044497 | 1.316661 | 1.374390 | 1.601103 | 1.884195 |
| 15.0 | 0.951599 | 0.944202 | 1.038866 | 1.052450 | 1.309071 | 1.370729 | 1.605166 | 1.890360 |
| 15.5 | 0.947007 | 0.940660 | 1.053862 | 1.066564 | 1.302411 | 1.364648 | 1.601304 | 1.883976 |
| 16.0 | 0.942486 | 0.937629 | 1.069488 | 1.081412 | 1.297877 | 1.359515 | 1.595616 | 1.874067 |
| 16.5 | 0.937515 | 0.933746 | 1.079961 | 1.091594 | 1.293478 | 1.355572 | 1.591349 | 1.872359 |
| 17.0 | 0.933477 | 0.931015 | 1.086155 | 1.097992 | 1.290882 | 1.352777 | 1.588834 | 1.871048 |
| 17.5 | 0.931058 | 0.929612 | 1.090003 | 1.102700 | 1.289978 | 1.352484 | 1.586923 | 1.866856 |
| 18.0 | 0.929738 | 0.929438 | 1.092092 | 1.106830 | 1.289822 | 1.354133 | 1.585578 | 1.859417 |
| 18.5 | 0.928710 | 0.929952 | 1.093180 | 1.110559 | 1.289852 | 1.358472 | 1.583749 | 1.851098 |
| 19.0 | 0.927839 | 0.930678 | 1.092291 | 1.114460 | 1.289334 | 1.366314 | 1.581293 | 1.842484 |
| 19.5 | 0.926923 | 0.932131 | 1.089379 | 1.117413 | 1.285792 | 1.373846 | 1.577161 | 1.830984 |
| 20.0 | 0.926323 | 0.934218 | 1.086099 | 1.121261 | 1.281717 | 1.381762 | 1.574049 | 1.819496 |
| 20.5 | 0.923918 | 0.935382 | 1.082486 | 1.125833 | 1.277833 | 1.389933 | 1.573114 | 1.810741 |
| 21.0 | 0.921376 | 0.937878 | 1.079216 | 1.131308 | 1.275210 | 1.396682 | 1.573385 | 1.802102 |
| 21.5 | 0.942127 | 0.919165 | 1.137310 | 1.076679 | 1.400946 | 1.273713 | 1.793055 | 1.572485 |
| 22.0 | 0.948656 | 0.915204 | 1.146584 | 1.074176 | 1.405172 | 1.274897 | 1.783096 | 1.571292 |
| 22.5 | 0.914807 | 0.950336 | 1.072029 | 1.152091 | 1.275117 | 1.406931 | 1.569730 | 1.773724 |
| 23.0 | 0.912119 | 0.955661 | 1.070973 | 1.159207 | 1.277483 | 1.409498 | 1.567420 | 1.763769 |
| 23.5 | 0.910178 | 0.962593 | 1.071338 | 1.164920 | 1.280108 | 1.410223 | 1.563812 | 1.753277 |
| 24.0 | 0.910464 | 0.969923 | 1.073402 | 1.170046 | 1.283008 | 1.410704 | 1.558981 | 1.739799 |
| 24.5 | 0.909578 | 0.977269 | 1.075898 | 1.174351 | 1.285598 | 1.411331 | 1.556113 | 1.730859 |
| 25.0 | 0.907606 | 0.980978 | 1.076618 | 1.176788 | 1.287871 | 1.412929 | 1.556145 | 1.727512 |
| 25.5 | 0.907907 | 0.987553 | 1.081492 | 1.181249 | 1.291207 | 1.413511 | 1.552898 | 1.716638 |
| 26.0 | 0.927694 | 1.004790 | 1.095499 | 1.191801 | 1.296656 | 1.413472 | 1.545720 | 1.702034 |
| 26.5 | 0.929833 | 1.010197 | 1.100204 | 1.196215 | 1.299987 | 1.413525 | 1.542184 | 1.692056 |
| 27.0 | 0.929927 | 1.012688 | 1.102686 | 1.198991 | 1.302089 | 1.414030 | 1.539633 | 1.684966 |
| 27.5 | 0.932628 | 1.015883 | 1.105531 | 1.201535 | 1.303546 | 1.413430 | 1.535730 | 1.674721 |
| 28.0 | 0.932733 | 1.016969 | 1.106883 | 1.203094 | 1.305184 | 1.413762 | 1.533714 | 1.669737 |
| 28.5 | 0.951685 | 1.030921 | 1.114282 | 1.204735 | 1.301408 | 1.400741 | 1.509794 | 1.637683 |
| 29.0 | 0.951036 | 1.032578 | 1.118499 | 1.208593 | 1.304539 | 1.401054 | 1.505073 | 1.626652 |
| 29.5 | 0.953911 | 1.035409 | 1.122257 | 1.210603 | 1.305607 | 1.400461 | 1.500016 | 1.613910 |
| 30.0 | 0.954255 | 1.035109 | 1.121858 | 1.210120 | 1.306278 | 1.400808 | 1.499738 | 1.611742 |

FIG. 51

| SNR(dB) | $\theta_{0,0}$ (°) | $\theta_{0,1}$ (°) | $\theta_{0,2}$ (°) | $\theta_{0,3}$ (°) | $\theta_{1,0}$ (°) | $\theta_{1,1}$ (°) | $\theta_{1,2}$ (°) | $\theta_{1,3}$ (°) |
|---|---|---|---|---|---|---|---|---|
| 10.0 | 16.636470 | 1.086073 | 0.010981 | 0.005493 | 16.623014 | 1.086073 | 0.010981 | 0.005493 |
| 10.5 | 16.937768 | 1.250626 | 0.010981 | 0.005493 | 16.869751 | 1.228686 | 0.010981 | 0.005493 |
| 11.0 | 17.282538 | 1.470031 | 0.010981 | 0.005493 | 17.192154 | 1.437120 | 0.010981 | 0.005493 |
| 11.5 | 17.679716 | 1.722346 | 0.010981 | 0.005493 | 17.598417 | 1.678466 | 0.010981 | 0.005493 |
| 12.0 | 18.104122 | 1.952722 | 0.010981 | 0.005493 | 18.022017 | 1.897870 | 0.010981 | 0.005493 |
| 12.5 | 18.666006 | 2.183097 | 0.010981 | 0.005493 | 18.642024 | 2.161156 | 0.010981 | 0.005493 |
| 13.0 | 19.254483 | 2.402501 | 0.010981 | 0.005493 | 19.254483 | 2.402501 | 0.010981 | 0.005493 |
| 13.5 | 19.886900 | 2.588995 | 0.010981 | 0.005493 | 19.888341 | 2.599966 | 0.010981 | 0.005493 |
| 14.0 | 20.465012 | 2.742579 | 0.010981 | 0.005493 | 20.466143 | 2.742579 | 0.010981 | 0.005493 |
| 14.5 | 20.934060 | 2.819370 | 0.010981 | 0.005493 | 20.913078 | 2.786460 | 0.010981 | 0.005493 |
| 15.0 | 21.136350 | 2.687728 | 0.010981 | 0.005493 | 21.073598 | 2.610936 | 0.010981 | 0.005493 |
| 15.5 | 20.607599 | 2.402501 | 0.010981 | 0.005493 | 20.583810 | 2.369591 | 0.010981 | 0.005493 |
| 16.0 | 20.179979 | 2.435412 | 0.010981 | 0.005493 | 20.178710 | 2.424442 | 0.010981 | 0.005493 |
| 16.5 | 20.082516 | 2.599966 | 0.010981 | 0.005493 | 20.081183 | 2.588995 | 0.010981 | 0.005493 |
| 17.0 | 20.298772 | 2.797430 | 0.010981 | 0.005493 | 20.298772 | 2.797430 | 0.010981 | 0.005493 |
| 17.5 | 20.704526 | 3.027805 | 0.010981 | 0.005493 | 20.703513 | 3.016835 | 0.010981 | 0.005493 |
| 18.0 | 21.194410 | 3.247210 | 0.010981 | 0.005493 | 21.194410 | 3.247210 | 0.010981 | 0.005493 |
| 18.5 | 21.617868 | 3.466615 | 0.010981 | 0.005493 | 21.618377 | 3.477585 | 0.010981 | 0.005493 |
| 19.0 | 21.940334 | 3.671491 | 0.021957 | 0.005493 | 21.959315 | 3.715329 | 0.021957 | 0.005493 |
| 19.5 | 22.413910 | 6.345330 | 0.120737 | 0.005493 | 21.350516 | 3.038775 | 0.010981 | 0.005493 |
| 20.0 | 22.492857 | 7.612765 | 0.241469 | 0.005493 | 21.207325 | 3.159448 | 0.010981 | 0.005493 |
| 20.5 | 22.493358 | 8.508397 | 0.384151 | 0.005493 | 21.293865 | 3.345942 | 0.010981 | 0.005493 |
| 21.0 | 21.492540 | 3.543406 | 0.010981 | 0.005493 | 22.493807 | 9.230959 | 0.559761 | 0.005493 |
| 21.5 | 22.494189 | 9.833052 | 0.779273 | 0.005493 | 21.759438 | 3.748207 | 0.021957 | 0.005493 |
| 22.0 | 22.494519 | 10.260508 | 1.009760 | 0.005493 | 22.002152 | 3.945479 | 0.021957 | 0.005493 |
| 22.5 | 22.494845 | 10.619841 | 1.317077 | 0.005493 | 22.205818 | 4.204445 | 0.032932 | 0.005493 |
| 23.0 | 22.490196 | 10.863501 | 1.602443 | 0.005493 | 22.351469 | 4.546061 | 0.054883 | 0.005493 |
| 23.5 | 22.490640 | 11.021565 | 1.887808 | 0.005493 | 22.423917 | 5.104508 | 0.076835 | 0.005493 |
| 24.0 | 22.491094 | 11.135673 | 2.239028 | 0.005493 | 22.476218 | 6.138932 | 0.120737 | 0.005493 |
| 24.5 | 22.474813 | 11.208225 | 2.689027 | 0.005493 | 22.492942 | 7.853794 | 0.186591 | 0.005493 |
| 25.0 | 22.460683 | 11.226479 | 3.215856 | 0.005493 | 22.493735 | 9.400159 | 0.263420 | 0.005493 |
| 25.5 | 22.434647 | 11.228279 | 3.830490 | 0.005493 | 22.482759 | 10.362624 | 0.362200 | 0.005493 |
| 26.0 | 22.438591 | 11.216050 | 4.214635 | 0.005493 | 22.494484 | 10.769386 | 0.428054 | 0.005493 |
| 26.5 | 22.467778 | 11.217935 | 4.666513 | 0.016479 | 22.494646 | 11.014263 | 0.526834 | 0.005493 |
| 27.0 | 22.493890 | 11.219599 | 4.996371 | 0.027466 | 22.473708 | 11.099635 | 0.636590 | 0.005493 |
| 27.5 | 22.494118 | 11.244123 | 5.194007 | 0.038452 | 22.391833 | 11.122786 | 0.812200 | 0.005493 |
| 28.0 | 22.494268 | 11.244274 | 5.326121 | 0.060425 | 22.231995 | 11.142179 | 1.207321 | 0.005493 |
| 28.5 | 22.494461 | 11.244467 | 5.479437 | 0.104370 | 21.983310 | 11.011125 | 2.809759 | 0.005493 |
| 29.0 | 22.494621 | 11.244626 | 5.566404 | 0.159302 | 21.986770 | 10.724677 | 4.763415 | 0.005493 |
| 29.5 | 22.494675 | 11.244680 | 5.588012 | 0.214233 | 21.936801 | 10.570386 | 5.586585 | 0.005493 |
| 30.0 | 22.494655 | 11.244661 | 5.546063 | 0.225220 | 21.787472 | 10.530396 | 5.619512 | 0.005493 |

FIG. 52

| SNR(dB) | $\theta_{2,0}(°)$ | $\theta_{2,1}(°)$ | $\theta_{2,2}(°)$ | $\theta_{2,3}(°)$ | $\theta_{3,0}(°)$ | $\theta_{3,1}(°)$ | $\theta_{3,2}(°)$ | $\theta_{3,3}(°)$ |
|---|---|---|---|---|---|---|---|---|
| 10.0 | 16.612566 | 1.086073 | 0.010981 | 0.005493 | 16.623014 | 1.086073 | 0.010981 | 0.005493 |
| 10.5 | 16.811993 | 1.206745 | 0.010981 | 0.005493 | 16.869751 | 1.228686 | 0.010981 | 0.005493 |
| 11.0 | 17.098703 | 1.393239 | 0.010981 | 0.005493 | 17.189387 | 1.426150 | 0.010981 | 0.005493 |
| 11.5 | 17.506638 | 1.634585 | 0.010981 | 0.005493 | 17.598417 | 1.678466 | 0.010981 | 0.005493 |
| 12.0 | 17.939536 | 1.843019 | 0.010981 | 0.005493 | 18.022017 | 1.897870 | 0.010981 | 0.005493 |
| 12.5 | 18.547797 | 2.095335 | 0.010981 | 0.005493 | 18.571939 | 2.117275 | 0.010981 | 0.005493 |
| 13.0 | 19.183016 | 2.325710 | 0.010981 | 0.005493 | 19.181210 | 2.325710 | 0.010981 | 0.005493 |
| 13.5 | 19.884018 | 2.578025 | 0.010981 | 0.005493 | 19.864569 | 2.567055 | 0.010981 | 0.005493 |
| 14.0 | 20.550867 | 2.819370 | 0.010981 | 0.005493 | 20.550867 | 2.819370 | 0.010981 | 0.005493 |
| 14.5 | 21.169583 | 3.170418 | 0.010981 | 0.005493 | 21.171848 | 3.192359 | 0.010981 | 0.005493 |
| 15.0 | 21.744411 | 3.839603 | 0.010981 | 0.005493 | 21.765506 | 3.890681 | 0.021957 | 0.005493 |
| 15.5 | 22.194298 | 5.507669 | 0.054883 | 0.005493 | 22.194495 | 5.529524 | 0.054883 | 0.005493 |
| 16.0 | 22.386423 | 6.866757 | 0.120737 | 0.005493 | 22.386423 | 6.866757 | 0.120737 | 0.005493 |
| 16.5 | 22.464747 | 7.846377 | 0.197566 | 0.005493 | 22.464747 | 7.846377 | 0.197566 | 0.005493 |
| 17.0 | 22.493371 | 8.622590 | 0.285371 | 0.005493 | 22.493371 | 8.622590 | 0.285371 | 0.005493 |
| 17.5 | 22.493729 | 9.233676 | 0.406103 | 0.005493 | 22.493728 | 9.233676 | 0.406103 | 0.005493 |
| 18.0 | 22.494036 | 9.721372 | 0.559761 | 0.005493 | 22.494036 | 9.721372 | 0.559761 | 0.005493 |
| 18.5 | 22.494322 | 10.108085 | 0.757322 | 0.005493 | 22.494327 | 10.108085 | 0.757322 | 0.005493 |
| 19.0 | 22.494593 | 10.423655 | 0.987809 | 0.005493 | 22.494593 | 10.423655 | 0.987809 | 0.005493 |
| 19.5 | 22.490211 | 11.011115 | 1.459760 | 0.005493 | 22.494811 | 10.671053 | 1.196346 | 0.005493 |
| 20.0 | 22.490929 | 11.240938 | 1.953662 | 0.005493 | 22.490166 | 10.898829 | 1.514638 | 0.005493 |
| 20.5 | 22.491433 | 11.241441 | 2.480491 | 0.005493 | 22.490682 | 11.076186 | 1.876833 | 0.005493 |
| 21.0 | 22.491221 | 11.188964 | 2.304881 | 0.005493 | 22.491980 | 11.241988 | 3.029271 | 0.005493 |
| 21.5 | 22.492560 | 11.242567 | 3.632929 | 0.005493 | 22.491755 | 11.241763 | 2.809759 | 0.005493 |
| 22.0 | 22.493107 | 11.243113 | 4.192684 | 0.005493 | 22.492238 | 11.242245 | 3.292685 | 0.005493 |
| 22.5 | 22.493645 | 11.243651 | 4.721283 | 0.016479 | 22.492817 | 11.242824 | 3.896343 | 0.005493 |
| 23.0 | 22.494043 | 11.244049 | 5.106717 | 0.038452 | 22.493182 | 11.243188 | 4.258538 | 0.005493 |
| 23.5 | 22.494333 | 11.244339 | 5.370603 | 0.071411 | 22.493474 | 11.243480 | 4.546017 | 0.016479 |
| 24.0 | 22.494547 | 11.244552 | 5.533896 | 0.137329 | 22.481196 | 11.243738 | 4.810515 | 0.027466 |
| 24.5 | 22.494696 | 11.244701 | 5.598634 | 0.214233 | 22.481937 | 11.243985 | 5.052161 | 0.038452 |
| 25.0 | 22.484504 | 11.244840 | 5.619845 | 0.335083 | 22.470966 | 11.232631 | 5.260912 | 0.060425 |
| 25.5 | 22.474872 | 11.244979 | 5.619984 | 0.477905 | 22.449383 | 11.233177 | 5.414323 | 0.093384 |
| 26.0 | 22.451262 | 11.240271 | 5.615290 | 0.642700 | 22.439322 | 11.244489 | 5.480306 | 0.137329 |
| 26.5 | 22.453451 | 11.222233 | 5.615762 | 0.895386 | 22.429831 | 11.244608 | 5.514037 | 0.203247 |
| 27.0 | 22.439897 | 11.207485 | 5.616513 | 1.268921 | 22.420845 | 11.244728 | 5.516515 | 0.335083 |
| 27.5 | 22.446888 | 11.212429 | 5.617501 | 1.774292 | 22.423604 | 11.244912 | 5.495986 | 0.543823 |
| 28.0 | 22.426329 | 11.216837 | 5.618380 | 2.235718 | 22.432277 | 11.240344 | 5.447448 | 0.840454 |
| 28.5 | 22.316835 | 11.243696 | 5.545081 | 2.477417 | 22.267647 | 11.241411 | 5.451740 | 1.400757 |
| 29.0 | 22.251851 | 11.243959 | 5.536970 | 2.609253 | 22.269525 | 11.242580 | 5.368956 | 2.081909 |
| 29.5 | 22.244524 | 11.244070 | 5.538257 | 2.664185 | 22.410611 | 11.202519 | 5.233773 | 2.543335 |
| 30.0 | 22.222833 | 11.244114 | 5.550381 | 2.686157 | 22.493290 | 11.190656 | 5.077990 | 2.796021 |

FIG. 53

| SNR(dB) | $\theta_{4,0}(°)$ | $\theta_{4,1}(°)$ | $\theta_{4,2}(°)$ | $\theta_{4,3}(°)$ | $\theta_{5,0}(°)$ | $\theta_{5,1}(°)$ | $\theta_{5,2}(°)$ | $\theta_{5,3}(°)$ |
|---|---|---|---|---|---|---|---|---|
| 10.0 | 21.186847 | 4.673341 | 0.010981 | 0.005493 | 21.213019 | 4.783043 | 0.010981 | 0.005493 |
| 10.5 | 21.645652 | 5.485139 | 0.010981 | 0.005493 | 21.666029 | 5.572901 | 0.010981 | 0.005493 |
| 11.0 | 21.986962 | 6.318877 | 0.010981 | 0.005493 | 21.989051 | 6.384699 | 0.010981 | 0.005493 |
| 11.5 | 22.222629 | 7.130675 | 0.010981 | 0.005493 | 22.223422 | 7.174556 | 0.010981 | 0.005493 |
| 12.0 | 22.349942 | 7.761520 | 0.098786 | 0.005493 | 22.350165 | 7.783289 | 0.098786 | 0.005493 |
| 12.5 | 22.452152 | 8.341903 | 0.153664 | 0.005493 | 22.452078 | 8.320241 | 0.153664 | 0.005493 |
| 13.0 | 22.493397 | 8.763360 | 0.197566 | 0.005493 | 22.493387 | 8.752572 | 0.197566 | 0.005493 |
| 13.5 | 22.493614 | 9.153513 | 0.263420 | 0.005493 | 22.493614 | 9.142789 | 0.263420 | 0.005493 |
| 14.0 | 22.493826 | 9.498291 | 0.340249 | 0.005493 | 22.493826 | 9.498291 | 0.340249 | 0.005493 |
| 14.5 | 22.494032 | 9.811084 | 0.450005 | 0.005493 | 22.494037 | 9.832167 | 0.450005 | 0.005493 |
| 15.0 | 22.494206 | 10.036899 | 0.581712 | 0.005493 | 22.494228 | 10.069354 | 0.592688 | 0.005493 |
| 15.5 | 22.494375 | 10.238056 | 0.724395 | 0.005493 | 22.494386 | 10.259637 | 0.735371 | 0.005493 |
| 16.0 | 22.494555 | 10.465430 | 0.889029 | 0.005493 | 22.494566 | 10.476373 | 0.889029 | 0.005493 |
| 16.5 | 22.494774 | 10.704409 | 1.075614 | 0.005493 | 22.494774 | 10.704409 | 1.075614 | 0.005493 |
| 17.0 | 22.490023 | 10.949795 | 1.328053 | 0.005493 | 22.490034 | 10.950127 | 1.339028 | 0.005493 |
| 17.5 | 22.490519 | 11.128288 | 1.657321 | 0.005493 | 22.490519 | 11.128288 | 1.657321 | 0.005493 |
| 18.0 | 22.491025 | 11.241034 | 2.052442 | 0.005493 | 22.491025 | 11.241034 | 2.052442 | 0.005493 |
| 18.5 | 22.491487 | 11.241495 | 2.524393 | 0.005493 | 22.491487 | 11.241495 | 2.524393 | 0.005493 |
| 19.0 | 22.491980 | 11.241988 | 3.040246 | 0.005493 | 22.491980 | 11.241988 | 3.040246 | 0.005493 |
| 19.5 | 22.492592 | 11.242599 | 3.654880 | 0.005493 | 22.492549 | 11.242556 | 3.610978 | 0.005493 |
| 20.0 | 22.493128 | 11.243135 | 4.214635 | 0.005493 | 22.493075 | 11.243081 | 4.148782 | 0.005493 |
| 20.5 | 22.493634 | 11.243640 | 4.710329 | 0.016479 | 22.493527 | 11.243533 | 4.611742 | 0.016479 |
| 21.0 | 22.493892 | 11.243898 | 4.963573 | 0.027466 | 22.494032 | 11.244038 | 5.095806 | 0.038452 |
| 21.5 | 22.494321 | 11.244327 | 5.369595 | 0.060425 | 22.494183 | 11.244188 | 5.238413 | 0.049438 |
| 22.0 | 22.494535 | 11.244541 | 5.533531 | 0.115356 | 22.494386 | 11.244392 | 5.413905 | 0.082397 |
| 22.5 | 22.494685 | 11.244690 | 5.609116 | 0.192261 | 22.494568 | 11.244573 | 5.544775 | 0.148315 |
| 23.0 | 22.494824 | 11.244829 | 5.619834 | 0.324097 | 22.494707 | 11.244712 | 5.598688 | 0.225220 |
| 23.5 | 22.490037 | 11.240056 | 5.615076 | 0.532837 | 22.494867 | 11.244872 | 5.619877 | 0.368042 |
| 24.0 | 22.490640 | 11.240658 | 5.615677 | 0.851440 | 22.490080 | 11.240099 | 5.615119 | 0.565796 |
| 24.5 | 22.491339 | 11.241356 | 5.599219 | 1.213989 | 22.490532 | 11.240551 | 5.615569 | 0.796509 |
| 25.0 | 22.492247 | 11.242262 | 5.601922 | 1.675415 | 22.491157 | 11.241174 | 5.616192 | 1.104126 |
| 25.5 | 22.493026 | 11.243039 | 5.604240 | 2.081909 | 22.491717 | 11.241733 | 5.616750 | 1.400757 |
| 26.0 | 22.481024 | 11.243687 | 5.606171 | 2.411499 | 22.476832 | 11.242292 | 5.617307 | 1.686401 |
| 26.5 | 22.482122 | 11.232226 | 5.607330 | 2.609253 | 22.478835 | 11.242959 | 5.617973 | 2.015991 |
| 27.0 | 22.494257 | 11.210344 | 5.619346 | 2.730103 | 22.493527 | 11.243539 | 5.618552 | 2.312622 |
| 27.5 | 22.494344 | 11.189102 | 5.619475 | 2.785034 | 22.493979 | 11.243991 | 5.619003 | 2.554321 |
| 28.0 | 22.494281 | 11.145222 | 5.619496 | 2.807007 | 22.494238 | 11.244249 | 5.619260 | 2.686157 |
| 28.5 | 22.280308 | 11.244378 | 5.619389 | 2.752075 | 22.185051 | 11.244485 | 5.619496 | 2.807007 |
| 29.0 | 22.112801 | 11.244399 | 5.619410 | 2.763062 | 21.864577 | 11.244485 | 5.619496 | 2.807007 |
| 29.5 | 21.917848 | 11.244247 | 5.519611 | 2.785034 | 21.588307 | 11.244485 | 5.619496 | 2.807007 |
| 30.0 | 21.665275 | 11.243919 | 5.373462 | 2.763062 | 20.893081 | 10.667867 | 5.432364 | 2.807007 |

FIG. 54

| SNR(dB) | $\theta_{6,0}(°)$ | $\theta_{6,1}(°)$ | $\theta_{6,2}(°)$ | $\theta_{6,3}(°)$ | $\theta_{7,0}(°)$ | $\theta_{7,1}(°)$ | $\theta_{7,2}(°)$ | $\theta_{7,3}(°)$ |
|---|---|---|---|---|---|---|---|---|
| 10.0 | 21.186847 | 4.673341 | 0.010981 | 0.005493 | 21.144589 | 4.574609 | 0.010981 | 0.005493 |
| 10.5 | 21.645652 | 5.485139 | 0.010981 | 0.005493 | 21.640687 | 5.397377 | 0.010981 | 0.005493 |
| 11.0 | 21.986962 | 6.318877 | 0.010981 | 0.005493 | 21.984873 | 6.253056 | 0.010981 | 0.005493 |
| 11.5 | 22.222629 | 7.130675 | 0.010981 | 0.005493 | 22.222035 | 7.086794 | 0.010981 | 0.005493 |
| 12.0 | 22.364133 | 7.761520 | 0.098786 | 0.005493 | 22.363931 | 7.739751 | 0.098786 | 0.005493 |
| 12.5 | 22.452115 | 8.331072 | 0.153664 | 0.005493 | 22.452152 | 8.341903 | 0.153664 | 0.005493 |
| 13.0 | 22.493425 | 8.808939 | 0.208542 | 0.005493 | 22.493435 | 8.830494 | 0.208542 | 0.005493 |
| 13.5 | 22.493684 | 9.284165 | 0.274395 | 0.005493 | 22.493690 | 9.286131 | 0.285371 | 0.005493 |
| 14.0 | 22.493938 | 9.705294 | 0.373176 | 0.005493 | 22.493938 | 9.705294 | 0.373176 | 0.005493 |
| 14.5 | 22.494212 | 10.114387 | 0.526834 | 0.005493 | 22.494196 | 10.092270 | 0.515859 | 0.005493 |
| 15.0 | 22.494527 | 10.508276 | 0.768297 | 0.005493 | 22.494507 | 10.476775 | 0.746346 | 0.005493 |
| 15.5 | 22.494938 | 10.964500 | 1.163419 | 0.005493 | 22.494923 | 10.944479 | 1.152443 | 0.005493 |
| 16.0 | 22.490607 | 11.240616 | 1.635370 | 0.005493 | 22.490578 | 11.221816 | 1.624394 | 0.005493 |
| 16.5 | 22.491111 | 11.241120 | 2.140247 | 0.005493 | 22.491100 | 11.241109 | 2.129272 | 0.005493 |
| 17.0 | 22.491669 | 11.241677 | 2.710978 | 0.005493 | 22.491658 | 11.241666 | 2.700003 | 0.005493 |
| 17.5 | 22.492238 | 11.242245 | 3.303661 | 0.005493 | 22.492238 | 11.242245 | 3.292685 | 0.005493 |
| 18.0 | 22.492817 | 11.242824 | 3.885368 | 0.005493 | 22.492806 | 11.242813 | 3.874392 | 0.005493 |
| 18.5 | 22.493321 | 11.243328 | 4.401221 | 0.005493 | 22.493321 | 11.243328 | 4.401221 | 0.005493 |
| 19.0 | 22.493752 | 11.243758 | 4.830825 | 0.016479 | 22.493752 | 11.243758 | 4.830825 | 0.016479 |
| 19.5 | 22.494107 | 11.244113 | 5.172184 | 0.038452 | 22.494107 | 11.244113 | 5.172184 | 0.038452 |
| 20.0 | 22.494375 | 11.244381 | 5.413486 | 0.071411 | 22.494375 | 11.244381 | 5.413486 | 0.071411 |
| 20.5 | 22.494557 | 11.244562 | 5.544453 | 0.126343 | 22.494557 | 11.244562 | 5.555193 | 0.126343 |
| 21.0 | 22.494695 | 11.244701 | 5.609148 | 0.203247 | 22.494706 | 11.244711 | 5.609180 | 0.214233 |
| 21.5 | 22.494856 | 11.244861 | 5.619866 | 0.357056 | 22.494824 | 11.244829 | 5.619834 | 0.324097 |
| 22.0 | 22.490145 | 11.240164 | 5.615183 | 0.587769 | 22.494985 | 11.244990 | 5.619995 | 0.499878 |
| 22.5 | 22.490554 | 11.240572 | 5.615591 | 0.796509 | 22.490619 | 11.240637 | 5.615655 | 0.829468 |
| 23.0 | 22.491265 | 11.241282 | 5.616299 | 1.159058 | 22.491373 | 11.241389 | 5.616406 | 1.213989 |
| 23.5 | 22.492191 | 11.242206 | 5.617222 | 1.631470 | 22.492342 | 11.242357 | 5.617372 | 1.708374 |
| 24.0 | 22.479482 | 11.243174 | 5.618187 | 2.125854 | 22.479740 | 11.243260 | 5.618273 | 2.169800 |
| 24.5 | 22.481291 | 11.243776 | 5.618788 | 2.433472 | 22.481421 | 11.243819 | 5.618831 | 2.455444 |
| 25.0 | 22.482385 | 11.232488 | 5.619174 | 2.642212 | 22.482321 | 11.232424 | 5.619153 | 2.631226 |
| 25.5 | 22.482905 | 11.233005 | 5.619346 | 2.752075 | 22.482904 | 11.233004 | 5.619346 | 2.730103 |
| 26.0 | 22.460718 | 11.233327 | 5.608424 | 2.796021 | 22.471508 | 11.233005 | 5.619346 | 2.719116 |
| 26.5 | 22.438508 | 11.233327 | 5.597481 | 2.807007 | 22.471725 | 11.233134 | 5.619389 | 2.752075 |
| 27.0 | 22.437790 | 11.222104 | 5.586473 | 2.807007 | 22.483034 | 11.221997 | 5.619410 | 2.763062 |
| 27.5 | 22.425916 | 11.221782 | 5.553449 | 2.807007 | 22.494323 | 11.210796 | 5.619410 | 2.763062 |
| 28.0 | 22.425352 | 11.221567 | 5.531434 | 2.807007 | 22.494301 | 11.177471 | 5.619432 | 2.774048 |
| 28.5 | 22.381233 | 11.221996 | 5.608295 | 2.774048 | 22.379895 | 11.145222 | 5.619496 | 2.807007 |
| 29.0 | 22.336003 | 11.244356 | 5.608166 | 2.752075 | 22.320699 | 11.112134 | 5.619496 | 2.807007 |
| 29.5 | 22.337264 | 11.244399 | 5.619410 | 2.763062 | 22.236816 | 11.090075 | 5.619496 | 2.807007 |
| 30.0 | 22.336639 | 11.244378 | 5.619389 | 2.752075 | 22.158038 | 11.001841 | 5.619496 | 2.807007 |

FIG. 55

| SNR(dB) | $\theta_{8,0}$ (°) | $\theta_{8,1}$ (°) | $\theta_{8,2}$ (°) | $\theta_{8,3}$ (°) | $\theta_{9,0}$ (°) | $\theta_{9,1}$ (°) | $\theta_{9,2}$ (°) | $\theta_{9,3}$ (°) |
|---|---|---|---|---|---|---|---|---|
| 10.0 | 22.493275 | 8.710389 | 0.010981 | 0.005493 | 22.493393 | 8.951735 | 0.010981 | 0.005493 |
| 10.5 | 22.493478 | 9.116288 | 0.010981 | 0.005493 | 22.493596 | 9.368604 | 0.010981 | 0.005493 |
| 11.0 | 22.493719 | 9.609949 | 0.010981 | 0.005493 | 22.493837 | 9.851294 | 0.010981 | 0.005493 |
| 11.5 | 22.493960 | 10.103610 | 0.010981 | 0.005493 | 22.494062 | 10.312044 | 0.010981 | 0.005493 |
| 12.0 | 22.494431 | 10.495843 | 0.592688 | 0.005493 | 22.494546 | 10.656190 | 0.669517 | 0.005493 |
| 12.5 | 22.494700 | 10.817474 | 0.823175 | 0.005493 | 22.494753 | 10.870369 | 0.878053 | 0.005493 |
| 13.0 | 22.494892 | 11.034880 | 0.998785 | 0.005493 | 22.494900 | 11.040108 | 1.009760 | 0.005493 |
| 13.5 | 22.490169 | 11.200990 | 1.207321 | 0.005493 | 22.490150 | 11.200990 | 1.207321 | 0.005493 |
| 14.0 | 22.490478 | 11.240487 | 1.492687 | 0.005493 | 22.490457 | 11.240466 | 1.470736 | 0.005493 |
| 14.5 | 22.490875 | 11.240884 | 1.898784 | 0.005493 | 22.490832 | 11.240841 | 1.854882 | 0.005493 |
| 15.0 | 22.491433 | 11.241441 | 2.469515 | 0.005493 | 22.491379 | 11.241388 | 2.414637 | 0.005493 |
| 15.5 | 22.492066 | 11.242074 | 3.128051 | 0.005493 | 22.492012 | 11.242020 | 3.062198 | 0.005493 |
| 16.0 | 22.492613 | 11.242620 | 3.676831 | 0.005493 | 22.492560 | 11.242567 | 3.621953 | 0.005493 |
| 16.5 | 22.493042 | 11.243049 | 4.126831 | 0.005493 | 22.493010 | 11.243017 | 4.082928 | 0.005493 |
| 17.0 | 22.493450 | 11.243456 | 4.532928 | 0.005493 | 22.493429 | 11.243435 | 4.510977 | 0.005493 |
| 17.5 | 22.493827 | 11.243833 | 4.907504 | 0.016479 | 22.493816 | 11.243822 | 4.896550 | 0.016479 |
| 18.0 | 22.494128 | 11.244133 | 5.215024 | 0.027466 | 22.494138 | 11.244144 | 5.215024 | 0.027466 |
| 18.5 | 22.494385 | 11.244391 | 5.434805 | 0.060425 | 22.494385 | 11.244391 | 5.434805 | 0.060425 |
| 19.0 | 22.494557 | 11.244562 | 5.565814 | 0.115356 | 22.494578 | 11.244583 | 5.565932 | 0.115356 |
| 19.5 | 22.494695 | 11.244700 | 5.619705 | 0.192261 | 22.494706 | 11.244711 | 5.619716 | 0.203247 |
| 20.0 | 22.494824 | 11.244829 | 5.619834 | 0.324097 | 22.494845 | 11.244851 | 5.619856 | 0.346069 |
| 20.5 | 22.494985 | 11.244990 | 5.619995 | 0.510864 | 22.490080 | 11.240099 | 5.615119 | 0.554810 |
| 21.0 | 22.490489 | 11.240508 | 5.615526 | 0.763550 | 22.490662 | 11.240680 | 5.615698 | 0.851440 |
| 21.5 | 22.491459 | 11.241475 | 5.616492 | 1.257935 | 22.491157 | 11.241174 | 5.616192 | 1.104126 |
| 22.0 | 22.492428 | 11.242443 | 5.617458 | 1.752319 | 22.491976 | 11.241991 | 5.617007 | 1.521606 |
| 22.5 | 22.492816 | 11.242830 | 5.617844 | 1.950073 | 22.493247 | 11.243260 | 5.618273 | 2.169800 |
| 23.0 | 22.493462 | 11.243475 | 5.618488 | 2.279663 | 22.493850 | 11.243862 | 5.618874 | 2.477417 |
| 23.5 | 22.493936 | 11.243948 | 5.618960 | 2.521362 | 22.494216 | 11.244227 | 5.619239 | 2.664185 |
| 24.0 | 22.494259 | 11.244270 | 5.619282 | 2.686157 | 22.494410 | 11.244421 | 5.619432 | 2.763062 |
| 24.5 | 22.483165 | 11.244399 | 5.619410 | 2.752075 | 22.483359 | 11.244464 | 5.619475 | 2.796021 |
| 25.0 | 22.483295 | 11.244442 | 5.619453 | 2.785034 | 22.483359 | 11.233456 | 5.619496 | 2.807007 |
| 25.5 | 22.472157 | 11.244442 | 5.608424 | 2.796021 | 22.472158 | 11.233456 | 5.619496 | 2.807007 |
| 26.0 | 22.460566 | 11.200175 | 5.608488 | 2.807007 | 22.450077 | 11.233456 | 5.619496 | 2.807007 |
| 26.5 | 22.425922 | 11.166958 | 5.608488 | 2.807007 | 22.427890 | 11.233456 | 5.619496 | 2.807007 |
| 27.0 | 22.401658 | 11.122669 | 5.608488 | 2.807007 | 22.395017 | 11.244485 | 5.619496 | 2.807007 |
| 27.5 | 22.353787 | 11.079046 | 5.619496 | 2.807007 | 22.372915 | 11.244485 | 5.619496 | 2.807007 |
| 28.0 | 22.304155 | 11.034929 | 5.619496 | 2.807007 | 22.361865 | 11.244485 | 5.619496 | 2.807007 |
| 28.5 | 22.262739 | 11.165668 | 5.619389 | 2.741089 | 22.494475 | 11.244485 | 5.619496 | 2.807007 |
| 29.0 | 22.223854 | 11.153327 | 5.619324 | 2.719116 | 22.494475 | 11.244485 | 5.619496 | 2.807007 |
| 29.5 | 22.193520 | 11.128775 | 5.619239 | 2.675171 | 22.494475 | 11.233456 | 5.619496 | 2.807007 |
| 30.0 | 22.187770 | 11.104072 | 5.619174 | 2.642212 | 22.494388 | 11.189339 | 5.619496 | 2.807007 |

FIG. 56

| SNR(dB) | $\theta_{10,0}$ (°) | $\theta_{10,1}$ (°) | $\theta_{10,2}$ (°) | $\theta_{10,3}$ (°) | $\theta_{11,0}$ (°) | $\theta_{11,1}$ (°) | $\theta_{11,2}$ (°) | $\theta_{11,3}$ (°) |
|---|---|---|---|---|---|---|---|---|
| 10.0 | 22.493505 | 9.182110 | 0.010981 | 0.005493 | 22.493393 | 8.951735 | 0.010981 | 0.005493 |
| 10.5 | 22.493725 | 9.620919 | 0.010981 | 0.005493 | 22.493596 | 9.368604 | 0.010981 | 0.005493 |
| 11.0 | 22.493955 | 10.092640 | 0.010981 | 0.005493 | 22.493837 | 9.851294 | 0.010981 | 0.005493 |
| 11.5 | 22.494164 | 10.520479 | 0.010981 | 0.005493 | 22.494062 | 10.312044 | 0.010981 | 0.005493 |
| 12.0 | 22.494683 | 10.825872 | 0.779273 | 0.005493 | 22.494552 | 10.656806 | 0.669517 | 0.005493 |
| 12.5 | 22.494938 | 11.041683 | 1.086590 | 0.005493 | 22.494867 | 10.994584 | 0.987809 | 0.005493 |
| 13.0 | 22.490325 | 11.182737 | 1.350004 | 0.005493 | 22.490217 | 11.181987 | 1.295126 | 0.005493 |
| 13.5 | 22.490618 | 11.240627 | 1.646345 | 0.005493 | 22.490596 | 11.240605 | 1.624394 | 0.005493 |
| 14.0 | 22.490972 | 11.240981 | 1.997564 | 0.005493 | 22.490993 | 11.241002 | 2.019516 | 0.005493 |
| 14.5 | 22.491444 | 11.241452 | 2.480491 | 0.005493 | 22.491508 | 11.241516 | 2.546344 | 0.005493 |
| 15.0 | 22.492109 | 11.242117 | 3.160978 | 0.005493 | 22.492206 | 11.242213 | 3.259758 | 0.005493 |
| 15.5 | 22.492903 | 11.242910 | 3.973172 | 0.005493 | 22.492999 | 11.243006 | 4.071953 | 0.005493 |
| 16.0 | 22.493536 | 11.243542 | 4.631708 | 0.005493 | 22.493622 | 11.243628 | 4.719513 | 0.005493 |
| 16.5 | 22.493998 | 11.244004 | 5.082770 | 0.016479 | 22.494062 | 11.244068 | 5.148495 | 0.016479 |
| 17.0 | 22.494310 | 11.244315 | 5.379497 | 0.038452 | 22.494353 | 11.244358 | 5.412650 | 0.049438 |
| 17.5 | 22.494502 | 11.244508 | 5.543649 | 0.071411 | 22.494534 | 11.244540 | 5.565460 | 0.082397 |
| 18.0 | 22.494641 | 11.244646 | 5.619652 | 0.137329 | 22.494652 | 11.244657 | 5.619662 | 0.159302 |
| 18.5 | 22.494749 | 11.244754 | 5.619759 | 0.247192 | 22.494781 | 11.244786 | 5.619791 | 0.280151 |
| 19.0 | 22.494931 | 11.244936 | 5.619941 | 0.433960 | 22.494991 | 11.244996 | 5.615011 | 0.510864 |
| 19.5 | 22.490296 | 11.240314 | 5.615333 | 0.664673 | 22.490554 | 11.240572 | 5.615591 | 0.796509 |
| 20.0 | 22.490920 | 11.240938 | 5.615956 | 0.983276 | 22.491308 | 11.241325 | 5.616342 | 1.181030 |
| 20.5 | 22.491782 | 11.241798 | 5.616814 | 1.400757 | 22.492256 | 11.242271 | 5.617286 | 1.664429 |
| 21.0 | 22.492601 | 11.242615 | 5.617629 | 1.840210 | 22.493161 | 11.243174 | 5.618187 | 2.125854 |
| 21.5 | 22.493828 | 11.243840 | 5.618852 | 2.466431 | 22.493311 | 11.243324 | 5.618337 | 2.202759 |
| 22.0 | 22.494216 | 11.244227 | 5.619239 | 2.664185 | 22.493850 | 11.243862 | 5.618874 | 2.477417 |
| 22.5 | 22.494195 | 11.244206 | 5.619217 | 2.653198 | 22.494388 | 11.244399 | 5.619410 | 2.763062 |
| 23.0 | 22.494388 | 11.244399 | 5.619410 | 2.752075 | 22.494453 | 11.244464 | 5.619475 | 2.796021 |
| 23.5 | 22.494453 | 11.244464 | 5.619475 | 2.796021 | 22.494475 | 11.244485 | 5.619496 | 2.807007 |
| 24.0 | 22.494475 | 11.244485 | 5.619496 | 2.807007 | 22.494475 | 11.244485 | 5.619496 | 2.807007 |
| 24.5 | 22.494475 | 11.244485 | 5.619496 | 2.807007 | 22.494475 | 11.244485 | 5.619496 | 2.807007 |
| 25.0 | 22.494475 | 11.244485 | 5.619496 | 2.807007 | 22.494475 | 11.244485 | 5.619496 | 2.807007 |
| 25.5 | 22.494475 | 11.244485 | 5.619496 | 2.807007 | 22.483424 | 11.244485 | 5.619496 | 2.807007 |
| 26.0 | 22.494475 | 11.244485 | 5.619496 | 2.807007 | 22.494453 | 11.233456 | 5.619496 | 2.807007 |
| 26.5 | 22.494475 | 11.244485 | 5.619496 | 2.807007 | 22.494432 | 11.211398 | 5.619496 | 2.807007 |
| 27.0 | 22.494475 | 11.244485 | 5.619496 | 2.796021 | 22.494388 | 11.189339 | 5.619496 | 2.807007 |
| 27.5 | 22.494475 | 11.244485 | 5.619496 | 2.796021 | 22.494367 | 11.167280 | 5.619496 | 2.796021 |
| 28.0 | 22.494475 | 11.244485 | 5.619496 | 2.796021 | 22.494302 | 11.122670 | 5.619475 | 2.796021 |
| 28.5 | 22.494475 | 11.244485 | 5.608488 | 2.807007 | 22.494410 | 11.244421 | 5.619432 | 2.763062 |
| 29.0 | 21.784551 | 11.244378 | 5.586323 | 2.796021 | 22.494475 | 11.244485 | 5.619496 | 2.807007 |
| 29.5 | 21.315453 | 11.064842 | 5.439831 | 2.752075 | 22.494475 | 11.244485 | 5.619496 | 2.807007 |
| 30.0 | 21.225825 | 11.025795 | 5.415798 | 2.730103 | 22.494475 | 11.244485 | 5.619496 | 2.807007 |

FIG. 57

| SNR(dB) | $\theta_{12,0}(°)$ | $\theta_{12,1}(°)$ | $\theta_{12,2}(°)$ | $\theta_{12,3}(°)$ | $\theta_{13,0}(°)$ | $\theta_{13,1}(°)$ | $\theta_{13,2}(°)$ | $\theta_{13,3}(°)$ |
|---|---|---|---|---|---|---|---|---|
| 10.0 | 22.494507 | 11.222574 | 0.010981 | 0.005493 | 22.494501 | 11.222574 | 0.010981 | 0.005493 |
| 10.5 | 22.500000 | 11.250000 | 0.000000 | 0.000000 | 22.500000 | 11.250000 | 0.000000 | 0.000000 |
| 11.0 | 22.500000 | 11.250000 | 0.000000 | 0.000000 | 22.500000 | 11.250000 | 0.000000 | 0.000000 |
| 11.5 | 22.500000 | 11.250000 | 0.000000 | 0.000000 | 22.500000 | 11.250000 | 0.000000 | 0.000000 |
| 12.0 | 22.491551 | 11.241559 | 2.601222 | 0.005493 | 22.491251 | 11.241259 | 2.282930 | 0.005493 |
| 12.5 | 22.492055 | 11.242063 | 3.117076 | 0.005493 | 22.492002 | 11.242009 | 3.062198 | 0.005493 |
| 13.0 | 22.492409 | 11.242417 | 3.479270 | 0.005493 | 22.492602 | 11.242610 | 3.676831 | 0.005493 |
| 13.5 | 22.492796 | 11.242803 | 3.863416 | 0.005493 | 22.493107 | 11.243113 | 4.181709 | 0.005493 |
| 14.0 | 22.493171 | 11.243178 | 4.247562 | 0.005493 | 22.493547 | 11.243553 | 4.631708 | 0.005493 |
| 14.5 | 22.493568 | 11.243574 | 4.653659 | 0.005493 | 22.493911 | 11.243917 | 5.004879 | 0.005493 |
| 15.0 | 22.493965 | 11.243971 | 5.059757 | 0.005493 | 22.494212 | 11.244217 | 5.312195 | 0.005493 |
| 15.5 | 22.494276 | 11.244282 | 5.378049 | 0.005493 | 22.494394 | 11.244400 | 5.498781 | 0.005493 |
| 16.0 | 22.494459 | 11.244464 | 5.564634 | 0.005493 | 22.494480 | 11.244485 | 5.597561 | 0.005493 |
| 16.5 | 22.494598 | 11.244603 | 5.619609 | 0.093384 | 22.494641 | 11.244646 | 5.619652 | 0.148315 |
| 17.0 | 22.494706 | 11.244711 | 5.619716 | 0.203247 | 22.494802 | 11.244808 | 5.619813 | 0.313110 |
| 17.5 | 22.494802 | 11.244808 | 5.619813 | 0.302124 | 22.494942 | 11.244947 | 5.619952 | 0.444946 |
| 18.0 | 22.494991 | 11.244996 | 5.615011 | 0.521851 | 22.490425 | 11.240443 | 5.615462 | 0.741577 |
| 18.5 | 22.490640 | 11.240658 | 5.615677 | 0.851440 | 22.491222 | 11.241239 | 5.616256 | 1.148071 |
| 19.0 | 22.491653 | 11.241669 | 5.616685 | 1.367798 | 22.492364 | 11.242378 | 5.617393 | 1.730347 |
| 19.5 | 22.492579 | 11.242593 | 5.617608 | 1.829224 | 22.493311 | 11.243324 | 5.618337 | 2.213745 |
| 20.0 | 22.493268 | 11.243281 | 5.618294 | 2.191772 | 22.493936 | 11.243948 | 5.618960 | 2.532349 |
| 20.5 | 22.493807 | 11.243819 | 5.618831 | 2.455444 | 22.494259 | 11.244270 | 5.619282 | 2.697144 |
| 21.0 | 22.494173 | 11.244184 | 5.619196 | 2.642212 | 22.494410 | 11.244421 | 5.619432 | 2.774048 |
| 21.5 | 22.494453 | 11.244464 | 5.619475 | 2.796021 | 22.494388 | 11.244399 | 5.619410 | 2.752075 |
| 22.0 | 22.494475 | 11.244485 | 5.619496 | 2.807007 | 22.494453 | 11.244464 | 5.619475 | 2.796021 |
| 22.5 | 22.494475 | 11.244485 | 5.619496 | 2.807007 | 22.494475 | 11.244485 | 5.619496 | 2.807007 |
| 23.0 | 22.494475 | 11.244485 | 5.619496 | 2.807007 | 22.494475 | 11.244485 | 5.619496 | 2.807007 |
| 23.5 | 22.494475 | 11.244485 | 5.619496 | 2.807007 | 22.494475 | 11.244485 | 5.619496 | 2.807007 |
| 24.0 | 22.494475 | 11.244485 | 5.619496 | 2.807007 | 22.483424 | 11.244485 | 5.619496 | 2.807007 |
| 24.5 | 22.494475 | 11.244485 | 5.619496 | 2.807007 | 22.483424 | 11.244485 | 5.619496 | 2.807007 |
| 25.0 | 22.494475 | 11.244485 | 5.619496 | 2.807007 | 22.472265 | 11.233456 | 5.619496 | 2.807007 |
| 25.5 | 22.483359 | 11.233456 | 5.619496 | 2.807007 | 22.449883 | 11.233392 | 5.608488 | 2.807007 |
| 26.0 | 22.483359 | 11.233456 | 5.619496 | 2.807007 | 22.416471 | 11.222319 | 5.608488 | 2.807007 |
| 26.5 | 22.494432 | 11.222427 | 5.619496 | 2.807007 | 22.360245 | 11.222319 | 5.608488 | 2.807007 |
| 27.0 | 22.494453 | 11.233456 | 5.619496 | 2.807007 | 22.245510 | 11.199981 | 5.597481 | 2.807007 |
| 27.5 | 22.494475 | 11.244485 | 5.619496 | 2.807007 | 22.136875 | 11.144405 | 5.597481 | 2.807007 |
| 28.0 | 22.494475 | 11.244485 | 5.619496 | 2.807007 | 21.698923 | 11.011421 | 5.507616 | 2.763062 |
| 28.5 | 22.493915 | 10.946695 | 5.619496 | 2.807007 | 21.034963 | 10.847852 | 5.327886 | 2.642212 |
| 29.0 | 22.492582 | 10.521678 | 5.525962 | 2.642212 | 20.868633 | 10.751399 | 5.303403 | 2.631226 |
| 29.5 | 22.492292 | 10.465598 | 5.500406 | 2.587280 | 20.751490 | 10.680564 | 5.257977 | 2.642212 |
| 30.0 | 22.492207 | 10.456960 | 5.487553 | 2.576294 | 20.670181 | 10.637173 | 5.244931 | 2.631226 |

FIG. 58

| SNR(dB) | $\theta_{14,0}(°)$ | $\theta_{14,1}(°)$ | $\theta_{14,2}(°)$ | $\theta_{14,3}(°)$ | $\theta_{15,0}(°)$ | $\theta_{15,1}(°)$ | $\theta_{15,2}(°)$ | $\theta_{15,3}(°)$ | cap.(bps/Hz) |
|---|---|---|---|---|---|---|---|---|---|
| 10.0 | 22.494501 | 11.222574 | 0.010981 | 0.005493 | 22.494507 | 11.244510 | 0.005493 | 0.000000 | 3.342828 |
| 10.5 | 22.494507 | 11.244510 | 0.005493 | 0.000000 | 22.494507 | 11.244510 | 0.005493 | 0.000000 | 3.497162 |
| 11.0 | 22.494507 | 11.244510 | 0.005493 | 0.000000 | 22.494507 | 11.244510 | 0.005493 | 0.000000 | 3.652401 |
| 11.5 | 22.494507 | 11.244510 | 0.005493 | 0.000000 | 22.494528 | 11.244531 | 0.043908 | 0.005493 | 3.807752 |
| 12.0 | 22.491562 | 11.241570 | 2.601222 | 0.005493 | 22.493632 | 11.243639 | 4.719513 | 0.005493 | 3.966553 |
| 12.5 | 22.492667 | 11.242674 | 3.731709 | 0.005493 | 22.494137 | 11.244142 | 5.235366 | 0.005493 | 4.124407 |
| 13.0 | 22.493622 | 11.243628 | 4.686586 | 0.005493 | 22.494394 | 11.244400 | 5.509756 | 0.005493 | 4.283277 |
| 13.5 | 22.494137 | 11.244142 | 5.202439 | 0.005493 | 22.494491 | 11.244496 | 5.608537 | 0.005493 | 4.442871 |
| 14.0 | 22.494394 | 11.244400 | 5.509756 | 0.005493 | 22.494501 | 11.244507 | 5.619512 | 0.005493 | 4.602573 |
| 14.5 | 22.494496 | 11.244501 | 5.619507 | 0.000000 | 22.494496 | 11.244501 | 5.619507 | 0.000000 | 4.761979 |
| 15.0 | 22.494496 | 11.244501 | 5.619507 | 0.000000 | 22.494496 | 11.244501 | 5.619507 | 0.000000 | 4.920976 |
| 15.5 | 22.494496 | 11.244501 | 5.619507 | 0.000000 | 22.494496 | 11.244501 | 5.619507 | 0.000000 | 5.081011 |
| 16.0 | 22.494496 | 11.244501 | 5.619507 | 0.000000 | 22.494496 | 11.244501 | 5.619507 | 0.000000 | 5.243850 |
| 16.5 | 22.490123 | 11.240142 | 5.615162 | 0.587769 | 22.491717 | 11.241733 | 5.616750 | 1.400757 | 5.409066 |
| 17.0 | 22.491157 | 11.241174 | 5.616192 | 1.115112 | 22.493505 | 11.243518 | 5.618531 | 2.312622 | 5.575854 |
| 17.5 | 22.491717 | 11.241733 | 5.616750 | 1.400757 | 22.493979 | 11.243991 | 5.619003 | 2.554321 | 5.742414 |
| 18.0 | 22.492837 | 11.242851 | 5.617865 | 1.972046 | 22.494281 | 11.244292 | 5.619303 | 2.708130 | 5.908021 |
| 18.5 | 22.493548 | 11.243561 | 5.618573 | 2.334595 | 22.494410 | 11.244421 | 5.619432 | 2.774048 | 6.072071 |
| 19.0 | 22.494044 | 11.244055 | 5.619067 | 2.587280 | 22.494453 | 11.244464 | 5.619475 | 2.796021 | 6.234444 |
| 19.5 | 22.494302 | 11.244313 | 5.619324 | 2.719116 | 22.494475 | 11.244485 | 5.619496 | 2.807007 | 6.396056 |
| 20.0 | 22.494410 | 11.244421 | 5.619432 | 2.774048 | 22.494475 | 11.244485 | 5.619496 | 2.807007 | 6.558030 |
| 20.5 | 22.494475 | 11.244485 | 5.619496 | 2.807007 | 22.494475 | 11.244485 | 5.619496 | 2.807007 | 6.719893 |
| 21.0 | 22.494475 | 11.244485 | 5.619496 | 2.807007 | 22.494475 | 11.244485 | 5.619496 | 2.807007 | 6.881454 |
| 21.5 | 22.494475 | 11.244485 | 5.619496 | 2.807007 | 22.494475 | 11.244485 | 5.619496 | 2.807007 | 7.042342 |
| 22.0 | 22.494475 | 11.244485 | 5.619496 | 2.807007 | 22.494475 | 11.244485 | 5.619496 | 2.807007 | 7.202358 |
| 22.5 | 22.494475 | 11.244485 | 5.619496 | 2.807007 | 22.494475 | 11.244485 | 5.619496 | 2.807007 | 7.359547 |
| 23.0 | 22.494475 | 11.244485 | 5.619496 | 2.807007 | 22.494475 | 11.244485 | 5.619496 | 2.807007 | 7.515818 |
| 23.5 | 22.494475 | 11.244485 | 5.619496 | 2.807007 | 22.494475 | 11.244485 | 5.619496 | 2.807007 | 7.670111 |
| 24.0 | 22.494475 | 11.244485 | 5.619496 | 2.807007 | 22.494475 | 11.244485 | 5.619496 | 2.807007 | 7.822287 |
| 24.5 | 22.494475 | 11.244485 | 5.619496 | 2.807007 | 22.494475 | 11.244485 | 5.619496 | 2.807007 | 7.972395 |
| 25.0 | 22.494475 | 11.244485 | 5.619496 | 2.807007 | 22.494475 | 11.244485 | 5.619496 | 2.807007 | 8.120232 |
| 25.5 | 22.494475 | 11.244485 | 5.619496 | 2.807007 | 22.494475 | 11.244485 | 5.619496 | 2.807007 | 8.265385 |
| 26.0 | 22.494475 | 11.244485 | 5.608488 | 2.807007 | 22.438983 | 11.233456 | 5.619496 | 2.807007 | 8.410629 |
| 26.5 | 22.494475 | 11.244485 | 5.608488 | 2.807007 | 22.359711 | 11.200368 | 5.619496 | 2.807007 | 8.552122 |
| 27.0 | 22.494453 | 11.244464 | 5.608488 | 2.807007 | 22.276948 | 11.145222 | 5.619496 | 2.807007 | 8.688445 |
| 27.5 | 22.494475 | 11.244485 | 5.619496 | 2.807007 | 22.108666 | 11.003593 | 5.520018 | 2.796021 | 8.818895 |
| 28.0 | 22.494475 | 11.244485 | 5.619496 | 2.807007 | 22.092605 | 10.928838 | 5.475236 | 2.785034 | 8.942272 |
| 28.5 | 22.494432 | 11.211398 | 5.619496 | 2.807007 | 21.376696 | 10.896539 | 5.421849 | 2.653198 | 9.063653 |
| 29.0 | 22.494060 | 11.086336 | 5.619367 | 2.741089 | 21.207588 | 10.851373 | 5.478820 | 2.631226 | 9.175644 |
| 29.5 | 22.493557 | 10.961873 | 5.619131 | 2.609253 | 21.199392 | 10.857246 | 5.459164 | 2.697144 | 9.281433 |
| 30.0 | 22.493298 | 10.917133 | 5.618960 | 2.532349 | 21.200541 | 10.825777 | 5.450388 | 2.741089 | 9.377338 |

FIG. 62

| $b_0,b_1,...b_{5,I}$ | $Re(e_I)$ | $Im(e_I)$ | $b_0,b_1,...b_{5,I}$ | $Re(e_I)$ | $Im(e_I)$ | $b_0,b_1,...b_{5,I}$ | $Re(e_I)$ | $Im(e_I)$ | $b_0,b_1,...b_{5,I}$ | $Re(e_I)$ | $Im(e_I)$ |
|---|---|---|---|---|---|---|---|---|---|---|---|
| 000000 | 0.2304 | 0.4223 | 010000 | -0.2304 | 0.4223 | 100000 | 0.2304 | -0.4223 | 110000 | -0.2304 | -0.4223 |
| 000001 | 0.2471 | 0.4128 | 010001 | -0.2471 | 0.4128 | 100001 | 0.2471 | -0.4128 | 110001 | -0.2471 | -0.4128 |
| 000010 | 0.2521 | 0.5033 | 010010 | -0.2521 | 0.5033 | 100010 | 0.2521 | -0.5033 | 110010 | -0.2521 | -0.5033 |
| 000011 | 0.2810 | 0.4877 | 010011 | -0.2810 | 0.4877 | 100011 | 0.2810 | -0.4877 | 110011 | -0.2810 | -0.4877 |
| 000100 | 0.4223 | 0.2304 | 010100 | -0.4223 | 0.2304 | 100100 | 0.4223 | -0.2304 | 110100 | -0.4223 | -0.2304 |
| 000101 | 0.4128 | 0.2471 | 010101 | -0.4128 | 0.2471 | 100101 | 0.4128 | -0.2471 | 110101 | -0.4128 | -0.2471 |
| 000110 | 0.5033 | 0.2521 | 010110 | -0.5033 | 0.2521 | 100110 | 0.5033 | -0.2521 | 110110 | -0.5033 | -0.2521 |
| 000111 | 0.4877 | 0.2810 | 010111 | -0.4877 | 0.2810 | 100111 | 0.4877 | -0.2810 | 110111 | -0.4877 | -0.2810 |
| 001000 | 0.3324 | 1.3847 | 011000 | -0.3324 | 1.3847 | 101000 | 0.3324 | -1.3847 | 111000 | -0.3324 | -1.3847 |
| 001001 | 0.7441 | 1.2142 | 011001 | -0.7441 | 1.2142 | 101001 | 0.7441 | -1.2142 | 111001 | -0.7441 | -1.2142 |
| 001010 | 0.3094 | 1.1524 | 011010 | -0.3094 | 1.1524 | 101010 | 0.3094 | -1.1524 | 111010 | -0.3094 | -1.1524 |
| 001011 | 0.6024 | 1.0300 | 011011 | -0.6024 | 1.0300 | 101011 | 0.6024 | -1.0300 | 111011 | -0.6024 | -1.0300 |
| 001100 | 1.3847 | 0.3324 | 011100 | -1.3847 | 0.3324 | 101100 | 1.3847 | -0.3324 | 111100 | -1.3847 | -0.3324 |
| 001101 | 1.2142 | 0.7441 | 011101 | -1.2142 | 0.7441 | 101101 | 1.2142 | -0.7441 | 111101 | -1.2142 | -0.7441 |
| 001110 | 1.1524 | 0.3094 | 011110 | -1.1524 | 0.3094 | 101110 | 1.1524 | -0.3094 | 111110 | -1.1524 | -0.3094 |
| 001111 | 1.0300 | 0.6024 | 011111 | -1.0300 | 0.6024 | 101111 | 1.0300 | -0.6024 | 111111 | -1.0300 | -0.6024 |

FIG. 64

| $b_{0,I}b_{1,I}...b_{7,I}$ | Re($e_i$) | Im($e_i$) | $b_{0,I}b_{1,I}...b_{7,I}$ | Re($e_i$) | Im($e_i$) | $b_{0,I}b_{1,I}...b_{7,I}$ | Re($e_i$) | Im($e_i$) | $b_{0,I}b_{1,I}...b_{7,I}$ | Re($e_i$) | Im($e_i$) |
|---|---|---|---|---|---|---|---|---|---|---|---|
| 00000000 | 0.1524 | 0.3087 | 01000000 | -0.1524 | 0.3087 | 10000000 | 0.1524 | -0.3087 | 11000000 | -0.1524 | -0.3087 |
| 00000001 | 0.1525 | 0.3087 | 01000001 | -0.1525 | 0.3087 | 10000001 | 0.1525 | -0.3087 | 11000001 | -0.1525 | -0.3087 |
| 00000010 | 0.1513 | 0.3043 | 01000010 | -0.1513 | 0.3043 | 10000010 | 0.1513 | -0.3043 | 11000010 | -0.1513 | -0.3043 |
| 00000011 | 0.1513 | 0.3043 | 01000011 | -0.1513 | 0.3043 | 10000011 | 0.1513 | -0.3043 | 11000011 | -0.1513 | -0.3043 |
| 00000100 | 0.1682 | 0.3004 | 01000100 | -0.1682 | 0.3004 | 10000100 | 0.1682 | -0.3004 | 11000100 | -0.1682 | -0.3004 |
| 00000101 | 0.1682 | 0.3005 | 01000101 | -0.1682 | 0.3005 | 10000101 | 0.1682 | -0.3005 | 11000101 | -0.1682 | -0.3005 |
| 00000110 | 0.1663 | 0.2964 | 01000110 | -0.1663 | 0.2964 | 10000110 | 0.1663 | -0.2964 | 11000110 | -0.1663 | -0.2964 |
| 00000111 | 0.1663 | 0.2964 | 01000111 | -0.1663 | 0.2964 | 10000111 | 0.1663 | -0.2964 | 11000111 | -0.1663 | -0.2964 |
| 00001000 | 0.1964 | 0.6584 | 01001000 | -0.1964 | 0.6584 | 10001000 | 0.1964 | -0.6584 | 11001000 | -0.1964 | -0.6584 |
| 00001001 | 0.1965 | 0.6583 | 01001001 | -0.1965 | 0.6583 | 10001001 | 0.1965 | -0.6583 | 11001001 | -0.1965 | -0.6583 |
| 00001010 | 0.1967 | 0.6652 | 01001010 | -0.1967 | 0.6652 | 10001010 | 0.1967 | -0.6652 | 11001010 | -0.1967 | -0.6652 |
| 00001011 | 0.1968 | 0.6652 | 01001011 | -0.1968 | 0.6652 | 10001011 | 0.1968 | -0.6652 | 11001011 | -0.1968 | -0.6652 |
| 00001100 | 0.3371 | 0.5987 | 01001100 | -0.3371 | 0.5987 | 10001100 | 0.3371 | -0.5987 | 11001100 | -0.3371 | -0.5987 |
| 00001101 | 0.3370 | 0.5987 | 01001101 | -0.3370 | 0.5987 | 10001101 | 0.3370 | -0.5987 | 11001101 | -0.3370 | -0.5987 |
| 00001110 | 0.3414 | 0.6039 | 01001110 | -0.3414 | 0.6039 | 10001110 | 0.3414 | -0.6039 | 11001110 | -0.3414 | -0.6039 |
| 00001111 | 0.3413 | 0.6039 | 01001111 | -0.3413 | 0.6039 | 10001111 | 0.3413 | -0.6039 | 11001111 | -0.3413 | -0.6039 |
| 00010000 | 0.3087 | 0.1524 | 01010000 | -0.3087 | 0.1524 | 10010000 | 0.3087 | -0.1524 | 11010000 | -0.3087 | -0.1524 |
| 00010001 | 0.3087 | 0.1525 | 01010001 | -0.3087 | 0.1525 | 10010001 | 0.3087 | -0.1525 | 11010001 | -0.3087 | -0.1525 |
| 00010010 | 0.3043 | 0.1513 | 01010010 | -0.3043 | 0.1513 | 10010010 | 0.3043 | -0.1513 | 11010010 | -0.3043 | -0.1513 |
| 00010011 | 0.3043 | 0.1513 | 01010011 | -0.3043 | 0.1513 | 10010011 | 0.3043 | -0.1513 | 11010011 | -0.3043 | -0.1513 |
| 00010100 | 0.3004 | 0.1682 | 01010100 | -0.3004 | 0.1682 | 10010100 | 0.3004 | -0.1682 | 11010100 | -0.3004 | -0.1682 |
| 00010101 | 0.3005 | 0.1682 | 01010101 | -0.3005 | 0.1682 | 10010101 | 0.3005 | -0.1682 | 11010101 | -0.3005 | -0.1682 |
| 00010110 | 0.2964 | 0.1663 | 01010110 | -0.2964 | 0.1663 | 10010110 | 0.2964 | -0.1663 | 11010110 | -0.2964 | -0.1663 |
| 00010111 | 0.2964 | 0.1663 | 01010111 | -0.2964 | 0.1663 | 10010111 | 0.2964 | -0.1663 | 11010111 | -0.2964 | -0.1663 |
| 00011000 | 0.6584 | 0.1964 | 01011000 | -0.6584 | 0.1964 | 10011000 | 0.6584 | -0.1964 | 11011000 | -0.6584 | -0.1964 |
| 00011001 | 0.6583 | 0.1965 | 01011001 | -0.6583 | 0.1965 | 10011001 | 0.6583 | -0.1965 | 11011001 | -0.6583 | -0.1965 |
| 00011010 | 0.6652 | 0.1967 | 01011010 | -0.6652 | 0.1967 | 10011010 | 0.6652 | -0.1967 | 11011010 | -0.6652 | -0.1967 |
| 00011011 | 0.6652 | 0.1968 | 01011011 | -0.6652 | 0.1968 | 10011011 | 0.6652 | -0.1968 | 11011011 | -0.6652 | -0.1968 |
| 00011100 | 0.5987 | 0.3371 | 01011100 | -0.5987 | 0.3371 | 10011100 | 0.5987 | -0.3371 | 11011100 | -0.5987 | -0.3371 |
| 00011101 | 0.5987 | 0.3370 | 01011101 | -0.5987 | 0.3370 | 10011101 | 0.5987 | -0.3370 | 11011101 | -0.5987 | -0.3370 |
| 00011110 | 0.6039 | 0.3414 | 01011110 | -0.6039 | 0.3414 | 10011110 | 0.6039 | -0.3414 | 11011110 | -0.6039 | -0.3414 |
| 00011111 | 0.6039 | 0.3413 | 01011111 | -0.6039 | 0.3413 | 10011111 | 0.6039 | -0.3413 | 11011111 | -0.6039 | -0.3413 |

FIG. 65

| $b_0,b_1,...b_7$ | Re($e_i$) | Im($e_i$) | $b_0,b_1,...b_7$ | Re($e_i$) | Im($e_i$) | $b_0,b_1,...b_7$ | Re($e_i$) | Im($e_i$) | $b_0,b_1,...b_7$ | Re($e_i$) | Im($e_i$) |
|---|---|---|---|---|---|---|---|---|---|---|---|
| 00100000 | 0.3183 | 1.5992 | 01100000 | -0.3183 | 1.5992 | 10100000 | 0.3183 | -1.5992 | 11100000 | -0.3183 | -1.5992 |
| 00100001 | 0.3186 | 1.5991 | 01100001 | -0.3186 | 1.5991 | 10100001 | 0.3186 | -1.5991 | 11100001 | -0.3186 | -1.5991 |
| 00100010 | 0.2756 | 1.3848 | 01100010 | -0.2756 | 1.3848 | 10100010 | 0.2756 | -1.3848 | 11100010 | -0.2756 | -1.3848 |
| 00100011 | 0.2759 | 1.3847 | 01100011 | -0.2759 | 1.3847 | 10100011 | 0.2759 | -1.3847 | 11100011 | -0.2759 | -1.3847 |
| 00100100 | 0.9060 | 1.3557 | 01100100 | -0.9060 | 1.3557 | 10100100 | 0.9060 | -1.3557 | 11100100 | -0.9060 | -1.3557 |
| 00100101 | 0.9058 | 1.3559 | 01100101 | -0.9058 | 1.3559 | 10100101 | 0.9058 | -1.3559 | 11100101 | -0.9058 | -1.3559 |
| 00100110 | 0.7846 | 1.1739 | 01100110 | -0.7846 | 1.1739 | 10100110 | 0.7846 | -1.1739 | 11100110 | -0.7846 | -1.1739 |
| 00100111 | 0.7843 | 1.1741 | 01100111 | -0.7843 | 1.1741 | 10100111 | 0.7843 | -1.1741 | 11100111 | -0.7843 | -1.1741 |
| 00101000 | 0.2257 | 0.9956 | 01101000 | -0.2257 | 0.9956 | 10101000 | 0.2257 | -0.9956 | 11101000 | -0.2257 | -0.9956 |
| 00101001 | 0.2259 | 0.9956 | 01101001 | -0.2259 | 0.9956 | 10101001 | 0.2259 | -0.9956 | 11101001 | -0.2259 | -0.9956 |
| 00101010 | 0.2276 | 1.0326 | 01101010 | -0.2276 | 1.0326 | 10101010 | 0.2276 | -1.0326 | 11101010 | -0.2276 | -1.0326 |
| 00101011 | 0.2278 | 1.0326 | 01101011 | -0.2278 | 1.0326 | 10101011 | 0.2278 | -1.0326 | 11101011 | -0.2278 | -1.0326 |
| 00101100 | 0.5446 | 0.8635 | 01101100 | -0.5446 | 0.8635 | 10101100 | 0.5446 | -0.8635 | 11101100 | -0.5446 | -0.8635 |
| 00101101 | 0.5445 | 0.8636 | 01101101 | -0.5445 | 0.8636 | 10101101 | 0.5445 | -0.8636 | 11101101 | -0.5445 | -0.8636 |
| 00101110 | 0.5694 | 0.8910 | 01101110 | -0.5694 | 0.8910 | 10101110 | 0.5694 | -0.8910 | 11101110 | -0.5694 | -0.8910 |
| 00101111 | 0.5692 | 0.8911 | 01101111 | -0.5692 | 0.8911 | 10101111 | 0.5692 | -0.8911 | 11101111 | -0.5692 | -0.8911 |
| 00110000 | 1.5992 | 0.3183 | 01110000 | -1.5992 | 0.3183 | 10110000 | 1.5992 | -0.3183 | 11110000 | -1.5992 | -0.3183 |
| 00110001 | 1.5991 | 0.3186 | 01110001 | -1.5991 | 0.3186 | 10110001 | 1.5991 | -0.3186 | 11110001 | -1.5991 | -0.3186 |
| 00110010 | 1.3848 | 0.2756 | 01110010 | -1.3848 | 0.2756 | 10110010 | 1.3848 | -0.2756 | 11110010 | -1.3848 | -0.2756 |
| 00110011 | 1.3847 | 0.2759 | 01110011 | -1.3847 | 0.2759 | 10110011 | 1.3847 | -0.2759 | 11110011 | -1.3847 | -0.2759 |
| 00110100 | 1.3557 | 0.9060 | 01110100 | -1.3557 | 0.9060 | 10110100 | 1.3557 | -0.9060 | 11110100 | -1.3557 | -0.9060 |
| 00110101 | 1.3559 | 0.9058 | 01110101 | -1.3559 | 0.9058 | 10110101 | 1.3559 | -0.9058 | 11110101 | -1.3559 | -0.9058 |
| 00110110 | 1.1739 | 0.7846 | 01110110 | -1.1739 | 0.7846 | 10110110 | 1.1739 | -0.7846 | 11110110 | -1.1739 | -0.7846 |
| 00110111 | 1.1741 | 0.7843 | 01110111 | -1.1741 | 0.7843 | 10110111 | 1.1741 | -0.7843 | 11110111 | -1.1741 | -0.7843 |
| 00111000 | 0.9956 | 0.2257 | 01111000 | -0.9956 | 0.2257 | 10111000 | 0.9956 | -0.2257 | 11111000 | -0.9956 | -0.2257 |
| 00111001 | 0.9956 | 0.2259 | 01111001 | -0.9956 | 0.2259 | 10111001 | 0.9956 | -0.2259 | 11111001 | -0.9956 | -0.2259 |
| 00111010 | 1.0326 | 0.2276 | 01111010 | -1.0326 | 0.2276 | 10111010 | 1.0326 | -0.2276 | 11111010 | -1.0326 | -0.2276 |
| 00111011 | 1.0326 | 0.2278 | 01111011 | -1.0326 | 0.2278 | 10111011 | 1.0326 | -0.2278 | 11111011 | -1.0326 | -0.2278 |
| 00111100 | 0.8635 | 0.5446 | 01111100 | -0.8635 | 0.5446 | 10111100 | 0.8635 | -0.5446 | 11111100 | -0.8635 | -0.5446 |
| 00111101 | 0.8636 | 0.5445 | 01111101 | -0.8636 | 0.5445 | 10111101 | 0.8636 | -0.5445 | 11111101 | -0.8636 | -0.5445 |
| 00111110 | 0.8910 | 0.5694 | 01111110 | -0.8910 | 0.5694 | 10111110 | 0.8910 | -0.5694 | 11111110 | -0.8910 | -0.5694 |
| 00111111 | 0.8911 | 0.5692 | 01111111 | -0.8911 | 0.5692 | 10111111 | 0.8911 | -0.5692 | 11111111 | -0.8911 | -0.5692 |

FIG. 67

| $b_0,b_1,...b_5,j$ | Re($e_j$) | Im($e_j$) | $b_0,b_1,...b_5,j$ | Re($e_j$) | Im($e_j$) | $b_0,b_1,...b_5,j$ | Re($e_j$) | Im($e_j$) | $b_0,b_1,...b_5,j$ | Re($e_j$) | Im($e_j$) |
|---|---|---|---|---|---|---|---|---|---|---|---|
| 000000 | 0.1818 | 0.3417 | 010000 | -0.1818 | 0.3417 | 100000 | 0.1818 | -0.3417 | 110000 | -0.1818 | -0.3417 |
| 000001 | 0.1932 | 0.3354 | 010001 | -0.1932 | 0.3354 | 100001 | 0.1932 | -0.3354 | 110001 | -0.1932 | -0.3354 |
| 000010 | 0.2339 | 0.5929 | 010010 | -0.2339 | 0.5929 | 100010 | 0.2339 | -0.5929 | 110010 | -0.2339 | -0.5929 |
| 000011 | 0.3030 | 0.5607 | 010011 | -0.3030 | 0.5607 | 100011 | 0.3030 | -0.5607 | 110011 | -0.3030 | -0.5607 |
| 000100 | 0.3417 | 0.1818 | 010100 | -0.3417 | 0.1818 | 100100 | 0.3417 | -0.1818 | 110100 | -0.3417 | -0.1818 |
| 000101 | 0.3354 | 0.1932 | 010101 | -0.3354 | 0.1932 | 100101 | 0.3354 | -0.1932 | 110101 | -0.3354 | -0.1932 |
| 000110 | 0.5929 | 0.2339 | 010110 | -0.5929 | 0.2339 | 100110 | 0.5929 | -0.2339 | 110110 | -0.5929 | -0.2339 |
| 000111 | 0.5607 | 0.3030 | 010111 | -0.5607 | 0.3030 | 100111 | 0.5607 | -0.3030 | 110111 | -0.5607 | -0.3030 |
| 001000 | 0.3007 | 1.4778 | 011000 | -0.3007 | 1.4778 | 101000 | 0.3007 | -1.4778 | 111000 | -0.3007 | -1.4778 |
| 001001 | 0.8324 | 1.2575 | 011001 | -0.8324 | 1.2575 | 101001 | 0.8324 | -1.2575 | 111001 | -0.8324 | -1.2575 |
| 001010 | 0.2662 | 1.0483 | 011010 | -0.2662 | 1.0483 | 101010 | 0.2662 | -1.0483 | 111010 | -0.2662 | -1.0483 |
| 001011 | 0.5530 | 0.9295 | 011011 | -0.5530 | 0.9295 | 101011 | 0.5530 | -0.9295 | 111011 | -0.5530 | -0.9295 |
| 001100 | 1.4778 | 0.3007 | 011100 | -1.4778 | 0.3007 | 101100 | 1.4778 | -0.3007 | 111100 | -1.4778 | -0.3007 |
| 001101 | 1.2575 | 0.8324 | 011101 | -1.2575 | 0.8324 | 101101 | 1.2575 | -0.8324 | 111101 | -1.2575 | -0.8324 |
| 001110 | 1.0483 | 0.2662 | 011110 | -1.0483 | 0.2662 | 101110 | 1.0483 | -0.2662 | 111110 | -1.0483 | -0.2662 |
| 001111 | 0.9295 | 0.5530 | 011111 | -0.9295 | 0.5530 | 101111 | 0.9295 | -0.5530 | 111111 | -0.9295 | -0.5530 |

FIG. 69

| $b_0,b_1,...b_7$ | Re($e_i$) | Im($e_i$) | $b_0,b_1,...b_7$ | Re($e_i$) | Im($e_i$) | $b_0,b_1,...b_7$ | Re($e_i$) | Im($e_i$) | $b_0,b_1,...b_7$ | Re($e_i$) | Im($e_i$) |
|---|---|---|---|---|---|---|---|---|---|---|---|
| 00000000 | 0.1430 | 0.3078 | 01000000 | -0.1430 | 0.3078 | 10000000 | 0.1430 | -0.3078 | 11000000 | -0.1430 | -0.3078 |
| 00000001 | 0.1430 | 0.3077 | 01000001 | -0.1430 | 0.3077 | 10000001 | 0.1430 | -0.3077 | 11000001 | -0.1430 | -0.3077 |
| 00000010 | 0.1413 | 0.3003 | 01000010 | -0.1413 | 0.3003 | 10000010 | 0.1413 | -0.3003 | 11000010 | -0.1413 | -0.3003 |
| 00000011 | 0.1414 | 0.3002 | 01000011 | -0.1414 | 0.3002 | 10000011 | 0.1414 | -0.3002 | 11000011 | -0.1414 | -0.3002 |
| 00000100 | 0.1637 | 0.2973 | 01000100 | -0.1637 | 0.2973 | 10000100 | 0.1637 | -0.2973 | 11000100 | -0.1637 | -0.2973 |
| 00000101 | 0.1636 | 0.2973 | 01000101 | -0.1636 | 0.2973 | 10000101 | 0.1636 | -0.2973 | 11000101 | -0.1636 | -0.2973 |
| 00000110 | 0.1604 | 0.2905 | 01000110 | -0.1604 | 0.2905 | 10000110 | 0.1604 | -0.2905 | 11000110 | -0.1604 | -0.2905 |
| 00000111 | 0.1603 | 0.2905 | 01000111 | -0.1603 | 0.2905 | 10000111 | 0.1603 | -0.2905 | 11000111 | -0.1603 | -0.2905 |
| 00001000 | 0.1768 | 0.6686 | 01001000 | -0.1768 | 0.6686 | 10001000 | 0.1768 | -0.6686 | 11001000 | -0.1768 | -0.6686 |
| 00001001 | 0.1793 | 0.6679 | 01001001 | -0.1793 | 0.6679 | 10001001 | 0.1793 | -0.6679 | 11001001 | -0.1793 | -0.6679 |
| 00001010 | 0.1769 | 0.6707 | 01001010 | -0.1769 | 0.6707 | 10001010 | 0.1769 | -0.6707 | 11001010 | -0.1769 | -0.6707 |
| 00001011 | 0.1793 | 0.6700 | 01001011 | -0.1793 | 0.6700 | 10001011 | 0.1793 | -0.6700 | 11001011 | -0.1793 | -0.6700 |
| 00001100 | 0.3506 | 0.5961 | 01001100 | -0.3506 | 0.5961 | 10001100 | 0.3506 | -0.5961 | 11001100 | -0.3506 | -0.5961 |
| 00001101 | 0.3484 | 0.5974 | 01001101 | -0.3484 | 0.5974 | 10001101 | 0.3484 | -0.5974 | 11001101 | -0.3484 | -0.5974 |
| 00001110 | 0.3523 | 0.5975 | 01001110 | -0.3523 | 0.5975 | 10001110 | 0.3523 | -0.5975 | 11001110 | -0.3523 | -0.5975 |
| 00001111 | 0.3501 | 0.5987 | 01001111 | -0.3501 | 0.5987 | 10001111 | 0.3501 | -0.5987 | 11001111 | -0.3501 | -0.5987 |
| 00010000 | 0.3078 | 0.1430 | 01010000 | -0.3078 | 0.1430 | 10010000 | 0.3078 | -0.1430 | 11010000 | -0.3078 | -0.1430 |
| 00010001 | 0.3077 | 0.1430 | 01010001 | -0.3077 | 0.1430 | 10010001 | 0.3077 | -0.1430 | 11010001 | -0.3077 | -0.1430 |
| 00010010 | 0.3003 | 0.1413 | 01010010 | -0.3003 | 0.1413 | 10010010 | 0.3003 | -0.1413 | 11010010 | -0.3003 | -0.1413 |
| 00010011 | 0.3002 | 0.1414 | 01010011 | -0.3002 | 0.1414 | 10010011 | 0.3002 | -0.1414 | 11010011 | -0.3002 | -0.1414 |
| 00010100 | 0.2973 | 0.1637 | 01010100 | -0.2973 | 0.1637 | 10010100 | 0.2973 | -0.1637 | 11010100 | -0.2973 | -0.1637 |
| 00010101 | 0.2973 | 0.1636 | 01010101 | -0.2973 | 0.1636 | 10010101 | 0.2973 | -0.1636 | 11010101 | -0.2973 | -0.1636 |
| 00010110 | 0.2905 | 0.1604 | 01010110 | -0.2905 | 0.1604 | 10010110 | 0.2905 | -0.1604 | 11010110 | -0.2905 | -0.1604 |
| 00010111 | 0.2905 | 0.1603 | 01010111 | -0.2905 | 0.1603 | 10010111 | 0.2905 | -0.1603 | 11010111 | -0.2905 | -0.1603 |
| 00011000 | 0.6686 | 0.1768 | 01011000 | -0.6686 | 0.1768 | 10011000 | 0.6686 | -0.1768 | 11011000 | -0.6686 | -0.1768 |
| 00011001 | 0.6679 | 0.1793 | 01011001 | -0.6679 | 0.1793 | 10011001 | 0.6679 | -0.1793 | 11011001 | -0.6679 | -0.1793 |
| 00011010 | 0.6707 | 0.1769 | 01011010 | -0.6707 | 0.1769 | 10011010 | 0.6707 | -0.1769 | 11011010 | -0.6707 | -0.1769 |
| 00011011 | 0.6700 | 0.1793 | 01011011 | -0.6700 | 0.1793 | 10011011 | 0.6700 | -0.1793 | 11011011 | -0.6700 | -0.1793 |
| 00011100 | 0.5961 | 0.3506 | 01011100 | -0.5961 | 0.3506 | 10011100 | 0.5961 | -0.3506 | 11011100 | -0.5961 | -0.3506 |
| 00011101 | 0.5974 | 0.3484 | 01011101 | -0.5974 | 0.3484 | 10011101 | 0.5974 | -0.3484 | 11011101 | -0.5974 | -0.3484 |
| 00011110 | 0.5975 | 0.3523 | 01011110 | -0.5975 | 0.3523 | 10011110 | 0.5975 | -0.3523 | 11011110 | -0.5975 | -0.3523 |
| 00011111 | 0.5987 | 0.3501 | 01011111 | -0.5987 | 0.3501 | 10011111 | 0.5987 | -0.3501 | 11011111 | -0.5987 | -0.3501 |

FIG. 70

| | | | | | | | | | | |
|---|---|---|---|---|---|---|---|---|---|---|
| 00100000 | 0.2071 | 1.6690 | 01100000 | -0.2071 | 1.6690 | 10100000 | 0.2071 | -1.6690 | 11100000 | -0.2071 | -1.6690 |
| 00100001 | 0.4482 | 1.6210 | 01100001 | -0.4482 | 1.6210 | 10100001 | 0.4482 | -1.6210 | 11100001 | -0.4482 | -1.6210 |
| 00100010 | 0.2080 | 1.3641 | 01100010 | -0.2080 | 1.3641 | 10100010 | 0.2080 | -1.3641 | 11100010 | -0.2080 | -1.3641 |
| 00100011 | 0.3307 | 1.3397 | 01100011 | -0.3307 | 1.3397 | 10100011 | 0.3307 | -1.3397 | 11100011 | -0.3307 | -1.3397 |
| 00100100 | 1.0341 | 1.3264 | 01100100 | -1.0341 | 1.3264 | 10100100 | 1.0341 | -1.3264 | 11100100 | -1.0341 | -1.3264 |
| 00100101 | 0.8297 | 1.4630 | 01100101 | -0.8297 | 1.4630 | 10100101 | 0.8297 | -1.4630 | 11100101 | -0.8297 | -1.4630 |
| 00100110 | 0.8178 | 1.1114 | 01100110 | -0.8178 | 1.1114 | 10100110 | 0.8178 | -1.1114 | 11100110 | -0.8178 | -1.1114 |
| 00100111 | 0.7138 | 1.1809 | 01100111 | -0.7138 | 1.1809 | 10100111 | 0.7138 | -1.1809 | 11100111 | -0.7138 | -1.1809 |
| 00101000 | 0.1957 | 0.9674 | 01101000 | -0.1957 | 0.9674 | 10101000 | 0.1957 | -0.9674 | 11101000 | -0.1957 | -0.9674 |
| 00101001 | 0.2170 | 0.9629 | 01101001 | -0.2170 | 0.9629 | 10101001 | 0.2170 | -0.9629 | 11101001 | -0.2170 | -0.9629 |
| 00101010 | 0.1977 | 1.0341 | 01101010 | -0.1977 | 1.0341 | 10101010 | 0.1977 | -1.0341 | 11101010 | -0.1977 | -1.0341 |
| 00101011 | 0.2288 | 1.0277 | 01101011 | -0.2288 | 1.0277 | 10101011 | 0.2288 | -1.0277 | 11101011 | -0.2288 | -1.0277 |
| 00101100 | 0.5458 | 0.8224 | 01101100 | -0.5458 | 0.8224 | 10101100 | 0.5458 | -0.8224 | 11101100 | -0.5458 | -0.8224 |
| 00101101 | 0.5276 | 0.8342 | 01101101 | -0.5276 | 0.8342 | 10101101 | 0.5276 | -0.8342 | 11101101 | -0.5276 | -0.8342 |
| 00101110 | 0.5916 | 0.8709 | 01101110 | -0.5916 | 0.8709 | 10101110 | 0.5916 | -0.8709 | 11101110 | -0.5916 | -0.8709 |
| 00101111 | 0.5651 | 0.8883 | 01101111 | -0.5651 | 0.8883 | 10101111 | 0.5651 | -0.8883 | 11101111 | -0.5651 | -0.8883 |
| 00110000 | 1.6690 | 0.2071 | 01110000 | -1.6690 | 0.2071 | 10110000 | 1.6690 | -0.2071 | 11110000 | -1.6690 | -0.2071 |
| 00110001 | 1.6210 | 0.4482 | 01110001 | -1.6210 | 0.4482 | 10110001 | 1.6210 | -0.4482 | 11110001 | -1.6210 | -0.4482 |
| 00110010 | 1.3641 | 0.2080 | 01110010 | -1.3641 | 0.2080 | 10110010 | 1.3641 | -0.2080 | 11110010 | -1.3641 | -0.2080 |
| 00110011 | 1.3397 | 0.3307 | 01110011 | -1.3397 | 0.3307 | 10110011 | 1.3397 | -0.3307 | 11110011 | -1.3397 | -0.3307 |
| 00110100 | 1.3264 | 1.0341 | 01110100 | -1.3264 | 1.0341 | 10110100 | 1.3264 | -1.0341 | 11110100 | -1.3264 | -1.0341 |
| 00110101 | 1.4630 | 0.8297 | 01110101 | -1.4630 | 0.8297 | 10110101 | 1.4630 | -0.8297 | 11110101 | -1.4630 | -0.8297 |
| 00110110 | 1.1114 | 0.8178 | 01110110 | -1.1114 | 0.8178 | 10110110 | 1.1114 | -0.8178 | 11110110 | -1.1114 | -0.8178 |
| 00110111 | 1.1809 | 0.7138 | 01110111 | -1.1809 | 0.7138 | 10110111 | 1.1809 | -0.7138 | 11110111 | -1.1809 | -0.7138 |
| 00111000 | 0.9674 | 0.1957 | 01111000 | -0.9674 | 0.1957 | 10111000 | 0.9674 | -0.1957 | 11111000 | -0.9674 | -0.1957 |
| 00111001 | 0.9629 | 0.2170 | 01111001 | -0.9629 | 0.2170 | 10111001 | 0.9629 | -0.2170 | 11111001 | -0.9629 | -0.2170 |
| 00111010 | 1.0341 | 0.1977 | 01111010 | -1.0341 | 0.1977 | 10111010 | 1.0341 | -0.1977 | 11111010 | -1.0341 | -0.1977 |
| 00111011 | 1.0277 | 0.2288 | 01111011 | -1.0277 | 0.2288 | 10111011 | 1.0277 | -0.2288 | 11111011 | -1.0277 | -0.2288 |
| 00111100 | 0.8224 | 0.5458 | 01111100 | -0.8224 | 0.5458 | 10111100 | 0.8224 | -0.5458 | 11111100 | -0.8224 | -0.5458 |
| 00111101 | 0.8342 | 0.5276 | 01111101 | -0.8342 | 0.5276 | 10111101 | 0.8342 | -0.5276 | 11111101 | -0.8342 | -0.5276 |
| 00111110 | 0.8709 | 0.5916 | 01111110 | -0.8709 | 0.5916 | 10111110 | 0.8709 | -0.5916 | 11111110 | -0.8709 | -0.5916 |
| 00111111 | 0.8883 | 0.5651 | 01111111 | -0.8883 | 0.5651 | 10111111 | 0.8883 | -0.5651 | 11111111 | -0.8883 | -0.5651 |

FIG. 72

| $d_0,b_{1,I},...b_{5,I}$ | Re(e) | Im(e) | $d_0,b_{1,I},...b_{5,I}$ | Re(e) | Im(e) | $d_0,b_{1,I},...b_{5,I}$ | Re(e) | Im(e) | $d_0,b_{1,I},...b_{5,I}$ | Re(e) | Im(e) |
|---|---|---|---|---|---|---|---|---|---|---|---|
| 000000 | 0.1567 | 0.3112 | 010000 | -0.1567 | 0.3112 | 100000 | 0.1567 | -0.3112 | 110000 | -0.1567 | -0.3112 |
| 000001 | 0.1709 | 0.3037 | 010001 | -0.1709 | 0.3037 | 100001 | 0.1709 | -0.3037 | 110001 | -0.1709 | -0.3037 |
| 000010 | 0.2093 | 0.6562 | 010010 | -0.2093 | 0.6562 | 100010 | 0.2093 | -0.6562 | 110010 | -0.2093 | -0.6562 |
| 000011 | 0.3315 | 0.6038 | 010011 | -0.3315 | 0.6038 | 100011 | 0.3315 | -0.6038 | 110011 | -0.3315 | -0.6038 |
| 000100 | 0.3112 | 0.1567 | 010100 | -0.3112 | 0.1567 | 100100 | 0.3112 | -0.1567 | 110100 | -0.3112 | -0.1567 |
| 000101 | 0.3037 | 0.1709 | 010101 | -0.3037 | 0.1709 | 100101 | 0.3037 | -0.1709 | 110101 | -0.3037 | -0.1709 |
| 000110 | 0.6562 | 0.2093 | 010110 | -0.6562 | 0.2093 | 100110 | 0.6562 | -0.2093 | 110110 | -0.6562 | -0.2093 |
| 000111 | 0.6038 | 0.3315 | 010111 | -0.6038 | 0.3315 | 100111 | 0.6038 | -0.3315 | 110111 | -0.6038 | -0.3315 |
| 001000 | 0.2959 | 1.4877 | 011000 | -0.2959 | 1.4877 | 101000 | 0.2959 | -1.4877 | 111000 | -0.2959 | -1.4877 |
| 001001 | 0.8427 | 1.2612 | 011001 | -0.8427 | 1.2612 | 101001 | 0.8427 | -1.2612 | 111001 | -0.8427 | -1.2612 |
| 001010 | 0.2389 | 1.0228 | 011010 | -0.2389 | 1.0228 | 101010 | 0.2389 | -1.0228 | 111010 | -0.2389 | -1.0228 |
| 001011 | 0.5559 | 0.8912 | 011011 | -0.5559 | 0.8912 | 101011 | 0.5559 | -0.8912 | 111011 | -0.5559 | -0.8912 |
| 001100 | 1.4877 | 0.2959 | 011100 | -1.4877 | 0.2959 | 101100 | 1.4877 | -0.2959 | 111100 | -1.4877 | -0.2959 |
| 001101 | 1.2612 | 0.8427 | 011101 | -1.2612 | 0.8427 | 101101 | 1.2612 | -0.8427 | 111101 | -1.2612 | -0.8427 |
| 001110 | 1.0228 | 0.2389 | 011110 | -1.0228 | 0.2389 | 101110 | 1.0228 | -0.2389 | 111110 | -1.0228 | -0.2389 |
| 001111 | 0.8912 | 0.5559 | 011111 | -0.8912 | 0.5559 | 101111 | 0.8912 | -0.5559 | 111111 | -0.8912 | -0.5559 |

FIG. 74

| $b_0, b_1, ...b_{7,l}$ | Re($e_l$) | Im($e_l$) | $b_0, b_1, ...b_{7,l}$ | Re($e_l$) | Im($e_l$) | $b_0, b_1, ...b_{7,l}$ | Re($e_l$) | Im($e_l$) | $b_0, b_1, ...b_{7,l}$ | Re($e_l$) | Im($e_l$) |
|---|---|---|---|---|---|---|---|---|---|---|---|
| 00000000 | 0.1170 | 0.3003 | 01000000 | -0.1170 | 0.3003 | 10000000 | 0.1170 | -0.3003 | 11000000 | -0.1170 | -0.3003 |
| 00000001 | 0.1171 | 0.3003 | 01000001 | -0.1171 | 0.3003 | 10000001 | 0.1171 | -0.3003 | 11000001 | -0.1171 | -0.3003 |
| 00000010 | 0.1204 | 0.3233 | 01000010 | -0.1204 | 0.3233 | 10000010 | 0.1204 | -0.3233 | 11000010 | -0.1204 | -0.3233 |
| 00000011 | 0.1204 | 0.3233 | 01000011 | -0.1204 | 0.3233 | 10000011 | 0.1204 | -0.3233 | 11000011 | -0.1204 | -0.3233 |
| 00000100 | 0.1454 | 0.2877 | 01000100 | -0.1454 | 0.2877 | 10000100 | 0.1454 | -0.2877 | 11000100 | -0.1454 | -0.2877 |
| 00000101 | 0.1453 | 0.2877 | 01000101 | -0.1453 | 0.2877 | 10000101 | 0.1453 | -0.2877 | 11000101 | -0.1453 | -0.2877 |
| 00000110 | 0.1566 | 0.3074 | 01000110 | -0.1566 | 0.3074 | 10000110 | 0.1566 | -0.3074 | 11000110 | -0.1566 | -0.3074 |
| 00000111 | 0.1565 | 0.3074 | 01000111 | -0.1565 | 0.3074 | 10000111 | 0.1565 | -0.3074 | 11000111 | -0.1565 | -0.3074 |
| 00001000 | 0.1427 | 0.6856 | 01001000 | -0.1427 | 0.6856 | 10001000 | 0.1427 | -0.6856 | 11001000 | -0.1427 | -0.6856 |
| 00001001 | 0.1562 | 0.6826 | 01001001 | -0.1562 | 0.6826 | 10001001 | 0.1562 | -0.6826 | 11001001 | -0.1562 | -0.6826 |
| 00001010 | 0.1422 | 0.6584 | 01001010 | -0.1422 | 0.6584 | 10001010 | 0.1422 | -0.6584 | 11001010 | -0.1422 | -0.6584 |
| 00001011 | 0.1529 | 0.6560 | 01001011 | -0.1529 | 0.6560 | 10001011 | 0.1529 | -0.6560 | 11001011 | -0.1529 | -0.6560 |
| 00001100 | 0.3840 | 0.5856 | 01001100 | -0.3840 | 0.5856 | 10001100 | 0.3840 | -0.5856 | 11001100 | -0.3840 | -0.5856 |
| 00001101 | 0.3723 | 0.5931 | 01001101 | -0.3723 | 0.5931 | 10001101 | 0.3723 | -0.5931 | 11001101 | -0.3723 | -0.5931 |
| 00001110 | 0.3651 | 0.5660 | 01001110 | -0.3651 | 0.5660 | 10001110 | 0.3651 | -0.5660 | 11001110 | -0.3651 | -0.5660 |
| 00001111 | 0.3559 | 0.5718 | 01001111 | -0.3559 | 0.5718 | 10001111 | 0.3559 | -0.5718 | 11001111 | -0.3559 | -0.5718 |
| 00010000 | 0.3003 | 0.1170 | 01010000 | -0.3003 | 0.1170 | 10010000 | 0.3003 | -0.1170 | 11010000 | -0.3003 | -0.1170 |
| 00010001 | 0.3003 | 0.1171 | 01010001 | -0.3003 | 0.1171 | 10010001 | 0.3003 | -0.1171 | 11010001 | -0.3003 | -0.1171 |
| 00010010 | 0.3233 | 0.1204 | 01010010 | -0.3233 | 0.1204 | 10010010 | 0.3233 | -0.1204 | 11010010 | -0.3233 | -0.1204 |
| 00010011 | 0.3233 | 0.1204 | 01010011 | -0.3233 | 0.1204 | 10010011 | 0.3233 | -0.1204 | 11010011 | -0.3233 | -0.1204 |
| 00010100 | 0.2877 | 0.1454 | 01010100 | -0.2877 | 0.1454 | 10010100 | 0.2877 | -0.1454 | 11010100 | -0.2877 | -0.1454 |
| 00010101 | 0.2877 | 0.1453 | 01010101 | -0.2877 | 0.1453 | 10010101 | 0.2877 | -0.1453 | 11010101 | -0.2877 | -0.1453 |
| 00010110 | 0.3074 | 0.1566 | 01010110 | -0.3074 | 0.1566 | 10010110 | 0.3074 | -0.1566 | 11010110 | -0.3074 | -0.1566 |
| 00010111 | 0.3074 | 0.1565 | 01010111 | -0.3074 | 0.1565 | 10010111 | 0.3074 | -0.1565 | 11010111 | -0.3074 | -0.1565 |
| 00011000 | 0.6856 | 0.1427 | 01011000 | -0.6856 | 0.1427 | 10011000 | 0.6856 | -0.1427 | 11011000 | -0.6856 | -0.1427 |
| 00011001 | 0.6826 | 0.1562 | 01011001 | -0.6826 | 0.1562 | 10011001 | 0.6826 | -0.1562 | 11011001 | -0.6826 | -0.1562 |
| 00011010 | 0.6584 | 0.1422 | 01011010 | -0.6584 | 0.1422 | 10011010 | 0.6584 | -0.1422 | 11011010 | -0.6584 | -0.1422 |
| 00011011 | 0.6560 | 0.1529 | 01011011 | -0.6560 | 0.1529 | 10011011 | 0.6560 | -0.1529 | 11011011 | -0.6560 | -0.1529 |
| 00011100 | 0.5856 | 0.3840 | 01011100 | -0.5856 | 0.3840 | 10011100 | 0.5856 | -0.3840 | 11011100 | -0.5856 | -0.3840 |
| 00011101 | 0.5931 | 0.3723 | 01011101 | -0.5931 | 0.3723 | 10011101 | 0.5931 | -0.3723 | 11011101 | -0.5931 | -0.3723 |
| 00011110 | 0.5660 | 0.3651 | 01011110 | -0.5660 | 0.3651 | 10011110 | 0.5660 | -0.3651 | 11011110 | -0.5660 | -0.3651 |
| 00011111 | 0.5718 | 0.3559 | 01011111 | -0.5718 | 0.3559 | 10011111 | 0.5718 | -0.3559 | 11011111 | -0.5718 | -0.3559 |

FIG. 75

| $b_0,b_1,...b_7$ | Re($e_i$) | Im($e_i$) | $b_0,b_1,...b_7$ | Re($e_i$) | Im($e_i$) | $b_0,b_1,...b_7$ | Re($e_i$) | Im($e_i$) | $b_0,b_1,...b_7$ | Re($e_i$) | Im($e_i$) |
|---|---|---|---|---|---|---|---|---|---|---|---|
| 00100000 | 0.1683 | 1.7041 | 01100000 | -0.1683 | 1.7041 | 10100000 | 0.1683 | -1.7041 | 11100000 | -0.1683 | -1.7041 |
| 00100001 | 0.4972 | 1.6386 | 01100001 | -0.4972 | 1.6386 | 10100001 | 0.4972 | -1.6386 | 11100001 | -0.4972 | -1.6386 |
| 00100010 | 0.1495 | 1.3560 | 01100010 | -0.1495 | 1.3560 | 10100010 | 0.1495 | -1.3560 | 11100010 | -0.1495 | -1.3560 |
| 00100011 | 0.3814 | 1.3099 | 01100011 | -0.3814 | 1.3099 | 10100011 | 0.3814 | -1.3099 | 11100011 | -0.3814 | -1.3099 |
| 00100100 | 1.0862 | 1.3238 | 01100100 | -1.0862 | 1.3238 | 10100100 | 1.0862 | -1.3238 | 11100100 | -1.0862 | -1.3238 |
| 00100101 | 0.8074 | 1.5101 | 01100101 | -0.8074 | 1.5101 | 10100101 | 0.8074 | -1.5101 | 11100101 | -0.8074 | -1.5101 |
| 00100110 | 0.8534 | 1.0644 | 01100110 | -0.8534 | 1.0644 | 10100110 | 0.8534 | -1.0644 | 11100110 | -0.8534 | -1.0644 |
| 00100111 | 0.6568 | 1.1958 | 01100111 | -0.6568 | 1.1958 | 10100111 | 0.6568 | -1.1958 | 11100111 | -0.6568 | -1.1958 |
| 00101000 | 0.1552 | 0.9481 | 01101000 | -0.1552 | 0.9481 | 10101000 | 0.1552 | -0.9481 | 11101000 | -0.1552 | -0.9481 |
| 00101001 | 0.2200 | 0.9352 | 01101001 | -0.2200 | 0.9352 | 10101001 | 0.2200 | -0.9352 | 11101001 | -0.2200 | -0.9352 |
| 00101010 | 0.1577 | 1.0449 | 01101010 | -0.1577 | 1.0449 | 10101010 | 0.1577 | -1.0449 | 11101010 | -0.1577 | -1.0449 |
| 00101011 | 0.2548 | 1.0255 | 01101011 | -0.2548 | 1.0255 | 10101011 | 0.2548 | -1.0255 | 11101011 | -0.2548 | -1.0255 |
| 00101100 | 0.5609 | 0.7800 | 01101100 | -0.5609 | 0.7800 | 10101100 | 0.5609 | -0.7800 | 11101100 | -0.5609 | -0.7800 |
| 00101101 | 0.5060 | 0.8167 | 01101101 | -0.5060 | 0.8167 | 10101101 | 0.5060 | -0.8167 | 11101101 | -0.5060 | -0.8167 |
| 00101110 | 0.6276 | 0.8501 | 01101110 | -0.6276 | 0.8501 | 10101110 | 0.6276 | -0.8501 | 11101110 | -0.6276 | -0.8501 |
| 00101111 | 0.5452 | 0.9052 | 01101111 | -0.5452 | 0.9052 | 10101111 | 0.5452 | -0.9052 | 11101111 | -0.5452 | -0.9052 |
| 00110000 | 1.7041 | 0.1683 | 01110000 | -1.7041 | 0.1683 | 10110000 | 1.7041 | -0.1683 | 11110000 | -1.7041 | -0.1683 |
| 00110001 | 1.6386 | 0.4972 | 01110001 | -1.6386 | 0.4972 | 10110001 | 1.6386 | -0.4972 | 11110001 | -1.6386 | -0.4972 |
| 00110010 | 1.3560 | 0.1495 | 01110010 | -1.3560 | 0.1495 | 10110010 | 1.3560 | -0.1495 | 11110010 | -1.3560 | -0.1495 |
| 00110011 | 1.3099 | 0.3814 | 01110011 | -1.3099 | 0.3814 | 10110011 | 1.3099 | -0.3814 | 11110011 | -1.3099 | -0.3814 |
| 00110100 | 1.3238 | 1.0862 | 01110100 | -1.3238 | 1.0862 | 10110100 | 1.3238 | -1.0862 | 11110100 | -1.3238 | -1.0862 |
| 00110101 | 1.5101 | 0.8074 | 01110101 | -1.5101 | 0.8074 | 10110101 | 1.5101 | -0.8074 | 11110101 | -1.5101 | -0.8074 |
| 00110110 | 1.0644 | 0.8534 | 01110110 | -1.0644 | 0.8534 | 10110110 | 1.0644 | -0.8534 | 11110110 | -1.0644 | -0.8534 |
| 00110111 | 1.1958 | 0.6568 | 01110111 | -1.1958 | 0.6568 | 10110111 | 1.1958 | -0.6568 | 11110111 | -1.1958 | -0.6568 |
| 00111000 | 0.9481 | 0.1552 | 01111000 | -0.9481 | 0.1552 | 10111000 | 0.9481 | -0.1552 | 11111000 | -0.9481 | -0.1552 |
| 00111001 | 0.9352 | 0.2200 | 01111001 | -0.9352 | 0.2200 | 10111001 | 0.9352 | -0.2200 | 11111001 | -0.9352 | -0.2200 |
| 00111010 | 1.0449 | 0.1577 | 01111010 | -1.0449 | 0.1577 | 10111010 | 1.0449 | -0.1577 | 11111010 | -1.0449 | -0.1577 |
| 00111011 | 1.0255 | 0.2548 | 01111011 | -1.0255 | 0.2548 | 10111011 | 1.0255 | -0.2548 | 11111011 | -1.0255 | -0.2548 |
| 00111100 | 0.7800 | 0.5609 | 01111100 | -0.7800 | 0.5609 | 10111100 | 0.7800 | -0.5609 | 11111100 | -0.7800 | -0.5609 |
| 00111101 | 0.8167 | 0.5060 | 01111101 | -0.8167 | 0.5060 | 10111101 | 0.8167 | -0.5060 | 11111101 | -0.8167 | -0.5060 |
| 00111110 | 0.8501 | 0.6276 | 01111110 | -0.8501 | 0.6276 | 10111110 | 0.8501 | -0.6276 | 11111110 | -0.8501 | -0.6276 |
| 00111111 | 0.9052 | 0.5452 | 01111111 | -0.9052 | 0.5452 | 10111111 | 0.9052 | -0.5452 | 11111111 | -0.9052 | -0.5452 |

FIG. 77

| $b_0,b_1,...b_5,$ | Re($e_i$) | Im($e_i$) | $b_0,b_1,...b_5,$ | Re($e_i$) | Im($e_i$) | $b_0,b_1,...b_5,$ | Re($e_i$) | Im($e_i$) | $b_0,b_1,...b_5,$ | Re($e_i$) | Im($e_i$) |
|---|---|---|---|---|---|---|---|---|---|---|---|
| 000000 | 0.1533 | 0.3120 | 010000 | -0.1533 | 0.3120 | 100000 | 0.1533 | -0.3120 | 110000 | -0.1533 | -0.3120 |
| 000001 | 0.1694 | 0.3035 | 010001 | -0.1694 | 0.3035 | 100001 | 0.1694 | -0.3035 | 110001 | -0.1694 | -0.3035 |
| 000010 | 0.1968 | 0.6713 | 010010 | -0.1968 | 0.6713 | 100010 | 0.1968 | -0.6713 | 110010 | -0.1968 | -0.6713 |
| 000011 | 0.3448 | 0.6087 | 010011 | -0.3448 | 0.6087 | 100011 | 0.3448 | -0.6087 | 110011 | -0.3448 | -0.6087 |
| 000100 | 0.3120 | 0.1533 | 010100 | -0.3120 | 0.1533 | 100100 | 0.3120 | -0.1533 | 110100 | -0.3120 | -0.1533 |
| 000101 | 0.3035 | 0.1694 | 010101 | -0.3035 | 0.1694 | 100101 | 0.3035 | -0.1694 | 110101 | -0.3035 | -0.1694 |
| 000110 | 0.6713 | 0.1968 | 010110 | -0.6713 | 0.1968 | 100110 | 0.6713 | -0.1968 | 110110 | -0.6713 | -0.1968 |
| 000111 | 0.6087 | 0.3448 | 010111 | -0.6087 | 0.3448 | 100111 | 0.6087 | -0.3448 | 110111 | -0.6087 | -0.3448 |
| 001000 | 0.2954 | 1.4849 | 011000 | -0.2954 | 1.4849 | 101000 | 0.2954 | -1.4849 | 111000 | -0.2954 | -1.4849 |
| 001001 | 0.8411 | 1.2588 | 011001 | -0.8411 | 1.2588 | 101001 | 0.8411 | -1.2588 | 111001 | -0.8411 | -1.2588 |
| 001010 | 0.2268 | 1.0229 | 011010 | -0.2268 | 1.0229 | 101010 | 0.2268 | -1.0229 | 111010 | -0.2268 | -1.0229 |
| 001011 | 0.5629 | 0.8836 | 011011 | -0.5629 | 0.8836 | 101011 | 0.5629 | -0.8836 | 111011 | -0.5629 | -0.8836 |
| 001100 | 1.4849 | 0.2954 | 011100 | -1.4849 | 0.2954 | 101100 | 1.4849 | -0.2954 | 111100 | -1.4849 | -0.2954 |
| 001101 | 1.2588 | 0.8411 | 011101 | -1.2588 | 0.8411 | 101101 | 1.2588 | -0.8411 | 111101 | -1.2588 | -0.8411 |
| 001110 | 1.0229 | 0.2268 | 011110 | -1.0229 | 0.2268 | 101110 | 1.0229 | -0.2268 | 111110 | -1.0229 | -0.2268 |
| 001111 | 0.8836 | 0.5629 | 011111 | -0.8836 | 0.5629 | 101111 | 0.8836 | -0.5629 | 111111 | -0.8836 | -0.5629 |

FIG. 79

| $b_0,b_1,...b_7$ | Re($e_i$) | Im($e_i$) | $b_0,b_1,...b_7$ | Re($e_i$) | Im($e_i$) | $b_0,b_1,...b_7$ | Re($e_i$) | Im($e_i$) | $b_0,b_1,...b_7$ | Re($e_i$) | Im($e_i$) |
|---|---|---|---|---|---|---|---|---|---|---|---|
| 00000000 | 0.0995 | 0.2435 | 01000000 | -0.0995 | 0.2435 | 10000000 | 0.0995 | -0.2435 | 11000000 | -0.0995 | -0.2435 |
| 00000001 | 0.0996 | 0.2434 | 01000001 | -0.0996 | 0.2434 | 10000001 | 0.0996 | -0.2434 | 11000001 | -0.0996 | -0.2434 |
| 00000010 | 0.1169 | 0.3886 | 01000010 | -0.1169 | 0.3886 | 10000010 | 0.1169 | -0.3886 | 11000010 | -0.1169 | -0.3886 |
| 00000011 | 0.1179 | 0.3883 | 01000011 | -0.1179 | 0.3883 | 10000011 | 0.1179 | -0.3883 | 11000011 | -0.1179 | -0.3883 |
| 00000100 | 0.1192 | 0.2345 | 01000100 | -0.1192 | 0.2345 | 10000100 | 0.1192 | -0.2345 | 11000100 | -0.1192 | -0.2345 |
| 00000101 | 0.1192 | 0.2345 | 01000101 | -0.1192 | 0.2345 | 10000101 | 0.1192 | -0.2345 | 11000101 | -0.1192 | -0.2345 |
| 00000110 | 0.1953 | 0.3558 | 01000110 | -0.1953 | 0.3558 | 10000110 | 0.1953 | -0.3558 | 11000110 | -0.1953 | -0.3558 |
| 00000111 | 0.1944 | 0.3563 | 01000111 | -0.1944 | 0.3563 | 10000111 | 0.1944 | -0.3563 | 11000111 | -0.1944 | -0.3563 |
| 00001000 | 0.1293 | 0.7217 | 01001000 | -0.1293 | 0.7217 | 10001000 | 0.1293 | -0.7217 | 11001000 | -0.1293 | -0.7217 |
| 00001001 | 0.1616 | 0.7151 | 01001001 | -0.1616 | 0.7151 | 10001001 | 0.1616 | -0.7151 | 11001001 | -0.1616 | -0.7151 |
| 00001010 | 0.1287 | 0.6355 | 01001010 | -0.1287 | 0.6355 | 10001010 | 0.1287 | -0.6355 | 11001010 | -0.1287 | -0.6355 |
| 00001011 | 0.1456 | 0.6318 | 01001011 | -0.1456 | 0.6318 | 10001011 | 0.1456 | -0.6318 | 11001011 | -0.1456 | -0.6318 |
| 00001100 | 0.4191 | 0.6016 | 01001100 | -0.4191 | 0.6016 | 10001100 | 0.4191 | -0.6016 | 11001100 | -0.4191 | -0.6016 |
| 00001101 | 0.3916 | 0.6198 | 01001101 | -0.3916 | 0.6198 | 10001101 | 0.3916 | -0.6198 | 11001101 | -0.3916 | -0.6198 |
| 00001110 | 0.3585 | 0.5403 | 01001110 | -0.3585 | 0.5403 | 10001110 | 0.3585 | -0.5403 | 11001110 | -0.3585 | -0.5403 |
| 00001111 | 0.3439 | 0.5497 | 01001111 | -0.3439 | 0.5497 | 10001111 | 0.3439 | -0.5497 | 11001111 | -0.3439 | -0.5497 |
| 00010000 | 0.2435 | 0.0995 | 01010000 | -0.2435 | 0.0995 | 10010000 | 0.2435 | -0.0995 | 11010000 | -0.2435 | -0.0995 |
| 00010001 | 0.2434 | 0.0996 | 01010001 | -0.2434 | 0.0996 | 10010001 | 0.2434 | -0.0996 | 11010001 | -0.2434 | -0.0996 |
| 00010010 | 0.3886 | 0.1169 | 01010010 | -0.3886 | 0.1169 | 10010010 | 0.3886 | -0.1169 | 11010010 | -0.3886 | -0.1169 |
| 00010011 | 0.3883 | 0.1179 | 01010011 | -0.3883 | 0.1179 | 10010011 | 0.3883 | -0.1179 | 11010011 | -0.3883 | -0.1179 |
| 00010100 | 0.2345 | 0.1192 | 01010100 | -0.2345 | 0.1192 | 10010100 | 0.2345 | -0.1192 | 11010100 | -0.2345 | -0.1192 |
| 00010101 | 0.2345 | 0.1192 | 01010101 | -0.2345 | 0.1192 | 10010101 | 0.2345 | -0.1192 | 11010101 | -0.2345 | -0.1192 |
| 00010110 | 0.3558 | 0.1953 | 01010110 | -0.3558 | 0.1953 | 10010110 | 0.3558 | -0.1953 | 11010110 | -0.3558 | -0.1953 |
| 00010111 | 0.3563 | 0.1944 | 01010111 | -0.3563 | 0.1944 | 10010111 | 0.3563 | -0.1944 | 11010111 | -0.3563 | -0.1944 |
| 00011000 | 0.7217 | 0.1293 | 01011000 | -0.7217 | 0.1293 | 10011000 | 0.7217 | -0.1293 | 11011000 | -0.7217 | -0.1293 |
| 00011001 | 0.7151 | 0.1616 | 01011001 | -0.7151 | 0.1616 | 10011001 | 0.7151 | -0.1616 | 11011001 | -0.7151 | -0.1616 |
| 00011010 | 0.6355 | 0.1287 | 01011010 | -0.6355 | 0.1287 | 10011010 | 0.6355 | -0.1287 | 11011010 | -0.6355 | -0.1287 |
| 00011011 | 0.6318 | 0.1456 | 01011011 | -0.6318 | 0.1456 | 10011011 | 0.6318 | -0.1456 | 11011011 | -0.6318 | -0.1456 |
| 00011100 | 0.6016 | 0.4191 | 01011100 | -0.6016 | 0.4191 | 10011100 | 0.6016 | -0.4191 | 11011100 | -0.6016 | -0.4191 |
| 00011101 | 0.6198 | 0.3916 | 01011101 | -0.6198 | 0.3916 | 10011101 | 0.6198 | -0.3916 | 11011101 | -0.6198 | -0.3916 |
| 00011110 | 0.5403 | 0.3585 | 01011110 | -0.5403 | 0.3585 | 10011110 | 0.5403 | -0.3585 | 11011110 | -0.5403 | -0.3585 |
| 00011111 | 0.5497 | 0.3439 | 01011111 | -0.5497 | 0.3439 | 10011111 | 0.5497 | -0.3439 | 11011111 | -0.5497 | -0.3439 |

FIG. 80

| $b_0,b_1,...b_7$ | Re($e_i$) | Im($e_i$) | $b_0,b_1,...b_7$ | Re($e_i$) | Im($e_i$) | $b_0,b_1,...b_7$ | Re($e_i$) | Im($e_i$) | $b_0,b_1,...b_7$ | Re($e_i$) | Im($e_i$) |
|---|---|---|---|---|---|---|---|---|---|---|---|
| 00100000 | 0.1665 | 1.6859 | 01100000 | -0.1665 | 1.6859 | 10100000 | 0.1665 | -1.6859 | 11100000 | -0.1665 | -1.6859 |
| 00100001 | 0.4919 | 1.6211 | 01100001 | -0.4919 | 1.6211 | 10100001 | 0.4919 | -1.6211 | 11100001 | -0.4919 | -1.6211 |
| 00100010 | 0.1360 | 1.3498 | 01100010 | -0.1360 | 1.3498 | 10100010 | 0.1360 | -1.3498 | 11100010 | -0.1360 | -1.3498 |
| 00100011 | 0.3914 | 1.2989 | 01100011 | -0.3914 | 1.2989 | 10100011 | 0.3914 | -1.2989 | 11100011 | -0.3914 | -1.2989 |
| 00100100 | 1.0746 | 1.3096 | 01100100 | -1.0746 | 1.3096 | 10100100 | 1.0746 | -1.3096 | 11100100 | -1.0746 | -1.3096 |
| 00100101 | 0.7987 | 1.4940 | 01100101 | -0.7987 | 1.4940 | 10100101 | 0.7987 | -1.4940 | 11100101 | -0.7987 | -1.4940 |
| 00100110 | 0.8585 | 1.0504 | 01100110 | -0.8585 | 1.0504 | 10100110 | 0.8585 | -1.0504 | 11100110 | -0.8585 | -1.0504 |
| 00100111 | 0.6419 | 1.1951 | 01100111 | -0.6419 | 1.1951 | 10100111 | 0.6419 | -1.1951 | 11100111 | -0.6419 | -1.1951 |
| 00101000 | 0.1334 | 0.9483 | 01101000 | -0.1334 | 0.9483 | 10101000 | 0.1334 | -0.9483 | 11101000 | -0.1334 | -0.9483 |
| 00101001 | 0.2402 | 0.9271 | 01101001 | -0.2402 | 0.9271 | 10101001 | 0.2402 | -0.9271 | 11101001 | -0.2402 | -0.9271 |
| 00101010 | 0.1323 | 1.0786 | 01101010 | -0.1323 | 1.0786 | 10101010 | 0.1323 | -1.0786 | 11101010 | -0.1323 | -1.0786 |
| 00101011 | 0.2910 | 1.0470 | 01101011 | -0.2910 | 1.0470 | 10101011 | 0.2910 | -1.0470 | 11101011 | -0.2910 | -1.0470 |
| 00101100 | 0.5764 | 0.7648 | 01101100 | -0.5764 | 0.7648 | 10101100 | 0.5764 | -0.7648 | 11101100 | -0.5764 | -0.7648 |
| 00101101 | 0.4860 | 0.8252 | 01101101 | -0.4860 | 0.8252 | 10101101 | 0.4860 | -0.8252 | 11101101 | -0.4860 | -0.8252 |
| 00101110 | 0.6693 | 0.8561 | 01101110 | -0.6693 | 0.8561 | 10101110 | 0.6693 | -0.8561 | 11101110 | -0.6693 | -0.8561 |
| 00101111 | 0.5348 | 0.9459 | 01101111 | -0.5348 | 0.9459 | 10101111 | 0.5348 | -0.9459 | 11101111 | -0.5348 | -0.9459 |
| 00110000 | 1.6859 | 0.1665 | 01110000 | -1.6859 | 0.1665 | 10110000 | 1.6859 | -0.1665 | 11110000 | -1.6859 | -0.1665 |
| 00110001 | 1.6211 | 0.4919 | 01110001 | -1.6211 | 0.4919 | 10110001 | 1.6211 | -0.4919 | 11110001 | -1.6211 | -0.4919 |
| 00110010 | 1.3498 | 0.1360 | 01110010 | -1.3498 | 0.1360 | 10110010 | 1.3498 | -0.1360 | 11110010 | -1.3498 | -0.1360 |
| 00110011 | 1.2989 | 0.3914 | 01110011 | -1.2989 | 0.3914 | 10110011 | 1.2989 | -0.3914 | 11110011 | -1.2989 | -0.3914 |
| 00110100 | 1.3096 | 1.0746 | 01110100 | -1.3096 | 1.0746 | 10110100 | 1.3096 | -1.0746 | 11110100 | -1.3096 | -1.0746 |
| 00110101 | 1.4940 | 0.7987 | 01110101 | -1.4940 | 0.7987 | 10110101 | 1.4940 | -0.7987 | 11110101 | -1.4940 | -0.7987 |
| 00110110 | 1.0504 | 0.8585 | 01110110 | -1.0504 | 0.8585 | 10110110 | 1.0504 | -0.8585 | 11110110 | -1.0504 | -0.8585 |
| 00110111 | 1.1951 | 0.6419 | 01110111 | -1.1951 | 0.6419 | 10110111 | 1.1951 | -0.6419 | 11110111 | -1.1951 | -0.6419 |
| 00111000 | 0.9483 | 0.1334 | 01111000 | -0.9483 | 0.1334 | 10111000 | 0.9483 | -0.1334 | 11111000 | -0.9483 | -0.1334 |
| 00111001 | 0.9271 | 0.2402 | 01111001 | -0.9271 | 0.2402 | 10111001 | 0.9271 | -0.2402 | 11111001 | -0.9271 | -0.2402 |
| 00111010 | 1.0786 | 0.1323 | 01111010 | -1.0786 | 0.1323 | 10111010 | 1.0786 | -0.1323 | 11111010 | -1.0786 | -0.1323 |
| 00111011 | 1.0470 | 0.2910 | 01111011 | -1.0470 | 0.2910 | 10111011 | 1.0470 | -0.2910 | 11111011 | -1.0470 | -0.2910 |
| 00111100 | 0.7648 | 0.5764 | 01111100 | -0.7648 | 0.5764 | 10111100 | 0.7648 | -0.5764 | 11111100 | -0.7648 | -0.5764 |
| 00111101 | 0.8252 | 0.4860 | 01111101 | -0.8252 | 0.4860 | 10111101 | 0.8252 | -0.4860 | 11111101 | -0.8252 | -0.4860 |
| 00111110 | 0.8561 | 0.6693 | 01111110 | -0.8561 | 0.6693 | 10111110 | 0.8561 | -0.6693 | 11111110 | -0.8561 | -0.6693 |
| 00111111 | 0.9459 | 0.5348 | 01111111 | -0.9459 | 0.5348 | 10111111 | 0.9459 | -0.5348 | 11111111 | -0.9459 | -0.5348 |

FIG. 82

| $b_0,b_{1,i}...b_{5,i}$ | Re($e_i$) | Im($e_i$) | $b_0,b_{1,i}...b_{5,i}$ | Re($e_i$) | Im($e_i$) | $b_0,b_{1,i}...b_{5,i}$ | Re($e_i$) | Im($e_i$) | $b_0,b_{1,i}...b_{5,i}$ | Re($e_i$) | Im($e_i$) |
|---|---|---|---|---|---|---|---|---|---|---|---|
| 000000 | 0.1305 | 0.3311 | 010000 | -0.1305 | 0.3311 | 100000 | 0.1305 | -0.3311 | 110000 | -0.1305 | -0.3311 |
| 000001 | 0.1633 | 0.3162 | 010001 | -0.1633 | 0.3162 | 100001 | 0.1633 | -0.3162 | 110001 | -0.1633 | -0.3162 |
| 000010 | 0.1622 | 0.7113 | 010010 | -0.1622 | 0.7113 | 100010 | 0.1622 | -0.7113 | 110010 | -0.1622 | -0.7113 |
| 000011 | 0.3905 | 0.6163 | 010011 | -0.3905 | 0.6163 | 100011 | 0.3905 | -0.6163 | 110011 | -0.3905 | -0.6163 |
| 000100 | 0.3311 | 0.1305 | 010100 | -0.3311 | 0.1305 | 100100 | 0.3311 | -0.1305 | 110100 | -0.3311 | -0.1305 |
| 000101 | 0.3162 | 0.1633 | 010101 | -0.3162 | 0.1633 | 100101 | 0.3162 | -0.1633 | 110101 | -0.3162 | -0.1633 |
| 000110 | 0.7113 | 0.1622 | 010110 | -0.7113 | 0.1622 | 100110 | 0.7113 | -0.1622 | 110110 | -0.7113 | -0.1622 |
| 000111 | 0.6163 | 0.3905 | 010111 | -0.6163 | 0.3905 | 100111 | 0.6163 | -0.3905 | 110111 | -0.6163 | -0.3905 |
| 001000 | 0.2909 | 1.4626 | 011000 | -0.2909 | 1.4626 | 101000 | 0.2909 | -1.4626 | 111000 | -0.2909 | -1.4626 |
| 001001 | 0.8285 | 1.2399 | 011001 | -0.8285 | 1.2399 | 101001 | 0.8285 | -1.2399 | 111001 | -0.8285 | -1.2399 |
| 001010 | 0.2062 | 1.0367 | 011010 | -0.2062 | 1.0367 | 101010 | 0.2062 | -1.0367 | 111010 | -0.2062 | -1.0367 |
| 001011 | 0.5872 | 0.8789 | 011011 | -0.5872 | 0.8789 | 101011 | 0.5872 | -0.8789 | 111011 | -0.5872 | -0.8789 |
| 001100 | 1.4626 | 0.2909 | 011100 | -1.4626 | 0.2909 | 101100 | 1.4626 | -0.2909 | 111100 | -1.4626 | -0.2909 |
| 001101 | 1.2399 | 0.8285 | 011101 | -1.2399 | 0.8285 | 101101 | 1.2399 | -0.8285 | 111101 | -1.2399 | -0.8285 |
| 001110 | 1.0367 | 0.2062 | 011110 | -1.0367 | 0.2062 | 101110 | 1.0367 | -0.2062 | 111110 | -1.0367 | -0.2062 |
| 001111 | 0.8789 | 0.5872 | 011111 | -0.8789 | 0.5872 | 101111 | 0.8789 | -0.5872 | 111111 | -0.8789 | -0.5872 |

FIG. 84

| $b_0,b_1,...b_{7,l}$ | Re($e_l$) | Im($e_l$) | $b_0,b_1,...b_{7,l}$ | Re($e_l$) | Im($e_l$) | $b_0,b_1,...b_{7,l}$ | Re($e_l$) | Im($e_l$) | $b_0,b_1,...b_{7,l}$ | Re($e_l$) | Im($e_l$) |
|---|---|---|---|---|---|---|---|---|---|---|---|
| 00000000 | 0.0851 | 0.2139 | 01000000 | -0.0851 | 0.2139 | 10000000 | 0.0851 | -0.2139 | 11000000 | -0.0851 | -0.2139 |
| 00000001 | 0.0851 | 0.2139 | 01000001 | -0.0851 | 0.2139 | 10000001 | 0.0851 | -0.2139 | 11000001 | -0.0851 | -0.2139 |
| 00000010 | 0.1018 | 0.4309 | 01000010 | -0.1018 | 0.4309 | 10000010 | 0.1018 | -0.4309 | 11000010 | -0.1018 | -0.4309 |
| 00000011 | 0.1068 | 0.4296 | 01000011 | -0.1068 | 0.4296 | 10000011 | 0.1068 | -0.4296 | 11000011 | -0.1068 | -0.4296 |
| 00000100 | 0.1062 | 0.2043 | 01000100 | -0.1062 | 0.2043 | 10000100 | 0.1062 | -0.2043 | 11000100 | -0.1062 | -0.2043 |
| 00000101 | 0.1061 | 0.2043 | 01000101 | -0.1061 | 0.2043 | 10000101 | 0.1061 | -0.2043 | 11000101 | -0.1061 | -0.2043 |
| 00000110 | 0.2328 | 0.3766 | 01000110 | -0.2328 | 0.3766 | 10000110 | 0.2328 | -0.3766 | 11000110 | -0.2328 | -0.3766 |
| 00000111 | 0.2283 | 0.3793 | 01000111 | -0.2283 | 0.3793 | 10000111 | 0.2283 | -0.3793 | 11000111 | -0.2283 | -0.3793 |
| 00001000 | 0.1119 | 0.7634 | 01001000 | -0.1119 | 0.7634 | 10001000 | 0.1119 | -0.7634 | 11001000 | -0.1119 | -0.7634 |
| 00001001 | 0.1892 | 0.7480 | 01001001 | -0.1892 | 0.7480 | 10001001 | 0.1892 | -0.7480 | 11001001 | -0.1892 | -0.7480 |
| 00001010 | 0.1087 | 0.6133 | 01001010 | -0.1087 | 0.6133 | 10001010 | 0.1087 | -0.6133 | 11001010 | -0.1087 | -0.6133 |
| 00001011 | 0.1395 | 0.6070 | 01001011 | -0.1395 | 0.6070 | 10001011 | 0.1395 | -0.6070 | 11001011 | -0.1395 | -0.6070 |
| 00001100 | 0.4609 | 0.6188 | 01001100 | -0.4609 | 0.6188 | 10001100 | 0.4609 | -0.6188 | 11001100 | -0.4609 | -0.6188 |
| 00001101 | 0.3953 | 0.6626 | 01001101 | -0.3953 | 0.6626 | 10001101 | 0.3953 | -0.6626 | 11001101 | -0.3953 | -0.6626 |
| 00001110 | 0.3569 | 0.5104 | 01001110 | -0.3569 | 0.5104 | 10001110 | 0.3569 | -0.5104 | 11001110 | -0.3569 | -0.5104 |
| 00001111 | 0.3308 | 0.5278 | 01001111 | -0.3308 | 0.5278 | 10001111 | 0.3308 | -0.5278 | 11001111 | -0.3308 | -0.5278 |
| 00010000 | 0.2139 | 0.0851 | 01010000 | -0.2139 | 0.0851 | 10010000 | 0.2139 | -0.0851 | 11010000 | -0.2139 | -0.0851 |
| 00010001 | 0.2139 | 0.0851 | 01010001 | -0.2139 | 0.0851 | 10010001 | 0.2139 | -0.0851 | 11010001 | -0.2139 | -0.0851 |
| 00010010 | 0.4309 | 0.1018 | 01010010 | -0.4309 | 0.1018 | 10010010 | 0.4309 | -0.1018 | 11010010 | -0.4309 | -0.1018 |
| 00010011 | 0.4296 | 0.1068 | 01010011 | -0.4296 | 0.1068 | 10010011 | 0.4296 | -0.1068 | 11010011 | -0.4296 | -0.1068 |
| 00010100 | 0.2043 | 0.1062 | 01010100 | -0.2043 | 0.1062 | 10010100 | 0.2043 | -0.1062 | 11010100 | -0.2043 | -0.1062 |
| 00010101 | 0.2043 | 0.1061 | 01010101 | -0.2043 | 0.1061 | 10010101 | 0.2043 | -0.1061 | 11010101 | -0.2043 | -0.1061 |
| 00010110 | 0.3766 | 0.2328 | 01010110 | -0.3766 | 0.2328 | 10010110 | 0.3766 | -0.2328 | 11010110 | -0.3766 | -0.2328 |
| 00010111 | 0.3793 | 0.2283 | 01010111 | -0.3793 | 0.2283 | 10010111 | 0.3793 | -0.2283 | 11010111 | -0.3793 | -0.2283 |
| 00011000 | 0.7634 | 0.1119 | 01011000 | -0.7634 | 0.1119 | 10011000 | 0.7634 | -0.1119 | 11011000 | -0.7634 | -0.1119 |
| 00011001 | 0.7480 | 0.1892 | 01011001 | -0.7480 | 0.1892 | 10011001 | 0.7480 | -0.1892 | 11011001 | -0.7480 | -0.1892 |
| 00011010 | 0.6133 | 0.1087 | 01011010 | -0.6133 | 0.1087 | 10011010 | 0.6133 | -0.1087 | 11011010 | -0.6133 | -0.1087 |
| 00011011 | 0.6070 | 0.1395 | 01011011 | -0.6070 | 0.1395 | 10011011 | 0.6070 | -0.1395 | 11011011 | -0.6070 | -0.1395 |
| 00011100 | 0.6188 | 0.4609 | 01011100 | -0.6188 | 0.4609 | 10011100 | 0.6188 | -0.4609 | 11011100 | -0.6188 | -0.4609 |
| 00011101 | 0.6626 | 0.3953 | 01011101 | -0.6626 | 0.3953 | 10011101 | 0.6626 | -0.3953 | 11011101 | -0.6626 | -0.3953 |
| 00011110 | 0.5104 | 0.3569 | 01011110 | -0.5104 | 0.3569 | 10011110 | 0.5104 | -0.3569 | 11011110 | -0.5104 | -0.3569 |
| 00011111 | 0.5278 | 0.3308 | 01011111 | -0.5278 | 0.3308 | 10011111 | 0.5278 | -0.3308 | 11011111 | -0.5278 | -0.3308 |

FIG. 85

| $b_{0,l}b_{1,l}...b_{7,l}$ | $Re(e_l)$ | $Im(e_l)$ | $b_{0,l}b_{1,l}...b_{7,l}$ | $Re(e_l)$ | $Im(e_l)$ | $b_{0,l}b_{1,l}...b_{7,l}$ | $Re(e_l)$ | $Im(e_l)$ | $b_{0,l}b_{1,l}...b_{7,l}$ | $Re(e_l)$ | $Im(e_l)$ |
|---|---|---|---|---|---|---|---|---|---|---|---|
| 00100000 | 0.1637 | 1.6576 | 01100000 | -0.1637 | 1.6576 | 10100000 | 0.1637 | -1.6576 | 11100000 | -0.1637 | -1.6576 |
| 00100001 | 0.4837 | 1.5939 | 01100001 | -0.4837 | 1.5939 | 10100001 | 0.4837 | -1.5939 | 11100001 | -0.4837 | -1.5939 |
| 00100010 | 0.1329 | 1.3458 | 01100010 | -0.1329 | 1.3458 | 10100010 | 0.1329 | -1.3458 | 11100010 | -0.1329 | -1.3458 |
| 00100011 | 0.3927 | 1.2941 | 01100011 | -0.3927 | 1.2941 | 10100011 | 0.3927 | -1.2941 | 11100011 | -0.3927 | -1.2941 |
| 00100100 | 1.0566 | 1.2877 | 01100100 | -1.0566 | 1.2877 | 10100100 | 1.0566 | -1.2877 | 11100100 | -1.0566 | -1.2877 |
| 00100101 | 0.7853 | 1.4689 | 01100101 | -0.7853 | 1.4689 | 10100101 | 0.7853 | -1.4689 | 11100101 | -0.7853 | -1.4689 |
| 00100110 | 0.8578 | 1.0455 | 01100110 | -0.8578 | 1.0455 | 10100110 | 0.8578 | -1.0455 | 11100110 | -0.8578 | -1.0455 |
| 00100111 | 0.6376 | 1.1926 | 01100111 | -0.6376 | 1.1926 | 10100111 | 0.6376 | -1.1926 | 11100111 | -0.6376 | -1.1926 |
| 00101000 | 0.1092 | 0.9471 | 01101000 | -0.1092 | 0.9471 | 10101000 | 0.1092 | -0.9471 | 11101000 | -0.1092 | -0.9471 |
| 00101001 | 0.2620 | 0.9167 | 01101001 | -0.2620 | 0.9167 | 10101001 | 0.2620 | -0.9167 | 11101001 | -0.2620 | -0.9167 |
| 00101010 | 0.1129 | 1.1148 | 01101010 | -0.1129 | 1.1148 | 10101010 | 0.1129 | -1.1148 | 11101010 | -0.1129 | -1.1148 |
| 00101011 | 0.3227 | 1.0730 | 01101011 | -0.3227 | 1.0730 | 10101011 | 0.3227 | -1.0730 | 11101011 | -0.3227 | -1.0730 |
| 00101100 | 0.5927 | 0.7468 | 01101100 | -0.5927 | 0.7468 | 10101100 | 0.5927 | -0.7468 | 11101100 | -0.5927 | -0.7468 |
| 00101101 | 0.4632 | 0.8334 | 01101101 | -0.4632 | 0.8334 | 10101101 | 0.4632 | -0.8334 | 11101101 | -0.4632 | -0.8334 |
| 00101110 | 0.7086 | 0.8680 | 01101110 | -0.7086 | 0.8680 | 10101110 | 0.7086 | -0.8680 | 11101110 | -0.7086 | -0.8680 |
| 00101111 | 0.5307 | 0.9868 | 01101111 | -0.5307 | 0.9868 | 10101111 | 0.5307 | -0.9868 | 11101111 | -0.5307 | -0.9868 |
| 00110000 | 1.6576 | 0.1637 | 01110000 | -1.6576 | 0.1637 | 10110000 | 1.6576 | -0.1637 | 11110000 | -1.6576 | -0.1637 |
| 00110001 | 1.5939 | 0.4837 | 01110001 | -1.5939 | 0.4837 | 10110001 | 1.5939 | -0.4837 | 11110001 | -1.5939 | -0.4837 |
| 00110010 | 1.3458 | 0.1329 | 01110010 | -1.3458 | 0.1329 | 10110010 | 1.3458 | -0.1329 | 11110010 | -1.3458 | -0.1329 |
| 00110011 | 1.2941 | 0.3927 | 01110011 | -1.2941 | 0.3927 | 10110011 | 1.2941 | -0.3927 | 11110011 | -1.2941 | -0.3927 |
| 00110100 | 1.2877 | 1.0566 | 01110100 | -1.2877 | 1.0566 | 10110100 | 1.2877 | -1.0566 | 11110100 | -1.2877 | -1.0566 |
| 00110101 | 1.4689 | 0.7853 | 01110101 | -1.4689 | 0.7853 | 10110101 | 1.4689 | -0.7853 | 11110101 | -1.4689 | -0.7853 |
| 00110110 | 1.0455 | 0.8578 | 01110110 | -1.0455 | 0.8578 | 10110110 | 1.0455 | -0.8578 | 11110110 | -1.0455 | -0.8578 |
| 00110111 | 1.1926 | 0.6376 | 01110111 | -1.1926 | 0.6376 | 10110111 | 1.1926 | -0.6376 | 11110111 | -1.1926 | -0.6376 |
| 00111000 | 0.9471 | 0.1092 | 01111000 | -0.9471 | 0.1092 | 10111000 | 0.9471 | -0.1092 | 11111000 | -0.9471 | -0.1092 |
| 00111001 | 0.9167 | 0.2620 | 01111001 | -0.9167 | 0.2620 | 10111001 | 0.9167 | -0.2620 | 11111001 | -0.9167 | -0.2620 |
| 00111010 | 1.1148 | 0.1129 | 01111010 | -1.1148 | 0.1129 | 10111010 | 1.1148 | -0.1129 | 11111010 | -1.1148 | -0.1129 |
| 00111011 | 1.0730 | 0.3227 | 01111011 | -1.0730 | 0.3227 | 10111011 | 1.0730 | -0.3227 | 11111011 | -1.0730 | -0.3227 |
| 00111100 | 0.7468 | 0.5927 | 01111100 | -0.7468 | 0.5927 | 10111100 | 0.7468 | -0.5927 | 11111100 | -0.7468 | -0.5927 |
| 00111101 | 0.8334 | 0.4632 | 01111101 | -0.8334 | 0.4632 | 10111101 | 0.8334 | -0.4632 | 11111101 | -0.8334 | -0.4632 |
| 00111110 | 0.8680 | 0.7086 | 01111110 | -0.8680 | 0.7086 | 10111110 | 0.8680 | -0.7086 | 11111110 | -0.8680 | -0.7086 |
| 00111111 | 0.9868 | 0.5307 | 01111111 | -0.9868 | 0.5307 | 10111111 | 0.9868 | -0.5307 | 11111111 | -0.9868 | -0.5307 |

FIG. 87

| $b_0,b_{1,I}...b_{5,I}$ | Re($e_I$) | Im($e_I$) | $b_0,b_{1,I}...b_{5,I}$ | Re($e_I$) | Im($e_I$) | $b_0,b_{1,I}...b_{5,I}$ | Re($e_I$) | Im($e_I$) | $b_0,b_{1,I}...b_{5,I}$ | Re($e_I$) | Im($e_I$) |
|---|---|---|---|---|---|---|---|---|---|---|---|
| 000000 | 0.1305 | 0.3311 | 010000 | -0.1305 | 0.3311 | 100000 | 0.1305 | -0.3311 | 110000 | -0.1305 | -0.3311 |
| 000001 | 0.1633 | 0.3162 | 010001 | -0.1633 | 0.3162 | 100001 | 0.1633 | -0.3162 | 110001 | -0.1633 | -0.3162 |
| 000010 | 0.1622 | 0.7113 | 010010 | -0.1622 | 0.7113 | 100010 | 0.1622 | -0.7113 | 110010 | -0.1622 | -0.7113 |
| 000011 | 0.3905 | 0.6163 | 010011 | -0.3905 | 0.6163 | 100011 | 0.3905 | -0.6163 | 110011 | -0.3905 | -0.6163 |
| 000100 | 0.3311 | 0.1305 | 010100 | -0.3311 | 0.1305 | 100100 | 0.3311 | -0.1305 | 110100 | -0.3311 | -0.1305 |
| 000101 | 0.3162 | 0.1633 | 010101 | -0.3162 | 0.1633 | 100101 | 0.3162 | -0.1633 | 110101 | -0.3162 | -0.1633 |
| 000110 | 0.7113 | 0.1622 | 010110 | -0.7113 | 0.1622 | 100110 | 0.7113 | -0.1622 | 110110 | -0.7113 | -0.1622 |
| 000111 | 0.6163 | 0.3905 | 010111 | -0.6163 | 0.3905 | 100111 | 0.6163 | -0.3905 | 110111 | -0.6163 | -0.3905 |
| 001000 | 0.2909 | 1.4626 | 011000 | -0.2909 | 1.4626 | 101000 | 0.2909 | -1.4626 | 111000 | -0.2909 | -1.4626 |
| 001001 | 0.8285 | 1.2399 | 011001 | -0.8285 | 1.2399 | 101001 | 0.8285 | -1.2399 | 111001 | -0.8285 | -1.2399 |
| 001010 | 0.2062 | 1.0367 | 011010 | -0.2062 | 1.0367 | 101010 | 0.2062 | -1.0367 | 111010 | -0.2062 | -1.0367 |
| 001011 | 0.5872 | 0.8789 | 011011 | -0.5872 | 0.8789 | 101011 | 0.5872 | -0.8789 | 111011 | -0.5872 | -0.8789 |
| 001100 | 1.4626 | 0.2909 | 011100 | -1.4626 | 0.2909 | 101100 | 1.4626 | -0.2909 | 111100 | -1.4626 | -0.2909 |
| 001101 | 1.2399 | 0.8285 | 011101 | -1.2399 | 0.8285 | 101101 | 1.2399 | -0.8285 | 111101 | -1.2399 | -0.8285 |
| 001110 | 1.0367 | 0.2062 | 011110 | -1.0367 | 0.2062 | 101110 | 1.0367 | -0.2062 | 111110 | -1.0367 | -0.2062 |
| 001111 | 0.8789 | 0.5872 | 011111 | -0.8789 | 0.5872 | 101111 | 0.8789 | -0.5872 | 111111 | -0.8789 | -0.5872 |

FIG. 89

| $d_{0,l}d_{1,l}...d_{7,l}$ | Re($e_l$) | Im($e_l$) | $d_{0,l}d_{1,l}...d_{7,l}$ | Re($e_l$) | Im($e_l$) | $d_{0,l}d_{1,l}...d_{7,l}$ | Re($e_l$) | Im($e_l$) | $d_{0,l}d_{1,l}...d_{7,l}$ | Re($e_l$) | Im($e_l$) |
|---|---|---|---|---|---|---|---|---|---|---|---|
| 00000000 | 0.0759 | 0.2200 | 01000000 | -0.0759 | 0.2200 | 10000000 | 0.0759 | -0.2200 | 11000000 | -0.0759 | -0.2200 |
| 00000001 | 0.0761 | 0.2199 | 01000001 | -0.0761 | 0.2199 | 10000001 | 0.0761 | -0.2199 | 11000001 | -0.0761 | -0.2199 |
| 00000010 | 0.0853 | 0.4476 | 01000010 | -0.0853 | 0.4476 | 10000010 | 0.0853 | -0.4476 | 11000010 | -0.0853 | -0.4476 |
| 00000011 | 0.1028 | 0.4439 | 01000011 | -0.1028 | 0.4439 | 10000011 | 0.1028 | -0.4439 | 11000011 | -0.1028 | -0.4439 |
| 00000100 | 0.1049 | 0.2077 | 01000100 | -0.1049 | 0.2077 | 10000100 | 0.1049 | -0.2077 | 11000100 | -0.1049 | -0.2077 |
| 00000101 | 0.1047 | 0.2078 | 01000101 | -0.1047 | 0.2078 | 10000101 | 0.1047 | -0.2078 | 11000101 | -0.1047 | -0.2078 |
| 00000110 | 0.2562 | 0.3768 | 01000110 | -0.2562 | 0.3768 | 10000110 | 0.2562 | -0.3768 | 11000110 | -0.2562 | -0.3768 |
| 00000111 | 0.2412 | 0.3865 | 01000111 | -0.2412 | 0.3865 | 10000111 | 0.2412 | -0.3865 | 11000111 | -0.2412 | -0.3865 |
| 00001000 | 0.0862 | 0.7899 | 01001000 | -0.0862 | 0.7899 | 10001000 | 0.0862 | -0.7899 | 11001000 | -0.0862 | -0.7899 |
| 00001001 | 0.2230 | 0.7627 | 01001001 | -0.2230 | 0.7627 | 10001001 | 0.2230 | -0.7627 | 11001001 | -0.2230 | -0.7627 |
| 00001010 | 0.0869 | 0.6236 | 01001010 | -0.0869 | 0.6236 | 10001010 | 0.0869 | -0.6236 | 11001010 | -0.0869 | -0.6236 |
| 00001011 | 0.1587 | 0.6093 | 01001011 | -0.1587 | 0.6093 | 10001011 | 0.1587 | -0.6093 | 11001011 | -0.1587 | -0.6093 |
| 00001100 | 0.4978 | 0.6194 | 01001100 | -0.4978 | 0.6194 | 10001100 | 0.4978 | -0.6194 | 11001100 | -0.4978 | -0.6194 |
| 00001101 | 0.3817 | 0.6969 | 01001101 | -0.3817 | 0.6969 | 10001101 | 0.3817 | -0.6969 | 11001101 | -0.3817 | -0.6969 |
| 00001110 | 0.3797 | 0.5023 | 01001110 | -0.3797 | 0.5023 | 10001110 | 0.3797 | -0.5023 | 11001110 | -0.3797 | -0.5023 |
| 00001111 | 0.3188 | 0.5430 | 01001111 | -0.3188 | 0.5430 | 10001111 | 0.3188 | -0.5430 | 11001111 | -0.3188 | -0.5430 |
| 00010000 | 0.2200 | 0.0759 | 01010000 | -0.2200 | 0.0759 | 10010000 | 0.2200 | -0.0759 | 11010000 | -0.2200 | -0.0759 |
| 00010001 | 0.2199 | 0.0761 | 01010001 | -0.2199 | 0.0761 | 10010001 | 0.2199 | -0.0761 | 11010001 | -0.2199 | -0.0761 |
| 00010010 | 0.4476 | 0.0853 | 01010010 | -0.4476 | 0.0853 | 10010010 | 0.4476 | -0.0853 | 11010010 | -0.4476 | -0.0853 |
| 00010011 | 0.4439 | 0.1028 | 01010011 | -0.4439 | 0.1028 | 10010011 | 0.4439 | -0.1028 | 11010011 | -0.4439 | -0.1028 |
| 00010100 | 0.2077 | 0.1049 | 01010100 | -0.2077 | 0.1049 | 10010100 | 0.2077 | -0.1049 | 11010100 | -0.2077 | -0.1049 |
| 00010101 | 0.2078 | 0.1047 | 01010101 | -0.2078 | 0.1047 | 10010101 | 0.2078 | -0.1047 | 11010101 | -0.2078 | -0.1047 |
| 00010110 | 0.3768 | 0.2562 | 01010110 | -0.3768 | 0.2562 | 10010110 | 0.3768 | -0.2562 | 11010110 | -0.3768 | -0.2562 |
| 00010111 | 0.3865 | 0.2412 | 01010111 | -0.3865 | 0.2412 | 10010111 | 0.3865 | -0.2412 | 11010111 | -0.3865 | -0.2412 |
| 00011000 | 0.7899 | 0.0862 | 01011000 | -0.7899 | 0.0862 | 10011000 | 0.7899 | -0.0862 | 11011000 | -0.7899 | -0.0862 |
| 00011001 | 0.7627 | 0.2230 | 01011001 | -0.7627 | 0.2230 | 10011001 | 0.7627 | -0.2230 | 11011001 | -0.7627 | -0.2230 |
| 00011010 | 0.6236 | 0.0869 | 01011010 | -0.6236 | 0.0869 | 10011010 | 0.6236 | -0.0869 | 11011010 | -0.6236 | -0.0869 |
| 00011011 | 0.6093 | 0.1587 | 01011011 | -0.6093 | 0.1587 | 10011011 | 0.6093 | -0.1587 | 11011011 | -0.6093 | -0.1587 |
| 00011100 | 0.6194 | 0.4978 | 01011100 | -0.6194 | 0.4978 | 10011100 | 0.6194 | -0.4978 | 11011100 | -0.6194 | -0.4978 |
| 00011101 | 0.6969 | 0.3817 | 01011101 | -0.6969 | 0.3817 | 10011101 | 0.6969 | -0.3817 | 11011101 | -0.6969 | -0.3817 |
| 00011110 | 0.5023 | 0.3797 | 01011110 | -0.5023 | 0.3797 | 10011110 | 0.5023 | -0.3797 | 11011110 | -0.5023 | -0.3797 |
| 00011111 | 0.5430 | 0.3188 | 01011111 | -0.5430 | 0.3188 | 10011111 | 0.5430 | -0.3188 | 11011111 | -0.5430 | -0.3188 |

FIG. 90

| $d_{0,l}d_{1,l}...d_{7,l}$ | Re($e_l$) | Im($e_l$) | $d_{0,l}d_{1,l}...d_{7,l}$ | Re($e_l$) | Im($e_l$) | $d_{0,l}d_{1,l}...d_{7,l}$ | Re($e_l$) | Im($e_l$) | $d_{0,l}d_{1,l}...d_{7,l}$ | Re($e_l$) | Im($e_l$) |
|---|---|---|---|---|---|---|---|---|---|---|---|
| 00100000 | 0.1604 | 1.6238 | 01100000 | -0.1604 | 1.6238 | 10100000 | 0.1604 | -1.6238 | 11100000 | -0.1604 | -1.6238 |
| 00100001 | 0.4738 | 1.5614 | 01100001 | -0.4738 | 1.5614 | 10100001 | 0.4738 | -1.5614 | 11100001 | -0.4738 | -1.5614 |
| 00100010 | 0.1330 | 1.3468 | 01100010 | -0.1330 | 1.3468 | 10100010 | 0.1330 | -1.3468 | 11100010 | -0.1330 | -1.3468 |
| 00100011 | 0.3930 | 1.2951 | 01100011 | -0.3930 | 1.2951 | 10100011 | 0.3930 | -1.2951 | 11100011 | -0.3930 | -1.2951 |
| 00100100 | 1.0350 | 1.2614 | 01100100 | -1.0350 | 1.2614 | 10100100 | 1.0350 | -1.2614 | 11100100 | -1.0350 | -1.2614 |
| 00100101 | 0.7693 | 1.4390 | 01100101 | -0.7693 | 1.4390 | 10100101 | 0.7693 | -1.4390 | 11100101 | -0.7693 | -1.4390 |
| 00100110 | 0.8585 | 1.0462 | 01100110 | -0.8585 | 1.0462 | 10100110 | 0.8585 | -1.0462 | 11100110 | -0.8585 | -1.0462 |
| 00100111 | 0.6381 | 1.1935 | 01100111 | -0.6381 | 1.1935 | 10100111 | 0.6381 | -1.1935 | 11100111 | -0.6381 | -1.1935 |
| 00101000 | 0.0945 | 0.9550 | 01101000 | -0.0945 | 0.9550 | 10101000 | 0.0945 | -0.9550 | 11101000 | -0.0945 | -0.9550 |
| 00101001 | 0.2785 | 0.9184 | 01101001 | -0.2785 | 0.9184 | 10101001 | 0.2785 | -0.9184 | 11101001 | -0.2785 | -0.9184 |
| 00101010 | 0.1119 | 1.1326 | 01101010 | -0.1119 | 1.1326 | 10101010 | 0.1119 | -1.1326 | 11101010 | -0.1119 | -1.1326 |
| 00101011 | 0.3305 | 1.0891 | 01101011 | -0.3305 | 1.0891 | 10101011 | 0.3305 | -1.0891 | 11101011 | -0.3305 | -1.0891 |
| 00101100 | 0.6086 | 0.7420 | 01101100 | -0.6086 | 0.7420 | 10101100 | 0.6086 | -0.7420 | 11101100 | -0.6086 | -0.7420 |
| 00101101 | 0.4526 | 0.8462 | 01101101 | -0.4526 | 0.8462 | 10101101 | 0.4526 | -0.8462 | 11101101 | -0.4526 | -0.8462 |
| 00101110 | 0.7219 | 0.8799 | 01101110 | -0.7219 | 0.8799 | 10101110 | 0.7219 | -0.8799 | 11101110 | -0.7219 | -0.8799 |
| 00101111 | 0.5366 | 1.0037 | 01101111 | -0.5366 | 1.0037 | 10101111 | 0.5366 | -1.0037 | 11101111 | -0.5366 | -1.0037 |
| 00110000 | 1.6238 | 0.1604 | 01110000 | -1.6238 | 0.1604 | 10110000 | 1.6238 | -0.1604 | 11110000 | -1.6238 | -0.1604 |
| 00110001 | 1.5614 | 0.4738 | 01110001 | -1.5614 | 0.4738 | 10110001 | 1.5614 | -0.4738 | 11110001 | -1.5614 | -0.4738 |
| 00110010 | 1.3468 | 0.1330 | 01110010 | -1.3468 | 0.1330 | 10110010 | 1.3468 | -0.1330 | 11110010 | -1.3468 | -0.1330 |
| 00110011 | 1.2951 | 0.3930 | 01110011 | -1.2951 | 0.3930 | 10110011 | 1.2951 | -0.3930 | 11110011 | -1.2951 | -0.3930 |
| 00110100 | 1.2614 | 1.0350 | 01110100 | -1.2614 | 1.0350 | 10110100 | 1.2614 | -1.0350 | 11110100 | -1.2614 | -1.0350 |
| 00110101 | 1.4390 | 0.7693 | 01110101 | -1.4390 | 0.7693 | 10110101 | 1.4390 | -0.7693 | 11110101 | -1.4390 | -0.7693 |
| 00110110 | 1.0462 | 0.8585 | 01110110 | -1.0462 | 0.8585 | 10110110 | 1.0462 | -0.8585 | 11110110 | -1.0462 | -0.8585 |
| 00110111 | 1.1935 | 0.6381 | 01110111 | -1.1935 | 0.6381 | 10110111 | 1.1935 | -0.6381 | 11110111 | -1.1935 | -0.6381 |
| 00111000 | 0.9550 | 0.0945 | 01111000 | -0.9550 | 0.0945 | 10111000 | 0.9550 | -0.0945 | 11111000 | -0.9550 | -0.0945 |
| 00111001 | 0.9184 | 0.2785 | 01111001 | -0.9184 | 0.2785 | 10111001 | 0.9184 | -0.2785 | 11111001 | -0.9184 | -0.2785 |
| 00111010 | 1.1326 | 0.1119 | 01111010 | -1.1326 | 0.1119 | 10111010 | 1.1326 | -0.1119 | 11111010 | -1.1326 | -0.1119 |
| 00111011 | 1.0891 | 0.3305 | 01111011 | -1.0891 | 0.3305 | 10111011 | 1.0891 | -0.3305 | 11111011 | -1.0891 | -0.3305 |
| 00111100 | 0.7420 | 0.6086 | 01111100 | -0.7420 | 0.6086 | 10111100 | 0.7420 | -0.6086 | 11111100 | -0.7420 | -0.6086 |
| 00111101 | 0.8462 | 0.4526 | 01111101 | -0.8462 | 0.4526 | 10111101 | 0.8462 | -0.4526 | 11111101 | -0.8462 | -0.4526 |
| 00111110 | 0.8799 | 0.7219 | 01111110 | -0.8799 | 0.7219 | 10111110 | 0.8799 | -0.7219 | 11111110 | -0.8799 | -0.7219 |
| 00111111 | 1.0037 | 0.5366 | 01111111 | -1.0037 | 0.5366 | 10111111 | 1.0037 | -0.5366 | 11111111 | -1.0037 | -0.5366 |

FIG. 91

$$s_{0,i} + s_{0,j} = a \ldots (1)$$

$$|s_{0,i}|^2 + |s_{0,i}|^2 = b \ldots (2)$$

$$s_{0,i} \triangleq s_{0,i,x} + js_{0,i,y}, a \triangleq a_x + ja_y \ldots (3)$$

$$\left(s_{0,i,x} - \frac{a_x}{2}\right)^2 + \left(s_{0,i,y} - \frac{a_y}{2}\right)^2 = \frac{b}{2} - \frac{|a|^2}{4} \ldots (4)$$

$$s_{0,i} = \frac{a}{2} + re^{j\theta}, s_{0,j} = \frac{a}{2} - re^{j\theta} \quad r = \sqrt{\frac{b}{2} - \frac{|a|^2}{4}}, \theta \in \{0,\ldots,2\pi\} \ldots (5)$$

$$s_{1,i} = s_{0,i} \cdot e^{j\frac{\pi}{2}}, s_{1,j} = s_{0,j} \cdot e^{j\frac{\pi}{2}} \quad s_{2,i} = s_{0,i} \cdot e^{j\frac{2\pi}{2}}, s_{2,j} = s_{0,j} \cdot e^{j\frac{2\pi}{2}} \quad s_{3,i} = s_{0,i} \cdot e^{j\frac{3\pi}{2}}, s_{3,j} = s_{0,j} \cdot e^{j\frac{3\pi}{2}} \ldots (6)$$

FIG. 92

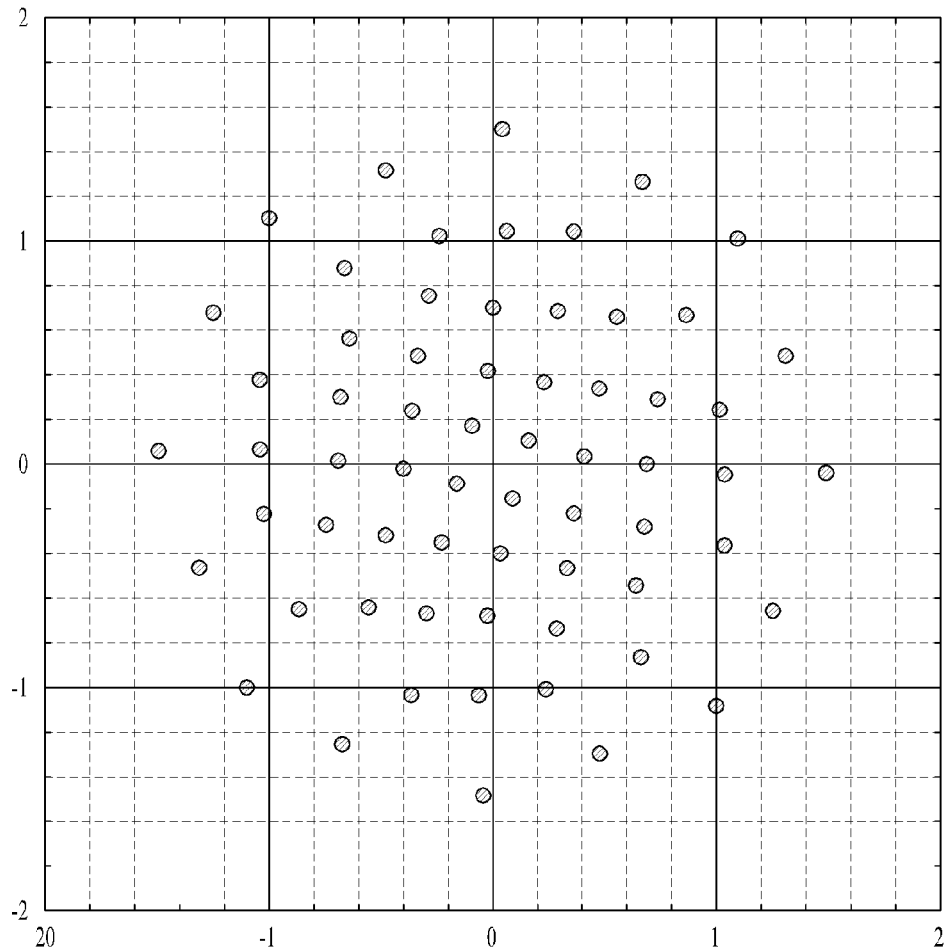

| $d\ d_1,...d_{5,l}$ | Re($e_l$) | Im($e_l$) | $d_0,d_1,...d_{5,l}$ | Re($e_l$) | Im($e_l$) | $d_0,d_1,...d_{5,l}$ | Re($e_l$) | Im($e_l$) | $d_0,d_1,...d_{5,l}$ | Re($e_l$) | Im($e_l$) |
|---|---|---|---|---|---|---|---|---|---|---|---|
| 000000 | 0.1305 | 0.3311 | 010000 | -0.1305 | 0.3311 | 100000 | 0.1305 | -0.3311 | 110000 | -0.1305 | -0.3311 |
| 000001 | 0.1633 | 0.3162 | 010001 | -0.1633 | 0.3162 | 100001 | 0.1633 | -0.3162 | 110001 | -0.1633 | -0.3162 |
| 000010 | 0.1622 | 0.7113 | 010010 | -0.1622 | 0.7113 | 100010 | 0.1622 | -0.7113 | 110010 | -0.1622 | -0.7113 |
| 000011 | 0.3905 | 0.6163 | 010011 | -0.3905 | 0.6163 | 100011 | 0.3905 | -0.6163 | 110011 | -0.3905 | -0.6163 |
| 000100 | 0.3311 | 0.1305 | 010100 | -0.3311 | 0.1305 | 100100 | 0.3311 | -0.1305 | 110100 | -0.3311 | -0.1305 |
| 000101 | 0.3162 | 0.1633 | 010101 | -0.3162 | 0.1633 | 100101 | 0.3162 | -0.1633 | 110101 | -0.3162 | -0.1633 |
| 000110 | 0.7113 | 0.1622 | 010110 | -0.7113 | 0.1622 | 100110 | 0.7113 | -0.1622 | 110110 | -0.7113 | -0.1622 |
| 000111 | 0.6163 | 0.3905 | 010111 | -0.6163 | 0.3905 | 100111 | 0.6163 | -0.3905 | 110111 | -0.6163 | -0.3905 |
| 001000 | 0.2909 | 1.4626 | 011000 | -0.2909 | 1.4626 | 101000 | 0.2909 | -1.4626 | 111000 | -0.2909 | -1.4626 |
| 001001 | 0.8285 | 1.2399 | 011001 | -0.8285 | 1.2399 | 101001 | 0.8285 | -1.2399 | 111001 | -0.8285 | -1.2399 |
| 001010 | 0.2062 | 1.0367 | 011010 | -0.2062 | 1.0367 | 101010 | 0.2062 | -1.0367 | 111010 | -0.2062 | -1.0367 |
| 001011 | 0.5872 | 0.8789 | 011011 | -0.5872 | 0.8789 | 101011 | 0.5872 | -0.8789 | 111011 | -0.5872 | -0.8789 |
| 001100 | 1.4626 | 0.2909 | 011100 | -1.4626 | 0.2909 | 101100 | 1.4626 | -0.2909 | 111100 | -1.4626 | -0.2909 |
| 001101 | 1.2399 | 0.8285 | 011101 | -1.2399 | 0.8285 | 101101 | 1.2399 | -0.8285 | 111101 | -1.2399 | -0.8285 |
| 001110 | 1.0367 | 0.2062 | 011110 | -1.0367 | 0.2062 | 101110 | 1.0367 | -0.2062 | 111110 | -1.0367 | -0.2062 |
| 001111 | 0.8789 | 0.5872 | 011111 | -0.8789 | 0.5872 | 101111 | 0.8789 | -0.5872 | 111111 | -0.8789 | -0.5872 |

| $d_0,d_{1,l},...d_{5,l}$ | Re($e_i$) | Im($e_i$) | $d_0,d_{1,l},...d_{5,l}$ | Re($e_i$) | Im($e_i$) | $d_0,d_{1,l},...d_{5,l}$ | Re($e_i$) | Im($e_i$) | $d_0,d_{1,l},...d_{5,l}$ | Re($e_i$) | Im($e_i$) |
|---|---|---|---|---|---|---|---|---|---|---|---|
| 000000 | 0.1177 | 0.1729 | 010000 | -0.1177 | 0.1729 | 100000 | 0.1177 | -0.1729 | 110000 | -0.1177 | -0.1729 |
| 000001 | 0.1601 | 0.3212 | 010001 | -0.1601 | 0.3212 | 100001 | 0.1601 | -0.3212 | 110001 | -0.1601 | -0.3212 |
| 000010 | 0.1352 | 0.7279 | 010010 | -0.1352 | 0.7279 | 100010 | 0.1352 | -0.7279 | 110010 | -0.1352 | -0.7279 |
| 000011 | 0.3246 | 0.6148 | 010011 | -0.3246 | 0.6148 | 100011 | 0.3246 | -0.6148 | 110011 | -0.3246 | -0.6148 |
| 000100 | 0.4192 | 0.1179 | 010100 | -0.4192 | 0.1179 | 100100 | 0.4192 | -0.1179 | 110100 | -0.4192 | -0.1179 |
| 000101 | 0.4033 | 0.2421 | 010101 | -0.4033 | 0.2421 | 100101 | 0.4033 | -0.2421 | 110101 | -0.4033 | -0.2421 |
| 000110 | 0.7524 | 0.1581 | 010110 | -0.7524 | 0.1581 | 100110 | 0.7524 | -0.1581 | 110110 | -0.7524 | -0.1581 |
| 000111 | 0.5996 | 0.4330 | 010111 | -0.5996 | 0.4330 | 100111 | 0.5996 | -0.4330 | 110111 | -0.5996 | -0.4330 |
| 001000 | 0.2902 | 1.4611 | 011000 | -0.2902 | 1.4611 | 101000 | 0.2902 | -1.4611 | 111000 | -0.2902 | -1.4611 |
| 001001 | 0.8180 | 1.2291 | 011001 | -0.8180 | 1.2291 | 101001 | 0.8180 | -1.2291 | 111001 | -0.8180 | -1.2291 |
| 001010 | 0.2036 | 1.0575 | 011010 | -0.2036 | 1.0575 | 101010 | 0.2036 | -1.0575 | 111010 | -0.2036 | -1.0575 |
| 001011 | 0.5641 | 0.8965 | 011011 | -0.5641 | 0.8965 | 101011 | 0.5641 | -0.8965 | 111011 | -0.5641 | -0.8965 |
| 001100 | 1.4453 | 0.2907 | 011100 | -1.4453 | 0.2907 | 101100 | 1.4453 | -0.2907 | 111100 | -1.4453 | -0.2907 |
| 001101 | 1.2157 | 0.8186 | 011101 | -1.2157 | 0.8186 | 101101 | 1.2157 | -0.8186 | 111101 | -1.2157 | -0.8186 |
| 001110 | 1.0447 | 0.2242 | 011110 | -1.0447 | 0.2242 | 101110 | 1.0447 | -0.2242 | 111110 | -1.0447 | -0.2242 |
| 001111 | 0.8497 | 0.6176 | 011111 | -0.8497 | 0.6176 | 101111 | 0.8497 | 0.6176 | 111111 | 0.8497 | 0.6176 |

FIG. 96

| $d_0,d_1,...d_{7I}$ | Re($e_I$) | Im($e_I$) | $d_0,d_1,...d_{7I}$ | Re($e_I$) | Im($e_I$) | $d_0,d_1,...d_{7I}$ | Re($e_I$) | Im($e_I$) | $d_0,d_1,...d_{7I}$ | Re($e_I$) | Im($e_I$) |
|---|---|---|---|---|---|---|---|---|---|---|---|
| 00000000 | 0.0759 | 0.2200 | 01000000 | -0.0759 | 0.2200 | 10000000 | 0.0759 | -0.2200 | 11000000 | -0.0759 | -0.2200 |
| 00000001 | 0.0761 | 0.2199 | 01000001 | -0.0761 | 0.2199 | 10000001 | 0.0761 | -0.2199 | 11000001 | -0.0761 | -0.2199 |
| 00000010 | 0.0853 | 0.4476 | 01000010 | -0.0853 | 0.4476 | 10000010 | 0.0853 | -0.4476 | 11000010 | -0.0853 | -0.4476 |
| 00000011 | 0.1028 | 0.4439 | 01000011 | -0.1028 | 0.4439 | 10000011 | 0.1028 | -0.4439 | 11000011 | -0.1028 | -0.4439 |
| 00000100 | 0.1049 | 0.2077 | 01000100 | -0.1049 | 0.2077 | 10000100 | 0.1049 | -0.2077 | 11000100 | -0.1049 | -0.2077 |
| 00000101 | 0.1047 | 0.2078 | 01000101 | -0.1047 | 0.2078 | 10000101 | 0.1047 | -0.2078 | 11000101 | -0.1047 | -0.2078 |
| 00000110 | 0.2562 | 0.3768 | 01000110 | -0.2562 | 0.3768 | 10000110 | 0.2562 | -0.3768 | 11000110 | -0.2562 | -0.3768 |
| 00000111 | 0.2412 | 0.3865 | 01000111 | -0.2412 | 0.3865 | 10000111 | 0.2412 | -0.3865 | 11000111 | -0.2412 | -0.3865 |
| 00001000 | 0.0862 | 0.7899 | 01001000 | -0.0862 | 0.7899 | 10001000 | 0.0862 | -0.7899 | 11001000 | -0.0862 | -0.7899 |
| 00001001 | 0.2230 | 0.7627 | 01001001 | -0.2230 | 0.7627 | 10001001 | 0.2230 | -0.7627 | 11001001 | -0.2230 | -0.7627 |
| 00001010 | 0.0869 | 0.6236 | 01001010 | -0.0869 | 0.6236 | 10001010 | 0.0869 | -0.6236 | 11001010 | -0.0869 | -0.6236 |
| 00001011 | 0.1587 | 0.6093 | 01001011 | -0.1587 | 0.6093 | 10001011 | 0.1587 | -0.6093 | 11001011 | -0.1587 | -0.6093 |
| 00001100 | 0.4978 | 0.6194 | 01001100 | -0.4978 | 0.6194 | 10001100 | 0.4978 | -0.6194 | 11001100 | -0.4978 | -0.6194 |
| 00001101 | 0.3817 | 0.6969 | 01001101 | -0.3817 | 0.6969 | 10001101 | 0.3817 | -0.6969 | 11001101 | -0.3817 | -0.6969 |
| 00001110 | 0.3797 | 0.5023 | 01001110 | -0.3797 | 0.5023 | 10001110 | 0.3797 | -0.5023 | 11001110 | -0.3797 | -0.5023 |
| 00001111 | 0.3188 | 0.5430 | 01001111 | -0.3188 | 0.5430 | 10001111 | 0.3188 | -0.5430 | 11001111 | -0.3188 | -0.5430 |
| 00010000 | 0.2200 | 0.0759 | 01010000 | -0.2200 | 0.0759 | 10010000 | 0.2200 | -0.0759 | 11010000 | -0.2200 | -0.0759 |
| 00010001 | 0.2199 | 0.0761 | 01010001 | -0.2199 | 0.0761 | 10010001 | 0.2199 | -0.0761 | 11010001 | -0.2199 | -0.0761 |
| 00010010 | 0.4476 | 0.0853 | 01010010 | -0.4476 | 0.0853 | 10010010 | 0.4476 | -0.0853 | 11010010 | -0.4476 | -0.0853 |

FIG. 97

| $d_0,d_1,...d_{7J}$ | Re($e_J$) | Im($e_J$) | $d_0,d_1,...d_{7J}$ | Re($e_J$) | Im($e_J$) | $d_0,d_1,...d_{7J}$ | Re($e_J$) | Im($e_J$) | $d_0,d_1,...d_{7J}$ | Re($e_J$) | Im($e_J$) |
|---|---|---|---|---|---|---|---|---|---|---|---|
| 00010011 | 0.4439 | 0.1028 | 01010011 | -0.4439 | 0.1028 | 10010011 | 0.4439 | -0.1028 | 11010011 | -0.4439 | -0.1028 |
| 00010100 | 0.2077 | 0.1049 | 01010100 | -0.2077 | 0.1049 | 10010100 | 0.2077 | -0.1049 | 11010100 | -0.2077 | -0.1049 |
| 00010101 | 0.2078 | 0.1047 | 01010101 | -0.2078 | 0.1047 | 10010101 | 0.2078 | -0.1047 | 11010101 | -0.2078 | -0.1047 |
| 00010110 | 0.3768 | 0.2562 | 01010110 | -0.3768 | 0.2562 | 10010110 | 0.3768 | -0.2562 | 11010110 | -0.3768 | -0.2562 |
| 00010111 | 0.3865 | 0.2412 | 01010111 | -0.3865 | 0.2412 | 10010111 | 0.3865 | -0.2412 | 11010111 | -0.3865 | -0.2412 |
| 00011000 | 0.7899 | 0.0862 | 01011000 | -0.7899 | 0.0862 | 10011000 | 0.7899 | -0.0862 | 11011000 | -0.7899 | -0.0862 |
| 00011001 | 0.7627 | 0.2230 | 01011001 | -0.7627 | 0.2230 | 10011001 | 0.7627 | -0.2230 | 11011001 | -0.7627 | -0.2230 |
| 00011010 | 0.6236 | 0.0869 | 01011010 | -0.6236 | 0.0869 | 10011010 | 0.6236 | -0.0869 | 11011010 | -0.6236 | -0.0869 |
| 00011011 | 0.6093 | 0.1587 | 01011011 | -0.6093 | 0.1587 | 10011011 | 0.6093 | -0.1587 | 11011011 | -0.6093 | -0.1587 |
| 00011100 | 0.6194 | 0.4978 | 01011100 | -0.6194 | 0.4978 | 10011100 | 0.6194 | -0.4978 | 11011100 | -0.6194 | -0.4978 |
| 00011101 | 0.6969 | 0.3817 | 01011101 | -0.6969 | 0.3817 | 10011101 | 0.6969 | -0.3817 | 11011101 | -0.6969 | -0.3817 |
| 00011110 | 0.5023 | 0.3797 | 01011110 | -0.5023 | 0.3797 | 10011110 | 0.5023 | -0.3797 | 11011110 | -0.5023 | -0.3797 |
| 00011111 | 0.5430 | 0.3188 | 01011111 | -0.5430 | 0.3188 | 10011111 | 0.5430 | -0.3188 | 11011111 | -0.5430 | -0.3188 |
| 00100000 | 0.1604 | 1.6238 | 01100000 | -0.1604 | 1.6238 | 10100000 | 0.1604 | -1.6238 | 11100000 | -0.1604 | -1.6238 |
| 00100001 | 0.4738 | 1.5614 | 01100001 | -0.4738 | 1.5614 | 10100001 | 0.4738 | -1.5614 | 11100001 | -0.4738 | -1.5614 |
| 00100010 | 0.1330 | 1.3468 | 01100010 | -0.1330 | 1.3468 | 10100010 | 0.1330 | -1.3468 | 11100010 | -0.1330 | -1.3468 |
| 00100011 | 0.3930 | 1.2951 | 01100011 | -0.3930 | 1.2951 | 10100011 | 0.3930 | -1.2951 | 11100011 | -0.3930 | -1.2951 |
| 00100100 | 1.0350 | 1.2614 | 01100100 | -1.0350 | 1.2614 | 10100100 | 1.0350 | -1.2614 | 11100100 | -1.0350 | -1.2614 |
| 00100101 | 0.7693 | 1.4390 | 01100101 | -0.7693 | 1.4390 | 10100101 | 0.7693 | -1.4390 | 11100101 | -0.7693 | -1.4390 |
| 00100110 | 0.8585 | 1.0462 | 01100110 | -0.8585 | 1.0462 | 10100110 | 0.8585 | -1.0462 | 11100110 | -0.8585 | -1.0462 |
| 00100111 | 0.6381 | 1.1935 | 01100111 | -0.6381 | 1.1935 | 10100111 | 0.6381 | -1.1935 | 11100111 | -0.6381 | -1.1935 |
| 00101000 | 0.0945 | 0.9550 | 01101000 | -0.0945 | 0.9550 | 10101000 | 0.0945 | -0.9550 | 11101000 | -0.0945 | -0.9550 |

FIG. 98

| $d_0,d_1,...d_{7l}$ | Re($e_l$) | Im($e_l$) | $d_0,d_1,...d_{7l}$ | Re($e_l$) | Im($e_l$) | $d_0,d_1,...d_{7l}$ | Re($e_l$) | Im($e_l$) | $d_0,d_1,...d_{7l}$ | Re($e_l$) | Im($e_l$) |
|---|---|---|---|---|---|---|---|---|---|---|---|
| 00101001 | 0.2785 | 0.9184 | 01101001 | -0.2785 | 0.9184 | 10101001 | 0.2785 | -0.9184 | 11101001 | -0.2785 | -0.9184 |
| 00101010 | 0.1119 | 1.1326 | 01101010 | -0.1119 | 1.1326 | 10101010 | 0.1119 | -1.1326 | 11101010 | -0.1119 | -1.1326 |
| 00101011 | 0.3305 | 1.0891 | 01101011 | -0.3305 | 1.0891 | 10101011 | 0.3305 | -1.0891 | 11101011 | -0.3305 | -1.0891 |
| 00101100 | 0.6086 | 0.7420 | 01101100 | -0.6086 | 0.7420 | 10101100 | 0.6086 | -0.7420 | 11101100 | -0.6086 | -0.7420 |
| 00101101 | 0.4526 | 0.8462 | 01101101 | -0.4526 | 0.8462 | 10101101 | 0.4526 | -0.8462 | 11101101 | -0.4526 | -0.8462 |
| 00101110 | 0.7219 | 0.8799 | 01101110 | -0.7219 | 0.8799 | 10101110 | 0.7219 | -0.8799 | 11101110 | -0.7219 | -0.8799 |
| 00101111 | 0.5366 | 1.0037 | 01101111 | -0.5366 | 1.0037 | 10101111 | 0.5366 | -1.0037 | 11101111 | -0.5366 | -1.0037 |
| 00110000 | 1.6238 | 0.1604 | 01110000 | -1.6238 | 0.1604 | 10110000 | 1.6238 | -0.1604 | 11110000 | -1.6238 | -0.1604 |
| 00110001 | 1.5614 | 0.4738 | 01110001 | -1.5614 | 0.4738 | 10110001 | 1.5614 | -0.4738 | 11110001 | -1.5614 | -0.4738 |
| 00110010 | 1.3468 | 0.1330 | 01110010 | -1.3468 | 0.1330 | 10110010 | 1.3468 | -0.1330 | 11110010 | -1.3468 | -0.1330 |
| 00110011 | 1.2951 | 0.3930 | 01110011 | -1.2951 | 0.3930 | 10110011 | 1.2951 | -0.3930 | 11110011 | -1.2951 | -0.3930 |
| 00110100 | 1.2614 | 1.0350 | 01110100 | -1.2614 | 1.0350 | 10110100 | 1.2614 | -1.0350 | 11110100 | -1.2614 | -1.0350 |
| 00110101 | 1.4390 | 0.7693 | 01110101 | -1.4390 | 0.7693 | 10110101 | 1.4390 | -0.7693 | 11110101 | -1.4390 | -0.7693 |
| 00110110 | 1.0462 | 0.8585 | 01110110 | -1.0462 | 0.8585 | 10110110 | 1.0462 | -0.8585 | 11110110 | -1.0462 | -0.8585 |
| 00110111 | 1.1935 | 0.6381 | 01110111 | -1.1935 | 0.6381 | 10110111 | 1.1935 | -0.6381 | 11110111 | -1.1935 | -0.6381 |
| 00111000 | 0.9550 | 0.0945 | 01111000 | -0.9550 | 0.0945 | 10111000 | 0.9550 | -0.0945 | 11111000 | -0.9550 | -0.0945 |
| 00111001 | 0.9184 | 0.2785 | 01111001 | -0.9184 | 0.2785 | 10111001 | 0.9184 | -0.2785 | 11111001 | -0.9184 | -0.2785 |
| 00111010 | 1.1326 | 0.1119 | 01111010 | -1.1326 | 0.1119 | 10111010 | 1.1326 | -0.1119 | 11111010 | -1.1326 | -0.1119 |
| 00111011 | 1.0891 | 0.3305 | 01111011 | -1.0891 | 0.3305 | 10111011 | 1.0891 | -0.3305 | 11111011 | -1.0891 | -0.3305 |
| 00111100 | 0.7420 | 0.6086 | 01111100 | -0.7420 | 0.6086 | 10111100 | 0.7420 | -0.6086 | 11111100 | -0.7420 | -0.6086 |
| 00111101 | 0.8462 | 0.4526 | 01111101 | -0.8462 | 0.4526 | 10111101 | 0.8462 | -0.4526 | 11111101 | -0.8462 | -0.4526 |
| 00111110 | 0.8799 | 0.7219 | 01111110 | -0.8799 | 0.7219 | 10111110 | 0.8799 | -0.7219 | 11111110 | -0.8799 | -0.7219 |
| 00111111 | 1.0037 | 0.5366 | 01111111 | -1.0037 | 0.5366 | 10111111 | 1.0037 | -0.5366 | 11111111 | -1.0037 | -0.5366 |

FIG. 100

| $d_0,d_1,...d_{71}$ | Re($e_l$) | Im($e_l$) | $d_0,d_1,...d_{71}$ | Re($e_l$) | Im($e_l$) | $d_0,d_1,...d_{71}$ | Re($e_l$) | Im($e_l$) | $d_0,d_1,...d_{71}$ | Re($e_l$) | Im($e_l$) |
|---|---|---|---|---|---|---|---|---|---|---|---|
| 00000000 | 0.0754 | 0.2310 | 01000000 | -0.0754 | 0.2310 | 10000000 | 0.0754 | -0.2310 | 11000000 | -0.0754 | -0.2310 |
| 00000001 | 0.0768 | 0.2305 | 01000001 | -0.0768 | 0.2305 | 10000001 | 0.0768 | -0.2305 | 11000001 | -0.0768 | -0.2305 |
| 00000010 | 0.0924 | 0.4136 | 01000010 | -0.0924 | 0.4136 | 10000010 | 0.0924 | -0.4136 | 11000010 | -0.0924 | -0.4136 |
| 00000011 | 0.1043 | 0.4125 | 01000011 | -0.1043 | 0.4125 | 10000011 | 0.1043 | -0.4125 | 11000011 | -0.1043 | -0.4125 |
| 00000100 | 0.0829 | 0.1135 | 01000100 | -0.0829 | 0.1135 | 10000100 | 0.0829 | -0.1135 | 11000100 | -0.0829 | -0.1135 |
| 00000101 | 0.0836 | 0.1149 | 01000101 | -0.0836 | 0.1149 | 10000101 | 0.0836 | -0.1149 | 11000101 | -0.0836 | -0.1149 |
| 00000110 | 0.2682 | 0.3856 | 01000110 | -0.2682 | 0.3856 | 10000110 | 0.2682 | -0.3856 | 11000110 | -0.2682 | -0.3856 |
| 00000111 | 0.2531 | 0.3906 | 01000111 | -0.2531 | 0.3906 | 10000111 | 0.2531 | -0.3906 | 11000111 | -0.2531 | -0.3906 |
| 00001000 | 0.0836 | 0.7817 | 01001000 | -0.0836 | 0.7817 | 10001000 | 0.0836 | -0.7817 | 11001000 | -0.0836 | -0.7817 |
| 00001001 | 0.2052 | 0.7608 | 01001001 | -0.2052 | 0.7608 | 10001001 | 0.2052 | -0.7608 | 11001001 | -0.2052 | -0.7608 |
| 00001010 | 0.0838 | 0.6034 | 01001010 | -0.0838 | 0.6034 | 10001010 | 0.0838 | -0.6034 | 11001010 | -0.0838 | -0.6034 |
| 00001011 | 0.1394 | 0.5961 | 01001011 | -0.1394 | 0.5961 | 10001011 | 0.1394 | -0.5961 | 11001011 | -0.1394 | -0.5961 |
| 00001100 | 0.4861 | 0.6331 | 01001100 | -0.4861 | 0.6331 | 10001100 | 0.4861 | -0.6331 | 11001100 | -0.4861 | -0.6331 |
| 00001101 | 0.3661 | 0.7034 | 01001101 | -0.3661 | 0.7034 | 10001101 | 0.3661 | -0.7034 | 11001101 | -0.3661 | -0.7034 |
| 00001110 | 0.3732 | 0.5159 | 01001110 | -0.3732 | 0.5159 | 10001110 | 0.3732 | -0.5159 | 11001110 | -0.3732 | -0.5159 |
| 00001111 | 0.3095 | 0.5511 | 01001111 | -0.3095 | 0.5511 | 10001111 | 0.3095 | -0.5511 | 11001111 | -0.3095 | -0.5511 |
| 00010000 | 0.3030 | 0.0811 | 01010000 | -0.3030 | 0.0811 | 10010000 | 0.3030 | -0.0811 | 11010000 | -0.3030 | -0.0811 |
| 00010001 | 0.3017 | 0.0853 | 01010001 | -0.3017 | 0.0853 | 10010001 | 0.3017 | -0.0853 | 11010001 | -0.3017 | -0.0853 |
| 00010010 | 0.4758 | 0.0932 | 01010010 | -0.4758 | 0.0932 | 10010010 | 0.4758 | -0.0932 | 11010010 | -0.4758 | -0.0932 |

FIG. 101

| $d_0d_1,...d_{7,l}$ | Re($e_l$) | Im($e_l$) | $d_0d_1,...d_{7,l}$ | Re($e_l$) | Im($e_l$) | $d_0d_1,...d_{7,l}$ | Re($e_l$) | Im($e_l$) |
|---|---|---|---|---|---|---|---|---|
| 00010011 | 0.4676 | 0.1242 | 01010011 | -0.4676 | 0.1242 | 10010011 | 0.4676 | -0.1242 | 11010011 | -0.4676 | -0.1242 |
| 00010100 | 0.2425 | 0.1081 | 01010100 | -0.2425 | 0.1081 | 10010100 | 0.2425 | -0.1081 | 11010100 | -0.2425 | -0.1081 |
| 00010101 | 0.2447 | 0.1115 | 01010101 | -0.2447 | 0.1115 | 10010101 | 0.2447 | -0.1115 | 11010101 | -0.2447 | -0.1115 |
| 00010110 | 0.3837 | 0.2813 | 01010110 | -0.3837 | 0.2813 | 10010110 | 0.3837 | -0.2813 | 11010110 | -0.3837 | -0.2813 |
| 00010111 | 0.3959 | 0.2642 | 01010111 | -0.3959 | 0.2642 | 10010111 | 0.3959 | -0.2642 | 11010111 | -0.3959 | -0.2642 |
| 00011000 | 0.7929 | 0.0859 | 01011000 | -0.7929 | 0.0859 | 10011000 | 0.7929 | -0.0859 | 11011000 | -0.7929 | -0.0859 |
| 00011001 | 0.7652 | 0.2324 | 01011001 | -0.7652 | 0.2324 | 10011001 | 0.7652 | -0.2324 | 11011001 | -0.7652 | -0.2324 |
| 00011010 | 0.6365 | 0.0872 | 01011010 | -0.6365 | 0.0872 | 10011010 | 0.6365 | -0.0872 | 11011010 | -0.6365 | -0.0872 |
| 00011011 | 0.6207 | 0.1757 | 01011011 | -0.6207 | 0.1757 | 10011011 | 0.6207 | -0.1757 | 11011011 | -0.6207 | -0.1757 |
| 00011100 | 0.6149 | 0.5145 | 01011100 | -0.6149 | 0.5145 | 10011100 | 0.6149 | -0.5145 | 11011100 | -0.6149 | -0.5145 |
| 00011101 | 0.6987 | 0.3934 | 01011101 | -0.6987 | 0.3934 | 10011101 | 0.6987 | -0.3934 | 11011101 | -0.6987 | -0.3934 |
| 00011110 | 0.5063 | 0.4029 | 01011110 | -0.5063 | 0.4029 | 10011110 | 0.5063 | -0.4029 | 11011110 | -0.5063 | -0.4029 |
| 00011111 | 0.5526 | 0.3356 | 01011111 | -0.5526 | 0.3356 | 10011111 | 0.5526 | -0.3356 | 11011111 | -0.5526 | -0.3356 |
| 00100000 | 0.1598 | 1.6262 | 01100000 | -0.1598 | 1.6262 | 10100000 | 0.1598 | -1.6262 | 11100000 | -0.1598 | -1.6262 |
| 00100001 | 0.4733 | 1.5637 | 01100001 | -0.4733 | 1.5637 | 10100001 | 0.4733 | -1.5637 | 11100001 | -0.4733 | -1.5637 |
| 00100010 | 0.1307 | 1.3502 | 01100010 | -0.1307 | 1.3502 | 10100010 | 0.1307 | -1.3502 | 11100010 | -0.1307 | -1.3502 |
| 00100011 | 0.3877 | 1.2983 | 01100011 | -0.3877 | 1.2983 | 10100011 | 0.3877 | -1.2983 | 11100011 | -0.3877 | -1.2983 |
| 00100100 | 1.0328 | 1.2617 | 01100100 | -1.0328 | 1.2617 | 10100100 | 1.0328 | -1.2617 | 11100100 | -1.0328 | -1.2617 |
| 00100101 | 0.7675 | 1.4398 | 01100101 | -0.7675 | 1.4398 | 10100101 | 0.7675 | -1.4398 | 11100101 | -0.7675 | -1.4398 |
| 00100110 | 0.8496 | 1.0508 | 01100110 | -0.8496 | 1.0508 | 10100110 | 0.8496 | -1.0508 | 11100110 | -0.8496 | -1.0508 |
| 00100111 | 0.6297 | 1.1967 | 01100111 | -0.6297 | 1.1967 | 10100111 | 0.6297 | -1.1967 | 11100111 | -0.6297 | -1.1967 |
| 00101000 | 0.0910 | 0.9531 | 01101000 | -0.0910 | 0.9531 | 10101000 | 0.0910 | -0.9531 | 11101000 | -0.0910 | -0.9531 |

FIG. 102

| $d_0,d_1,...d_{7J}$ | Re($e_j$) | Im($e_j$) | $d_0,d_1,...d_{7J}$ | Re($e_j$) | Im($e_j$) | $d_0,d_1,...d_{7J}$ | Re($e_j$) | Im($e_j$) | $d_0,d_1,...d_{7J}$ | Re($e_j$) | Im($e_j$) |
|---|---|---|---|---|---|---|---|---|---|---|---|
| 00101001 | 0.2649 | 0.9198 | 01101001 | -0.2649 | 0.9198 | 10101001 | 0.2649 | -0.9198 | 11101001 | -0.2649 | -0.9198 |
| 00101010 | 0.1080 | 1.1340 | 01101010 | -0.1080 | 1.1340 | 10101010 | 0.1080 | -1.1340 | 11101010 | -0.1080 | -1.1340 |
| 00101011 | 0.3214 | 1.0926 | 01101011 | -0.3214 | 1.0926 | 10101011 | 0.3214 | -1.0926 | 11101011 | -0.3214 | -1.0926 |
| 00101100 | 0.5941 | 0.7527 | 01101100 | -0.5941 | 0.7527 | 10101100 | 0.5941 | -0.7527 | 11101100 | -0.5941 | -0.7527 |
| 00101101 | 0.4371 | 0.8528 | 01101101 | -0.4371 | 0.8528 | 10101101 | 0.4371 | -0.8528 | 11101101 | -0.4371 | -0.8528 |
| 00101110 | 0.7093 | 0.8880 | 01101110 | -0.7093 | 0.8880 | 10101110 | 0.7093 | -0.8880 | 11101110 | -0.7093 | -0.8880 |
| 00101111 | 0.5235 | 1.0090 | 01101111 | -0.5235 | 1.0090 | 10101111 | 0.5235 | -1.0090 | 11101111 | -0.5235 | -1.0090 |
| 00110000 | 1.6180 | 0.1602 | 01110000 | -1.6180 | 0.1602 | 10110000 | 1.6180 | -0.1602 | 11110000 | -1.6180 | -0.1602 |
| 00110001 | 1.5540 | 0.4734 | 01110001 | -1.5540 | 0.4734 | 10110001 | 1.5540 | -0.4734 | 11110001 | -1.5540 | -0.4734 |
| 00110010 | 1.3411 | 0.1336 | 01110010 | -1.3411 | 0.1336 | 10110010 | 1.3411 | -0.1336 | 11110010 | -1.3411 | -0.1336 |
| 00110011 | 1.2883 | 0.3955 | 01110011 | -1.2883 | 0.3955 | 10110011 | 1.2883 | -0.3955 | 11110011 | -1.2883 | -0.3955 |
| 00110100 | 1.2561 | 1.0337 | 01110100 | -1.2561 | 1.0337 | 10110100 | 1.2561 | -1.0337 | 11110100 | -1.2561 | -1.0337 |
| 00110101 | 1.4311 | 0.7676 | 01110101 | -1.4311 | 0.7676 | 10110101 | 1.4311 | -0.7676 | 11110101 | -1.4311 | -0.7676 |
| 00110110 | 1.0362 | 0.8626 | 01110110 | -1.0362 | 0.8626 | 10110110 | 1.0362 | -0.8626 | 11110110 | -1.0362 | -0.8626 |
| 00110111 | 1.1845 | 0.6419 | 01110111 | -1.1845 | 0.6419 | 10110111 | 1.1845 | -0.6419 | 11110111 | -1.1845 | -0.6419 |
| 00111000 | 0.9546 | 0.0957 | 01111000 | -0.9546 | 0.0957 | 10111000 | 0.9546 | -0.0957 | 11111000 | -0.9546 | -0.0957 |
| 00111001 | 0.9163 | 0.2834 | 01111001 | -0.9163 | 0.2834 | 10111001 | 0.9163 | -0.2834 | 11111001 | -0.9163 | -0.2834 |
| 00111010 | 1.1282 | 0.1128 | 01111010 | -1.1282 | 0.1128 | 10111010 | 1.1282 | -0.1128 | 11111010 | -1.1282 | -0.1128 |
| 00111011 | 1.0838 | 0.3340 | 01111011 | -1.0838 | 0.3340 | 10111011 | 1.0838 | -0.3340 | 11111011 | -1.0838 | -0.3340 |
| 00111100 | 0.7329 | 0.6204 | 01111100 | -0.7329 | 0.6204 | 10111100 | 0.7329 | -0.6204 | 11111100 | -0.7329 | -0.6204 |
| 00111101 | 0.8428 | 0.4615 | 01111101 | -0.8428 | 0.4615 | 10111101 | 0.8428 | -0.4615 | 11111101 | -0.8428 | -0.4615 |
| 00111110 | 0.8680 | 0.7295 | 01111110 | -0.8680 | 0.7295 | 10111110 | 0.8680 | -0.7295 | 11111110 | -0.8680 | -0.7295 |
| 00111111 | 0.9959 | 0.5426 | 01111111 | -0.9959 | 0.5426 | 10111111 | 0.9959 | -0.5426 | 11111111 | -0.9959 | -0.5426 |

| $d_0,d_1,...d_{5,I}$ | Re($e_i$) | Im($e_i$) | $d_0,d_1,...d_{5,I}$ | Re($e_i$) | Im($e_i$) | $d_0,d_1,...d_{5,I}$ | Re($e_i$) | Im($e_i$) | $d_0,d_1,...d_{5,I}$ | Re($e_i$) | Im($e_i$) |
|---|---|---|---|---|---|---|---|---|---|---|---|
| 000000 | 0.1350 | 0.4323 | 010000 | -0.1252 | 0.4366 | 100000 | 0.1252 | -0.4366 | 110000 | -0.1350 | -0.4323 |
| 000001 | 0.1329 | 0.2567 | 010001 | -0.1268 | 0.2590 | 100001 | 0.1268 | -0.2590 | 110001 | -0.1329 | -0.2567 |
| 000010 | 0.1743 | 0.7080 | 010010 | -0.1581 | 0.7124 | 100010 | 0.1581 | -0.7124 | 110010 | -0.1743 | -0.7080 |
| 000011 | 0.4463 | 0.6255 | 010011 | -0.4314 | 0.6337 | 100011 | 0.4314 | -0.6337 | 110011 | -0.4463 | -0.6255 |
| 000100 | 0.4366 | 0.1252 | 010100 | -0.4323 | 0.1350 | 100100 | 0.4323 | -0.1350 | 110100 | -0.4366 | -0.1252 |
| 000101 | 0.2590 | 0.1268 | 010101 | -0.2567 | 0.1329 | 100101 | 0.2567 | -0.1329 | 110101 | -0.2590 | -0.1268 |
| 000110 | 0.7124 | 0.1581 | 010110 | -0.7080 | 0.1743 | 100110 | 0.7080 | -0.1743 | 110110 | -0.7124 | -0.1581 |
| 000111 | 0.6337 | 0.4314 | 010111 | -0.6255 | 0.4463 | 100111 | 0.6255 | -0.4463 | 110111 | -0.6337 | -0.4314 |
| 001000 | 0.2707 | 1.4326 | 011000 | -0.2919 | 1.4217 | 101000 | 0.2919 | -1.4217 | 111000 | -0.2707 | -1.4326 |
| 001001 | 0.8113 | 1.2328 | 011001 | -0.8261 | 1.2215 | 101001 | 0.8261 | -1.2215 | 111001 | -0.8113 | -1.2328 |
| 001010 | 0.2130 | 1.0366 | 011010 | -0.1876 | 1.0370 | 101010 | 0.1876 | -1.0370 | 111010 | -0.2130 | -1.0366 |
| 001011 | 0.6106 | 0.9019 | 011011 | -0.5888 | 0.9118 | 101011 | 0.5888 | -0.9118 | 111011 | -0.6106 | -0.9019 |
| 001100 | 1.4217 | 0.2919 | 011100 | -1.4326 | 0.2707 | 101100 | 1.4326 | -0.2707 | 111100 | -1.4217 | -0.2919 |
| 001101 | 1.2215 | 0.8261 | 011101 | -1.2328 | 0.8113 | 101101 | 1.2328 | -0.8113 | 111101 | -1.2215 | -0.8261 |
| 001110 | 1.0370 | 0.1876 | 011110 | -1.0366 | 0.2130 | 101110 | 1.0366 | -0.2130 | 111110 | -1.0370 | -0.1876 |
| 001111 | 0.9118 | 0.5888 | 011111 | -0.9019 | 0.6106 | 101111 | 0.9019 | -0.6106 | 111111 | -0.9118 | -0.5888 |

| $d_{0,l},d_{1,l},...d_{5,l}$ | Re(e) | Im(e) | $d_{0,l},d_{1,l},...d_{5,l}$ | Re(e) | Im(e) | $d_{0,l},d_{1,l},...d_{5,l}$ | Re(e) | Im(e) | $d_{0,l},d_{1,l},...d_{5,l}$ | Re(e) | Im(e) |
|---|---|---|---|---|---|---|---|---|---|---|---|
| 000000 | 1.4528 | 0.2735 | 010000 | -1.4528 | 0.2735 | 100000 | 1.4528 | -0.2735 | 110000 | -1.4528 | -0.2735 |
| 000001 | 1.1705 | 0.8021 | 010001 | -1.1705 | 0.8021 | 100001 | 1.1705 | -0.8021 | 110001 | -1.1705 | -0.8021 |
| 000010 | 0.7296 | 1.2006 | 010010 | -0.7296 | 1.2006 | 100010 | 0.7296 | -1.2006 | 110010 | -0.7296 | -1.2006 |
| 000011 | 0.6628 | 0.8144 | 010011 | -0.6628 | 0.8144 | 100011 | 0.6628 | -0.8144 | 110011 | -0.6628 | -0.8144 |
| 000100 | 1.0265 | 0.1595 | 010100 | -1.0265 | 0.1595 | 100100 | 1.0265 | -0.1595 | 110100 | -1.0265 | -0.1595 |
| 000101 | 0.9673 | 0.4701 | 010101 | -0.9673 | 0.4701 | 100101 | 0.9673 | -0.4701 | 110101 | -0.9673 | -0.4701 |
| 000110 | 0.6798 | 0.1375 | 010110 | -0.6798 | 0.1375 | 100110 | 0.6798 | -0.1375 | 110110 | -0.6798 | -0.1375 |
| 000111 | 0.6653 | 0.4615 | 010111 | -0.6653 | 0.4615 | 100111 | 0.6653 | -0.4615 | 110111 | -0.6653 | -0.4615 |
| 001000 | 0.2437 | 1.4889 | 011000 | -0.2437 | 1.4889 | 101000 | 0.2437 | -1.4889 | 111000 | -0.2437 | -1.4889 |
| 001001 | 0.1123 | 0.6475 | 011001 | -0.1123 | 0.6475 | 101001 | 0.1123 | -0.6475 | 111001 | -0.1123 | -0.6475 |
| 001010 | 0.2166 | 1.0920 | 011010 | -0.2166 | 1.0920 | 101010 | 0.2166 | -1.0920 | 111010 | -0.2166 | -1.0920 |
| 001011 | 0.3258 | 0.7670 | 011011 | -0.3258 | 0.7670 | 101011 | 0.3258 | -0.7670 | 111011 | -0.3258 | -0.7670 |
| 001100 | 0.1383 | 0.1265 | 011100 | -0.1383 | 0.1265 | 101100 | 0.1383 | -0.1265 | 111100 | -0.1383 | -0.1265 |
| 001101 | 0.1394 | 0.3792 | 011101 | -0.1394 | 0.3792 | 101101 | 0.1394 | -0.3792 | 111101 | -0.1394 | -0.3792 |
| 001110 | 0.4047 | 0.1330 | 011110 | -0.4047 | 0.1330 | 101110 | 0.4047 | -0.1330 | 111110 | -0.4047 | -0.1330 |
| 001111 | 0.3980 | 0.4148 | 011111 | -0.3980 | 0.4148 | 101111 | 0.3980 | -0.4148 | 111111 | -0.3980 | -0.4148 |

FIG. 106

| $d_0 d_1 ... d_{7j}$ | Re($e_j$) | Im($e_j$) | $d_0 d_1 ... d_{7j}$ | Re($e_j$) | Im($e_j$) | $d_0 d_1 ... d_{7j}$ | Re($e_j$) | Im($e_j$) | $d_0 d_1 ... d_{7j}$ | Re($e_j$) | Im($e_j$) |
|---|---|---|---|---|---|---|---|---|---|---|---|
| 00000000 | 0.0566 | 0.2614 | 01000000 | -0.0585 | 0.2606 | 10000000 | 0.0585 | -0.2606 | 11000000 | -0.0566 | -0.2614 |
| 00000001 | 0.0868 | 0.2841 | 01000001 | -0.0884 | 0.2840 | 10000001 | 0.0884 | -0.2840 | 11000001 | -0.0868 | -0.2841 |
| 00000010 | 0.0753 | 0.4576 | 01000010 | -0.0802 | 0.4591 | 10000010 | 0.0802 | -0.4591 | 11000010 | -0.0753 | -0.4576 |
| 00000011 | 0.1130 | 0.4375 | 01000011 | -0.1168 | 0.4382 | 10000011 | 0.1168 | -0.4382 | 11000011 | -0.1130 | -0.4375 |
| 00000100 | 0.0646 | 0.1282 | 01000100 | -0.0644 | 0.1257 | 10000100 | 0.0644 | -0.1257 | 11000100 | -0.0646 | -0.1282 |
| 00000101 | 0.1527 | 0.2307 | 01000101 | -0.1533 | 0.2304 | 10000101 | 0.1533 | -0.2304 | 11000101 | -0.1527 | -0.2307 |
| 00000110 | 0.2933 | 0.3937 | 01000110 | -0.2949 | 0.3935 | 10000110 | 0.2949 | -0.3935 | 11000110 | -0.2933 | -0.3937 |
| 00000111 | 0.2503 | 0.3875 | 01000111 | -0.2544 | 0.3817 | 10000111 | 0.2544 | -0.3817 | 11000111 | -0.2503 | -0.3875 |
| 00001000 | 0.0782 | 0.7901 | 01001000 | -0.0788 | 0.7914 | 10001000 | 0.0788 | -0.7914 | 11001000 | -0.0782 | -0.7901 |
| 00001001 | 0.2230 | 0.7654 | 01001001 | -0.2266 | 0.7685 | 10001001 | 0.2266 | -0.7685 | 11001001 | -0.2230 | -0.7654 |
| 00001010 | 0.0724 | 0.6228 | 01001010 | -0.0769 | 0.6239 | 10001010 | 0.0769 | -0.6239 | 11001010 | -0.0724 | -0.6228 |
| 00001011 | 0.1705 | 0.6096 | 01001011 | -0.1736 | 0.6134 | 10001011 | 0.1736 | -0.6134 | 11001011 | -0.1705 | -0.6096 |
| 00001100 | 0.5055 | 0.6200 | 01001100 | -0.5051 | 0.6218 | 10001100 | 0.5051 | -0.6218 | 11001100 | -0.5055 | -0.6200 |
| 00001101 | 0.3737 | 0.7086 | 01001101 | -0.3751 | 0.7082 | 10001101 | 0.3751 | -0.7082 | 11001101 | -0.3737 | -0.7086 |
| 00001110 | 0.3955 | 0.5092 | 01001110 | -0.3969 | 0.5076 | 10001110 | 0.3969 | -0.5076 | 11001110 | -0.3955 | -0.5092 |
| 00001111 | 0.3092 | 0.5646 | 01001111 | -0.3135 | 0.5658 | 10001111 | 0.3135 | -0.5658 | 11001111 | -0.3092 | -0.5646 |
| 00010000 | 0.2606 | 0.0585 | 01010000 | -0.2614 | 0.0566 | 10010000 | 0.2614 | -0.0566 | 11010000 | -0.2606 | -0.0585 |
| 00010001 | 0.2840 | 0.0884 | 01010001 | -0.2841 | 0.0868 | 10010001 | 0.2841 | -0.0868 | 11010001 | -0.2840 | -0.0884 |
| 00010010 | 0.4591 | 0.0802 | 01010010 | -0.4576 | 0.0753 | 10010010 | 0.4576 | -0.0753 | 11010010 | -0.4591 | -0.0802 |

FIG. 107

| $d_0,d_1,...d_{7l}$ | Re($e_l$) | Im($e_l$) | $d_0,d_1,...d_{7l}$ | Re($e_l$) | Im($e_l$) | $d_0,d_1,...d_{7l}$ | Re($e_l$) | Im($e_l$) | $d_0,d_1,...d_{7l}$ | Re($e_l$) | Im($e_l$) |
|---|---|---|---|---|---|---|---|---|---|---|---|
| 00010011 | 0.4382 | 0.1168 | 01010011 | -0.4375 | 0.1130 | 10010011 | 0.4375 | -0.1130 | 11010011 | -0.4382 | -0.1168 |
| 00010100 | 0.1257 | 0.0644 | 01010100 | -0.1282 | 0.0646 | 10010100 | 0.1282 | -0.0646 | 11010100 | -0.1257 | -0.0644 |
| 00010101 | 0.2304 | 0.1533 | 01010101 | -0.2307 | 0.1527 | 10010101 | 0.2307 | -0.1527 | 11010101 | -0.2304 | -0.1533 |
| 00010110 | 0.3935 | 0.2949 | 01010110 | -0.3937 | 0.2933 | 10010110 | 0.3937 | -0.2933 | 11010110 | -0.3935 | -0.2949 |
| 00010111 | 0.3817 | 0.2544 | 01010111 | -0.3875 | 0.2503 | 10010111 | 0.3875 | -0.2503 | 11010111 | -0.3817 | -0.2544 |
| 00011000 | 0.7914 | 0.0788 | 01011000 | -0.7901 | 0.0782 | 10011000 | 0.7901 | -0.0782 | 11011000 | -0.7914 | -0.0788 |
| 00011001 | 0.7685 | 0.2266 | 01011001 | -0.7654 | 0.2230 | 10011001 | 0.7654 | -0.2230 | 11011001 | -0.7685 | -0.2266 |
| 00011010 | 0.6239 | 0.0769 | 01011010 | -0.6228 | 0.0724 | 10011010 | 0.6228 | -0.0724 | 11011010 | -0.6239 | -0.0769 |
| 00011011 | 0.6134 | 0.1736 | 01011011 | -0.6096 | 0.1705 | 10011011 | 0.6096 | -0.1705 | 11011011 | -0.6134 | -0.1736 |
| 00011100 | 0.6218 | 0.5051 | 01011100 | -0.6200 | 0.5055 | 10011100 | 0.6200 | -0.5055 | 11011100 | -0.6218 | -0.5051 |
| 00011101 | 0.7082 | 0.3751 | 01011101 | -0.7086 | 0.3737 | 10011101 | 0.7086 | -0.3737 | 11011101 | -0.7082 | -0.3751 |
| 00011110 | 0.5076 | 0.3969 | 01011110 | -0.5092 | 0.3955 | 10011110 | 0.5092 | -0.3955 | 11011110 | -0.5076 | -0.3969 |
| 00011111 | 0.5658 | 0.3135 | 01011111 | -0.5646 | 0.3092 | 10011111 | 0.5646 | -0.3092 | 11011111 | -0.5658 | -0.3135 |
| 00100000 | 0.1660 | 1.6155 | 01100000 | -0.1603 | 1.6097 | 10100000 | 0.1603 | -1.6097 | 11100000 | -0.1660 | -1.6155 |
| 00100001 | 0.4759 | 1.5419 | 01100001 | -0.4720 | 1.5469 | 10100001 | 0.4720 | -1.5469 | 11100001 | -0.4759 | -1.5419 |
| 00100010 | 0.1324 | 1.3524 | 01100010 | -0.1315 | 1.3497 | 10100010 | 0.1315 | -1.3497 | 11100010 | -0.1324 | -1.3524 |
| 00100011 | 0.3880 | 1.2943 | 01100011 | -0.3955 | 1.2968 | 10100011 | 0.3955 | -1.2968 | 11100011 | -0.3880 | -1.2943 |
| 00100100 | 1.0225 | 1.2486 | 01100100 | -1.0210 | 1.2440 | 10100100 | 1.0210 | -1.2440 | 11100100 | -1.0225 | -1.2486 |
| 00100101 | 0.7614 | 1.4241 | 01100101 | -0.7599 | 1.4196 | 10100101 | 0.7599 | -1.4196 | 11100101 | -0.7614 | -1.4241 |
| 00100110 | 0.8569 | 1.0437 | 01100110 | -0.8579 | 1.0436 | 10100110 | 0.8579 | -1.0436 | 11100110 | -0.8569 | -1.0437 |
| 00100111 | 0.6370 | 1.1910 | 01100111 | -0.6369 | 1.1882 | 10100111 | 0.6369 | -1.1882 | 11100111 | -0.6370 | -1.1910 |
| 00101000 | 0.0916 | 0.9586 | 01101000 | -0.0929 | 0.9593 | 10101000 | 0.0929 | -0.9593 | 11101000 | -0.0916 | -0.9586 |

FIG. 108

| $d_0 d_1 ... d_{7j}$ | Re($e_j$) | Im($e_j$) | $d_0 d_1 ... d_{7j}$ | Re($e_j$) | Im($e_j$) | $d_0 d_1 ... d_{7j}$ | Re($e_j$) | Im($e_j$) | $d_0 d_1 ... d_{7j}$ | Re($e_j$) | Im($e_j$) |
|---|---|---|---|---|---|---|---|---|---|---|---|
| 00101001 | 0.2731 | 0.9232 | 01101001 | -0.2776 | 0.9252 | 10101001 | 0.2776 | -0.9252 | 11101001 | -0.2731 | -0.9232 |
| 00101010 | 0.1104 | 1.1396 | 01101010 | -0.1119 | 1.1393 | 10101010 | 0.1119 | -1.1393 | 11101010 | -0.1104 | -1.1396 |
| 00101011 | 0.3314 | 1.0930 | 01101011 | -0.3301 | 1.0958 | 10101011 | 0.3301 | -1.0958 | 11101011 | -0.3314 | -1.0930 |
| 00101100 | 0.6098 | 0.7440 | 01101100 | -0.6119 | 0.7442 | 10101100 | 0.6119 | -0.7442 | 11101100 | -0.6098 | -0.7440 |
| 00101101 | 0.4529 | 0.8490 | 01101101 | -0.4518 | 0.8519 | 10101101 | 0.4518 | -0.8519 | 11101101 | -0.4529 | -0.8490 |
| 00101110 | 0.7239 | 0.8840 | 01101110 | -0.7230 | 0.8792 | 10101110 | 0.7230 | -0.8792 | 11101110 | -0.7239 | -0.8840 |
| 00101111 | 0.5369 | 1.0063 | 01101111 | -0.5364 | 1.0064 | 10101111 | 0.5364 | -1.0064 | 11101111 | -0.5369 | -1.0063 |
| 00110000 | 1.6097 | 0.1603 | 01110000 | -1.6155 | 0.1660 | 10110000 | 1.6155 | -0.1660 | 11110000 | -1.6097 | -0.1603 |
| 00110001 | 1.5469 | 0.4720 | 01110001 | -1.5419 | 0.4759 | 10110001 | 1.5419 | -0.4759 | 11110001 | -1.5469 | -0.4720 |
| 00110010 | 1.3497 | 0.1315 | 01110010 | -1.3524 | 0.1324 | 10110010 | 1.3524 | -0.1324 | 11110010 | -1.3497 | -0.1315 |
| 00110011 | 1.2968 | 0.3955 | 01110011 | -1.2943 | 0.3880 | 10110011 | 1.2943 | -0.3880 | 11110011 | -1.2968 | -0.3955 |
| 00110100 | 1.2440 | 1.0210 | 01110100 | -1.2486 | 1.0225 | 10110100 | 1.2486 | -1.0225 | 11110100 | -1.2440 | -1.0210 |
| 00110101 | 1.4196 | 0.7599 | 01110101 | -1.4241 | 0.7614 | 10110101 | 1.4241 | -0.7614 | 11110101 | -1.4196 | -0.7599 |
| 00110110 | 1.0436 | 0.8579 | 01110110 | -1.0437 | 0.8569 | 10110110 | 1.0437 | -0.8569 | 11110110 | -1.0436 | -0.8579 |
| 00110111 | 1.1882 | 0.6369 | 01110111 | -1.1910 | 0.6370 | 10110111 | 1.1910 | -0.6370 | 11110111 | -1.1882 | -0.6369 |
| 00111000 | 0.9593 | 0.0929 | 01111000 | -0.9586 | 0.0916 | 10111000 | 0.9586 | -0.0916 | 11111000 | -0.9593 | -0.0929 |
| 00111001 | 0.9252 | 0.2776 | 01111001 | -0.9232 | 0.2731 | 10111001 | 0.9232 | -0.2731 | 11111001 | -0.9252 | -0.2776 |
| 00111010 | 1.1393 | 0.1119 | 01111010 | -1.1396 | 0.1104 | 10111010 | 1.1396 | -0.1104 | 11111010 | -1.1393 | -0.1119 |
| 00111011 | 1.0958 | 0.3301 | 01111011 | -1.0930 | 0.3314 | 10111011 | 1.0930 | -0.3314 | 11111011 | -1.0958 | -0.3301 |
| 00111100 | 0.7442 | 0.6119 | 01111100 | -0.7440 | 0.6098 | 10111100 | 0.7440 | -0.6098 | 11111100 | -0.7442 | -0.6119 |
| 00111101 | 0.8519 | 0.4518 | 01111101 | -0.8490 | 0.4529 | 10111101 | 0.8490 | -0.4529 | 11111101 | -0.8519 | -0.4518 |
| 00111110 | 0.8792 | 0.7230 | 01111110 | -0.8840 | 0.7239 | 10111110 | 0.8840 | -0.7239 | 11111110 | -0.8792 | -0.7230 |
| 00111111 | 1.0064 | 0.5364 | 01111111 | -1.0063 | 0.5369 | 10111111 | 1.0063 | -0.5369 | 11111111 | -1.0064 | -0.5364 |

FIG. 110

| $d_0,d_1,...d_{7l}$ | Re($e_l$) | Im($e_l$) | $d_0,d_1,...d_{7l}$ | Re($e_l$) | Im($e_l$) | $d_0,d_1,...d_{7l}$ | Re($e_l$) | Im($e_l$) | $d_0,d_1,...d_{7l}$ | Re($e_l$) | Im($e_l$) |
|---|---|---|---|---|---|---|---|---|---|---|---|
| 00000000 | 0.0593 | 0.2193 | 01000000 | -0.0593 | 0.2193 | 10000000 | 0.0593 | -0.2193 | 11000000 | -0.0593 | -0.2193 |
| 00000001 | 0.0690 | 0.3047 | 01000001 | -0.0690 | 0.3047 | 10000001 | 0.0690 | -0.3047 | 11000001 | -0.0690 | -0.3047 |
| 00000010 | 0.0663 | 0.4879 | 01000010 | -0.0663 | 0.4879 | 10000010 | 0.0663 | -0.4879 | 11000010 | -0.0663 | -0.4879 |
| 00000011 | 0.1151 | 0.4474 | 01000011 | -0.1151 | 0.4474 | 10000011 | 0.1151 | -0.4474 | 11000011 | -0.1151 | -0.4474 |
| 00000100 | 0.1689 | 0.2163 | 01000100 | -0.1689 | 0.2163 | 10000100 | 0.1689 | -0.2163 | 11000100 | -0.1689 | -0.2163 |
| 00000101 | 0.1971 | 0.2525 | 01000101 | -0.1971 | 0.2525 | 10000101 | 0.1971 | -0.2525 | 11000101 | -0.1971 | -0.2525 |
| 00000110 | 0.3096 | 0.3796 | 01000110 | -0.3096 | 0.3796 | 10000110 | 0.3096 | -0.3796 | 11000110 | -0.3096 | -0.3796 |
| 00000111 | 0.2489 | 0.3933 | 01000111 | -0.2489 | 0.3933 | 10000111 | 0.2489 | -0.3933 | 11000111 | -0.2489 | -0.3933 |
| 00001000 | 0.0790 | 0.7970 | 01001000 | -0.0790 | 0.7970 | 10001000 | 0.0790 | -0.7970 | 11001000 | -0.0790 | -0.7970 |
| 00001001 | 0.2340 | 0.7710 | 01001001 | -0.2340 | 0.7710 | 10001001 | 0.2340 | -0.7710 | 11001001 | -0.2340 | -0.7710 |
| 00001010 | 0.0723 | 0.6395 | 01001010 | -0.0723 | 0.6395 | 10001010 | 0.0723 | -0.6395 | 11001010 | -0.0723 | -0.6395 |
| 00001011 | 0.1896 | 0.6163 | 01001011 | -0.1896 | 0.6163 | 10001011 | 0.1896 | -0.6163 | 11001011 | -0.1896 | -0.6163 |
| 00001100 | 0.5090 | 0.6272 | 01001100 | -0.5090 | 0.6272 | 10001100 | 0.5090 | -0.6272 | 11001100 | -0.5090 | -0.6272 |
| 00001101 | 0.3787 | 0.7126 | 01001101 | -0.3787 | 0.7126 | 10001101 | 0.3787 | -0.7126 | 11001101 | -0.3787 | -0.7126 |
| 00001110 | 0.4079 | 0.5049 | 01001110 | -0.4079 | 0.5049 | 10001110 | 0.4079 | -0.5049 | 11001110 | -0.4079 | -0.5049 |
| 00001111 | 0.3088 | 0.5677 | 01001111 | -0.3088 | 0.5677 | 10001111 | 0.3088 | -0.5677 | 11001111 | -0.3088 | -0.5677 |
| 00010000 | 0.0675 | 0.0626 | 01010000 | -0.0675 | 0.0626 | 10010000 | 0.0675 | -0.0626 | 11010000 | -0.0675 | -0.0626 |
| 00010001 | 0.3475 | 0.0595 | 01010001 | -0.3475 | 0.0595 | 10010001 | 0.3475 | -0.0595 | 11010001 | -0.3475 | -0.0595 |
| 00010010 | 0.5482 | 0.0626 | 01010010 | -0.5482 | 0.0626 | 10010010 | 0.5482 | -0.0626 | 11010010 | -0.5482 | -0.0626 |

FIG. 111

| $d_0,d_1,...d_{7I}$ | $Re(e_I)$ | $Im(e_I)$ | $d_0,d_1,...d_{7I}$ | $Re(e_I)$ | $Im(e_I)$ | $d_0,d_1,...d_{7I}$ | $Re(e_I)$ | $Im(e_I)$ | $d_0,d_1,...d_{7I}$ | $Re(e_I)$ | $Im(e_I)$ |
|---|---|---|---|---|---|---|---|---|---|---|---|
| 00010011 | 0.4784 | 0.1124 | 01010011 | -0.4784 | 0.1124 | 10010011 | 0.4784 | -0.1124 | 11010011 | -0.4784 | -0.1124 |
| 00010100 | 0.1674 | 0.0751 | 01010100 | -0.1674 | 0.0751 | 10010100 | 0.1674 | -0.0751 | 11010100 | -0.1674 | -0.0751 |
| 00010101 | 0.2856 | 0.1132 | 01010101 | -0.2856 | 0.1132 | 10010101 | 0.2856 | -0.1132 | 11010101 | -0.2856 | -0.1132 |
| 00010110 | 0.4134 | 0.3028 | 01010110 | -0.4134 | 0.3028 | 10010110 | 0.4134 | -0.3028 | 11010110 | -0.4134 | -0.3028 |
| 00010111 | 0.4235 | 0.2289 | 01010111 | -0.4235 | 0.2289 | 10010111 | 0.4235 | -0.2289 | 11010111 | -0.4235 | -0.2289 |
| 00011000 | 0.8258 | 0.0840 | 01011000 | -0.8258 | 0.0840 | 10011000 | 0.8258 | -0.0840 | 11011000 | -0.8258 | -0.0840 |
| 00011001 | 0.7936 | 0.2483 | 01011001 | -0.7936 | 0.2483 | 10011001 | 0.7936 | -0.2483 | 11011001 | -0.7936 | -0.2483 |
| 00011010 | 0.6788 | 0.0783 | 01011010 | -0.6788 | 0.0783 | 10011010 | 0.6788 | -0.0783 | 11011010 | -0.6788 | -0.0783 |
| 00011011 | 0.6501 | 0.2025 | 01011011 | -0.6501 | 0.2025 | 10011011 | 0.6501 | -0.2025 | 11011011 | -0.6501 | -0.2025 |
| 00011100 | 0.6246 | 0.5211 | 01011100 | -0.6246 | 0.5211 | 10011100 | 0.6246 | -0.5211 | 11011100 | -0.6246 | -0.5211 |
| 00011101 | 0.7241 | 0.3961 | 01011101 | -0.7241 | 0.3961 | 10011101 | 0.7241 | -0.3961 | 11011101 | -0.7241 | -0.3961 |
| 00011110 | 0.5144 | 0.4089 | 01011110 | -0.5144 | 0.4089 | 10011110 | 0.5144 | -0.4089 | 11011110 | -0.5144 | -0.4089 |
| 00011111 | 0.5918 | 0.3146 | 01011111 | -0.5918 | 0.3146 | 10011111 | 0.5918 | -0.3146 | 11011111 | -0.5918 | -0.3146 |
| 00100000 | 0.1631 | 1.5801 | 01100000 | -0.1631 | 1.5801 | 10100000 | 0.1631 | -1.5801 | 11100000 | -0.1631 | -1.5801 |
| 00100001 | 0.4806 | 1.5133 | 01100001 | -0.4806 | 1.5133 | 10100001 | 0.4806 | -1.5133 | 11100001 | -0.4806 | -1.5133 |
| 00100010 | 0.1260 | 1.3365 | 01100010 | -0.1260 | 1.3365 | 10100010 | 0.1260 | -1.3365 | 11100010 | -0.1260 | -1.3365 |
| 00100011 | 0.3750 | 1.2897 | 01100011 | -0.3750 | 1.2897 | 10100011 | 0.3750 | -1.2897 | 11100011 | -0.3750 | -1.2897 |
| 00100100 | 1.0324 | 1.2029 | 01100100 | -1.0324 | 1.2029 | 10100100 | 1.0324 | -1.2029 | 11100100 | -1.0324 | -1.2029 |
| 00100101 | 0.7737 | 1.3837 | 01100101 | -0.7737 | 1.3837 | 10100101 | 0.7737 | -1.3837 | 11100101 | -0.7737 | -1.3837 |
| 00100110 | 0.8350 | 1.0529 | 01100110 | -0.8350 | 1.0529 | 10100110 | 0.8350 | -1.0529 | 11100110 | -0.8350 | -1.0529 |
| 00100111 | 0.6147 | 1.1949 | 01100111 | -0.6147 | 1.1949 | 10100111 | 0.6147 | -1.1949 | 11100111 | -0.6147 | -1.1949 |
| 00101000 | 0.0929 | 0.9596 | 01101000 | -0.0929 | 0.9596 | 10101000 | 0.0929 | -0.9596 | 11101000 | -0.0929 | -0.9596 |

FIG. 112

| $d_0,d_1,...d_{7j}$ | Re($e_j$) | Im($e_j$) | $d_0,d_1,...d_{7j}$ | Re($e_j$) | Im($e_j$) | $d_0,d_1,...d_{7j}$ | Re($e_j$) | Im($e_j$) | $d_0,d_1,...d_{7j}$ | Re($e_j$) | Im($e_j$) |
|---|---|---|---|---|---|---|---|---|---|---|---|
| 00101001 | 0.2768 | 0.9260 | 01101001 | -0.2768 | 0.9260 | 10101001 | 0.2768 | -0.9260 | 11101001 | -0.2768 | -0.9260 |
| 00101010 | 0.1095 | 1.1349 | 01101010 | -0.1095 | 1.1349 | 10101010 | 0.1095 | -1.1349 | 11101010 | -0.1095 | -1.1349 |
| 00101011 | 0.3250 | 1.0941 | 01101011 | -0.3250 | 1.0941 | 10101011 | 0.3250 | -1.0941 | 11101011 | -0.3250 | -1.0941 |
| 00101100 | 0.6086 | 0.7556 | 01101100 | -0.6086 | 0.7556 | 10101100 | 0.6086 | -0.7556 | 11101100 | -0.6086 | -0.7556 |
| 00101101 | 0.4514 | 0.8566 | 01101101 | -0.4514 | 0.8566 | 10101101 | 0.4514 | -0.8566 | 11101101 | -0.4514 | -0.8566 |
| 00101110 | 0.7161 | 0.8933 | 01101110 | -0.7161 | 0.8933 | 10101110 | 0.7161 | -0.8933 | 11101110 | -0.7161 | -0.8933 |
| 00101111 | 0.5294 | 1.0121 | 01101111 | -0.5294 | 1.0121 | 10101111 | 0.5294 | -1.0121 | 11101111 | -0.5294 | -1.0121 |
| 00110000 | 1.5809 | 0.1471 | 01110000 | -1.5809 | 0.1471 | 10110000 | 1.5809 | -0.1471 | 11110000 | -1.5809 | -0.1471 |
| 00110001 | 1.5253 | 0.4385 | 01110001 | -1.5253 | 0.4385 | 10110001 | 1.5253 | -0.4385 | 11110001 | -1.5253 | -0.4385 |
| 00110010 | 1.3380 | 0.1363 | 01110010 | -1.3380 | 0.1363 | 10110010 | 1.3380 | -0.1363 | 11110010 | -1.3380 | -0.1363 |
| 00110011 | 1.2837 | 0.4026 | 01110011 | -1.2837 | 0.4026 | 10110011 | 1.2837 | -0.4026 | 11110011 | -1.2837 | -0.4026 |
| 00110100 | 1.2476 | 0.9785 | 01110100 | -1.2476 | 0.9785 | 10110100 | 1.2476 | -0.9785 | 11110100 | -1.2476 | -0.9785 |
| 00110101 | 1.4137 | 0.7196 | 01110101 | -1.4137 | 0.7196 | 10110101 | 1.4137 | -0.7196 | 11110101 | -1.4137 | -0.7196 |
| 00110110 | 1.0246 | 0.8681 | 01110110 | -1.0246 | 0.8681 | 10110110 | 1.0246 | -0.8681 | 11110110 | -1.0246 | -0.8681 |
| 00110111 | 1.1771 | 0.6494 | 01110111 | -1.1771 | 0.6494 | 10110111 | 1.1771 | -0.6494 | 11110111 | -1.1771 | -0.6494 |
| 00111000 | 0.9782 | 0.0985 | 01111000 | -0.9782 | 0.0985 | 10111000 | 0.9782 | -0.0985 | 11111000 | -0.9782 | -0.0985 |
| 00111001 | 0.9383 | 0.2922 | 01111001 | -0.9383 | 0.2922 | 10111001 | 0.9383 | -0.2922 | 11111001 | -0.9383 | -0.2922 |
| 00111010 | 1.1455 | 0.1158 | 01111010 | -1.1455 | 0.1158 | 10111010 | 1.1455 | -0.1158 | 11111010 | -1.1455 | -0.1158 |
| 00111011 | 1.0972 | 0.3418 | 01111011 | -1.0972 | 0.3418 | 10111011 | 1.0972 | -0.3418 | 11111011 | -1.0972 | -0.3418 |
| 00111100 | 0.7446 | 0.6273 | 01111100 | -0.7446 | 0.6273 | 10111100 | 0.7446 | -0.6273 | 11111100 | -0.7446 | -0.6273 |
| 00111101 | 0.8573 | 0.4721 | 01111101 | -0.8573 | 0.4721 | 10111101 | 0.8573 | -0.4721 | 11111101 | -0.8573 | -0.4721 |
| 00111110 | 0.8767 | 0.7377 | 01111110 | -0.8767 | 0.7377 | 10111110 | 0.8767 | -0.7377 | 11111110 | -0.8767 | -0.7377 |
| 00111111 | 1.0059 | 0.5518 | 01111111 | -1.0059 | 0.5518 | 10111111 | 1.0059 | -0.5518 | 11111111 | -1.0059 | -0.5518 |

| $d_0, d_1, ... d_{5,l}$ | Re($e_l$) | Im($e_l$) | $d_0, d_1, ... d_{5,l}$ | Re($e_l$) | Im($e_l$) | $d_0, d_1, ... d_{5,l}$ | Re($e_l$) | Im($e_l$) | $d_0, d_1, ... d_{5,l}$ | Re($e_l$) | Im($e_l$) |
|---|---|---|---|---|---|---|---|---|---|---|---|
| 000000 | 1.4572 | 0.3311 | 010000 | 0.3311 | -1.4572 | 100000 | -0.3311 | 1.4572 | 110000 | -1.4572 | -0.3311 |
| 000001 | 1.1531 | 0.7846 | 010001 | 1.1773 | -0.7647 | 100001 | -1.1773 | 0.7647 | 110001 | -1.1531 | -0.7846 |
| 000010 | 0.7647 | 1.1773 | 010010 | 0.7846 | -1.1531 | 100010 | -0.7846 | 1.1531 | 110010 | -0.7647 | -1.1773 |
| 000011 | 0.7345 | 0.7657 | 010011 | 0.7657 | -0.7345 | 100011 | -0.7657 | 0.7345 | 110011 | -0.7345 | -0.7657 |
| 000100 | 1.0771 | 0.0825 | 010100 | 1.3907 | -0.2062 | 100100 | -1.3907 | 0.2062 | 110100 | -1.0771 | -0.0825 |
| 000101 | 1.0071 | 0.4243 | 010101 | 1.0539 | -0.3794 | 100101 | -1.0539 | 0.3794 | 110101 | -1.0071 | -0.4243 |
| 000110 | 0.7207 | 0.1124 | 010110 | 0.6879 | -0.1408 | 100110 | -0.6879 | 0.1408 | 110110 | -0.7207 | -0.1124 |
| 000111 | 0.7042 | 0.4186 | 010111 | 0.7258 | -0.4079 | 100111 | -0.7258 | 0.4079 | 110111 | -0.7042 | -0.4186 |
| 001000 | 0.2062 | 1.3907 | 011000 | 0.0825 | -1.0771 | 101000 | -0.0825 | 1.0771 | 111000 | -0.2062 | -1.3907 |
| 001001 | 0.1408 | 0.6879 | 011001 | 0.1124 | -0.7207 | 101001 | -0.1124 | 0.7207 | 111001 | -0.1408 | -0.6879 |
| 001010 | 0.3794 | 1.0539 | 011010 | 0.4243 | -1.0071 | 101010 | -0.4243 | 1.0071 | 111010 | -0.3794 | -1.0539 |
| 001011 | 0.4079 | 0.7258 | 011011 | 0.4186 | -0.7042 | 101011 | -0.4186 | 0.7042 | 111011 | -0.4079 | -0.7258 |
| 001100 | 0.1340 | 0.1304 | 011100 | 0.1304 | -0.1340 | 101100 | -0.1304 | 0.1340 | 111100 | -0.1340 | -0.1304 |
| 001101 | 0.1397 | 0.4017 | 011101 | 0.1293 | -0.4088 | 101101 | -0.1293 | 0.4088 | 111101 | -0.1397 | -0.4017 |
| 001110 | 0.4088 | 0.1293 | 011110 | 0.4017 | -0.1397 | 101110 | -0.4017 | 0.1397 | 111110 | -0.4088 | -0.1293 |
| 001111 | 0.4215 | 0.4074 | 011111 | 0.4074 | -0.4215 | 101111 | -0.4074 | 0.4215 | 111111 | -0.4215 | -0.4074 |

| $d_0,d_1,...d_{5,l}$ | Re(e$_l$) | Im(e$_l$) | $d_0,d_1,...d_{5,l}$ | Re(e$_l$) | Im(e$_l$) | $d_0,d_1,...d_{5,l}$ | Re(e$_l$) | Im(e$_l$) | $d_0,d_1,...d_{5,l}$ | Re(e$_l$) | Im(e$_l$) |
|---|---|---|---|---|---|---|---|---|---|---|---|
| 000000 | 1.4517 | 0.2588 | 010000 | -1.4517 | 0.2588 | 100000 | 1.4517 | -0.2588 | 110000 | -1.4517 | -0.2588 |
| 000001 | 1.1300 | 0.8692 | 010001 | -1.1300 | 0.8692 | 100001 | 1.1300 | -0.8692 | 110001 | -1.1300 | -0.8692 |
| 000010 | 0.6815 | 1.1994 | 010010 | -0.6815 | 1.1994 | 100010 | 0.6815 | -1.1994 | 110010 | -0.6815 | -1.1994 |
| 000011 | 0.6730 | 0.8129 | 010011 | -0.6730 | 0.8129 | 100011 | 0.6730 | -0.8129 | 110011 | -0.6730 | -0.8129 |
| 000100 | 1.0438 | 0.1631 | 010100 | -1.0438 | 0.1631 | 100100 | 1.0438 | -0.1631 | 110100 | -1.0438 | -0.1631 |
| 000101 | 1.0154 | 0.4996 | 010101 | -1.0154 | 0.4996 | 100101 | 1.0154 | -0.4996 | 110101 | -1.0154 | -0.4996 |
| 000110 | 0.7083 | 0.1480 | 010110 | -0.7083 | 0.1480 | 100110 | 0.7083 | -0.1480 | 110110 | -0.7083 | -0.1480 |
| 000111 | 0.6870 | 0.4655 | 010111 | -0.6870 | 0.4655 | 100111 | 0.6870 | -0.4655 | 110111 | -0.6870 | -0.4655 |
| 001000 | 0.2212 | 1.4381 | 011000 | -0.2212 | 1.4381 | 101000 | 0.2212 | -1.4381 | 111000 | -0.2212 | -1.4381 |
| 001001 | 0.1135 | 0.6554 | 011001 | -0.1135 | 0.6554 | 101001 | 0.1135 | -0.6554 | 111001 | -0.1135 | -0.6554 |
| 001010 | 0.2120 | 1.0636 | 011010 | -0.2120 | 1.0636 | 101010 | 0.2120 | -1.0636 | 111010 | -0.2120 | -1.0636 |
| 001011 | 0.3503 | 0.7554 | 011011 | -0.3503 | 0.7554 | 101011 | 0.3503 | -0.7554 | 111011 | -0.3503 | -0.7554 |
| 001100 | 0.1413 | 0.1259 | 011100 | -0.1413 | 0.1259 | 101100 | 0.1413 | -0.1259 | 111100 | -0.1413 | -0.1259 |
| 001101 | 0.1413 | 0.3819 | 011101 | -0.1413 | 0.3819 | 101101 | 0.1413 | -0.3819 | 111101 | -0.1413 | -0.3819 |
| 001110 | 0.4205 | 0.1340 | 011110 | -0.4205 | 0.1340 | 101110 | 0.4205 | -0.1340 | 111110 | -0.4205 | -0.1340 |
| 001111 | 0.4090 | 0.4184 | 011111 | -0.4090 | 0.4184 | 101111 | 0.4090 | -0.4184 | 111111 | -0.4090 | -0.4184 |

FIG. 116

| $d_0,d_1,...d_{7J}$ | Re($e_J$) | Im($e_J$) | $d_0,d_1,...d_{7J}$ | Re($e_J$) | Im($e_J$) | $d_0,d_1,...d_{7J}$ | Re($e_J$) | Im($e_J$) | $d_0,d_1,...d_{7J}$ | Re($e_J$) | Im($e_J$) |
|---|---|---|---|---|---|---|---|---|---|---|---|
| 00000000 | 0.0540 | 0.2206 | 01000000 | -0.0543 | 0.2240 | 10000000 | 0.0543 | -0.2240 | 11000000 | -0.0540 | -0.2206 |
| 00000001 | 0.0926 | 0.2979 | 01000001 | -0.0873 | 0.2975 | 10000001 | 0.0873 | -0.2975 | 11000001 | -0.0926 | -0.2979 |
| 00000010 | 0.0648 | 0.4848 | 01000010 | -0.0635 | 0.4836 | 10000010 | 0.0635 | -0.4836 | 11000010 | -0.0648 | -0.4848 |
| 00000011 | 0.1150 | 0.4381 | 01000011 | -0.1111 | 0.4398 | 10000011 | 0.1111 | -0.4398 | 11000011 | -0.1150 | -0.4381 |
| 00000100 | 0.0625 | 0.1225 | 01000100 | -0.0606 | 0.1253 | 10000100 | 0.0606 | -0.1253 | 11000100 | -0.0625 | -0.1225 |
| 00000101 | 0.1816 | 0.2628 | 01000101 | -0.1811 | 0.2639 | 10000101 | 0.1811 | -0.2639 | 11000101 | -0.1816 | -0.2628 |
| 00000110 | 0.3179 | 0.4062 | 01000110 | -0.3152 | 0.4076 | 10000110 | 0.3152 | -0.4076 | 11000110 | -0.3179 | -0.4062 |
| 00000111 | 0.2442 | 0.3957 | 01000111 | -0.2425 | 0.3960 | 10000111 | 0.2425 | -0.3960 | 11000111 | -0.2442 | -0.3957 |
| 00001000 | 0.0756 | 0.8021 | 01001000 | -0.0777 | 0.8015 | 10001000 | 0.0777 | -0.8015 | 11001000 | -0.0756 | -0.8021 |
| 00001001 | 0.2328 | 0.7790 | 01001001 | -0.2304 | 0.7750 | 10001001 | 0.2304 | -0.7750 | 11001001 | -0.2328 | -0.7790 |
| 00001010 | 0.0722 | 0.6382 | 01001010 | -0.0719 | 0.6368 | 10001010 | 0.0719 | -0.6368 | 11001010 | -0.0722 | -0.6382 |
| 00001011 | 0.1867 | 0.6238 | 01001011 | -0.1838 | 0.6218 | 10001011 | 0.1838 | -0.6218 | 11001011 | -0.1867 | -0.6238 |
| 00001100 | 0.5114 | 0.6253 | 01001100 | -0.5121 | 0.6251 | 10001100 | 0.5121 | -0.6251 | 11001100 | -0.5114 | -0.6253 |
| 00001101 | 0.3795 | 0.7195 | 01001101 | -0.3775 | 0.7176 | 10001101 | 0.3775 | -0.7176 | 11001101 | -0.3795 | -0.7195 |
| 00001110 | 0.4041 | 0.5134 | 01001110 | -0.4046 | 0.5121 | 10001110 | 0.4046 | -0.5121 | 11001110 | -0.4041 | -0.5134 |
| 00001111 | 0.3039 | 0.5804 | 01001111 | -0.3051 | 0.5794 | 10001111 | 0.3051 | -0.5794 | 11001111 | -0.3039 | -0.5804 |
| 00010000 | 0.2240 | 0.0543 | 01010000 | -0.2206 | 0.0540 | 10010000 | 0.2206 | -0.0540 | 11010000 | -0.2240 | -0.0543 |
| 00010001 | 0.2975 | 0.0873 | 01010001 | -0.2979 | 0.0926 | 10010001 | 0.2979 | -0.0926 | 11010001 | -0.2975 | -0.0873 |
| 00010010 | 0.4836 | 0.0635 | 01010010 | -0.4848 | 0.0648 | 10010010 | 0.4848 | -0.0648 | 11010010 | -0.4836 | -0.0635 |

FIG. 117

| $d_0,d_{1,j},...d_{7,j}$ | Re($e_j$) | Im($e_j$) | $d_0,d_{1,j},...d_{7,j}$ | Re($e_j$) | Im($e_j$) | $d_0,d_{1,j},...d_{7,j}$ | Re($e_j$) | Im($e_j$) | $d_0,d_{1,j},...d_{7,j}$ | Re($e_j$) | Im($e_j$) |
|---|---|---|---|---|---|---|---|---|---|---|---|
| 00010011 | 0.4398 | 0.1111 | 01010011 | -0.4381 | 0.1150 | 10010011 | 0.4381 | -0.1150 | 11010011 | -0.4398 | -0.1111 |
| 00010100 | 0.1253 | 0.0606 | 01010100 | -0.1225 | 0.0625 | 10010100 | 0.1225 | -0.0625 | 11010100 | -0.1253 | -0.0606 |
| 00010101 | 0.2639 | 0.1811 | 01010101 | -0.2628 | 0.1816 | 10010101 | 0.2628 | -0.1816 | 11010101 | -0.2639 | -0.1811 |
| 00010110 | 0.4076 | 0.3152 | 01010110 | -0.4062 | 0.3179 | 10010110 | 0.4062 | -0.3179 | 11010110 | -0.4076 | -0.3152 |
| 00010111 | 0.3960 | 0.2425 | 01010111 | -0.3957 | 0.2442 | 10010111 | 0.3957 | -0.2442 | 11010111 | -0.3960 | -0.2425 |
| 00011000 | 0.8015 | 0.0777 | 01011000 | -0.8021 | 0.0756 | 10011000 | 0.8021 | -0.0756 | 11011000 | -0.8015 | -0.0777 |
| 00011001 | 0.7750 | 0.2304 | 01011001 | -0.7790 | 0.2328 | 10011001 | 0.7790 | -0.2328 | 11011001 | -0.7750 | -0.2304 |
| 00011010 | 0.6368 | 0.0719 | 01011010 | -0.6382 | 0.0722 | 10011010 | 0.6382 | -0.0722 | 11011010 | -0.6368 | -0.0719 |
| 00011011 | 0.6218 | 0.1838 | 01011011 | -0.6238 | 0.1867 | 10011011 | 0.6238 | -0.1867 | 11011011 | -0.6218 | -0.1838 |
| 00011100 | 0.6251 | 0.5121 | 01011100 | -0.6253 | 0.5114 | 10011100 | 0.6253 | -0.5114 | 11011100 | -0.6251 | -0.5121 |
| 00011101 | 0.7176 | 0.3775 | 01011101 | -0.7195 | 0.3795 | 10011101 | 0.7195 | -0.3795 | 11011101 | -0.7176 | -0.3775 |
| 00011110 | 0.5121 | 0.4046 | 01011110 | -0.5134 | 0.4041 | 10011110 | 0.5134 | -0.4041 | 11011110 | -0.5121 | -0.4046 |
| 00011111 | 0.5794 | 0.3051 | 01011111 | -0.5804 | 0.3039 | 10011111 | 0.5804 | -0.3039 | 11011111 | -0.5794 | -0.3051 |
| 00100000 | 0.1670 | 1.5818 | 01100000 | -0.1511 | 1.5880 | 10100000 | 0.1511 | -1.5880 | 11100000 | -0.1670 | -1.5818 |
| 00100001 | 0.4741 | 1.5223 | 01100001 | -0.4615 | 1.5302 | 10100001 | 0.4615 | -1.5302 | 11100001 | -0.4741 | -1.5223 |
| 00100010 | 0.1216 | 1.3408 | 01100010 | -0.1376 | 1.3434 | 10100010 | 0.1376 | -1.3434 | 11100010 | -0.1216 | -1.3408 |
| 00100011 | 0.3832 | 1.2939 | 01100011 | -0.3925 | 1.2905 | 10100011 | 0.3925 | -1.2905 | 11100011 | -0.3832 | -1.2939 |
| 00100100 | 1.0217 | 1.2213 | 01100100 | -1.0038 | 1.2453 | 10100100 | 1.0038 | -1.2453 | 11100100 | -1.0217 | -1.2213 |
| 00100101 | 0.7640 | 1.4032 | 01100101 | -0.7483 | 1.4134 | 10100101 | 0.7483 | -1.4134 | 11100101 | -0.7640 | -1.4032 |
| 00100110 | 0.8470 | 1.0487 | 01100110 | -0.8596 | 1.0389 | 10100110 | 0.8596 | -1.0389 | 11100110 | -0.8470 | -1.0487 |
| 00100111 | 0.6242 | 1.1954 | 01100111 | -0.6376 | 1.1916 | 10100111 | 0.6376 | -1.1916 | 11100111 | -0.6242 | -1.1954 |
| 00101000 | 0.0925 | 0.9668 | 01101000 | -0.0957 | 0.9637 | 10101000 | 0.0957 | -0.9637 | 11101000 | -0.0925 | -0.9668 |

FIG. 118

| $d_0d_1...d_{7j}$ | Re($e_i$) | Im($e_i$) | $d_0d_1...d_{7j}$ | Re($e_i$) | Im($e_i$) | $d_0d_1...d_{7j}$ | Re($e_i$) | Im($e_i$) | $d_0d_1...d_{7j}$ | Re($e_i$) | Im($e_i$) |
|---|---|---|---|---|---|---|---|---|---|---|---|
| 00101001 | 0.2777 | 0.9331 | 01101001 | -0.2819 | 0.9294 | 10101001 | 0.2819 | -0.9294 | 11101001 | -0.2777 | -0.9331 |
| 00101010 | 0.1078 | 1.1426 | 01101010 | -0.1158 | 1.1405 | 10101010 | 0.1158 | -1.1405 | 11101010 | -0.1078 | -1.1426 |
| 00101011 | 0.3282 | 1.0979 | 01101011 | -0.3354 | 1.0976 | 10101011 | 0.3354 | -1.0976 | 11101011 | -0.3282 | -1.0979 |
| 00101100 | 0.6156 | 0.7499 | 01101100 | -0.6154 | 0.7500 | 10101100 | 0.6154 | -0.7500 | 11101100 | -0.6156 | -0.7499 |
| 00101101 | 0.4590 | 0.8564 | 01101101 | -0.4579 | 0.8555 | 10101101 | 0.4579 | -0.8555 | 11101101 | -0.4590 | -0.8564 |
| 00101110 | 0.7273 | 0.8870 | 01101110 | -0.7277 | 0.8845 | 10101110 | 0.7277 | -0.8845 | 11101110 | -0.7273 | -0.8870 |
| 00101111 | 0.5375 | 1.0119 | 01101111 | -0.5424 | 1.0114 | 10101111 | 0.5424 | -1.0114 | 11101111 | -0.5375 | -1.0119 |
| 00110000 | 1.5880 | 0.1511 | 01110000 | -1.5818 | 0.1670 | 10110000 | 1.5818 | -0.1670 | 11110000 | -1.5880 | -0.1511 |
| 00110001 | 1.5302 | 0.4615 | 01110001 | -1.5223 | 0.4741 | 10110001 | 1.5223 | -0.4741 | 11110001 | -1.5302 | -0.4615 |
| 00110010 | 1.3434 | 0.1376 | 01110010 | -1.3408 | 0.1216 | 10110010 | 1.3408 | -0.1216 | 11110010 | -1.3434 | -0.1376 |
| 00110011 | 1.2905 | 0.3925 | 01110011 | -1.2939 | 0.3832 | 10110011 | 1.2939 | -0.3832 | 11110011 | -1.2905 | -0.3925 |
| 00110100 | 1.2453 | 1.0038 | 01110100 | -1.2213 | 1.0217 | 10110100 | 1.2213 | -1.0217 | 11110100 | -1.2453 | -1.0038 |
| 00110101 | 1.4134 | 0.7483 | 01110101 | -1.4032 | 0.7640 | 10110101 | 1.4032 | -0.7640 | 11110101 | -1.4134 | -0.7483 |
| 00110110 | 1.0389 | 0.8596 | 01110110 | -1.0487 | 0.8470 | 10110110 | 1.0487 | -0.8470 | 11110110 | -1.0389 | -0.8596 |
| 00110111 | 1.1916 | 0.6376 | 01110111 | -1.1954 | 0.6242 | 10110111 | 1.1954 | -0.6242 | 11110111 | -1.1916 | -0.6376 |
| 00111000 | 0.9637 | 0.0957 | 01111000 | -0.9668 | 0.0925 | 10111000 | 0.9668 | -0.0925 | 11111000 | -0.9637 | -0.0957 |
| 00111001 | 0.9294 | 0.2819 | 01111001 | -0.9331 | 0.2777 | 10111001 | 0.9331 | -0.2777 | 11111001 | -0.9294 | -0.2819 |
| 00111010 | 1.1405 | 0.1158 | 01111010 | -1.1426 | 0.1078 | 10111010 | 1.1426 | -0.1078 | 11111010 | -1.1405 | -0.1158 |
| 00111011 | 1.0976 | 0.3354 | 01111011 | -1.0979 | 0.3282 | 10111011 | 1.0979 | -0.3282 | 11111011 | -1.0976 | -0.3354 |
| 00111100 | 0.7500 | 0.6154 | 01111100 | -0.7499 | 0.6156 | 10111100 | 0.7499 | -0.6156 | 11111100 | -0.7500 | -0.6154 |
| 00111101 | 0.8555 | 0.4579 | 01111101 | -0.8564 | 0.4590 | 10111101 | 0.8564 | -0.4590 | 11111101 | -0.8555 | -0.4579 |
| 00111110 | 0.8845 | 0.7277 | 01111110 | -0.8870 | 0.7273 | 10111110 | 0.8870 | -0.7273 | 11111110 | -0.8845 | -0.7277 |
| 00111111 | 1.0114 | 0.5424 | 01111111 | -1.0119 | 0.5375 | 10111111 | 1.0119 | -0.5375 | 11111111 | -1.0114 | -0.5424 |

FIG. 120

| $d_0,d_{1j},...d_{7j}$ | Re($e_j$) | Im($e_j$) | $d_0,d_{1j},...d_{7j}$ | Re($e_j$) | Im($e_j$) | $d_0,d_{1j},...d_{7j}$ | Re($e_j$) | Im($e_j$) | $d_0,d_{1j},...d_{7j}$ | Re($e_j$) | Im($e_j$) |
|---|---|---|---|---|---|---|---|---|---|---|---|
| 00000000 | 0.0574 | 0.1963 | 01000000 | -0.0574 | 0.1963 | 10000000 | 0.0574 | -0.1963 | 11000000 | -0.0574 | -0.1963 |
| 00000001 | 0.0669 | 0.3144 | 01000001 | -0.0669 | 0.3144 | 10000001 | 0.0669 | -0.3144 | 11000001 | -0.0669 | -0.3144 |
| 00000010 | 0.0572 | 0.5009 | 01000010 | -0.0572 | 0.5009 | 10000010 | 0.0572 | -0.5009 | 11000010 | -0.0572 | -0.5009 |
| 00000011 | 0.1248 | 0.4458 | 01000011 | -0.1248 | 0.4458 | 10000011 | 0.1248 | -0.4458 | 11000011 | -0.1248 | -0.4458 |
| 00000100 | 0.1712 | 0.1992 | 01000100 | -0.1712 | 0.1992 | 10000100 | 0.1712 | -0.1992 | 11000100 | -0.1712 | -0.1992 |
| 00000101 | 0.2082 | 0.2587 | 01000101 | -0.2082 | 0.2587 | 10000101 | 0.2082 | -0.2587 | 11000101 | -0.2082 | -0.2587 |
| 00000110 | 0.3301 | 0.3896 | 01000110 | -0.3301 | 0.3896 | 10000110 | 0.3301 | -0.3896 | 11000110 | -0.3301 | -0.3896 |
| 00000111 | 0.2440 | 0.4019 | 01000111 | -0.2440 | 0.4019 | 10000111 | 0.2440 | -0.4019 | 11000111 | -0.2440 | -0.4019 |
| 00001000 | 0.0794 | 0.8118 | 01001000 | -0.0794 | 0.8118 | 10001000 | 0.0794 | -0.8118 | 11001000 | -0.0794 | -0.8118 |
| 00001001 | 0.2342 | 0.7783 | 01001001 | -0.2342 | 0.7783 | 10001001 | 0.2342 | -0.7783 | 11001001 | -0.2342 | -0.7783 |
| 00001010 | 0.0689 | 0.6496 | 01001010 | -0.0689 | 0.6496 | 10001010 | 0.0689 | -0.6496 | 11001010 | -0.0689 | -0.6496 |
| 00001011 | 0.1934 | 0.6217 | 01001011 | -0.1934 | 0.6217 | 10001011 | 0.1934 | -0.6217 | 11001011 | -0.1934 | -0.6217 |
| 00001100 | 0.5135 | 0.6336 | 01001100 | -0.5135 | 0.6336 | 10001100 | 0.5135 | -0.6336 | 11001100 | -0.5135 | -0.6336 |
| 00001101 | 0.3795 | 0.7192 | 01001101 | -0.3795 | 0.7192 | 10001101 | 0.3795 | -0.7192 | 11001101 | -0.3795 | -0.7192 |
| 00001110 | 0.4174 | 0.5130 | 01001110 | -0.4174 | 0.5130 | 10001110 | 0.4174 | -0.5130 | 11001110 | -0.4174 | -0.5130 |
| 00001111 | 0.3054 | 0.5754 | 01001111 | -0.3054 | 0.5754 | 10001111 | 0.3054 | -0.5754 | 11001111 | -0.3054 | -0.5754 |
| 00010000 | 0.0662 | 0.0590 | 01010000 | -0.0662 | 0.0590 | 10010000 | 0.0662 | -0.0590 | 11010000 | -0.0662 | -0.0590 |
| 00010001 | 0.3775 | 0.0575 | 01010001 | -0.3775 | 0.0575 | 10010001 | 0.3775 | -0.0575 | 11010001 | -0.3775 | -0.0575 |
| 00010010 | 0.5724 | 0.0565 | 01010010 | -0.5724 | 0.0565 | 10010010 | 0.5724 | -0.0565 | 11010010 | -0.5724 | -0.0565 |

FIG. 121

| $d_0d_1,...d_{7J}$ | Re(e$_j$) | Im(e$_j$) | $d_0d_1,...d_{7J}$ | Re(e$_j$) | Im(e$_j$) | $d_0d_1,...d_{7J}$ | Re(e$_j$) | Im(e$_j$) |
|---|---|---|---|---|---|---|---|---|
| 00010011 | 0.4995 | 0.1254 | 01010011 | -0.4995 | 0.1254 | 10010011 | 0.4995 | -0.1254 |

FIG. 122

| $d_0,d_1,...d_{7,l}$ | Re($e_l$) | Im($e_l$) | $d_0,d_{1,l}...d_{7,l}$ | Re($e_l$) | Im($e_l$) | $d_0,d_{1,l}...d_{7,l}$ | Re($e_l$) | Im($e_l$) | $d_0,d_{1,l}...d_{7,l}$ | Re($e_l$) | Im($e_l$) |
|---|---|---|---|---|---|---|---|---|---|---|---|
| 00101001 | 0.2795 | 0.9338 | 01101001 | -0.2795 | 0.9338 | 10101001 | 0.2795 | -0.9338 | 11101001 | -0.2795 | -0.9338 |
| 00101010 | 0.1114 | 1.1460 | 01101010 | -0.1114 | 1.1460 | 10101010 | 0.1114 | -1.1460 | 11101010 | -0.1114 | -1.1460 |
| 00101011 | 0.3287 | 1.0979 | 01101011 | -0.3287 | 1.0979 | 10101011 | 0.3287 | -1.0979 | 11101011 | -0.3287 | -1.0979 |
| 00101100 | 0.6125 | 0.7588 | 01101100 | -0.6125 | 0.7588 | 10101100 | 0.6125 | -0.7588 | 11101100 | -0.6125 | -0.7588 |
| 00101101 | 0.4536 | 0.8607 | 01101101 | -0.4536 | 0.8607 | 10101101 | 0.4536 | -0.8607 | 11101101 | -0.4536 | -0.8607 |
| 00101110 | 0.7204 | 0.8902 | 01101110 | -0.7204 | 0.8902 | 10101110 | 0.7204 | -0.8902 | 11101110 | -0.7204 | -0.8902 |
| 00101111 | 0.5336 | 1.0118 | 01101111 | -0.5336 | 1.0118 | 10101111 | 0.5336 | -1.0118 | 11101111 | -0.5336 | -1.0118 |
| 00110000 | 1.5611 | 0.1362 | 01110000 | -1.5611 | 0.1362 | 10110000 | 1.5611 | -0.1362 | 11110000 | -1.5611 | -0.1362 |
| 00110001 | 1.5001 | 0.4134 | 01110001 | -1.5001 | 0.4134 | 10110001 | 1.5001 | -0.4134 | 11110001 | -1.5001 | -0.4134 |
| 00110010 | 1.3345 | 0.1491 | 01110010 | -1.3345 | 0.1491 | 10110010 | 1.3345 | -0.1491 | 11110010 | -1.3345 | -0.1491 |
| 00110011 | 1.2695 | 0.4351 | 01110011 | -1.2695 | 0.4351 | 10110011 | 1.2695 | -0.4351 | 11110011 | -1.2695 | -0.4351 |
| 00110100 | 1.2290 | 0.9646 | 01110100 | -1.2290 | 0.9646 | 10110100 | 1.2290 | -0.9646 | 11110100 | -1.2290 | -0.9646 |
| 00110101 | 1.3962 | 0.7020 | 01110101 | -1.3962 | 0.7020 | 10110101 | 1.3962 | -0.7020 | 11110101 | -1.3962 | -0.7020 |
| 00110110 | 0.9999 | 0.8909 | 01110110 | -0.9999 | 0.8909 | 10110110 | 0.9999 | -0.8909 | 11110110 | -0.9999 | -0.8909 |
| 00110111 | 1.1576 | 0.6802 | 01110111 | -1.1576 | 0.6802 | 10110111 | 1.1576 | -0.6802 | 11110111 | -1.1576 | -0.6802 |
| 00111000 | 0.9854 | 0.0994 | 01111000 | -0.9854 | 0.0994 | 10111000 | 0.9854 | -0.0994 | 11111000 | -0.9854 | -0.0994 |
| 00111001 | 0.9486 | 0.2947 | 01111001 | -0.9486 | 0.2947 | 10111001 | 0.9486 | -0.2947 | 11111001 | -0.9486 | -0.2947 |
| 00111010 | 1.1510 | 0.1088 | 01111010 | -1.1510 | 0.1088 | 10111010 | 1.1510 | -0.1088 | 11111010 | -1.1510 | -0.1088 |
| 00111011 | 1.1110 | 0.3299 | 01111011 | -1.1110 | 0.3299 | 10111011 | 1.1110 | -0.3299 | 11111011 | -1.1110 | -0.3299 |
| 00111100 | 0.7523 | 0.6302 | 01111100 | -0.7523 | 0.6302 | 10111100 | 0.7523 | -0.6302 | 11111100 | -0.7523 | -0.6302 |
| 00111101 | 0.8680 | 0.4747 | 01111101 | -0.8680 | 0.4747 | 10111101 | 0.8680 | -0.4747 | 11111101 | -0.8680 | -0.4747 |
| 00111110 | 0.8846 | 0.7348 | 01111110 | -0.8846 | 0.7348 | 10111110 | 0.8846 | -0.7348 | 11111110 | -0.8846 | -0.7348 |
| 00111111 | 1.0176 | 0.5463 | 01111111 | -1.0176 | 0.5463 | 10111111 | 1.0176 | -0.5463 | 11111111 | -1.0176 | -0.5463 |

| $d_0,d_1,...d_{5,l}$ | Re(e$_l$) | Im(e$_l$) | $d_0,d_1,...d_{5,l}$ | Re(e$_l$) | Im(e$_l$) | $d_0,d_1,...d_{5,l}$ | Re(e$_l$) | Im(e$_l$) | $d_0,d_1,...d_{5,l}$ | Re(e$_l$) | Im(e$_l$) |
|---|---|---|---|---|---|---|---|---|---|---|---|
| 000000 | 1.4572 | 0.3311 | 010000 | 0.3311 | -1.4572 | 100000 | -0.3311 | 1.4572 | 110000 | -1.4572 | -0.3311 |
| 000001 | 1.1531 | 0.7846 | 010001 | 1.1773 | -0.7647 | 100001 | -1.1773 | 0.7647 | 110001 | -1.1531 | -0.7846 |
| 000010 | 0.7647 | 1.1773 | 010010 | 0.7846 | -1.1531 | 100010 | -0.7846 | 1.1531 | 110010 | -0.7647 | -1.1773 |
| 000011 | 0.7345 | 0.7657 | 010011 | 0.7657 | -0.7345 | 100011 | -0.7657 | 0.7345 | 110011 | -0.7345 | -0.7657 |
| 000100 | 1.0771 | 0.0825 | 010100 | 1.3907 | -0.2062 | 100100 | -1.3907 | 0.2062 | 110100 | -1.0771 | -0.0825 |
| 000101 | 1.0071 | 0.4243 | 010101 | 1.0539 | -0.3794 | 100101 | -1.0539 | 0.3794 | 110101 | -1.0071 | -0.4243 |
| 000110 | 0.7207 | 0.1124 | 010110 | 0.6879 | -0.1408 | 100110 | -0.6879 | 0.1408 | 110110 | -0.7207 | -0.1124 |
| 000111 | 0.7042 | 0.4186 | 010111 | 0.7258 | -0.4079 | 100111 | -0.7258 | 0.4079 | 110111 | -0.7042 | -0.4186 |
| 001000 | 0.2062 | 1.3907 | 011000 | 0.0825 | -1.0771 | 101000 | -0.0825 | 1.0771 | 111000 | -0.2062 | -1.3907 |
| 001001 | 0.1408 | 0.6879 | 011001 | 0.1124 | -0.7207 | 101001 | -0.1124 | 0.7207 | 111001 | -0.1408 | -0.6879 |
| 001010 | 0.3794 | 1.0539 | 011010 | 0.4243 | -1.0071 | 101010 | -0.4243 | 1.0071 | 111010 | -0.3794 | -1.0539 |
| 001011 | 0.4079 | 0.7258 | 011011 | 0.4186 | -0.7042 | 101011 | -0.4186 | 0.7042 | 111011 | -0.4079 | -0.7258 |
| 001100 | 0.1340 | 0.1304 | 011100 | 0.1304 | -0.1340 | 101100 | -0.1304 | 0.1340 | 111100 | -0.1340 | -0.1304 |
| 001101 | 0.1397 | 0.4017 | 011101 | 0.4017 | -0.1293 | 101101 | -0.1293 | 0.4088 | 111101 | -0.1397 | -0.4017 |
| 001110 | 0.4088 | 0.1293 | 011110 | 0.4017 | -0.1397 | 101110 | -0.4017 | 0.1397 | 111110 | -0.4088 | -0.1293 |
| 001111 | 0.4215 | 0.4074 | 011111 | 0.4074 | -0.4215 | 101111 | -0.4074 | 0.4215 | 111111 | -0.4215 | -0.4074 |

| $d_0,d_1,...d_{5,I}$ | Re($e_i$) | Im($e_i$) | $d_0,d_1,...d_{5,I}$ | Re($e_i$) | Im($e_i$) | $d_0,d_1,...d_{5,I}$ | Re($e_i$) | Im($e_i$) | $d_0,d_1,...d_{5,I}$ | Re($e_i$) | Im($e_i$) |
|---|---|---|---|---|---|---|---|---|---|---|---|
| 000000 | 1.4319 | 0.2300 | 010000 | -1.4319 | 0.2300 | 100000 | 1.4319 | -0.2300 | 110000 | -1.4319 | -0.2300 |
| 000001 | 1.0762 | 0.9250 | 010001 | -1.0762 | 0.9250 | 100001 | 1.0762 | -0.9250 | 110001 | -1.0762 | -0.9250 |
| 000010 | 0.6290 | 1.1820 | 010010 | -0.6290 | 1.1820 | 100010 | 0.6290 | -1.1820 | 110010 | -0.6290 | -1.1820 |
| 000011 | 0.6851 | 0.8072 | 010011 | -0.6851 | 0.8072 | 100011 | 0.6851 | -0.8072 | 110011 | -0.6851 | -0.8072 |
| 000100 | 1.0443 | 0.1688 | 010100 | -1.0443 | 0.1688 | 100100 | 1.0443 | -0.1688 | 110100 | -1.0443 | -0.1688 |
| 000101 | 1.0635 | 0.5305 | 010101 | -1.0635 | 0.5305 | 100101 | 1.0635 | -0.5305 | 110101 | -1.0635 | -0.5305 |
| 000110 | 0.7220 | 0.1540 | 010110 | -0.7220 | 0.1540 | 100110 | 0.7220 | -0.1540 | 110110 | -0.7220 | -0.1540 |
| 000111 | 0.7151 | 0.4711 | 010111 | -0.7151 | 0.4711 | 100111 | 0.7151 | -0.4711 | 110111 | -0.7151 | -0.4711 |
| 001000 | 0.2099 | 1.4205 | 011000 | -0.2099 | 1.4205 | 101000 | 0.2099 | -1.4205 | 111000 | -0.2099 | -1.4205 |
| 001001 | 0.1190 | 0.6677 | 011001 | -0.1190 | 0.6677 | 101001 | 0.1190 | -0.6677 | 111001 | -0.1190 | -0.6677 |
| 001010 | 0.2031 | 1.0551 | 011010 | -0.2031 | 1.0551 | 101010 | 0.2031 | -1.0551 | 111010 | -0.2031 | -1.0551 |
| 001011 | 0.3722 | 0.7548 | 011011 | -0.3722 | 0.7548 | 101011 | 0.3722 | -0.7548 | 111011 | -0.3722 | -0.7548 |
| 001100 | 0.1438 | 0.1287 | 011100 | -0.1438 | 0.1287 | 101100 | 0.1438 | -0.1287 | 111100 | -0.1438 | -0.1287 |
| 001101 | 0.1432 | 0.3903 | 011101 | -0.1432 | 0.3903 | 101101 | 0.1432 | -0.3903 | 111101 | -0.1432 | -0.3903 |
| 001110 | 0.4298 | 0.1384 | 011110 | -0.4298 | 0.1384 | 101110 | 0.4298 | -0.1384 | 111110 | -0.4298 | -0.1384 |
| 001111 | 0.4215 | 0.4279 | 011111 | -0.4215 | 0.4279 | 101111 | 0.4215 | -0.4279 | 111111 | -0.4215 | -0.4279 |

FIG. 126

| $d_0d_1...d_{71}$ | Re($e_l$) | Im($e_l$) | $d_0d_1...d_{71}$ | Re($e_l$) | Im($e_l$) | $d_0d_1...d_{71}$ | Re($e_l$) | Im($e_l$) | $d_0d_1...d_{71}$ | Re($e_l$) | Im($e_l$) |
|---|---|---|---|---|---|---|---|---|---|---|---|
| 00000000 | 0.3620 | -1.5134 | 01000000 | -1.5134 | -0.3620 | 10000000 | 1.5134 | 0.3620 | 11000000 | -0.3620 | 1.5134 |
| 00000001 | 1.2890 | 0.9657 | 01000001 | 1.5016 | 0.0222 | 10000001 | -1.5016 | -0.0222 | 11000001 | -1.2890 | -0.9657 |
| 00000010 | -0.0222 | 1.5016 | 01000010 | 0.9657 | -1.2890 | 10000010 | -0.9657 | 1.2890 | 11000010 | 0.0222 | -1.5016 |
| 00000011 | 1.0671 | 1.0750 | 01000011 | 1.0750 | -1.0671 | 10000011 | -1.0750 | 1.0671 | 11000011 | -1.0671 | -1.0750 |
| 00000100 | 1.3840 | 0.6109 | 01000100 | 1.2232 | -0.6194 | 10000100 | -1.2232 | 0.6194 | 11000100 | -1.3840 | -0.6109 |
| 00000101 | 1.2061 | 0.7526 | 01000101 | 1.2750 | -0.8471 | 10000101 | -1.2750 | 0.8471 | 11000101 | -1.2061 | -0.7526 |
| 00000110 | 0.9870 | 0.6534 | 01000110 | 1.0141 | -0.6534 | 10000110 | -1.0141 | 0.6534 | 11000110 | -0.9870 | -0.6534 |
| 00000111 | 1.0110 | 0.8456 | 01000111 | 1.0393 | -0.8424 | 10000111 | -1.0393 | 0.8424 | 11000111 | -1.0110 | -0.8456 |
| 00001000 | 0.6194 | 1.2232 | 01001000 | 0.6109 | -1.3840 | 10001000 | -0.6109 | 1.3840 | 11001000 | -0.6194 | -1.2232 |
| 00001001 | 0.6534 | 1.0141 | 01001001 | 0.6534 | -0.9870 | 10001001 | -0.6534 | 0.9870 | 11001001 | -0.6534 | -1.0141 |
| 00001010 | 0.8471 | 1.2750 | 01001010 | 0.7526 | -1.2061 | 10001010 | -0.7526 | 1.2061 | 11001010 | -0.8471 | -1.2750 |
| 00001011 | 0.8424 | 1.0393 | 01001011 | 0.8456 | -1.0110 | 10001011 | -0.8456 | 1.0110 | 11001011 | -0.8424 | -1.0393 |
| 00001100 | 0.6430 | 0.6487 | 01001100 | 0.6487 | -0.6430 | 10001100 | -0.6487 | 0.6430 | 11001100 | -0.6430 | -0.6487 |
| 00001101 | 0.6466 | 0.8204 | 01001101 | 0.6529 | -0.8103 | 10001101 | -0.6529 | 0.8103 | 11001101 | -0.6466 | -0.8204 |
| 00001110 | 0.8103 | 0.6529 | 01001110 | 0.8204 | -0.6466 | 10001110 | -0.8204 | 0.6466 | 11001110 | -0.8103 | -0.6529 |
| 00001111 | 0.8191 | 0.8365 | 01001111 | 0.8365 | -0.8191 | 10001111 | -0.8365 | 0.8191 | 11001111 | -0.8191 | -0.8365 |
| 00010000 | 1.1537 | 0.0759 | 01010000 | 1.2044 | -0.0977 | 10010000 | -1.2044 | 0.0977 | 11010000 | -1.1537 | -0.0759 |
| 00010001 | 1.3042 | 0.1868 | 01010001 | 1.4051 | -0.2026 | 10010001 | -1.4051 | 0.2026 | 11010001 | -1.3042 | -0.1868 |
| 00010010 | 0.9716 | 0.0615 | 01010010 | 0.9901 | -0.0764 | 10010010 | -0.9901 | 0.0764 | 11010010 | -0.9716 | -0.0615 |

FIG. 127

| $d_0d_1...d_{71}$ | Re($e_l$) | Im($e_l$) | $d_0d_1...d_{71}$ | Re($e_l$) | Im($e_l$) | $d_0d_1...d_{71}$ | Re($e_l$) | Im($e_l$) | $d_0d_1...d_{71}$ | Re($e_l$) | Im($e_l$) |
|---|---|---|---|---|---|---|---|---|---|---|---|
| 00010011 | 0.9503 | 0.1965 | 01010011 | 0.9754 | -0.2036 | 10010011 | -0.9754 | 0.2036 | 11010011 | -0.9503 | -0.1965 |
| 00010100 | 1.1935 | 0.4932 | 01010100 | 1.4180 | -0.4906 | 10010100 | -1.4180 | 0.4906 | 11010100 | -1.1935 | -0.4932 |
| 00010101 | 1.1614 | 0.3127 | 01010101 | 1.2175 | -0.3462 | 10010101 | -1.2175 | 0.3462 | 11010101 | -1.1614 | -0.3127 |
| 00010110 | 0.9850 | 0.4897 | 01010110 | 1.0063 | -0.4878 | 10010110 | -1.0063 | 0.4878 | 11010110 | -0.9850 | -0.4897 |
| 00010111 | 0.9766 | 0.3332 | 01010111 | 1.0145 | -0.3370 | 10010111 | -1.0145 | 0.3370 | 11010111 | -0.9766 | -0.3332 |
| 00011000 | 0.6299 | 0.0609 | 01011000 | 0.6300 | -0.0730 | 10011000 | -0.6300 | 0.0730 | 11011000 | -0.6299 | -0.0609 |
| 00011001 | 0.6308 | 0.1979 | 01011001 | 0.6334 | -0.2064 | 10011001 | -0.6334 | 0.2064 | 11011001 | -0.6308 | -0.1979 |
| 00011010 | 0.7914 | 0.0587 | 01011010 | 0.7974 | -0.0729 | 10011010 | -0.7974 | 0.0729 | 11011010 | -0.7914 | -0.0587 |
| 00011011 | 0.7884 | 0.1977 | 01011011 | 0.8000 | -0.2038 | 10011011 | -0.8000 | 0.2038 | 11011011 | -0.7884 | -0.1977 |
| 00011100 | 0.6368 | 0.4901 | 01011100 | 0.6426 | -0.4884 | 10011100 | -0.6426 | 0.4884 | 11011100 | -0.6368 | -0.4901 |
| 00011101 | 0.6337 | 0.3402 | 01011101 | 0.6385 | -0.3418 | 10011101 | -0.6385 | 0.3418 | 11011101 | -0.6337 | -0.3402 |
| 00011110 | 0.8027 | 0.4900 | 01011110 | 0.8161 | -0.4869 | 10011110 | -0.8161 | 0.4869 | 11011110 | -0.8027 | -0.4900 |
| 00011111 | 0.7950 | 0.3425 | 01011111 | 0.8098 | -0.3436 | 10011111 | -0.8098 | 0.3436 | 11011111 | -0.7950 | -0.3425 |
| 00100000 | 0.0977 | 1.2044 | 01100000 | 0.0759 | -1.1537 | 10100000 | -0.0759 | 1.1537 | 11100000 | -0.0977 | -1.2044 |
| 00100001 | 0.0764 | 0.9901 | 01100001 | 0.0615 | -0.9716 | 10100001 | -0.0615 | 0.9716 | 11100001 | -0.0764 | -0.9901 |
| 00100010 | 0.2026 | 1.4051 | 01100010 | 0.1868 | -1.3042 | 10100010 | -0.1868 | 1.3042 | 11100010 | -0.2026 | -1.4051 |
| 00100011 | 0.2036 | 0.9754 | 01100011 | 0.1965 | -0.9503 | 10100011 | -0.1965 | 0.9503 | 11100011 | -0.2036 | -0.9754 |
| 00100100 | 0.0730 | 0.6300 | 01100100 | 0.0609 | -0.6299 | 10100100 | -0.0609 | 0.6299 | 11100100 | -0.0730 | -0.6300 |
| 00100101 | 0.0729 | 0.7974 | 01100101 | 0.0587 | -0.7914 | 10100101 | -0.0587 | 0.7914 | 11100101 | -0.0729 | -0.7974 |
| 00100110 | 0.2064 | 0.6334 | 01100110 | 0.1979 | -0.6308 | 10100110 | -0.1979 | 0.6308 | 11100110 | -0.2064 | -0.6334 |
| 00100111 | 0.2038 | 0.8000 | 01100111 | 0.1977 | -0.7884 | 10100111 | -0.1977 | 0.7884 | 11100111 | -0.2038 | -0.8000 |
| 00101000 | 0.4906 | 1.4180 | 01101000 | 0.4932 | -1.1935 | 10101000 | -0.4932 | 1.1935 | 11101000 | -0.4906 | -1.4180 |

FIG. 128

| $d_0 d_1 ... d_{71}$ | Re($e_l$) | Im($e_l$) | $d_0 d_1 ... d_{71}$ | Re($e_l$) | Im($e_l$) | $d_0 d_1 ... d_{71}$ | Re($e_l$) | Im($e_l$) | $d_0 d_1 ... d_{71}$ | Re($e_l$) | Im($e_l$) |
|---|---|---|---|---|---|---|---|---|---|---|---|
| 00101001 | 0.4878 | 1.0063 | 01101001 | 0.4897 | -0.9850 | 10101001 | -0.4897 | 0.9850 | 11101001 | -0.4878 | -1.0063 |
| 00101010 | 0.3462 | 1.2175 | 01101010 | 0.3127 | -1.1614 | 10101010 | -0.3127 | 1.1614 | 11101010 | -0.3462 | -1.2175 |
| 00101011 | 0.3370 | 1.0145 | 01101011 | 0.3332 | -0.9766 | 10101011 | -0.3332 | 0.9766 | 11101011 | -0.3370 | -1.0145 |
| 00101100 | 0.4884 | 0.6426 | 01101100 | 0.4901 | -0.6368 | 10101100 | -0.4901 | 0.6368 | 11101100 | -0.4884 | -0.6426 |
| 00101101 | 0.4869 | 0.8161 | 01101101 | 0.4900 | -0.8027 | 10101101 | -0.4900 | 0.8027 | 11101101 | -0.4869 | -0.8161 |
| 00101110 | 0.3418 | 0.6385 | 01101110 | 0.3402 | -0.6337 | 10101110 | -0.3402 | 0.6337 | 11101110 | -0.3418 | -0.6385 |
| 00101111 | 0.3436 | 0.8098 | 01101111 | 0.3425 | -0.7950 | 10101111 | -0.3425 | 0.7950 | 11101111 | -0.3436 | -0.8098 |
| 00110000 | 0.0652 | 0.0665 | 01110000 | 0.0665 | -0.0652 | 10110000 | -0.0665 | 0.0652 | 11110000 | -0.0652 | -0.0665 |
| 00110001 | 0.0655 | 0.1997 | 01110001 | 0.0693 | -0.2010 | 10110001 | -0.0693 | 0.2010 | 11110001 | -0.0655 | -0.1997 |
| 00110010 | 0.2010 | 0.0693 | 01110010 | 0.1997 | -0.0655 | 10110010 | -0.1997 | 0.0655 | 11110010 | -0.2010 | -0.0693 |
| 00110011 | 0.2010 | 0.2010 | 01110011 | 0.2010 | -0.2010 | 10110011 | -0.2010 | 0.2010 | 11110011 | -0.2010 | -0.2010 |
| 00110100 | 0.0699 | 0.4787 | 01110100 | 0.0654 | -0.4804 | 10110100 | -0.0654 | 0.4804 | 11110100 | -0.0699 | -0.4787 |
| 00110101 | 0.0672 | 0.3369 | 01110101 | 0.0680 | -0.3376 | 10110101 | -0.0680 | 0.3376 | 11110101 | -0.0672 | -0.3369 |
| 00110110 | 0.2041 | 0.4789 | 01110110 | 0.1992 | -0.4808 | 10110110 | -0.1992 | 0.4808 | 11110110 | -0.2041 | -0.4789 |
| 00110111 | 0.2017 | 0.3359 | 01110111 | 0.2014 | -0.3410 | 10110111 | -0.2014 | 0.3410 | 11110111 | -0.2017 | -0.3359 |
| 00111000 | 0.4804 | 0.0654 | 01111000 | 0.4787 | -0.0699 | 10111000 | -0.4787 | 0.0699 | 11111000 | -0.4804 | -0.0654 |
| 00111001 | 0.4808 | 0.1992 | 01111001 | 0.4789 | -0.2041 | 10111001 | -0.4789 | 0.2041 | 11111001 | -0.4808 | -0.1992 |
| 00111010 | 0.3376 | 0.0680 | 01111010 | 0.3369 | -0.0672 | 10111010 | -0.3369 | 0.0672 | 11111010 | -0.3376 | -0.0680 |
| 00111011 | 0.3410 | 0.2014 | 01111011 | 0.3359 | -0.2017 | 10111011 | -0.3359 | 0.2017 | 11111011 | -0.3410 | -0.2014 |
| 00111100 | 0.4856 | 0.4863 | 01111100 | 0.4863 | -0.4856 | 10111100 | -0.4863 | 0.4856 | 11111100 | -0.4856 | -0.4863 |
| 00111101 | 0.4843 | 0.3404 | 01111101 | 0.4838 | -0.3389 | 10111101 | -0.4838 | 0.3389 | 11111101 | -0.4843 | -0.3404 |
| 00111110 | 0.3389 | 0.4838 | 01111110 | 0.3404 | -0.4843 | 10111110 | -0.3404 | 0.4843 | 11111110 | -0.3389 | -0.4838 |
| 00111111 | 0.3423 | 0.3376 | 01111111 | 0.3376 | -0.3423 | 10111111 | -0.3376 | 0.3423 | 11111111 | -0.3423 | -0.3376 |

FIG. 130

| $d_0d_1...d_{7l}$ | Re($e_l$) | Im($e_l$) | $d_0d_1...d_{7l}$ | Re($e_l$) | Im($e_l$) | $d_0d_1...d_{7l}$ | Re($e_l$) | Im($e_l$) | $d_0d_1...d_{7l}$ | Re($e_l$) | Im($e_l$) |
|---|---|---|---|---|---|---|---|---|---|---|---|
| 00000000 | 1.2412 | 1.0688 | 01000000 | -1.2412 | 1.0688 | 10000000 | 1.2412 | -1.0688 | 11000000 | -1.2412 | -1.0688 |
| 00000001 | 1.2668 | 0.8034 | 01000001 | -1.2668 | 0.8034 | 10000001 | 1.2668 | -0.8034 | 11000001 | -1.2668 | -0.8034 |
| 00000010 | 0.9860 | 1.1758 | 01000010 | -0.9860 | 1.1758 | 10000010 | 0.9860 | -1.1758 | 11000010 | -0.9860 | -1.1758 |
| 00000011 | 1.0365 | 0.9065 | 01000011 | -1.0365 | 0.9065 | 10000011 | 1.0365 | -0.9065 | 11000011 | -1.0365 | -0.9065 |
| 00000100 | 1.2111 | 0.5135 | 01000100 | -1.2111 | 0.5135 | 10000100 | 1.2111 | -0.5135 | 11000100 | -1.2111 | -0.5135 |
| 00000101 | 1.4187 | 0.6066 | 01000101 | -1.4187 | 0.6066 | 10000101 | 1.4187 | -0.6066 | 11000101 | -1.4187 | -0.6066 |
| 00000110 | 1.0103 | 0.4879 | 01000110 | -1.0103 | 0.4879 | 10000110 | 1.0103 | -0.4879 | 11000110 | -1.0103 | -0.4879 |
| 00000111 | 1.0380 | 0.6906 | 01000111 | -1.0380 | 0.6906 | 10000111 | 1.0380 | -0.6906 | 11000111 | -1.0380 | -0.6906 |
| 00001000 | 0.6963 | 1.3442 | 01001000 | -0.6963 | 1.3442 | 10001000 | 0.6963 | -1.3442 | 11001000 | -0.6963 | -1.3442 |
| 00001001 | 0.7089 | 1.1122 | 01001001 | -0.7089 | 1.1122 | 10001001 | 0.7089 | -1.1122 | 11001001 | -0.7089 | -1.1122 |
| 00001010 | 0.1256 | 1.4745 | 01001010 | -0.1256 | 1.4745 | 10001010 | 0.1256 | -1.4745 | 11001010 | -0.1256 | -1.4745 |
| 00001011 | 0.8331 | 0.9455 | 01001011 | -0.8331 | 0.9455 | 10001011 | 0.8331 | -0.9455 | 11001011 | -0.8331 | -0.9455 |
| 00001100 | 0.6615 | 0.6012 | 01001100 | -0.6615 | 0.6012 | 10001100 | 0.6615 | -0.6012 | 11001100 | -0.6615 | -0.6012 |
| 00001101 | 0.6894 | 0.7594 | 01001101 | -0.6894 | 0.7594 | 10001101 | 0.6894 | -0.7594 | 11001101 | -0.6894 | -0.7594 |
| 00001110 | 0.8373 | 0.5633 | 01001110 | -0.8373 | 0.5633 | 10001110 | 0.8373 | -0.5633 | 11001110 | -0.8373 | -0.5633 |
| 00001111 | 0.8552 | 0.7410 | 01001111 | -0.8552 | 0.7410 | 10001111 | 0.8552 | -0.7410 | 11001111 | -0.8552 | -0.7410 |
| 00010000 | 1.2666 | 0.1027 | 01010000 | -1.2666 | 0.1027 | 10010000 | 1.2666 | -0.1027 | 11010000 | -1.2666 | -0.1027 |
| 00010001 | 1.4915 | 0.1198 | 01010001 | -1.4915 | 0.1198 | 10010001 | 1.4915 | -0.1198 | 11010001 | -1.4915 | -0.1198 |
| 00010010 | 1.0766 | 0.0945 | 01010010 | -1.0766 | 0.0945 | 10010010 | 1.0766 | -0.0945 | 11010010 | -1.0766 | -0.0945 |

FIG. 131

| $d_0,d_1,...d_{71}$ | Re($e_i$) | Im($e_i$) | $d_0,d_1,...d_{71}$ | Re($e_i$) | Im($e_i$) | $d_0,d_1,...d_{71}$ | Re($e_i$) | Im($e_i$) | $d_0,d_1,...d_{71}$ | Re($e_i$) | Im($e_i$) |
|---|---|---|---|---|---|---|---|---|---|---|---|
| 00010011 | 0.9007 | 0.0848 | 01010011 | -0.9007 | 0.0848 | 10010011 | 0.9007 | -0.0848 | 11010011 | -0.9007 | -0.0848 |
| 00010100 | 1.2454 | 0.3064 | 01010100 | -1.2454 | 0.3064 | 10010100 | 1.2454 | -0.3064 | 11010100 | -1.2454 | -0.3064 |
| 00010101 | 1.4646 | 0.3600 | 01010101 | -1.4646 | 0.3600 | 10010101 | 1.4646 | -0.3600 | 11010101 | -1.4646 | -0.3600 |
| 00010110 | 1.0570 | 0.2995 | 01010110 | -1.0570 | 0.2995 | 10010110 | 1.0570 | -0.2995 | 11010110 | -1.0570 | -0.2995 |
| 00010111 | 0.9140 | 0.2530 | 01010111 | -0.9140 | 0.2530 | 10010111 | 0.9140 | -0.2530 | 11010111 | -0.9140 | -0.2530 |
| 00011000 | 0.5461 | 0.0679 | 01011000 | -0.5461 | 0.0679 | 10011000 | 0.5461 | -0.0679 | 11011000 | -0.5461 | -0.0679 |
| 00011001 | 0.5681 | 0.1947 | 01011001 | -0.5681 | 0.1947 | 10011001 | 0.5681 | -0.1947 | 11011001 | -0.5681 | -0.1947 |
| 00011010 | 0.6874 | 0.0537 | 01011010 | -0.6874 | 0.0537 | 10011010 | 0.6874 | -0.0537 | 11011010 | -0.6874 | -0.0537 |
| 00011011 | 0.7375 | 0.1492 | 01011011 | -0.7375 | 0.1492 | 10011011 | 0.7375 | -0.1492 | 11011011 | -0.7375 | -0.1492 |
| 00011100 | 0.6290 | 0.4553 | 01011100 | -0.6290 | 0.4553 | 10011100 | 0.6290 | -0.4553 | 11011100 | -0.6290 | -0.4553 |
| 00011101 | 0.6007 | 0.3177 | 01011101 | -0.6007 | 0.3177 | 10011101 | 0.6007 | -0.3177 | 11011101 | -0.6007 | -0.3177 |
| 00011110 | 0.7885 | 0.4231 | 01011110 | -0.7885 | 0.4231 | 10011110 | 0.7885 | -0.4231 | 11011110 | -0.7885 | -0.4231 |
| 00011111 | 0.7627 | 0.2849 | 01011111 | -0.7627 | 0.2849 | 10011111 | 0.7627 | -0.2849 | 11011111 | -0.7627 | -0.2849 |
| 00100000 | 0.0816 | 1.1632 | 01100000 | -0.0816 | 1.1632 | 10100000 | 0.0816 | -1.1632 | 11100000 | -0.0816 | -1.1632 |
| 00100001 | 0.0830 | 0.9813 | 01100001 | -0.0830 | 0.9813 | 10100001 | 0.0830 | -0.9813 | 11100001 | -0.0830 | -0.9813 |
| 00100010 | 0.2528 | 1.2315 | 01100010 | -0.2528 | 1.2315 | 10100010 | 0.2528 | -1.2315 | 11100010 | -0.2528 | -1.2315 |
| 00100011 | 0.2502 | 1.0100 | 01100011 | -0.2502 | 1.0100 | 10100011 | 0.2502 | -1.0100 | 11100011 | -0.2502 | -1.0100 |
| 00100100 | 0.0732 | 0.6827 | 01100100 | -0.0732 | 0.6827 | 10100100 | 0.0732 | -0.6827 | 11100100 | -0.0732 | -0.6827 |
| 00100101 | 0.0811 | 0.8293 | 01100101 | -0.0811 | 0.8293 | 10100101 | 0.0811 | -0.8293 | 11100101 | -0.0811 | -0.8293 |
| 00100110 | 0.2159 | 0.6673 | 01100110 | -0.2159 | 0.6673 | 10100110 | 0.2159 | -0.6673 | 11100110 | -0.2159 | -0.6673 |
| 00100111 | 0.2359 | 0.8283 | 01100111 | -0.2359 | 0.8283 | 10100111 | 0.2359 | -0.8283 | 11100111 | -0.2359 | -0.8283 |
| 00101000 | 0.4302 | 1.4458 | 01101000 | -0.4302 | 1.4458 | 10101000 | 0.4302 | -1.4458 | 11101000 | -0.4302 | -1.4458 |

FIG. 132

| $d_0d_1\ldots d_{7l}$ | Re($e_l$) | Im($e_l$) | $d_0d_1\ldots d_{7l}$ | Re($e_l$) | Im($e_l$) | $d_0d_1\ldots d_{7l}$ | Re($e_l$) | Im($e_l$) | $d_0d_1\ldots d_{7l}$ | Re($e_l$) | Im($e_l$) |
|---|---|---|---|---|---|---|---|---|---|---|---|
| 00101001 | 0.5852 | 0.9680 | 01101001 | -0.5852 | 0.9680 | 10101001 | 0.5852 | -0.9680 | 11101001 | -0.5852 | -0.9680 |
| 00101010 | 0.4528 | 1.2074 | 01101010 | -0.4528 | 1.2074 | 10101010 | 0.4528 | -1.2074 | 11101010 | -0.4528 | -1.2074 |
| 00101011 | 0.4167 | 1.0099 | 01101011 | -0.4167 | 1.0099 | 10101011 | 0.4167 | -1.0099 | 11101011 | -0.4167 | -1.0099 |
| 00101100 | 0.5035 | 0.6307 | 01101100 | -0.5035 | 0.6307 | 10101100 | 0.5035 | -0.6307 | 11101100 | -0.5035 | -0.6307 |
| 00101101 | 0.5359 | 0.7954 | 01101101 | -0.5359 | 0.7954 | 10101101 | 0.5359 | -0.7954 | 11101101 | -0.5359 | -0.7954 |
| 00101110 | 0.3580 | 0.6532 | 01101110 | -0.3580 | 0.6532 | 10101110 | 0.3580 | -0.6532 | 11101110 | -0.3580 | -0.6532 |
| 00101111 | 0.3841 | 0.8207 | 01101111 | -0.3841 | 0.8207 | 10101111 | 0.3841 | -0.8207 | 11101111 | -0.3841 | -0.8207 |
| 00110000 | 0.0576 | 0.0745 | 01110000 | -0.0576 | 0.0745 | 10110000 | 0.0576 | -0.0745 | 11110000 | -0.0576 | -0.0745 |
| 00110001 | 0.0581 | 0.2241 | 01110001 | -0.0581 | 0.2241 | 10110001 | 0.0581 | -0.2241 | 11110001 | -0.0581 | -0.2241 |
| 00110010 | 0.1720 | 0.0742 | 01110010 | -0.1720 | 0.0742 | 10110010 | 0.1720 | -0.0742 | 11110010 | -0.1720 | -0.0742 |
| 00110011 | 0.1753 | 0.2222 | 01110011 | -0.1753 | 0.2222 | 10110011 | 0.1753 | -0.2222 | 11110011 | -0.1753 | -0.2222 |
| 00110100 | 0.0652 | 0.5269 | 01110100 | -0.0652 | 0.5269 | 10110100 | 0.0652 | -0.5269 | 11110100 | -0.0652 | -0.5269 |
| 00110101 | 0.0611 | 0.3767 | 01110101 | -0.0611 | 0.3767 | 10110101 | 0.0611 | -0.3767 | 11110101 | -0.0611 | -0.3767 |
| 00110110 | 0.1972 | 0.5178 | 01110110 | -0.1972 | 0.5178 | 10110110 | 0.1972 | -0.5178 | 11110110 | -0.1972 | -0.5178 |
| 00110111 | 0.1836 | 0.3695 | 01110111 | -0.1836 | 0.3695 | 10110111 | 0.1836 | -0.3695 | 11110111 | -0.1836 | -0.3695 |
| 00111000 | 0.4145 | 0.0709 | 01111000 | -0.4145 | 0.0709 | 10111000 | 0.4145 | -0.0709 | 11111000 | -0.4145 | -0.0709 |
| 00111001 | 0.4266 | 0.2100 | 01111001 | -0.4266 | 0.2100 | 10111001 | 0.4266 | -0.2100 | 11111001 | -0.4266 | -0.2100 |
| 00111010 | 0.2912 | 0.0730 | 01111010 | -0.2912 | 0.0730 | 10111010 | 0.2912 | -0.0730 | 11111010 | -0.2912 | -0.0730 |
| 00111011 | 0.2982 | 0.2177 | 01111011 | -0.2982 | 0.2177 | 10111011 | 0.2982 | -0.2177 | 11111011 | -0.2982 | -0.2177 |
| 00111100 | 0.4766 | 0.4821 | 01111100 | -0.4766 | 0.4821 | 10111100 | 0.4766 | -0.4821 | 11111100 | -0.4766 | -0.4821 |
| 00111101 | 0.4497 | 0.3448 | 01111101 | -0.4497 | 0.3448 | 10111101 | 0.4497 | -0.3448 | 11111101 | -0.4497 | -0.3448 |
| 00111110 | 0.3334 | 0.5025 | 01111110 | -0.3334 | 0.5025 | 10111110 | 0.3334 | -0.5025 | 11111110 | -0.3334 | -0.5025 |
| 00111111 | 0.3125 | 0.3601 | 01111111 | -0.3125 | 0.3601 | 10111111 | 0.3125 | -0.3601 | 11111111 | -0.3125 | -0.3601 |

APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

This application claims the benefit of U.S. Provisional Patent Application Nos. 61/908,728 filed on Nov. 25, 2013, 61/908,729 filed on Nov. 25, 2013, 61/908,730 filed on Nov. 26, 2013, 61/908,731 filed on Nov. 26, 2013, 61/908,732 filed on Nov. 26, 2013, 61/908,734 filed on Nov. 26, 2013, 61/908,736 filed on Nov. 26, 2013, 61/908,738 filed on Nov. 26, 2013, 61/908,739 filed on Nov. 26, 2013 and 61/908,741 filed on Nov. 26, 2013 which is hereby incorporated by reference as if fully set forth herein.

BACKGROUND OF THE INVENTION

1. Field of the Invention

The present invention relates to an apparatus for transmitting broadcast signals, an apparatus for receiving broadcast signals and methods for transmitting and receiving broadcast signals.

2. Discussion of the Related Art

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

That is, a digital broadcast system can provide HD (high definition) images, multi-channel audio and various additional services. However, data transmission efficiency for transmission of large amounts of data, robustness of transmission/reception networks and network flexibility in consideration of mobile reception equipment need to be improved for digital broadcast.

SUMMARY OF THE INVENTION

Accordingly, the present invention is directed to an apparatus for transmitting broadcast signals and an apparatus for receiving broadcast signals for future broadcast services and methods for transmitting and receiving broadcast signals for future broadcast services.

An object of the present invention is to provide an apparatus and method for transmitting broadcast signals to multiplex data of a broadcast transmission/reception system providing two or more different broadcast services in a time domain and transmit the multiplexed data through the same RF signal bandwidth and an apparatus and method for receiving broadcast signals corresponding thereto.

Another object of the present invention is to provide an apparatus for transmitting broadcast signals, an apparatus for receiving broadcast signals and methods for transmitting and receiving broadcast signals to classify data corresponding to services by components, transmit data corresponding to each component as a data pipe, receive and process the data Still another object of the present invention is to provide an apparatus for transmitting broadcast signals, an apparatus for receiving broadcast signals and methods for transmitting and receiving broadcast signals to signal signaling information necessary to provide broadcast signals.

To achieve the object and other advantages and in accordance with the purpose of the invention, as embodied and broadly described herein, the present invention provides a method of transmitting broadcast signals. The method of transmitting broadcast signals includes processing input streams into plural PLPs (Physical Layer Pipes); encoding data of the each PLPs according to code rates, wherein the encoding data of the each PLPs further includes, encoding data of at least one PLP with LDPC (Low Density Parity Check) codes, bit interleaving the LDPC encoded data of the PLP, mapping the bit interleaved data onto a set of constellations according to the code rate, MIMO (Multi Input Multi Output) encoding the mapped data, and time interleaving the MIMO encoded data; building at least one signal frame by mapping the encoded data of the each PLPs; and modulating data in the built signal frame by OFDM (Orthogonal Frequency Division Multiplexing) method and transmitting the broadcast signals having the modulated data, wherein the bit interelaved data of each PLPs are mapped by using either QAM (Quadrature Amplitude Modulation), NUQ (Non Uniform QAM), or NUC (Non Uniform Constellation).

Preferably, the constellations are arranged symmetrically to In-phase axis of complex plane, and wherein the constellations are arranged symmetrically to Quadrature axis of complex plane.

Preferably, each of the constellations are rotated by multiple of 90 degrees in complex plane, the roated constellations overlap with the original constellations.

Preferably, the set of the constellations has arbitrary shape, when the bit interleaved data are mapped by using the NUC.

Preferably, the constellations are arranged as shown in FIG. 66.

when the bit interleaved data are mapped by using the NUC, number of the constellations are 64, and the code rate is 6/15.

Preferably, values of real and imaginary components of the each constellations are expressed as:

| $d_{0,i}d_{1,i}\ldots d_{5,i}$ | $Re(e_i)$ | $Im(e_i)$ |
|---|---|---|
| 000000 | 0.1818 | 0.3417 |
| 000001 | 0.1932 | 0.3354 |
| 000010 | 0.2339 | 0.5929 |
| 000011 | 0.3030 | 0.5607 |
| 000100 | 0.3417 | 0.1818 |
| 000101 | 0.3354 | 0.1932 |
| 000110 | 0.5929 | 0.2339 |
| 000111 | 0.5607 | 0.3030 |
| 001000 | 0.3007 | 1.4778 |
| 001001 | 0.8324 | 1.2575 |
| 001010 | 0.2662 | 1.0483 |
| 001011 | 0.5530 | 0.9295 |
| 001100 | 1.4778 | 0.3007 |
| 001101 | 1.2575 | 0.8324 |
| 001110 | 1.0483 | 0.2662 |
| 001111 | 0.9295 | 0.5530 |
| 010000 | −0.1818 | 0.3417 |
| 010001 | −0.1932 | 0.3354 |
| 010010 | −0.2339 | 0.5929 |
| 010011 | −0.3030 | 0.5607 |
| 010100 | −0.3417 | 0.1818 |
| 010101 | −0.3354 | 0.1932 |
| 010110 | −0.5929 | 0.2339 |
| 010111 | −0.5607 | 0.3030 |
| 011000 | −0.3007 | 1.4778 |
| 011001 | −0.8324 | 1.2575 |
| 011010 | −0.2662 | 1.0483 |
| 011011 | −0.5530 | 0.9295 |
| 011100 | −1.4778 | 0.3007 |
| 011101 | −1.2575 | 0.8324 |
| 011110 | −1.0483 | 0.2662 |
| 011111 | −0.9295 | 0.5530 |
| 100000 | 0.1818 | −0.3417 |
| 100001 | 0.1932 | −0.3354 |
| 100010 | 0.2339 | −0.5929 |

-continued

| $d_{0,i}d_{1,i}\ldots d_{5,i}$ | $Re(e_i)$ | $Im(e_i)$ |
|---|---|---|
| 100011 | 0.3030 | −0.5607 |
| 100100 | 0.3417 | −0.1818 |
| 100101 | 0.3354 | −0.1932 |
| 100110 | 0.5929 | −0.2339 |
| 100111 | 0.5607 | −0.3030 |
| 101000 | 0.3007 | −1.4778 |
| 101001 | 0.8324 | −1.2575 |
| 101010 | 0.2662 | −1.0483 |
| 101011 | 0.5530 | −0.9295 |
| 101100 | 1.4778 | −0.3007 |
| 101101 | 1.2575 | −0.8324 |
| 101110 | 1.0483 | −0.2662 |
| 101111 | 0.9295 | −0.5530 |
| 110000 | −0.1818 | −0.3417 |
| 110001 | −0.1932 | −0.3354 |
| 110010 | −0.2339 | −0.5929 |
| 110011 | −0.3030 | −0.5607 |
| 110100 | −0.3417 | −0.1818 |
| 110101 | −0.3354 | −0.1932 |
| 110110 | −0.5929 | −0.2339 |
| 110111 | −0.5607 | −0.3030 |
| 111000 | −0.3007 | −1.4778 |
| 111001 | −0.8324 | −1.2575 |
| 111010 | −0.2662 | −1.0483 |
| 111011 | −0.5530 | −0.9295 |
| 111100 | −1.4778 | −0.3007 |
| 111101 | −1.2575 | −0.8324 |
| 111110 | −1.0483 | −0.2662 |
| 111111 | −0.9295 | −0.5530, | wherein the constellations are listed in first column, wherein the values of real components are listed in second column, and wherein the values of imaginary components are listed in third column.

Preferably, the set of constellations used by an associated PLP is signaled by a PLP modulation parameter in the signal frame.

In other aspect, the present invention provides a method of receiving broadcast signals. The method of receiving broadcast signals includes receiving the broadcast signals having at least one signal frame and demodulating data in the at least one signal frame by OFDM (Orthogonal Frequency Division Multiplexing) method; parsing the at least one signal frame by demapping data of plural PLPs (Physical Layer Pipes); decoding the data of the each PLPs according to code rates, wherein the decoding the data of the each PLPs further includes, time deinterleaving data of at least one PLP, MIMO (Multi Input Multi Output) decoding the time deinterleaved data of the PLP, demapping the MIMO decoded data from a set of constellations according to the code rate, bit deinterleaving the demapped data, and decoding the bit deinterleaved data with LDPC (Low Density Parity Check) codes; and processing the decoded data of the each PLPs to output output streams, wherein the MIMO decoded data of the each PLPs are demapped by using either QAM (Quadrature Amplitude Modulation), NUQ (Non Uniform QAM), or NUC (Non Uniform Constellation).

Preferably, the constellations are arranged symmetrically to In-phase axis of complex plane, and wherein the constellations are arranged symmetrically to Quadrature axis of complex plane.

Preferably, each of the constellations are rotated by multiple of 90 degrees in complex plane, the roated constellations overlap with the original constellations.

Preferably, the set of the constellations has arbitrary shape, when the MIMO decoded data are demapped by using the NUC.

Preferably, the constellations are arranged as shown in FIG. 66.

when the MIMO decoded data are demapped by using the NUC, number of the constellations are 64, and the code rate is 6/15.

Preferably, values of real and imaginary components of the each constellations are expressed as:

| $d_{0,i}d_{1,i}\ldots d_{5,i}$ | $Re(e_i)$ | $Im(e_i)$ |
|---|---|---|
| 000000 | 0.1818 | 0.3417 |
| 000001 | 0.1932 | 0.3354 |
| 000010 | 0.2339 | 0.5929 |
| 000011 | 0.3030 | 0.5607 |
| 000100 | 0.3417 | 0.1818 |
| 000101 | 0.3354 | 0.1932 |
| 000110 | 0.5929 | 0.2339 |
| 000111 | 0.5607 | 0.3030 |
| 001000 | 0.3007 | 1.4778 |
| 001001 | 0.8324 | 1.2575 |
| 001010 | 0.2662 | 1.0483 |
| 001011 | 0.5530 | 0.9295 |
| 001100 | 1.4778 | 0.3007 |
| 001101 | 1.2575 | 0.8324 |
| 001110 | 1.0483 | 0.2662 |
| 001111 | 0.9295 | 0.5530 |
| 010000 | −0.1818 | 0.3417 |
| 010001 | −0.1932 | 0.3354 |
| 010010 | −0.2339 | 0.5929 |
| 010011 | −0.3030 | 0.5607 |
| 010100 | −0.3417 | 0.1818 |
| 010101 | −0.3354 | 0.1932 |
| 010110 | −0.5929 | 0.2339 |
| 010111 | −0.5607 | 0.3030 |
| 011000 | −0.3007 | 1.4778 |
| 011001 | −0.8324 | 1.2575 |
| 011010 | −0.2662 | 1.0483 |
| 011011 | −0.5530 | 0.9295 |
| 011100 | −1.4778 | 0.3007 |
| 011101 | −1.2575 | 0.8324 |
| 011110 | −1.0483 | 0.2662 |
| 011111 | −0.9295 | 0.5530 |
| 100000 | 0.1818 | −0.3417 |
| 100001 | 0.1932 | −0.3354 |
| 100010 | 0.2339 | −0.5929 |
| 100011 | 0.3030 | −0.5607 |
| 100100 | 0.3417 | −0.1818 |
| 100101 | 0.3354 | −0.1932 |
| 100110 | 0.5929 | −0.2339 |
| 100111 | 0.5607 | −0.3030 |
| 101000 | 0.3007 | −1.4778 |
| 101001 | 0.8324 | −1.2575 |
| 101010 | 0.2662 | −1.0483 |
| 101011 | 0.5530 | −0.9295 |
| 101100 | 1.4778 | −0.3007 |
| 101101 | 1.2575 | −0.8324 |
| 101110 | 1.0483 | −0.2662 |
| 101111 | 0.9295 | −0.5530 |
| 110000 | −0.1818 | −0.3417 |
| 110001 | −0.1932 | −0.3354 |
| 110010 | −0.2339 | −0.5929 |
| 110011 | −0.3030 | −0.5607 |
| 110100 | −0.3417 | −0.1818 |
| 110101 | −0.3354 | −0.1932 |
| 110110 | −0.5929 | −0.2339 |
| 110111 | −0.5607 | −0.3030 |
| 111000 | −0.3007 | −1.4778 |
| 111001 | −0.8324 | −1.2575 |
| 111010 | −0.2662 | −1.0483 |
| 111011 | −0.5530 | −0.9295 |
| 111100 | −1.4778 | −0.3007 |
| 111101 | −1.2575 | −0.8324 |
| 111110 | −1.0483 | −0.2662 |
| 111111 | −0.9295 | −0.5530, | wherein the constellations are listed in first column, wherein the values of real components are listed in second column, and wherein the values of imaginary components are listed in third column.

Preferably, the set of constellations used by an associated PLP is signaled by a PLP modulation parameter in the signal frame.

In another aspect, the present invention provides an apparatus for transmitting broadcast signals. The apparatus for transmitting broadcast signals includes an input processing module to process input streams into plural PLPs (Physical Layer Pipes); an encoding module to encode data of the each PLPs according to code rates, wherein the encoding module further includes, an LDPC block to encode data of at least one PLP with LDPC (Low Density Parity Check) codes, a bit interleaving block to bit interleave the LDPC encoded data of the PLP, a mapping block to map the bit interleaved data onto a set of constellations according to the code rate, a MIMO (Multi Input Multi Output) encoding block to MIMO encode the mapped data, and a time interleaving block to time interleave the MIMO encoded data; a frame building module to build at least one signal frame by mapping the encoded data of the each PLPs; and an OFDM module to modulate data in the built signal frame by OFDM (Orthogonal Frequency Division Multiplexing) method and to transmit the broadcast signals having the modulated data, wherein the bit interelaved data of each PLPs are mapped by using either QAM (Quadrature Amplitude Modulation), NUQ (Non Uniform QAM), or NUC (Non Uniform Constellation).

Preferably, the constellations are arranged symmetrically to In-phase axis of complex plane, and wherein the constellations are arranged symmetrically to Quadrature axis of complex plane.

Preferably, each of the constellations are rotated by multiple of 90 degrees in complex plane, the roated constellations overlap with the original constellations.

Preferably, the set of the constellations has arbitrary shape, when the bit interleaved data are mapped by using the NUC.

Preferably, the constellations are arranged as shown in FIG. 66.

when the bit interleaved data are mapped by using the NUC, number of the constellations are 64, and the code rate is 6/15.

Preferably, values of real and imaginary components of the each constellations are expressed as:

| $d_{0,i}d_{1,i}\ldots d_{5,i}$ | $Re(e_i)$ | $Im(e_i)$ |
|---|---|---|
| 000000 | 0.1818 | 0.3417 |
| 000001 | 0.1932 | 0.3354 |
| 000010 | 0.2339 | 0.5929 |
| 000011 | 0.3030 | 0.5607 |
| 000100 | 0.3417 | 0.1818 |
| 000101 | 0.3354 | 0.1932 |
| 000110 | 0.5929 | 0.2339 |
| 000111 | 0.5607 | 0.3030 |
| 001000 | 0.3007 | 1.4778 |
| 001001 | 0.8324 | 1.2575 |
| 001010 | 0.2662 | 1.0483 |
| 001011 | 0.5530 | 0.9295 |
| 001100 | 1.4778 | 0.3007 |
| 001101 | 1.2575 | 0.8324 |
| 001110 | 1.0483 | 0.2662 |
| 001111 | 0.9295 | 0.5530 |
| 010000 | −0.1818 | 0.3417 |
| 010001 | −0.1932 | 0.3354 |
| 010010 | −0.2339 | 0.5929 |
| 010011 | −0.3030 | 0.5607 |
| 010100 | −0.3417 | 0.1818 |
| 010101 | −0.3354 | 0.1932 |
| 010110 | −0.5929 | 0.2339 |
| 010111 | −0.5607 | 0.3030 |
| 011000 | −0.3007 | 1.4778 |
| 011001 | −0.8324 | 1.2575 |
| 011010 | −0.2662 | 1.0483 |
| 011011 | −0.5530 | 0.9295 |
| 011100 | −1.4778 | 0.3007 |
| 011101 | −1.2575 | 0.8324 |
| 011110 | −1.0483 | 0.2662 |
| 011111 | −0.9295 | 0.5530 |
| 100000 | 0.1818 | −0.3417 |
| 100001 | 0.1932 | −0.3354 |
| 100010 | 0.2339 | −0.5929 |
| 100011 | 0.3030 | −0.5607 |
| 100100 | 0.3417 | −0.1818 |
| 100101 | 0.3354 | −0.1932 |
| 100110 | 0.5929 | −0.2339 |
| 100111 | 0.5607 | −0.3030 |
| 101000 | 0.3007 | −1.4778 |
| 101001 | 0.8324 | −1.2575 |
| 101010 | 0.2662 | −1.0483 |
| 101011 | 0.5530 | −0.9295 |
| 101100 | 1.4778 | −0.3007 |
| 101101 | 1.2575 | −0.8324 |
| 101110 | 1.0483 | −0.2662 |
| 101111 | 0.9295 | −0.5530 |
| 110000 | −0.1818 | −0.3417 |
| 110001 | −0.1932 | −0.3354 |
| 110010 | −0.2339 | −0.5929 |
| 110011 | −0.3030 | −0.5607 |
| 110100 | −0.3417 | −0.1818 |
| 110101 | −0.3354 | −0.1932 |
| 110110 | −0.5929 | −0.2339 |
| 110111 | −0.5607 | −0.3030 |
| 111000 | −0.3007 | −1.4778 |
| 111001 | −0.8324 | −1.2575 |
| 111010 | −0.2662 | −1.0483 |
| 111011 | −0.5530 | −0.9295 |
| 111100 | −1.4778 | −0.3007 |
| 111101 | −1.2575 | −0.8324 |
| 111110 | −1.0483 | −0.2662 |
| 111111 | −0.9295 | −0.5530, | wherein the constellations are listed in first column, wherein the values of real components are listed in second column, and wherein the values of imaginary components are listed in third column.

Preferably, the set of constellations used by an associated PLP is signaled by a PLP modulation parameter in the signal frame.

In another aspect, the present invention provides an apparatus for receiving broadcast signals. The apparatus for receiving broadcast signals includes a receiving module to receive the broadcast signals having at least one signal frame and to demodulate data in the at least one signal frame by OFDM (Orthogonal Frequency Division Multiplexing) method; a parsing module to parse the at least one signal frame by demapping data of plural PLPs (Physical Layer Pipes); a decoding module to decode the data of the each PLPs according to code rates, wherein the decoding module further includes, a time deinterleaving block to time deinterleave data of at least one PLP, a MIMO (Multi Input Multi Output) decoding block to MIMO decode the time deinterleaved data of the PLP, a demapping block to demap the MIMO decoded data from a set of constellations according to the code rate, a bit deinterleaving block to bit deinterleave the demapped data, and an LDPC block to decode the bit deinterleaved data with LDPC (Low Density Parity Check) codes; and an output processing module to process the decoded data of the each PLPs to output output streams, wherein the MIMO decoded data of the each PLPs are demapped by using either QAM (Quadrature Amplitude Modulation), NUQ (Non Uniform QAM), or NUC (Non Uniform Constellation).

Preferably, the constellations are arranged symmetrically to In-phase axis of complex plane, and wherein the constellations are arranged symmetrically to Quadrature axis of complex plane.

Preferably, each of the constellations are rotated by multiple of 90 degrees in complex plane, the roated constellations overlap with the original constellations.

Preferably, the set of the constellations has arbitrary shape, when the MIMO decoded data are demapped by using the NUC.

Preferably, the constellations are arranged as shown in FIG. 66.

when the MIMO decoded data are demapped by using the NUC, number of the constellations are 64, and the code rate is 6/15.

Preferably, values of real and imaginary components of the each constellations are expressed as:

| $d_{0,i}d_{1,i}\ldots d_{5,i}$ | $Re(e_i)$ | $Im(e_i)$ |
|---|---|---|
| 000000 | 0.1818 | 0.3417 |
| 000001 | 0.1932 | 0.3354 |
| 000010 | 0.2339 | 0.5929 |
| 000011 | 0.3030 | 0.5607 |
| 000100 | 0.3417 | 0.1818 |
| 000101 | 0.3354 | 0.1932 |
| 000110 | 0.5929 | 0.2339 |
| 000111 | 0.5607 | 0.3030 |
| 001000 | 0.3007 | 1.4778 |
| 001001 | 0.8324 | 1.2575 |
| 001010 | 0.2662 | 1.0483 |
| 001011 | 0.5530 | 0.9295 |
| 001100 | 1.4778 | 0.3007 |
| 001101 | 1.2575 | 0.8324 |
| 001110 | 1.0483 | 0.2662 |
| 001111 | 0.9295 | 0.5530 |
| 010000 | −0.1818 | 0.3417 |
| 010001 | −0.1932 | 0.3354 |
| 010010 | −0.2339 | 0.5929 |
| 010011 | −0.3030 | 0.5607 |
| 010100 | −0.3417 | 0.1818 |
| 010101 | −0.3354 | 0.1932 |
| 010110 | −0.5929 | 0.2339 |
| 010111 | −0.5607 | 0.3030 |
| 011000 | −0.3007 | 1.4778 |
| 011001 | −0.8324 | 1.2575 |
| 011010 | −0.2662 | 1.0483 |
| 011011 | −0.5530 | 0.9295 |
| 011100 | −1.4778 | 0.3007 |
| 011101 | −1.2575 | 0.8324 |
| 011110 | −1.0483 | 0.2662 |
| 011111 | −0.9295 | 0.5530 |
| 100000 | 0.1818 | −0.3417 |
| 100001 | 0.1932 | −0.3354 |
| 100010 | 0.2339 | −0.5929 |
| 100011 | 0.3030 | −0.5607 |
| 100100 | 0.3417 | −0.1818 |
| 100101 | 0.3354 | −0.1932 |
| 100110 | 0.5929 | −0.2339 |
| 100111 | 0.5607 | −0.3030 |
| 101000 | 0.3007 | −1.4778 |
| 101001 | 0.8324 | −1.2575 |
| 101010 | 0.2662 | −1.0483 |
| 101011 | 0.5530 | −0.9295 |
| 101100 | 1.4778 | −0.3007 |
| 101101 | 1.2575 | −0.8324 |
| 101110 | 1.0483 | −0.2662 |
| 101111 | 0.9295 | −0.5530 |
| 110000 | −0.1818 | −0.3417 |
| 110001 | −0.1932 | −0.3354 |
| 110010 | −0.2339 | −0.5929 |
| 110011 | −0.3030 | −0.5607 |
| 110100 | −0.3417 | −0.1818 |
| 110101 | −0.3354 | −0.1932 |
| 110110 | −0.5929 | −0.2339 |
| 110111 | −0.5607 | −0.3030 |
| 111000 | −0.3007 | −1.4778 |
| 111001 | −0.8324 | −1.2575 |
| 111010 | −0.2662 | −1.0483 |
| 111011 | −0.5530 | −0.9295 |
| 111100 | −1.4778 | −0.3007 |
| 111101 | −1.2575 | −0.8324 |
| 111110 | −1.0483 | −0.2662 |
| 111111 | −0.9295 | −0.5530, | wherein the constellations are listed in first column, wherein the values of real components are listed in second column, and wherein the values of imaginary components are listed in third column.

Preferably, the set of constellations used by an associated PLP is signaled by a PLP modulation parameter in the signal frame.

The present invention can process data according to service characteristics to control QoS (Quality of Services) for each service or service component, thereby providing various broadcast services.

The present invention can achieve transmission flexibility by transmitting various broadcast services through the same RF signal bandwidth.

The present invention can improve data transmission efficiency and increase robustness of transmission/reception of broadcast signals using a MIMO system.

According to the present invention, it is possible to provide broadcast signal transmission and reception methods and apparatus capable of receiving digital broadcast signals without error even with mobile reception equipment or in an indoor environment.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 11 illustrates a signaling hierarchy structure of the frame according to an embodiment of the present invention.

FIG. 12 illustrates preamble signaling data according to an embodiment of the present invention.

FIG. 13 illustrates PLS1 data according to an embodiment of the present invention.

FIG. 14 illustrates PLS2 data according to an embodiment of the present invention.

FIG. 29 illustrates interlaved XFECBLOCKs from each interleaving array according to an embodiment of the present invention.

FIG. 36 shows the parameters of 16 NUCs created according to one embodiment of the present invention.

FIG. 37 shows constellations for the respective SNRs based on the parameters of the 16 NUCs created according to one embodiment of the present invention.

FIG. 39 shows some of 64 NUCs created according to one embodiment of the present invention and bits allocated thereto.

FIG. 40 shows the others of 64 NUCs created according to one embodiment of the present invention and bits allocated thereto.

FIG. 41 shows constellations for the respective SNRs based on the parameters of the 64 NUCs created according to one embodiment of the present invention.

FIG. 43 shows some of 256 NUCs created according to one embodiment of the present invention and bits allocated thereto.

FIG. 44 shows others of 256 NUCs created according to one embodiment of the present invention and bits allocated thereto.

FIG. 45 shows others of 256 NUCs created according to one embodiment of the present invention and bits allocated thereto.

FIG. 46 shows the others of 256 NUCs created according to one embodiment of the present invention and bits allocated thereto.

FIG. 49 shows some of 1024 NUCs created according to one embodiment of the present invention and bits allocated thereto.

FIG. 50 shows others of 1024 NUCs created according to one embodiment of the present invention and bits allocated thereto.

FIG. 51 shows others of 1024 NUCs created according to one embodiment of the present invention and bits allocated thereto.

FIG. 52 shows others of 1024 NUCs created according to one embodiment of the present invention and bits allocated thereto.

FIG. 53 shows others of 1024 NUCs created according to one embodiment of the present invention and bits allocated thereto.

FIG. 54 shows others of 1024 NUCs created according to one embodiment of the present invention and bits allocated thereto.

FIG. 55 shows others of 1024 NUCs created according to one embodiment of the present invention and bits allocated thereto.

FIG. 56 shows others of 1024 NUCs created according to one embodiment of the present invention and bits allocated thereto.

FIG. 57 shows others of 1024 NUCs created according to one embodiment of the present invention and bits allocated thereto.

FIG. 58 shows the others of 1024 NUCs created according to one embodiment of the present invention and bits allocated thereto.

FIG. 62 shows coordinates of the respective constellations of 64 NUCs for 5/15 code rate according to one embodiment of the present invention.

FIG. 64 shows a part of the coordinates of the respective constellations of 256 NUCs for 5/15 code rate according to one embodiment of the present invention.

FIG. 65 shows the other part of the coordinates of the respective constellations of 256 NUCs for 5/15 code rate according to one embodiment of the present invention.

FIG. 67 shows coordinates of the respective constellations of 64 NUCs for 6/15 code rate according to one embodiment of the present invention.

FIG. 69 shows a part of the coordinates of the respective constellations of 256 NUCs for 6/15 code rate according to one embodiment of the present invention.

FIG. 70 shows the other part of the coordinates of the respective constellations of 256 NUCs for 6/15 code rate according to one embodiment of the present invention.

FIG. 72 shows coordinates of the respective constellations of 64 NUCs for 7/15 code rate according to one embodiment of the present invention.

FIG. 74 shows a part of the coordinates of the respective constellations of 256 NUCs for 7/15 code rate according to one embodiment of the present invention.

FIG. 75 shows the other part of the coordinates of the respective constellations of 256 NUCs for 7/15 code rate according to one embodiment of the present invention.

FIG. 77 shows coordinates of the respective constellations of 64 NUCs for 8/15 code rate according to one embodiment of the present invention.

FIG. 79 shows a part of the coordinates of the respective constellations of 256 NUCs for 8/15 code rate according to one embodiment of the present invention.

FIG. 80 shows the other part of the coordinates of the respective constellations of 256 NUCs for 8/15 code rate according to one embodiment of the present invention.

FIG. 82 shows coordinates of the respective constellations of 64 NUCs for 9/15 code rate according to one embodiment of the present invention.

FIG. 84 shows a part of the coordinates of the respective constellations of 256 NUCs for 9/15 code rate according to one embodiment of the present invention.

FIG. 85 shows the other part of the coordinates of the respective constellations of 256 NUCs for 9/15 code rate according to one embodiment of the present invention.

FIG. 87 shows coordinates of the respective constellations of 64 NUCs for 10/15 code rate according to one embodiment of the present invention.

FIG. 89 shows a part of the coordinates of the respective constellations of 256 NUCs for 10/15 code rate according to one embodiment of the present invention.

FIG. 90 shows the other part of the coordinates of the respective constellations of 256 NUCs for 10/15 code rate according to one embodiment of the present invention.

FIG. 91 describes a process of mapping IQ-balanced/IQ-symmetric non-uniform constellations according to one embodiment of the present invention.

FIG. 92 shows constellations of 64 NUCs at the SNR of 18 dB using the method of IQ-balanced non-uniform constellation mapping according to one embodiment of the present invention.

FIG. 96 shows a part of the coordinates of the constellations of 256 NUCs for 10/15 code rate based on the IQ-balanced non-uniform constellation mapping method according to one embodiment of the present invention.

FIG. 97 shows another part of the coordinates of the constellations of 256 NUCs for 10/15 code rate based on the IQ-balanced non-uniform constellation mapping method according to one embodiment of the present invention.

FIG. 98 shows the other part of the coordinates of the constellations of 256 NUCs for 10/15 code rate based on the IQ-balanced non-uniform constellation mapping method according to one embodiment of the present invention.

FIG. 100 shows a part of the coordinates of the constellations of 256 NUCs for 10/15 code rate based on the IQ-symmetric non-uniform constellation mapping method according to one embodiment of the present invention.

FIG. 101 shows another part of the coordinates of the constellations of 256 NUCs for 10/15 code rate based on the IQ-symmetric non-uniform constellation mapping method according to one embodiment of the present invention.

FIG. 102 shows the other part of the coordinates of the constellations of 256 NUCs for 10/15 code rate based on the IQ-symmetric non-uniform constellation mapping method according to one embodiment of the present invention.

FIG. 106 shows a part of the coordinates of the constellations of 256 NUCs for 11/15 code rate based on the IQ-balanced non-uniform constellation mapping method according to one embodiment of the present invention.

FIG. 107 shows another part of the coordinates of the constellations of 256 NUCs for 11/15 code rate based on the IQ-balanced non-uniform constellation mapping method according to one embodiment of the present invention.

FIG. 108 shows the other part of the coordinates of the constellations of 256 NUCs for 11/15 code rate based on the IQ-balanced non-uniform constellation mapping method according to one embodiment of the present invention.

FIG. 110 shows a part of the coordinates of the constellations of 256 NUCs for 11/15 code rate based on the IQ-symmetric non-uniform constellation mapping method according to one embodiment of the present invention.

FIG. 111 shows another part of the coordinates of the constellations of 256 NUCs for 11/15 code rate based on the IQ-symmetric non-uniform constellation mapping method according to one embodiment of the present invention.

FIG. 112 shows the other part of the coordinates of the constellations of 256 NUCs for 11/15 code rate based on the IQ-symmetric non-uniform constellation mapping method according to one embodiment of the present invention.

FIG. 116 shows a part of the coordinates of the constellations of 256 NUCs for 12/15 code rate based on the IQ-balanced non-uniform constellation mapping method according to one embodiment of the present invention.

FIG. 117 shows another part of the coordinates of the constellations of 256 NUCs for 12/15 code rate based on the IQ-balanced non-uniform constellation mapping method according to one embodiment of the present invention.

FIG. 118 shows the other part of the coordinates of the constellations of 256 NUCs for 12/15 code rate based on the IQ-balanced non-uniform constellation mapping method according to one embodiment of the present invention.

FIG. 119 shows a constellation of 256 NUCs for 12/15 code rate based on the IQ-symmetric non-uniform constellation mapping method according to one embodiment of the present invention.

FIG. 120 shows a part of the coordinates of the constellations of 256 NUCs for 12/15 code rate based on the IQ-symmetric non-uniform constellation mapping method according to one embodiment of the present invention.

FIG. 121 shows another part of the coordinates of the constellations of 256 NUCs for 12/15 code rate based on the IQ-symmetric non-uniform constellation mapping method according to one embodiment of the present invention.

FIG. 122 shows the other part of the coordinates of the constellations of 256 NUCs for 12/15 code rate based on the IQ-symmetric non-uniform constellation mapping method according to one embodiment of the present invention.

FIG. 123 shows a constellation of 64 NUCs for 13/15 code rate based on the IQ-balanced non-uniform constellation mapping method according to one embodiment of the present invention.

FIG. 124 shows a constellation of 64 NUCs for 13/15 code rate based on the IQ-symmetric non-uniform constellation mapping method according to one embodiment of the present invention.

FIG. 125 shows a constellation of 256 NUCs for 13/15 code rate based on the IQ-balanced non-uniform constellation mapping method according to one embodiment of the present invention.

FIG. 126 shows a part of the coordinates of the constellations of 256 NUCs for 13/15 code rate based on the IQ-balanced non-uniform constellation mapping method according to one embodiment of the present invention.

FIG. 127 shows another part of the coordinates of the constellations of 256 NUCs for 13/15 code rate based on the IQ-balanced non-uniform constellation mapping method according to one embodiment of the present invention.

FIG. 128 shows the other part of the coordinates of the constellations of 256 NUCs for 13/15 code rate based on the IQ-balanced non-uniform constellation mapping method according to one embodiment of the present invention.

FIG. 129 shows a constellation of 256 NUCs for 13/15 code rate based on the IQ-symmetric non-uniform constellation mapping method according to one embodiment of the present invention.

FIG. 130 shows a part of the coordinates of the constellations of 256 NUCs for 13/15 code rate based on the IQ-symmetric non-uniform constellation mapping method according to one embodiment of the present invention.

FIG. 131 shows another part of the coordinates of the constellations of 256 NUCs for 13/15 code rate based on the IQ-symmetric non-uniform constellation mapping method according to one embodiment of the present invention.

FIG. 132 shows the other part of the coordinates of the constellations of 256 NUCs for 13/15 code rate based on the IQ-symmetric non-uniform constellation mapping method according to one embodiment of the present invention.

Figure 133:
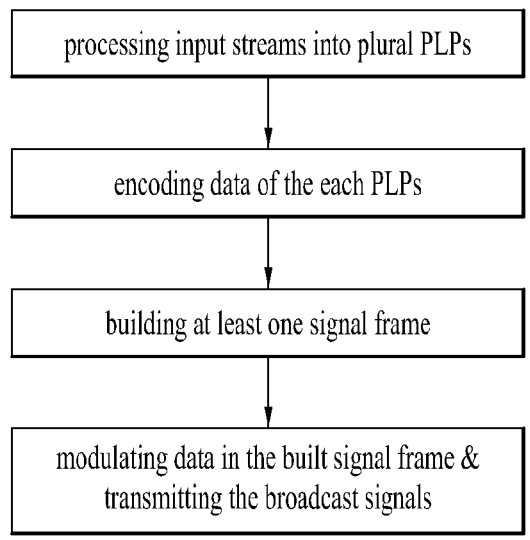

FIG. 133 illustrates a method of transmitting broadcast signal according to an embodiment of the present invention.

Figure 134:
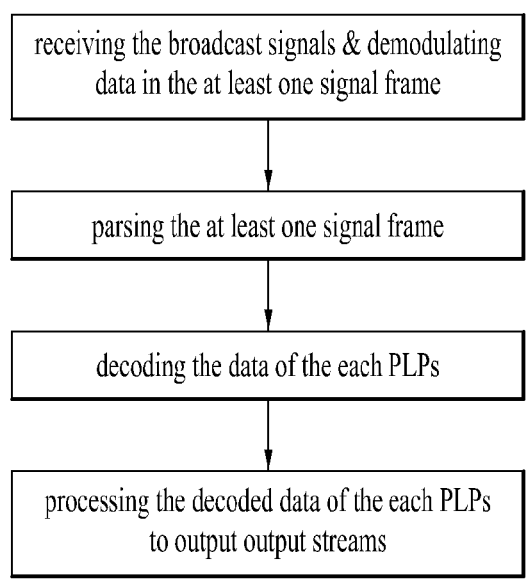

FIG. 134 illustrates a method of receiving broadcast signal according to an embodiment of the present invention.

DETAILED DESCRIPTION OF THE INVENTION

Reference will now be made in detail to the preferred embodiments of the present invention, examples of which are illustrated in the accompanying drawings. The detailed description, which will be given below with reference to the accompanying drawings, is intended to explain exemplary embodiments of the present invention, rather than to show the only embodiments that can be implemented according to the present invention. The following detailed description includes specific details in order to provide a thorough understanding of the present invention. However, it will be apparent to those skilled in the art that the present invention may be practiced without such specific details.

Although most terms used in the present invention have been selected from general ones widely used in the art, some terms have been arbitrarily selected by the applicant and their meanings are explained in detail in the following description as needed. Thus, the present invention should be understood based upon the intended meanings of the terms rather than their simple names or meanings.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc. The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

The present invention may defines three physical layer (PL) profiles—base, handheld and advanced profiles—each optimized to minimize receiver complexity while attaining the performance required for a particular use case. The physical layer (PHY) profiles are subsets of all configurations that a corresponding receiver should implement.

The three PHY profiles share most of the functional blocks but differ slightly in specific blocks and/or parameters. Additional PHY profiles can be defined in the future. For the system evolution, future profiles can also be multiplexed with the existing profiles in a single RF channel through a future extension frame (FEF). The details of each PHY profile are described below.

1. Base Profile

The base profile represents a main use case for fixed receiving devices that are usually connected to a roof-top antenna. The base profile also includes portable devices that could be transported to a place but belong to a relatively stationary reception category. Use of the base profile could be extended to handheld devices or even vehicular by some improved implementations, but those use cases are not expected for the base profile receiver operation.

Target SNR range of reception is from approximately 10 to 20 dB, which includes the 15 dB SNR reception capability of the existing broadcast system (e.g. ATSC A/53). The receiver complexity and power consumption is not as critical as in the battery-operated handheld devices, which will use the handheld profile. Key system parameters for the base profile are listed in below table 1.

TABLE 1

| LDPC codeword length | 16K, 64K bits |
|---|---|
| Constellation size | 4~10 bpcu (bits per channel use) |
| Time de-interleaving memory size | ≤$2^{19}$ data cells |
| Pilot patterns | Pilot pattern for fixed reception |
| FFT size | 16K, 32K points |

2. Handheld Profile

The handheld profile is designed for use in handheld and vehicular devices that operate with battery power. The devices can be moving with pedestrian or vehicle speed. The power consumption as well as the receiver complexity is very important for the implementation of the devices of the handheld profile. The target SNR range of the handheld profile is approximately 0 to 10 dB, but can be configured to reach below 0 dB when intended for deeper indoor reception.

In addition to low SNR capability, resilience to the Doppler Effect caused by receiver mobility is the most important performance attribute of the handheld profile. Key system parameters for the handheld profile are listed in the below table 2.

TABLE 2

| LDPC codeword length | 16K bits |
|---|---|
| Constellation size | 2~8 bpcu |
| Time de-interleaving memory size | ≤$2^{18}$ data cells |
| Pilot patterns | Pilot patterns for mobile and indoor reception |
| FFT size | 8K, 16K points |

3. Advanced Profile

The advanced profile provides highest channel capacity at the cost of more implementation complexity. This profile requires using MIMO transmission and reception, and UHDTV service is a target use case for which this profile is specifically designed. The increased capacity can also be used to allow an increased number of services in a given bandwidth, e.g., multiple SDTV or HDTV services.

The target SNR range of the advanced profile is approximately 20 to 30 dB. MIMO transmission may initially use existing elliptically-polarized transmission equipment, with extension to full-power cross-polarized transmission in the future. Key system parameters for the advanced profile are listed in below table 3.

TABLE 3

| LDPC codeword length | 16K, 64K bits |
|---|---|
| Constellation size | 8~12 bpcu |
| Time de-interleaving memory size | ≤$2^{19}$ data cells |
| Pilot patterns | Pilot pattern for fixed reception |
| FFT size | 16K, 32K points |

In this case, the base profile can be used as a profile for both the terrestrial broadcast service and the mobile broadcast service. That is, the base profile can be used to define a concept of a profile which includes the mobile profile. Also, the advanced profile can be divided advanced profile for a base profile with MIMO and advanced profile for a handheld profile with MIMO. Moreover, the three profiles can be changed according to intention of the designer.

The following terms and definitions may apply to the present invention. The following terms and definitions can be changed according to design.

auxiliary stream: sequence of cells carrying data of as yet undefined modulation and coding, which may be used for future extensions or as required by broadcasters or network operators base data pipe: data pipe that carries service signaling data baseband frame (or BBFRAME): set of $K_{bch}$ bits which form the input to one FEC encoding process (BCH and LDPC encoding)

cell: modulation value that is carried by one carrier of the OFDM transmission coded block: LDPC-encoded block of PLS1 data or one of the LDPC-encoded blocks of PLS2 data data pipe: logical channel in the physical layer that carries service data or related metadata, which may carry one or multiple service(s) or service component(s).

data pipe unit: a basic unit for allocating data cells to a DP in a frame.

data symbol: OFDM symbol in a frame which is not a preamble symbol (the frame signaling symbol and frame edge symbol is included in the data symbol)

DP_ID: this 8-bit field identifies uniquely a DP within the system identified by the SYSTEM_ID dummy cell: cell carrying a pseudo-random value used to fill the remaining capacity not used for PLS signaling, DPs or auxiliary streams emergency alert channel: part of a frame that carries EAS information data frame: physical layer time slot that starts with a preamble and ends with a frame edge symbol frame repetition unit: a set of frames belonging to same or different physical layer profile including a FEF, which is repeated eight times in a super-frame fast information channel: a logical channel in a frame that carries the mapping information between a service and the corresponding base DP FECBLOCK: set of LDPC-encoded bits of a DP data FFT size: nominal FFT size used for a particular mode, equal to the active symbol period $T_S$ expressed in cycles of the elementary period T frame signaling symbol: OFDM symbol with higher pilot density used at the start of a frame in certain combinations of FFT size, guard interval and scattered pilot pattern, which carries a part of the PLS data frame edge symbol: OFDM symbol with higher pilot density used at the end of a frame in certain combinations of FFT size, guard interval and scattered pilot pattern frame-group: the set of all the frames having the same PHY profile type in a super-frame.

future extension frame: physical layer time slot within the super-frame that could be used for future extension, which starts with a preamble Futurecast UTB system: proposed physical layer broadcasting system, of which the input is one or more MPEG2-TS or IP or general stream(s) and of which the output is an RF signal input stream: A stream of data for an ensemble of services delivered to the end users by the system.

normal data symbol: data symbol excluding the frame signaling symbol and the frame edge symbol PHY profile: subset of all configurations that a corresponding receiver should implement PLS: physical layer signaling data consisting of PLS1 and PLS2

PLS1: a first set of PLS data carried in the FSS symbols having a fixed size, coding and modulation, which carries basic information about the system as well as the parameters needed to decode the PLS2

NOTE: PLS1 data remains constant for the duration of a frame-group.

PLS2: a second set of PLS data transmitted in the FSS symbol, which carries more detailed PLS data about the system and the DPs PLS2 dynamic data: PLS2 data that may dynamically change frame-by-frame PLS2 static data: PLS2 data that remains static for the duration of a frame-group preamble signaling data: signaling data carried by the preamble symbol and used to identify the basic mode of the system preamble symbol: fixed-length pilot symbol that carries basic PLS data and is located in the beginning of a frame NOTE: The preamble symbol is mainly used for fast initial band scan to detect the system signal, its timing, frequency offset, and FFT-size.

reserved for future use: not defined by the present document but may be defined in future super-frame: set of eight frame repetition units time interleaving block (TI block): set of cells within which time interleaving is carried out, corresponding to one use of the time interleaver memory TI group: unit over which dynamic capacity allocation for a particular DP is carried out, made up of an integer, dynamically varying number of XFECBLOCKs.

NOTE: The TI group may be mapped directly to one frame or may be mapped to multiple frames. It may contain one or more TI blocks.

Type 1 DP: DP of a frame where all DPs are mapped into the frame in TDM fashion

Type 2 DP: DP of a frame where all DPs are mapped into the frame in FDM fashion

XFECBLOCK: set of $N_{cells}$ cells carrying all the bits of one LDPC FECBLOCK

Figure 1:
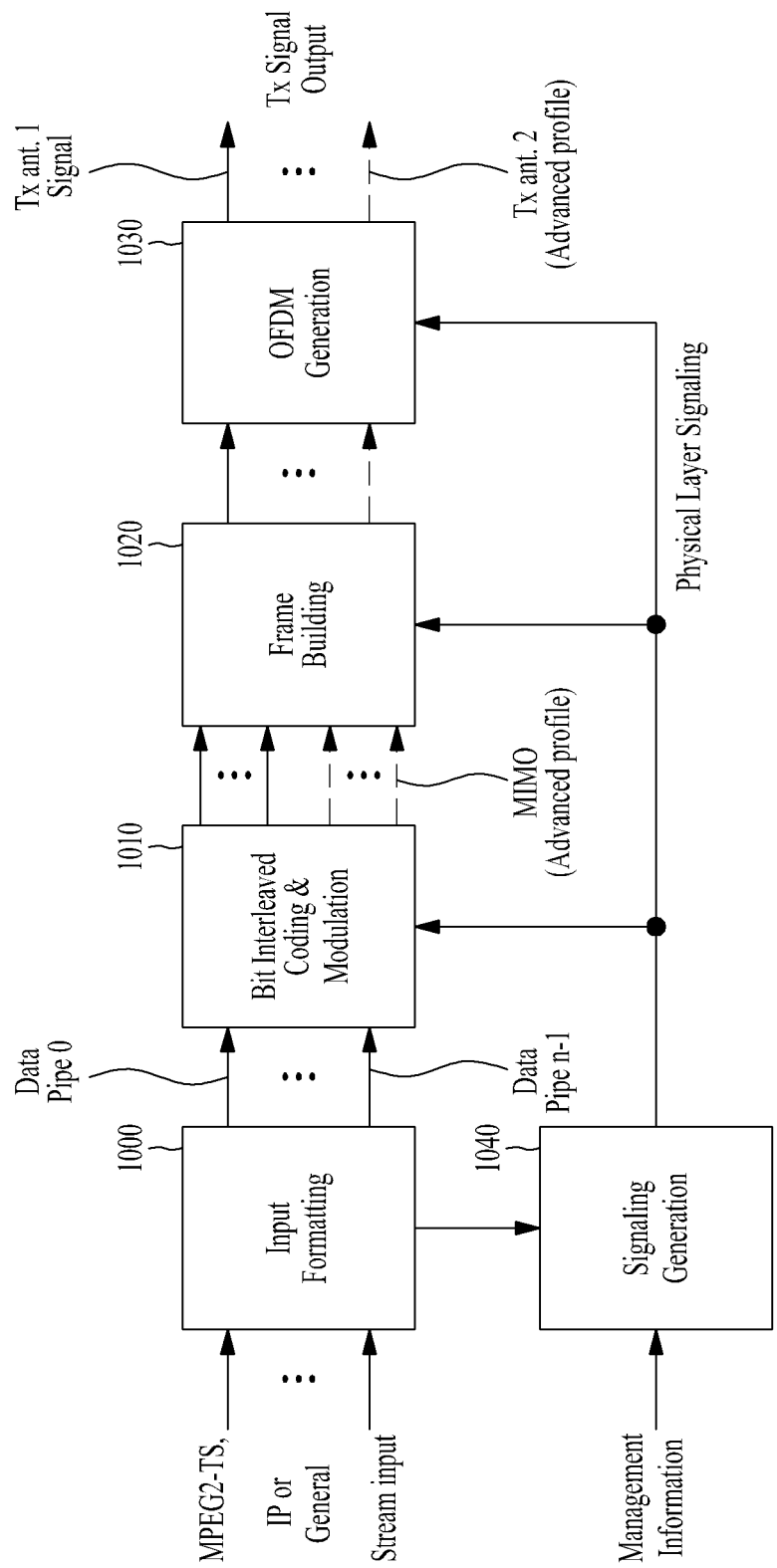
FIG. 1 illustrates a structure of an apparatus for transmitting broadcast signals for future broadcast services according to an embodiment of the present invention.

FIG. 1 illustrates a structure of an apparatus for transmitting broadcast signals for future broadcast services according to an embodiment of the present invention.

The apparatus for transmitting broadcast signals for future broadcast services according to an embodiment of the present invention can include an input formatting block 1000, a BICM (Bit interleaved coding & modulation) block 1010, a frame structure block 1020, an OFDM (Orthogonal Frequency Division Multiplexing) generation block 1030 and a signaling generation block 1040. A description will be given of the operation of each module of the apparatus for transmitting broadcast signals.

IP stream/packets and MPEG2-TS are the main input formats, other stream types are handled as General Streams. In addition to these data inputs, Management Information is input to control the scheduling and allocation of the corresponding bandwidth for each input stream. One or multiple TS stream(s), IP stream(s) and/or General Stream(s) inputs are simultaneously allowed.

The input formatting block 1000 can demultiplex each input stream into one or multiple data pipe(s), to each of which an independent coding and modulation is applied. The data pipe (DP) is the basic unit for robustness control, thereby affecting quality-of-service (QoS). One or multiple service(s) or service component(s) can be carried by a single DP. Details of operations of the input formatting block 1000 will be described later.

The data pipe is a logical channel in the physical layer that carries service data or related metadata, which may carry one or multiple service(s) or service component(s).

Also, the data pipe unit: a basic unit for allocating data cells to a DP in a frame.

In the BICM block 1010, parity data is added for error correction and the encoded bit streams are mapped to complex-value constellation symbols. The symbols are interleaved across a specific interleaving depth that is used for the corresponding DP. For the advanced profile, MIMO encoding is performed in the BICM block 1010 and the additional data path is added at the output for MIMO transmission. Details of operations of the BICM block 1010 will be described later.

The Frame Building block 1020 can map the data cells of the input DPs into the OFDM symbols within a frame. After mapping, the frequency interleaving is used for frequency-domain diversity, especially to combat frequency-selective fading channels. Details of operations of the Frame Building block 1020 will be described later.

After inserting a preamble at the beginning of each frame, the OFDM Generation block 1030 can apply conventional OFDM modulation having a cyclic prefix as guard interval. For antenna space diversity, a distributed MISO scheme is applied across the transmitters. In addition, a Peak-to-Average Power Reduction (PAPR) scheme is performed in the time domain. For flexible network planning, this proposal provides a set of various FFT sizes, guard interval lengths and corresponding pilot patterns. Details of operations of the OFDM Generation block 1030 will be described later.

The Signaling Generation block 1040 can create physical layer signaling information used for the operation of each functional block. This signaling information is also transmitted so that the services of interest are properly recovered at the receiver side. Details of operations of the Signaling Generation block 1040 will be described later.

Figure 2:
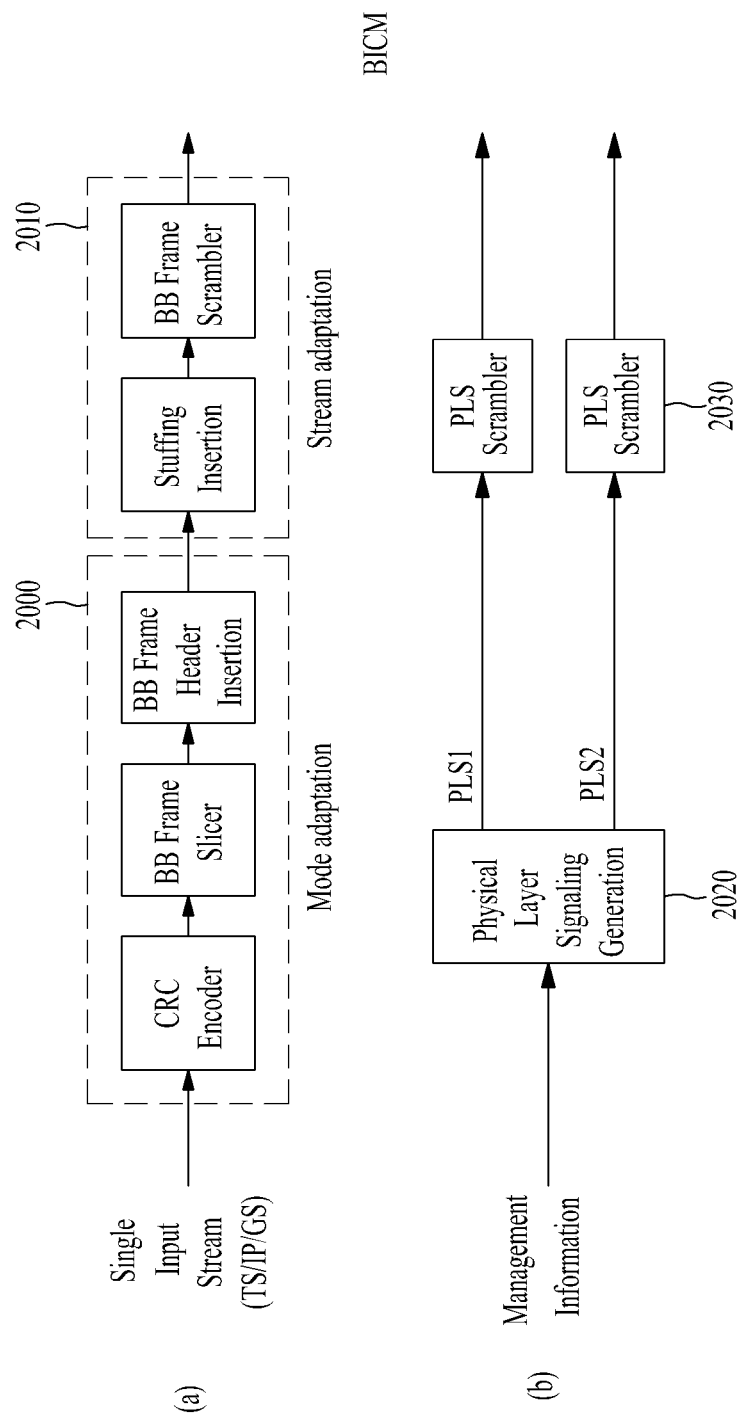
FIG. 2 illustrates an input formatting block according to one embodiment of the present invention.
Figure 3:
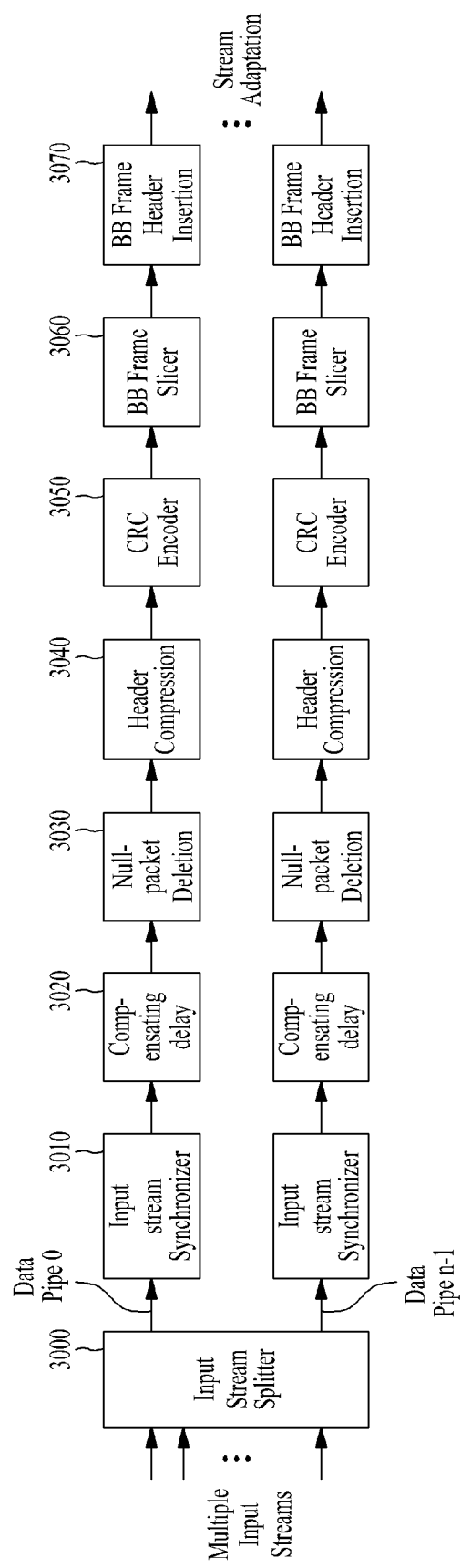
FIG. 3 illustrates an input formatting block according to another embodiment of the present invention.
Figure 4:
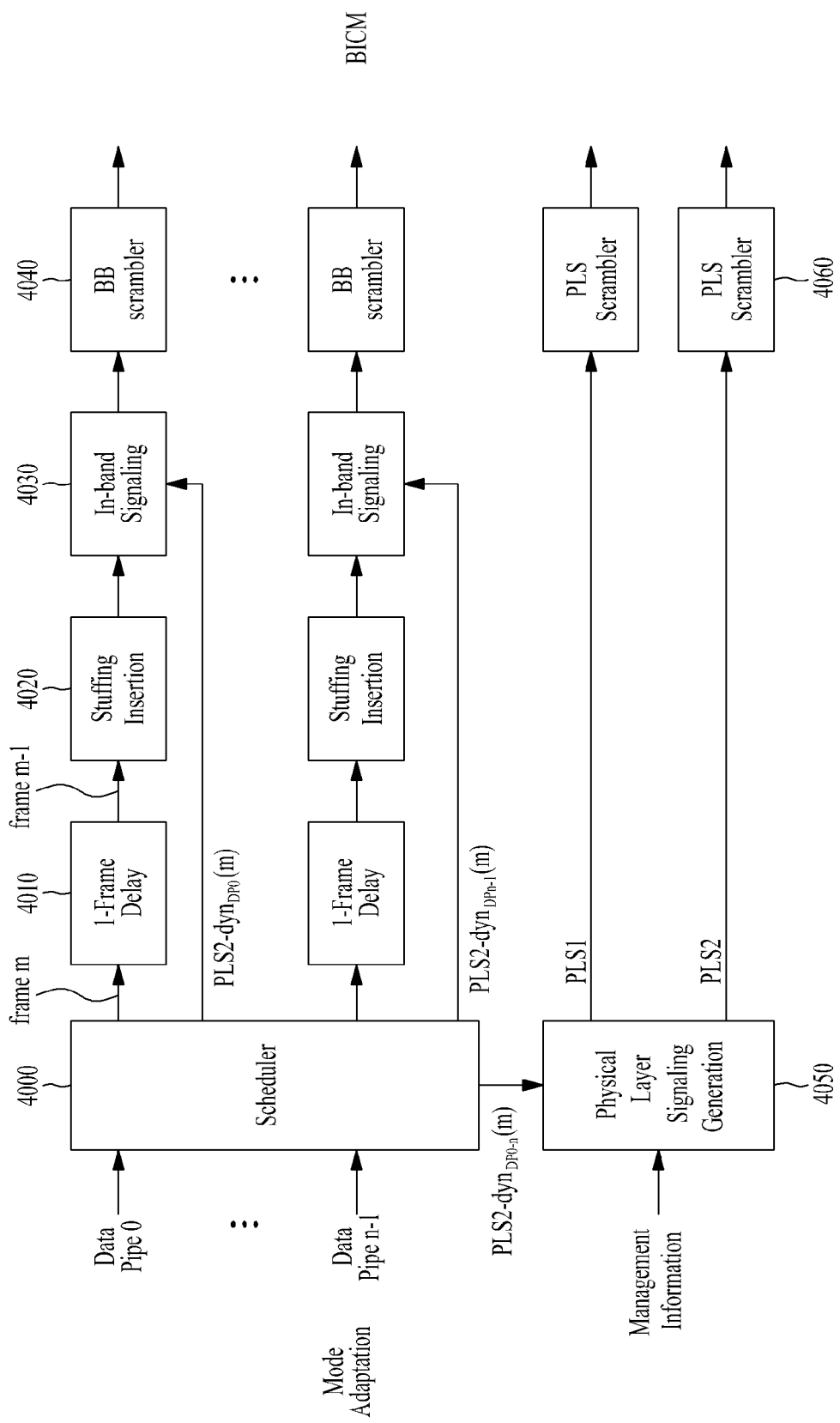
FIG. 4 illustrates an input formatting block according to another embodiment of the present invention.

FIGS. 2, 3 and 4 illustrate the input formatting block 1000 according to embodiments of the present invention. A description will be given of each figure.

FIG. 2 illustrates an input formatting block according to one embodiment of the present invention. FIG. 2 shows an input formatting module when the input signal is a single input stream.

The input formatting block illustrated in FIG. 2 corresponds to an embodiment of the input formatting block 1000 described with reference to FIG. 1.

The input to the physical layer may be composed of one or multiple data streams. Each data stream is carried by one DP. The mode adaptation modules slice the incoming data stream into data fields of the baseband frame (BBF). The system supports three types of input data streams: MPEG2-TS, Internet protocol (IP) and Generic stream (GS). MPEG2-TS is characterized by fixed length (188 byte) packets with the first byte being a sync-byte (0x47). An IP stream is composed of variable length IP datagram packets, as signaled within IP packet headers. The system supports both IPv4 and IPv6 for the IP stream. GS may be composed of variable length packets or constant length packets, signaled within encapsulation packet headers.

(a) shows a mode adaptation block 2000 and a stream adaptation 2010 for signal DP and (b) shows a PLS generation block 2020 and a PLS scrambler 2030 for generating and processing PLS data. A description will be given of the operation of each block.

The Input Stream Splitter splits the input TS, IP, GS streams into multiple service or service component (audio, video, etc.) streams. The mode adaptation module 2010 is comprised of a CRC Encoder, BB (baseband) Frame Slicer, and BB Frame Header Insertion block.

The CRC Encoder provides three kinds of CRC encoding for error detection at the user packet (UP) level, i.e., CRC-8, CRC-16, and CRC-32. The computed CRC bytes are appended after the UP. CRC-8 is used for TS stream and CRC-32 for IP stream. If the GS stream doesn't provide the CRC encoding, the proposed CRC encoding should be applied.

BB Frame Slicer maps the input into an internal logical-bit format. The first received bit is defined to be the MSB. The BB Frame Slicer allocates a number of input bits equal to the available data field capacity. To allocate a number of input bits equal to the BBF payload, the UP packet stream is sliced to fit the data field of BBF.

BB Frame Header Insertion block can insert fixed length BBF header of 2 bytes is inserted in front of the BB Frame. The BBF header is composed of STUFFI (1 bit), SYNCD (13 bits), and RFU (2 bits). In addition to the fixed 2-Byte BBF header, BBF can have an extension field (1 or 3 bytes) at the end of the 2-byte BBF header.

The stream adaptation 2010 is comprised of stuffing insertion block and BB scrambler.

The stuffing insertion block can insert stuffing field into a payload of a BB frame. If the input data to the stream adaptation is sufficient to fill a BB-Frame, STUFFI is set to '0' and the BBF has no stuffing field. Otherwise STUFFI is set to '1' and the stuffing field is inserted immediately after the BBF header. The stuffing field comprises two bytes of the stuffing field header and a variable size of stuffing data.

The BB scrambler scrambles complete BBF for energy dispersal. The scrambling sequence is synchronous with the BBF. The scrambling sequence is generated by the feed-back shift register.

The PLS generation block 2020 can generate physical layer signaling (PLS) data. The PLS provides the receiver with a means to access physical layer DPs. The PLS data consists of PLS1 data and PLS2 data.

The PLS1 data is a first set of PLS data carried in the FSS symbols in the frame having a fixed size, coding and modulation, which carries basic information about the system as well as the parameters needed to decode the PLS2 data. The PLS1 data provides basic transmission parameters including parameters required to enable the reception and decoding of the PLS2 data. Also, the PLS1 data remains constant for the duration of a frame-group.

The PLS2 data is a second set of PLS data transmitted in the FSS symbol, which carries more detailed PLS data about the system and the DPs. The PLS2 contains parameters that provide sufficient information for the receiver to decode the desired DP. The PLS2 signaling further consists of two types of parameters, PLS2 Static data (PLS2-STAT data) and PLS2 dynamic data (PLS2-DYN data). The PLS2 Static data is PLS2 data that remains static for the duration of a frame-group and the PLS2 dynamic data is PLS2 data that may dynamically change frame-by-frame.

Details of the PLS data will be described later.

The PLS scrambler 2030 can scramble the generated PLS data for energy dispersal.

The above-described blocks may be omitted or replaced by blocks having similar or identical functions.

FIG. 3 illustrates an input formatting block according to another embodiment of the present invention.

The input formatting block illustrated in FIG. 3 corresponds to an embodiment of the input formatting block 1000 described with reference to FIG. 1.

FIG. 3 shows a mode adaptation block of the input formatting block when the input signal corresponds to multiple input streams.

The mode adaptation block of the input formatting block for processing the multiple input streams can independently process the multiple input streams.

Referring to FIG. 3, the mode adaptation block for respectively processing the multiple input streams can include an input stream splitter 3000, an input stream synchronizer 3010, a compensating delay block 3020, a null packet deletion block 3030, a head compression block 3040, a CRC encoder 3050, a BB frame slicer 3060 and a BB header insertion block 3070. Description will be given of each block of the mode adaptation block.

Operations of the CRC encoder 3050, BB frame slicer 3060 and BB header insertion block 3070 correspond to those of the CRC encoder, BB frame slicer and BB header insertion block described with reference to FIG. 2 and thus description thereof is omitted.

The input stream splitter 3000 can split the input TS, IP, GS streams into multiple service or service component (audio, video, etc.) streams.

The input stream synchronizer 3010 may be referred as ISSY. The ISSY can provide suitable means to guarantee Constant Bit Rate (CBR) and constant end-to-end transmission delay for any input data format. The ISSY is always used for the case of multiple DPs carrying TS, and optionally used for multiple DPs carrying GS streams.

The compensating delay block 3020 can delay the split TS packet stream following the insertion of ISSY information to allow a TS packet recombining mechanism without requiring additional memory in the receiver.

The null packet deletion block 3030, is used only for the TS input stream case. Some TS input streams or split TS streams may have a large number of null-packets present in order to accommodate VBR (variable bit-rate) services in a CBR TS stream. In this case, in order to avoid unnecessary transmission overhead, null-packets can be identified and not transmitted. In the receiver, removed null-packets can be re-inserted in the exact place where they were originally by reference to a deleted null-packet (DNP) counter that is inserted in the transmission, thus guaranteeing constant bit-rate and avoiding the need for time-stamp (PCR) updating.

The head compression block 3040 can provide packet header compression to increase transmission efficiency for TS or IP input streams. Because the receiver can have a priori information on certain parts of the header, this known information can be deleted in the transmitter.

For Transport Stream, the receiver has a-priori information about the sync-byte configuration (0x47) and the packet length (188 Byte). If the input TS stream carries content that has only one PID, i.e., for only one service component (video, audio, etc.) or service sub-component (SVC base layer, SVC enhancement layer, MVC base view or MVC dependent views), TS packet header compression can be applied (optionally) to the Transport Stream. IP packet header compression is used optionally if the input steam is an IP stream.

The above-described blocks may be omitted or replaced by blocks having similar or identical functions.

FIG. 4 illustrates an input formatting block according to another embodiment of the present invention.

The input formatting block illustrated in FIG. 4 corresponds to an embodiment of the input formatting block 1000 described with reference to FIG. 1.

FIG. 4 illustrates a stream adaptation block of the input formatting module when the input signal corresponds to multiple input streams.

Referring to FIG. 4, the mode adaptation block for respectively processing the multiple input streams can include a scheduler 4000, an 1-Frame delay block 4010, a stuffing insertion block 4020, an in-band signaling 4030, a BB Frame scrambler 4040, a PLS generation block 4050 and a PLS scrambler 4060. Description will be given of each block of the stream adaptation block.

Operations of the stuffing insertion block 4020, the BB Frame scrambler 4040, the PLS generation block 4050 and the PLS scrambler 4060 correspond to those of the stuffing insertion block, BB scrambler, PLS generation block and the PLS scrambler described with reference to FIG. 2 and thus description thereof is omitted.

The scheduler 4000 can determine the overall cell allocation across the entire frame from the amount of FECBLOCKs of each DP. Including the allocation for PLS, EAC and FIC, the scheduler generate the values of PLS2-DYN data, which is transmitted as in-band signaling or PLS cell in FSS of the frame. Details of FECBLOCK, EAC and FIC will be described later.

The 1-Frame delay block 4010 can delay the input data by one transmission frame such that scheduling information about the next frame can be transmitted through the current frame for in-band signaling information to be inserted into the DPs.

The in-band signaling 4030 can insert un-delayed part of the PLS2 data into a DP of a frame.

The above-described blocks may be omitted or replaced by blocks having similar or identical functions.

Figure 5:
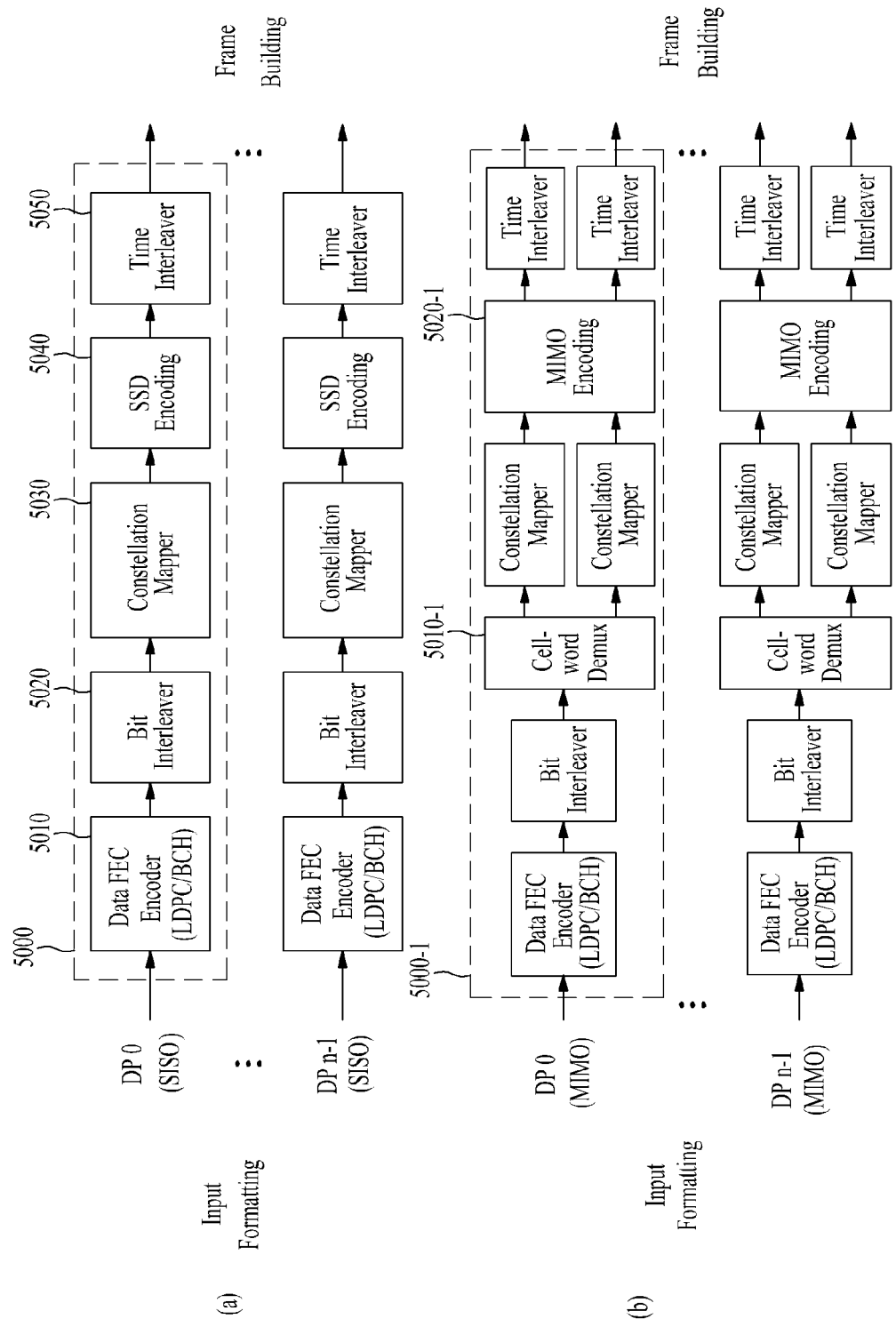
FIG. 5 illustrates a BICM block according to an embodiment of the present invention.

FIG. 5 illustrates a BICM block according to an embodiment of the present invention.

The BICM block illustrated in FIG. 5 corresponds to an embodiment of the BICM block 1010 described with reference to FIG. 1.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the a BICM block according to an embodiment of the present invention can independently process DPs input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each DP.

(a) shows the BICM block shared by the base profile and the handheld profile and (b) shows the BICM block of the advanced profile.

The BICM block shared by the base profile and the handheld profile and the BICM block of the advanced profile can include plural processing blocks for processing each DP.

A description will be given of each processing block of the BICM block for the base profile and the handheld profile and the BICM block for the advanced profile.

A processing block 5000 of the BICM block for the base profile and the handheld profile can include a Data FEC encoder 5010, a bit interleaver 5020, a constellation mapper 5030, an SSD (Signal Space Diversity) encoding block 5040 and a time interleaver 5050.

The Data FEC encoder 5010 can perform the FEC encoding on the input BBF to generate FECBLOCK procedure using outer coding (BCH), and inner coding (LDPC). The outer coding (BCH) is optional coding method. Details of operations of the Data FEC encoder 5010 will be described later.

The bit interleaver 5020 can interleave outputs of the Data FEC encoder 5010 to achieve optimized performance with combination of the LDPC codes and modulation scheme while providing an efficiently implementable structure. Details of operations of the bit interleaver 5020 will be described later.

The constellation mapper 5030 can modulate each cell word from the bit interleaver 5020 in the base and the handheld profiles, or cell word from the Cell-word demultiplexer 5010-1 in the advanced profile using either QPSK, QAM-16, non-uniform QAM (NUQ-64, NUQ-256, NUQ-1024) or non-uniform constellation (NUC-16, NUC-64, NUC-256, NUC-1024) to give a power-normalized constellation point, $e_f$. This constellation mapping is applied only for DPs. Observe that QAM-16 and NUQs are square shaped, while NUCs have arbitrary shape. When each constellation is rotated by any multiple of 90 degrees, the rotated constellation exactly overlaps with its original one. This "rotation-sense" symmetric property makes the capacities and the average powers of the real and imaginary components equal to each other. Both NUQs and NUCs are defined specifically for each code rate and the particular one used is signaled by the parameter DP_MOD filed in PLS2 data.

The SSD encoding block 5040 can precode cells in two (2D), three (3D), and four (4D) dimensions to increase the reception robustness under difficult fading conditions.

The time interleaver 5050 can operates at the DP level. The parameters of time interleaving (TI) may be set differently for each DP. Details of operations of the time interleaver 5050 will be described later.

A processing block 5000-1 of the BICM block for the advanced profile can include the Data FEC encoder, bit interleaver, constellation mapper, and time interleaver. However, the processing block 5000-1 is distinguished from the processing block 5000 further includes a cell-word demultiplexer 5010-1 and a MIMO encoding block 5020-1.

Also, the operations of the Data FEC encoder, bit interleaver, constellation mapper, and time interleaver in the processing block 5000-1 correspond to those of the Data FEC encoder 5010, bit interleaver 5020, constellation mapper 5030, and time interleaver 5050 described and thus description thereof is omitted.

The cell-word demultiplexer 5010-1 is used for the DP of the advanced profile to divide the single cell-word stream into dual cell-word streams for MIMO processing. Details of operations of the cell-word demultiplexer 5010-1 will be described later.

The MIMO encoding block 5020-1 can processing the output of the cell-word demultiplexer 5010-1 using MIMO encoding scheme. The MIMO encoding scheme was optimized for broadcasting signal transmission. The MIMO technology is a promising way to get a capacity increase but it depends on channel characteristics. Especially for broadcasting, the strong LOS component of the channel or a difference in the received signal power between two antennas caused by different signal propagation characteristics makes it difficult to get capacity gain from MIMO. The proposed MIMO encoding scheme overcomes this problem using a rotation-based pre-coding and phase randomization of one of the MIMO output signals.

MIMO encoding is intended for a 2×2 MIMO system requiring at least two antennas at both the transmitter and the receiver. Two MIMO encoding modes are defined in this proposal; full-rate spatial multiplexing (FR-SM) and full-rate full-diversity spatial multiplexing (FRFD-SM). The FR-SM encoding provides capacity increase with relatively small complexity increase at the receiver side while the FRFD-SM encoding provides capacity increase and additional diversity gain with a great complexity increase at the receiver side. The proposed MIMO encoding scheme has no restriction on the antenna polarity configuration.

MIMO processing is required for the advanced profile frame, which means all DPs in the advanced profile frame are processed by the MIMO encoder. MIMO processing is applied at DP level. Pairs of the Constellation Mapper outputs NUQ ($e_{1,i}$ and $e_{2,i}$) are fed to the input of the MIMO Encoder. Paired MIMO Encoder output (g1,i and g2,i) is transmitted by the same carrier k and OFDM symbol 1 of their respective TX antennas.

The above-described blocks may be omitted or replaced by blocks having similar or identical functions.

Figure 6:
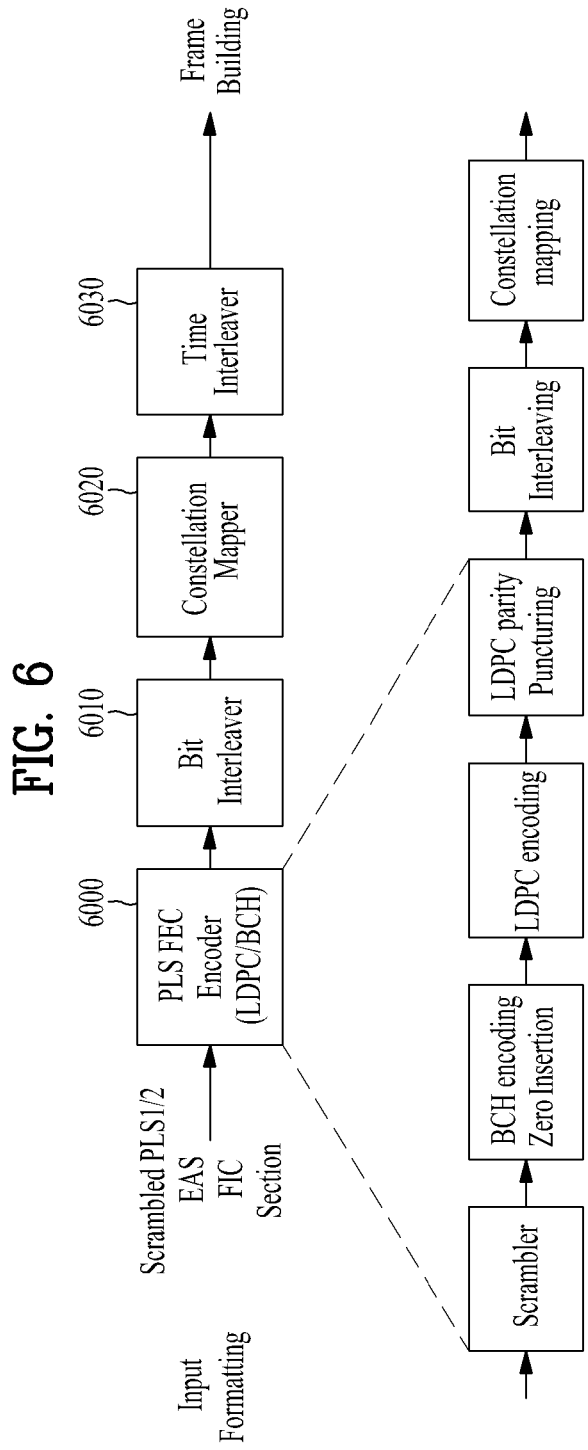
FIG. 6 illustrates a BICM block according to another embodiment of the present invention.

FIG. 6 illustrates a BICM block according to another embodiment of the present invention.

The BICM block illustrated in FIG. 6 corresponds to an embodiment of the BICM block 1010 described with reference to FIG. 1.

FIG. 6 illustrates a BICM block for protection of physical layer signaling (PLS), emergency alert channel (EAC) and fast information channel (FIC). EAC is a part of a frame that carries EAS information data and FIC is a logical channel in a frame that carries the mapping information between a service and the corresponding base DP. Details of the EAC and FIC will be described later.

Referring to FIG. 6, the BICM block for protection of PLS, EAC and FIC can include a PLS FEC encoder 6000, a bit interleaver 6010, a constellation mapper 6020 and time interleaver 6030.

Also, the PLS FEC encoder 6000 can include a scrambler, BCH encoding/zero insertion block, LDPC encoding block and LDPC parity puncturing block. Description will be given of each block of the BICM block.

The PLS FEC encoder 6000 can encode the scrambled PLS1/2 data, EAC and FIC section.

The scrambler can scramble PLS1 data and PLS2 data before BCH encoding and shortened and punctured LDPC encoding.

The BCH encoding/zero insertion block can perform outer encoding on the scrambled PLS1/2 data using the shortened BCH code for PLS protection and insert zero bits after the BCH encoding. For PLS1 data only, the output bits of the zero insertion may be permutted before LDPC encoding.

The LDPC encoding block can encode the output of the BCH encoding/zero insertion block using LDPC code. To generate a complete coded block, $C_{ldpc}$, parity bits, $P_{ldpc}$ are encoded systematically from each zero-inserted PLS information block, $I_{ldpc}$ and appended after it.

$$C_{ldpc} = [I_{ldpc} P_{ldpc}] = [i_0, i_1, \ldots, i_{K_{ldpc}-1}, P_0, P_1, \ldots, P_{N_{ldpc}-K_{ldpc}-1}] \quad \text{[Expression 1]}$$

The LDPC code parameters for PLS1 and PLS2 are as following table 4.

TABLE 4

| Signaling Type | $K_{sig}$ | $K_{bch}$ | $N_{bch\_parity}$ | $K_{ldpc}$ (= $N_{bch}$) | $N_{ldpc}$ | $N_{ldpc\_parity}$ | code rate | $Q_{ldpc}$ |
|---|---|---|---|---|---|---|---|---|
| PLS1 | 342 | 1020 | 60 | 1080 | 4320 | 3240 | 1/4 | 36 |
| PLS2 | <1021 | | | | | | | |
| | >1020 | 2100 | | 2160 | 7200 | 5040 | 3/10 | 56 |

The LDPC parity puncturing block can perform puncturing on the PLS1 data and PLS 2 data.

When shortening is applied to the PLS1 data protection, some LDPC parity bits are punctured after LDPC encoding. Also, for the PLS2 data protection, the LDPC parity bits of PLS2 are punctured after LDPC encoding. These punctured bits are not transmitted.

The bit interleaver 6010 can interleave the each shortened and punctured PLS1 data and PLS2 data.

The constellation mapper 6020 can map the bit ineterlaeved PLS1 data and PLS2 data onto constellations.

The time interleaver 6030 can interleave the mapped PLS1 data and PLS2 data.

The above-described blocks may be omitted or replaced by blocks having similar or identical functions.

Figure 7:
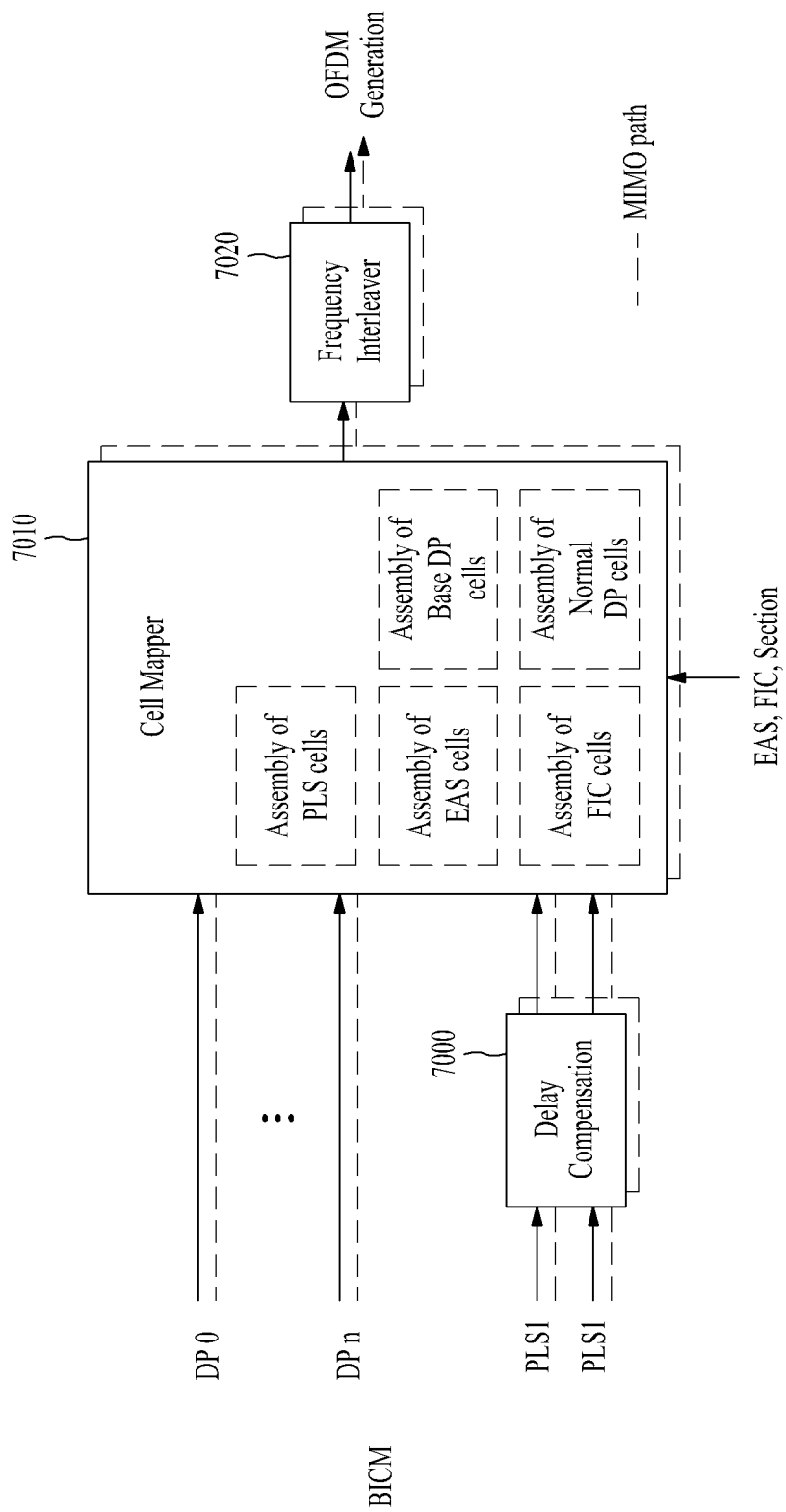
FIG. 7 illustrates a frame building block according to one embodiment of the present invention.

FIG. 7 illustrates a frame building block according to one embodiment of the present invention.

The frame building block illustrated in FIG. 7 corresponds to an embodiment of the frame building block 1020 described with reference to FIG. 1.

Referring to FIG. 7, the frame building block can include a delay compensation block 7000, a cell mapper 7010 and a frequency interleaver 7020. Description will be given of each block of the frame building block.

The delay compensation block 7000 can adjust the timing between the data pipes and the corresponding PLS data to ensure that they are co-timed at the transmitter end. The PLS data is delayed by the same amount as data pipes are by addressing the delays of data pipes caused by the Input Formatting block and BICM block. The delay of the BICM block is mainly due to the time interleaver. In-band signaling data carries information of the next TI group so that they are carried one frame ahead of the DPs to be signaled. The Delay Compensating block delays in-band signaling data accordingly.

The cell mapper 7010 can map PLS, EAC, FIC, DPs, auxiliary streams and dummy cells into the active carriers of the OFDM symbols in the frame. The basic function of the cell mapper 7010 is to map data cells produced by the TIs for each of the DPs, PLS cells, and EAC/FIC cells, if any, into arrays of active OFDM cells corresponding to each of the OFDM symbols within a frame. Service signaling data (such as PSI (program specific information)/SI) can be separately gathered and sent by a data pipe. The Cell Mapper operates according to the dynamic information produced by the scheduler and the configuration of the frame structure. Details of the frame will be described later.

The frequency interleaver 7020 can randomly interleave data cells received from the cell mapper 7010 to provide frequency diversity. Also, the frequency interleaver 7020 can operate on very OFDM symbol pair comprised of two sequential OFDM symbols using a different interleaving-seed order to get maximum interleaving gain in a single frame.

The above-described blocks may be omitted or replaced by blocks having similar or identical functions.

Figure 8:
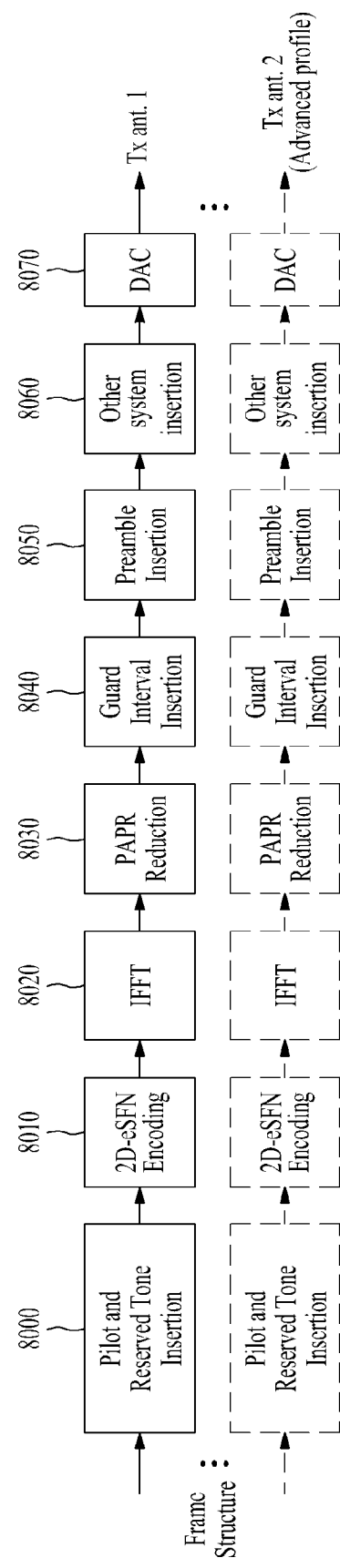
FIG. 8 illustrates an OFMD generation block according to an embodiment of the present invention.

FIG. 8 illustrates an OFMD generation block according to an embodiment of the present invention.

The OFMD generation block illustrated in FIG. 8 corresponds to an embodiment of the OFMD generation block 1030 described with reference to FIG. 1.

The OFDM generation block modulates the OFDM carriers by the cells produced by the Frame Building block, inserts the pilots, and produces the time domain signal for transmission. Also, this block subsequently inserts guard intervals, and applies PAPR (Peak-to-Average Power Radio) reduction processing to produce the final RF signal.

Referring to FIG. 8, the frame building block can include a pilot and reserved tone insertion block 8000, a 2D-eSFN encoding block 8010, an IFFT (Inverse Fast Fourier Transform) block 8020, a PAPR reduction block 8030, a guard interval insertion block 8040, a preamble insertion block 8050, other system insertion block 8060 and a DAC block 8070. Description will be given of each block of the frame building block.

The pilot and reserved tone insertion block 8000 can insert pilots and the reserved tone.

Various cells within the OFDM symbol are modulated with reference information, known as pilots, which have transmitted values known a priori in the receiver. The information of pilot cells is made up of scattered pilots, continual pilots, edge pilots, FSS (frame signaling symbol) pilots and FES (frame edge symbol) pilots. Each pilot is transmitted at a particular boosted power level according to pilot type and pilot pattern. The value of the pilot information is derived from a reference sequence, which is a series of values, one for each transmitted carrier on any given symbol. The pilots can be used for frame synchronization, frequency synchronization, time synchronization, channel estimation, and transmission mode identification, and also can be used to follow the phase noise.

Reference information, taken from the reference sequence, is transmitted in scattered pilot cells in every symbol except the preamble, FSS and FES of the frame. Continual pilots are inserted in every symbol of the frame. The number and location of continual pilots depends on both the FFT size and the scattered pilot pattern. The edge carriers are edge pilots in every symbol except for the preamble symbol. They are inserted in order to allow frequency interpolation up to the edge of the spectrum. FSS pilots are inserted in FSS(s) and FES pilots are inserted in FES. They are inserted in order to allow time interpolation up to the edge of the frame.

The system according to an embodiment of the present invention supports the SFN network, where distributed MISO scheme is optionally used to support very robust transmission mode. The 2D-eSFN is a distributed MISO scheme that uses multiple TX antennas, each of which is located in the different transmitter site in the SFN network.

The 2D-eSFN encoding block 8010 can process a 2D-eSFN processing to distorts the phase of the signals transmitted from multiple transmitters, in order to create both time and frequency diversity in the SFN configuration. Hence, burst errors due to low flat fading or deep-fading for a long time can be mitigated.

The IFFT block 8020 can modulate the output from the 2D-eSFN encoding block 8010 using OFDM modulation scheme. Any cell in the data symbols which has not been designated as a pilot (or as a reserved tone) carries one of the data cells from the frequency interleaver. The cells are mapped to OFDM carriers.

The PAPR reduction block 8030 can perform a PAPR reduction on input signal using various PAPR reduction algorithm in the time domain.

The guard interval insertion block 8040 can insert guard intervals and the preamble insertion block 8050 can insert preamble in front of the signal. Details of a structure of the preamble will be described later. The other system insertion block 8060 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc. Data related to respective broadcast services can be transmitted through different frames.

The DAC block 8070 can convert an input digital signal into an analog signal and output the analog signal. The signal output from the DAC block 7800 can be transmitted through multiple output antennas according to the physical layer profiles. A Tx antenna according to an embodiment of the present invention can have vertical or horizontal polarity.

The above-described blocks may be omitted or replaced by blocks having similar or identical functions according to design.

Figure 9:
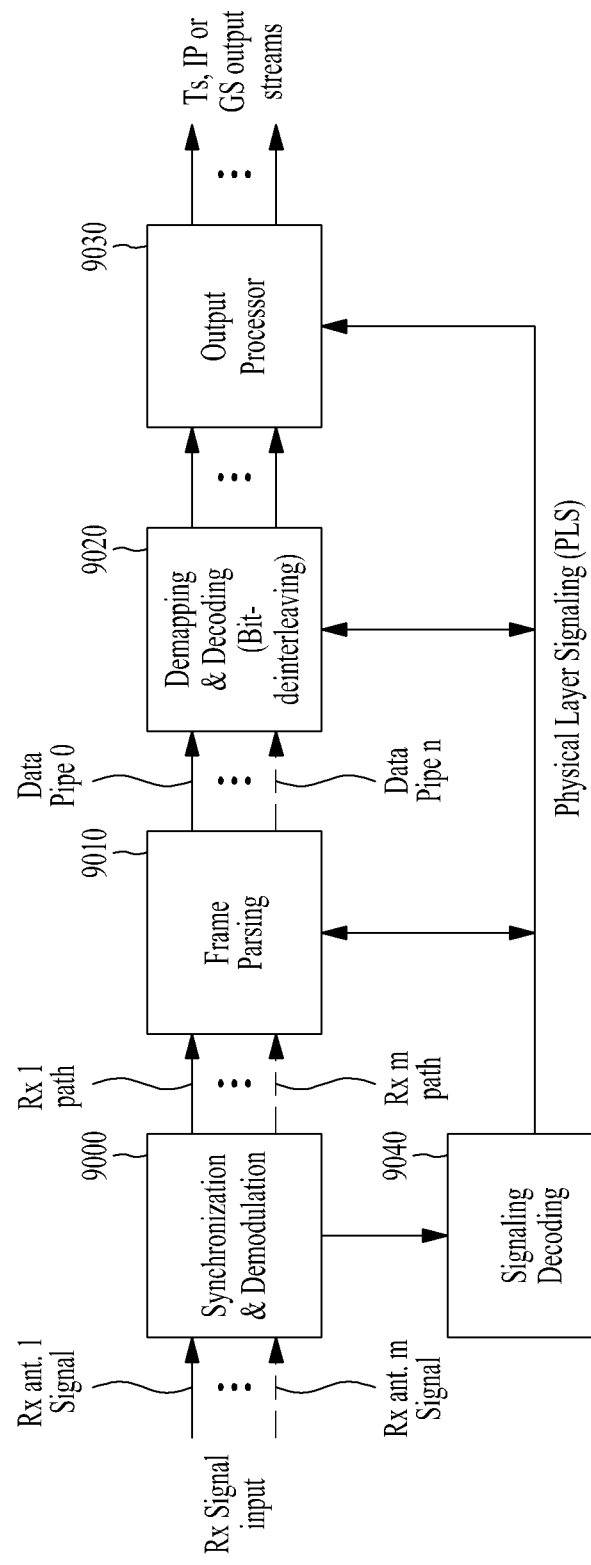
FIG. 9 illustrates a structure of an apparatus for receiving broadcast signals for future broadcast services according to an embodiment of the present invention.

FIG. 9 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 1.

The apparatus for receiving broadcast signals for future broadcast services according to an embodiment of the present invention can include a synchronization & demodulation module 9000, a frame parsing module 9010, a demapping & decoding module 9020, an output processor 9030 and a signaling decoding module 9040. A description will be given of operation of each module of the apparatus for receiving broadcast signals.

The synchronization & demodulation module 9000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module 9100 can parse input signal frames and extract data through which a service selected by a user is transmitted. If the apparatus for transmitting broadcast signals performs interleaving, the frame parsing module 9100 can carry out deinterleaving corresponding to a reverse procedure of interleaving. In this case, the positions of a signal and data that need to be extracted can be obtained by decoding data output from the signaling decoding module 9400 to restore scheduling information generated by the apparatus for transmitting broadcast signals.

The demapping & decoding module 9200 can convert the input signals into bit domain data and then deinterleave the same as necessary. The demapping & decoding module 9200 can perform demapping for mapping applied for transmission efficiency and correct an error generated on a transmission channel through decoding. In this case, the demapping & decoding module 9200 can obtain transmission parameters necessary for demapping and decoding by decoding the data output from the signaling decoding module 9400.

The output processor 9300 can perform reverse procedures of various compression/signal processing procedures which are applied by the apparatus for transmitting broadcast signals to improve transmission efficiency. In this case, the output processor 9300 can acquire necessary control information from data output from the signaling decoding module 9400. The output of the output processor 8300 corresponds to a signal input to the apparatus for transmitting broadcast signals and may be MPEG-TSs, IP streams (v4 or v6) and generic streams.

The signaling decoding module 9400 can obtain PLS information from the signal demodulated by the synchronization & demodulation module 9000. As described above, the frame parsing module 9100, demapping & decoding module 9200 and output processor 9300 can execute functions thereof using the data output from the signaling decoding module 9400.

Figure 10:
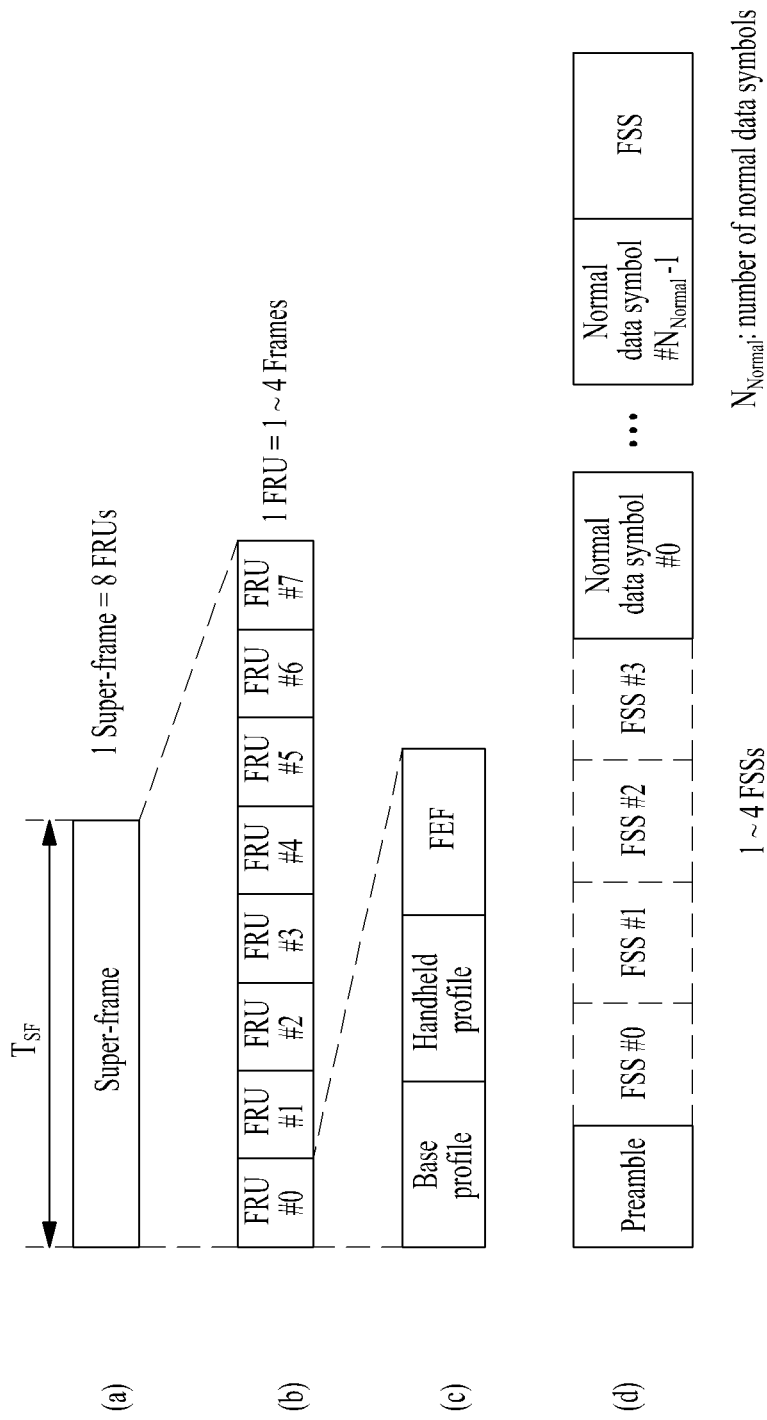
FIG. 10 illustrates a frame structure according to an embodiment of the present invention.

FIG. 10 illustrates a frame structure according to an embodiment of the present invention.

FIG. 10 shows an example configuration of the frame types and FRUs in a super-frame. (a) shows a super frame according to an embodiment of the present invention, (b) shows FRU (Frame Repetition Unit) according to an embodiment of the present invention, (c) shows frames of variable PHY profiles in the FRU and (d) shows a structure of a frame.

A super-frame may be composed of eight FRUs. The FRU is a basic multiplexing unit for TDM of the frames, and is repeated eight times in a super-frame.

Each frame in the FRU belongs to one of the PHY profiles, (base, handheld, advanced) or FEF. The maximum allowed number of the frames in the FRU is four and a given PHY profile can appear any number of times from zero times to four times in the FRU (e.g., base, base, handheld, advanced). PHY profile definitions can be extended using reserved values of the PHY_PROFILE in the preamble, if required.

The FEF part is inserted at the end of the FRU, if included. When the FEF is included in the FRU, the minimum number of FEFs is 8 in a super-frame. It is not recommended that FEF parts be adjacent to each other.

One frame is further divided into a number of OFDM symbols and a preamble. As shown in (d), the frame comprises a preamble, one or more frame signaling symbols (FSS), normal data symbols and a frame edge symbol (FES).

The preamble is a special symbol that enables fast Future-cast UTB system signal detection and provides a set of basic transmission parameters for efficient transmission and reception of the signal. The detailed description of the preamble will be will be described later.

The main purpose of the FSS(s) is to carry the PLS data. For fast synchronization and channel estimation, and hence fast decoding of PLS data, the FSS has more dense pilot pattern than the normal data symbol. The FES has exactly the same pilots as the FSS, which enables frequency-only interpolation within the FES and temporal interpolation, without extrapolation, for symbols immediately preceding the FES.

FIG. 11 illustrates a signaling hierarchy structure of the frame according to an embodiment of the present invention.

FIG. 11 illustrates the signaling hierarchy structure, which is split into three main parts: the preamble signaling data 11000, the PLS1 data 11010 and the PLS2 data 11020. The purpose of the preamble, which is carried by the preamble symbol in every frame, is to indicate the transmission type and basic transmission parameters of that frame. The PLS1 enables the receiver to access and decode the PLS2 data, which contains the parameters to access the DP of interest. The PLS2 is carried in every frame and split into two main parts: PLS2-STAT data and PLS2-DYN data. The static and dynamic portion of PLS2 data is followed by padding, if necessary.

FIG. 12 illustrates preamble signaling data according to an embodiment of the present invention.

Preamble signaling data carries 21 bits of information that are needed to enable the receiver to access PLS data and trace DPs within the frame structure. Details of the preamble signaling data are as follows:

PHY_PROFILE: This 3-bit field indicates the PHY profile type of the current frame. The mapping of different PHY profile types is given in below table 5.

TABLE 5

| Value | PHY profile |
|---|---|
| 000 | Base profile |
| 001 | Handheld profile |
| 010 | Advanced profiled |
| 011~110 | Reserved |
| 111 | FEF |

FFT_SIZE: This 2 bit field indicates the FFT size of the current frame within a frame-group, as described in below table 6.

TABLE 6

| Value | FFT size |
|---|---|
| 00 | 8K FFT |
| 01 | 16K FFT |
| 10 | 32K FFT |
| 11 | Reserved |

GI_FRACTION: This 3 bit field indicates the guard interval fraction value in the current super-frame, as described in below table 7.

TABLE 7

| Value | GI_FRACTION |
|---|---|
| 000 | 1/5 |
| 001 | 1/10 |
| 010 | 1/20 |
| 011 | 1/40 |
| 100 | 1/80 |
| 101 | 1/160 |
| 110~111 | Reserved |

EAC_FLAG: This 1 bit field indicates whether the EAC is provided in the current frame. If this field is set to '1', emergency alert service (EAS) is provided in the current frame. If this field set to '0', EAS is not carried in the current frame. This field can be switched dynamically within a super-frame.

PILOT_MODE: This 1-bit field indicates whether the pilot mode is mobile mode or fixed mode for the current frame in the current frame-group. If this field is set to '0', mobile pilot mode is used. If the field is set to '1', the fixed pilot mode is used.

PAPR_FLAG: This 1-bit field indicates whether PAPR reduction is used for the current frame in the current frame-group. If this field is set to value '1', tone reservation is used for PAPR reduction. If this field is set to '0', PAPR reduction is not used.

FRU_CONFIGURE: This 3-bit field indicates the PHY profile type configurations of the frame repetition units (FRU) that are present in the current super-frame. All profile types conveyed in the current super-frame are identified in this field in all preambles in the current super-frame. The 3-bit field has a different definition for each profile, as show in below table 8.

TABLE 8

| | Current PHY_PROFILE = '000' (base) | Current PHY_PROFILE = '001' (handheld) | Current PHY_PROFILE = '010' (advanced) | Current PHY_PROFILE = '111' (FEF) |
|---|---|---|---|---|
| FRU_CONFIGURE = 000 | Only base profile present | Only handheld profile present | Only advanced profile present | Only FEF present |
| FRU_CONFIGURE = 1XX | Handheld profile present | Base profile present | Base profile present | Base profile present |
| FRU_CONFIGURE = X1X | Advanced profile present | Advanced profile present | Handheld profile present | Handheld profile present |

TABLE 8-continued

| | Current PHY_PROFILE = '000' (base) | Current PHY_PROFILE = '001' (handheld) | Current PHY_PROFILE = '010' (advanced) | Current PHY_PROFILE = '111' (FEF) |
|---|---|---|---|---|
| FRU_CONFIGURE = XX1 | FEF present | FEF present | FEF present | Advanced profile present |

RESERVED: This 7-bit field is reserved for future use.

FIG. 13 illustrates PLS1 data according to an embodiment of the present invention.

PLS1 data provides basic transmission parameters including parameters required to enable the reception and decoding of the PLS2. As above mentioned, the PLS1 data remain unchanged for the entire duration of one frame-group. The detailed definition of the signaling fields of the PLS1 data are as follows:

PREAMBLE_DATA: This 20-bit field is a copy of the preamble signaling data excluding the EAC_FLAG.

NUM_FRAME_FRU: This 2-bit field indicates the number of the frames per FRU.

PAYLOAD_TYPE: This 3-bit field indicates the format of the payload data carried in the frame-group. PAYLOAD_TYPE is signaled as shown in table 9.

TABLE 9

| value | Payload type |
|---|---|
| 1XX | TS stream is transmitted |
| X1X | IP stream is transmitted |
| XX1 | GS stream is transmitted |

NUM_FSS: This 2-bit field indicates the number of FSS symbols in the current frame.

SYSTEM_VERSION: This 8-bit field indicates the version of the transmitted signal format. The SYSTEM_VERSION is divided into two 4-bit fields, which are a major version and a minor version.

Major version: The MSB four bits of SYSTEM_VERSION field indicate major version information. A change in the major version field indicates a non-backward-compatible change. The default value is '0000'. For the version described in this standard, the value is set to '0000'.

Minor version: The LSB four bits of SYSTEM_VERSION field indicate minor version information. A change in the minor version field is backward-compatible.

CELL_ID: This is a 16-bit field which uniquely identifies a geographic cell in an ATSC network. An ATSC cell coverage area may consist of one or more frequencies, depending on the number of frequencies used per Futurecast UTB system. If the value of the CELL_ID is not known or unspecified, this field is set to '0'.

NETWORK_ID: This is a 16-bit field which uniquely identifies the current ATSC network.

SYSTEM_ID: This 16-bit field uniquely identifies the Futurecast UTB system within the ATSC network. The Futurecast UTB system is the terrestrial broadcast system whose input is one or more input streams (TS, IP, GS) and whose output is an RF signal. The Futurecast UTB system carries one or more PHY profiles and FEF, if any. The same Futurecast UTB system may carry different input streams and use different RF frequencies in different geographical areas, allowing local service insertion. The frame structure and scheduling is controlled in one place and is identical for all transmissions within a Futurecast UTB system. One or more Futurecast UTB systems may have the same SYSTEM_ID meaning that they all have the same physical layer structure and configuration.

The following loop consists of FRU_PHY_PROFILE, FRU_FRAME_LENGTH, FRU_GI_FRACTION, and RESERVED which are used to indicate the FRU configuration and the length of each frame type. The loop size is fixed so that four PHY profiles (including a FEF) are signaled within the FRU. If NUM_FRAME_FRU is less than 4, the unused fields are filled with zeros.

FRU_PHY_PROFILE: This 3-bit field indicates the PHY profile type of the $(i+1)^{th}$ (i is the loop index) frame of the associated FRU. This field uses the same signaling format as shown in the table 8.

FRU_FRAME_LENGTH: This 2-bit field indicates the length of the $(i+1)^{th}$ frame of the associated FRU. Using FRU_FRAME_LENGTH together with FRU_GI_FRACTION, the exact value of the frame duration can be obtained.

FRU_GI_FRACTION: This 3-bit field indicates the guard interval fraction value of the $(i+1)^{th}$ frame of the associated FRU. FRU_GI_FRACTION is signaled according to the table 7.

RESERVED: This 4-bit field is reserved for future use.

The following fields provide parameters for decoding the PLS2 data.

PLS2_FEC_TYPE: This 2-bit field indicates the FEC type used by the PLS2 protection. The FEC type is signaled according to table 10. The details of the LDPC codes will be described later.

TABLE 10

| Content | PLS2 FEC type |
| --- | --- |
| 00 | 4K-1/4 and 7K-3/10 LDPC codes |
| 01~11 | Reserved |

PLS2_MOD: This 3-bit field indicates the modulation type used by the PLS2. The modulation type is signaled according to table 11.

TABLE 11

| Value | PLS2_MODE |
| --- | --- |
| 000 | BPSK |
| 001 | QPSK |
| 010 | QAM-16 |
| 011 | NUQ-64 |
| 100~111 | Reserved |

PLS2_SIZE_CELL: This 15-bit field indicates $C_{total\_partial\_block}$, the size (specified as the number of QAM cells) of the collection of full coded blocks for PLS2 that is carried in the current frame-group. This value is constant during the entire duration of the current frame-group.

PLS2_STAT_SIZE_BIT: This 14-bit field indicates the size, in bits, of the PLS2-STAT for the current frame-group. This value is constant during the entire duration of the current frame-group.

PLS2_DYN_SIZE_BIT: This 14-bit field indicates the size, in bits, of the PLS2-DYN for the current frame-group. This value is constant during the entire duration of the current frame-group.

PLS2_REP_FLAG: This 1-bit flag indicates whether the PLS2 repetition mode is used in the current frame-group. When this field is set to value '1', the PLS2 repetition mode is activated. When this field is set to value '0', the PLS2 repetition mode is deactivated.

PLS2_REP_SIZE_CELL: This 15-bit field indicates $C_{total\_partial\_block}$, the size (specified as the number of QAM cells) of the collection of partial coded blocks for PLS2 carried in every frame of the current frame-group, when PLS2 repetition is used. If repetition is not used, the value of this field is equal to 0. This value is constant during the entire duration of the current frame-group.

PLS2_NEXT_FEC_TYPE: This 2-bit field indicates the FEC type used for PLS2 that is carried in every frame of the next frame-group. The FEC type is signaled according to the table 10.

PLS2_NEXT_MOD: This 3-bit field indicates the modulation type used for PLS2 that is carried in every frame of the next frame-group. The modulation type is signaled according to the table 11.

PLS2_NEXT_REP_FLAG: This 1-bit flag indicates whether the PLS2 repetition mode is used in the next frame-group. When this field is set to value '1', the PLS2 repetition mode is activated. When this field is set to value '0', the PLS2 repetition mode is deactivated.

PLS2_NEXT_REP_SIZE_CELL: This 15-bit field indicates $C_{total\_full\_block}$, The size (specified as the number of QAM cells) of the collection of full coded blocks for PLS2 that is carried in every frame of the next frame-group, when PLS2 repetition is used. If repetition is not used in the next frame-group, the value of this field is equal to 0. This value is constant during the entire duration of the current frame-group.

PLS2_NEXT_REP_STAT_SIZE_BIT: This 14-bit field indicates the size, in bits, of the PLS2-STAT for the next frame-group. This value is constant in the current frame-group.

PLS2_NEXT_REP_DYN_SIZE_BIT: This 14-bit field indicates the size, in bits, of the PLS2-DYN for the next frame-group. This value is constant in the current frame-group.

PLS2_AP_MODE: This 2-bit field indicates whether additional parity is provided for PLS2 in the current frame-group. This value is constant during the entire duration of the current frame-group. The below table 12 gives the values of this field. When this field is set to '00', additional parity is not used for the PLS2 in the current frame-group.

TABLE 12

| Value | PLS2-AP mode |
| --- | --- |
| 00 | AP is not provided |
| 01 | AP1 mode |
| 10~11 | Reserved |

PLS2_AP_SIZE_CELL: This 15-bit field indicates the size (specified as the number of QAM cells) of the additional parity bits of the PLS2. This value is constant during the entire duration of the current frame-group.

PLS2_NEXT_AP_MODE: This 2-bit field indicates whether additional parity is provided for PLS2 signaling in every frame of next frame-group. This value is constant during the entire duration of the current frame-group. The table 12 defines the values of this field.

PLS2_NEXT_AP_SIZE_CELL: This 15-bit field indicates the size (specified as the number of QAM cells) of the additional parity bits of the PLS2 in every frame of the next frame-group. This value is constant during the entire duration of the current frame-group.

RESERVED: This 32-bit field is reserved for future use.

CRC_32: A 32-bit error detection code, which is applied to the entire PLS1 signaling.

FIG. 14 illustrates PLS2 data according to an embodiment of the present invention.

FIG. 14 illustrates PLS2-STAT data of the PLS2 data. The PLS2-STAT data are the same within a frame-group, while the PLS2-DYN data provide information that is specific for the current frame.

The details of fields of the PLS2-STAT data are as follows:

FIC_FLAG: This 1-bit field indicates whether the FIC is used in the current frame-group. If this field is set to '1', the FIC is provided in the current frame. If this field set to '0', the FIC is not carried in the current frame. This value is constant during the entire duration of the current frame-group.

AUX_FLAG: This 1-bit field indicates whether the auxiliary stream(s) is used in the current frame-group. If this field is set to '1', the auxiliary stream is provided in the current frame. If this field set to '0', the auxiliary stream is not carried in the current frame. This value is constant during the entire duration of current frame-group.

NUM_DP: This 6-bit field indicates the number of DPs carried within the current frame. The value of this field ranges from 1 to 64, and the number of DPs is NUM_DP+1.

DP_ID: This 6-bit field identifies uniquely a DP within a PHY profile.

DP_TYPE: This 3-bit field indicates the type of the DP. This is signaled according to the below table 13.

TABLE 13

| Value | DP Type |
|---|---|
| 000 | DP Type 1 |
| 001 | DP Type 2 |
| 010~111 | reserved |

DP_GROUP_ID: This 8-bit field identifies the DP group with which the current DP is associated. This can be used by a receiver to access the DPs of the service components associated with a particular service, which will have the same DP_GROUP_ID.

BASE_DP_ID: This 6-bit field indicates the DP carrying service signaling data (such as PSI/SI) used in the Management layer. The DP indicated by BASE_DP_ID may be either a normal DP carrying the service signaling data along with the service data or a dedicated DP carrying only the service signaling data DP_FEC_TYPE: This 2-bit field indicates the FEC type used by the associated DP. The FEC type is signaled according to the below table 14.

TABLE 14

| Value | FEC_TYPE |
|---|---|
| 00 | 16K LDPC |
| 01 | 64K LDPC |
| 10~11 | Reserved |

DP_COD: This 4-bit field indicates the code rate used by the associated DP. The code rate is signaled according to the below table 15.

TABLE 15

| Value | Code rate |
|---|---|
| 0000 | 5/15 |
| 0001 | 6/15 |
| 0010 | 7/15 |
| 0011 | 8/15 |
| 0100 | 9/15 |
| 0101 | 10/15 |
| 0110 | 11/15 |
| 0111 | 12/15 |
| 1000 | 13/15 |
| 1001~1111 | Reserved |

DP_MOD: This 4-bit field indicates the modulation used by the associated DP. The modulation is signaled according to the below table 16.

TABLE 16

| Value | Modulation |
|---|---|
| 0000 | QPSK |
| 0001 | QAM-16 |
| 0010 | NUQ-64 |
| 0011 | NUQ-256 |
| 0100 | NUQ-1024 |
| 0101 | NUC-16 |
| 0110 | NUC-64 |
| 0111 | NUC-256 |
| 1000 | NUC-1024 |
| 1001~1111 | reserved |

DP_SSD_FLAG: This 1-bit field indicates whether the SSD mode is used in the associated DP. If this field is set to value '1', SSD is used. If this field is set to value '0', SSD is not used.

The following field appears only if PHY_PROFILE is equal to '010', which indicates the advanced profile:

DP_MIMO: This 3-bit field indicates which type of MIMO encoding process is applied to the associated DP. The type of MIMO encoding process is signaled according to the table 17.

TABLE 17

| Value | MIMO encoding |
|---|---|
| 000 | FR-SM |
| 001 | FRFD-SM |
| 010~111 | reserved |

DP_TI_TYPE: This 1-bit field indicates the type of time-interleaving. A value of '0' indicates that one TI group corresponds to one frame and contains one or more TI-blocks. A value of '1' indicates that one TI group is carried in more than one frame and contains only one TI-block.

DP_TI_LENGTH: The use of this 2-bit field (the allowed values are only 1, 2, 4, 8) is determined by the values set within the DP_TI_TYPE field as follows:

If the DP_TI_TYPE is set to the value '1', this field indicates $P_I$, the number of the frames to which each TI group is mapped, and there is one TI-block per TI group ($N_{TI}=1$). The allowed $P_I$ values with 2-bit field are defined in the below table 18.

If the DP_TI_TYPE is set to the value '0', this field indicates the number of TI-blocks $N_{TI}$ per TI group, and there is one TI group per frame ($P_I=1$). The allowed $P_I$ values with 2-bit field are defined in the below table 18.

TABLE 18

| 2-bit field | $P_I$ | $N_{TI}$ |
|---|---|---|
| 00 | 1 | 1 |
| 01 | 2 | 2 |
| 10 | 4 | 3 |
| 11 | 8 | 4 |

DP_FRAME_INTERVAL: This 2-bit field indicates the frame interval ($I_{JUMP}$) within the frame-group for the associated DP and the allowed values are 1, 2, 4, 8 (the corresponding 2-bit field is '00', '01', '10', or '11', respectively). For DPs that do not appear every frame of the frame-group, the value of this field is equal to the interval between successive frames. For example, if a DP appears on the frames 1, 5, 9, 13, etc., this field is set to '4'. For DPs that appear in every frame, this field is set to '1'.

DP_TI_BYPASS: This 1-bit field determines the availability of time interleaver. If time interleaving is not used for a DP, it is set to '1'. Whereas if time interleaving is used it is set to '0'.

DP_FIRST_FRAME_IDX: This 5-bit field indicates the index of the first frame of the super-frame in which the current DP occurs. The value of DP_FIRST_FRAME_IDX ranges from 0 to 31

DP_NUM_BLOCK_MAX: This 10-bit field indicates the maximum value of DP_NUM_BLOCKS for this DP. The value of this field has the same range as DP_NUM_BLOCKS.

DP_PAYLOAD_TYPE: This 2-bit field indicates the type of the payload data carried by the given DP. DP_PAYLOAD_TYPE is signaled according to the below table 19.

TABLE 19

| Value | Payload Type |
|---|---|
| 00 | TS. |
| 01 | IP |
| 10 | GS |
| 11 | reserved |

DP_INBAND_MODE: This 2-bit field indicates whether the current DP carries in-band signaling information. The in-band signaling type is signaled according to the below table 20.

TABLE 20

| Value | In-band mode |
|---|---|
| 00 | In-band signaling is not carried. |
| 01 | INBAND-PLS is carried only |
| 10 | INBAND-ISSY is carried only |
| 11 | INBAND-PLS and INBAND-ISSY are carried |

DP_PROTOCOL_TYPE: This 2-bit field indicates the protocol type of the payload carried by the given DP. It is signaled according to the below table 21 when input payload types are selected.

TABLE 21

| Value | If DP_PAYLOAD_TYPE Is TS | If DP_PAYLOAD_TYPE Is IP | If DP_PAYLOAD_TYPE Is GS |
|---|---|---|---|
| 00 | MPEG2-TS | IPv4 | (Note) |
| 01 | Reserved | IPv6 | Reserved |
| 10 | Reserved | Reserved | Reserved |
| 11 | Reserved | Reserved | Reserved |

DP_CRC_MODE: This 2-bit field indicates whether CRC encoding is used in the Input Formatting block. The CRC mode is signaled according to the below table 22.

TABLE 22

| Value | CRC mode |
|---|---|
| 00 | Not used |
| 01 | CRC-8 |
| 10 | CRC-16 |
| 11 | CRC-32 |

DNP_MODE: This 2-bit field indicates the null-packet deletion mode used by the associated DP when DP_PAYLOAD_TYPE is set to TS ('00'). DNP_MODE is signaled according to the below table 23. If DP_PAYLOAD_TYPE is not TS ('00'), DNP_MODE is set to the value '00'.

TABLE 23

| Value | Null-packet deletion mode |
|---|---|
| 00 | Not used |
| 01 | DNP-NORMAL |
| 10 | DNP-OFFSET |
| 11 | reserved |

ISSY_MODE: This 2-bit field indicates the ISSY mode used by the associated DP when DP_PAYLOAD_TYPE is set to TS ('00'). The ISSY_MODE is signaled according to the below table 24 If DP_PAYLOAD_TYPE is not TS ('00'), ISSY_MODE is set to the value '00'.

TABLE 24

| Value | ISSY mode |
|---|---|
| 00 | Not used |
| 01 | ISSY-UP |
| 10 | ISSY-BBF |
| 11 | reserved |

HC_MODE_TS: This 2-bit field indicates the TS header compression mode used by the associated DP when DP_PAYLOAD_TYPE is set to TS ('00'). The HC_MODE_TS is signaled according to the below table 25.

TABLE 25

| Value | Header compression mode |
|---|---|
| 00 | HC_MODE_TS 1 |
| 01 | HC_MODE_TS 2 |
| 10 | HC_MODE_TS 3 |
| 11 | HC_MODE_TS 4 |

HC_MODE_IP: This 2-bit field indicates the IP header compression mode when DP_PAYLOAD_TYPE is set to IP ('01'). The HC_MODE_IP is signaled according to the below table 26.

TABLE 26

| Value | Header compression mode |
|---|---|
| 00 | No compression |
| 01 | HC_MODE_IP 1 |
| 10~11 | reserved |

PID: This 13-bit field indicates the PID number for TS header compression when DP_PAYLOAD_TYPE is set to TS ('00') and HC_MODE_TS is set to '01' or '10'.

RESERVED: This 8-bit field is reserved for future use.

The following field appears only if FIC_FLAG is equal to '1':

FIC_VERSION: This 8-bit field indicates the version number of the FIC.

FIC_LENGTH_BYTE: This 13-bit field indicates the length, in bytes, of the FIC.

RESERVED: This 8-bit field is reserved for future use.

The following field appears only if AUX_FLAG is equal to '1':

NUM_AUX: This 4-bit field indicates the number of auxiliary streams. Zero means no auxiliary streams are used.

AUX_CONFIG_RFU: This 8-bit field is reserved for future use.

AUX_STREAM_TYPE: This 4-bit is reserved for future use for indicating the type of the current auxiliary stream.

AUX_PRIVATE_CONFIG: This 28-bit field is reserved for future use for signaling auxiliary streams.

Figures 15, 16:
FIG. 15 illustrates PLS2 data according to another embodiment of the present invention.
FIG. 16 illustrates a logical structure of a frame according to an embodiment of the present invention.

FIG. 15 illustrates PLS2 data according to another embodiment of the present invention.

FIG. 15 illustrates PLS2-DYN data of the PLS2 data. The values of the PLS2-DYN data may change during the duration of one frame-group, while the size of fields remains constant.

The details of fields of the PLS2-DYN data are as follows:

FRAME_INDEX: This 5-bit field indicates the frame index of the current frame within the super-frame. The index of the first frame of the super-frame is set to '0'.

PLS_CHANGE_COUNTER: This 4-bit field indicates the number of super-frames ahead where the configuration will change. The next super-frame with changes in the configuration is indicated by the value signaled within this field. If this field is set to the value '0000', it means that no scheduled change is foreseen: e.g., value '1' indicates that there is a change in the next super-frame.

FIC_CHANGE_COUNTER: This 4-bit field indicates the number of super-frames ahead where the configuration (i.e., the contents of the FIC) will change. The next super-frame with changes in the configuration is indicated by the value signaled within this field. If this field is set to the value '0000', it means that no scheduled change is foreseen: e.g. value '0001' indicates that there is a change in the next super-frame.

RESERVED: This 16-bit field is reserved for future use.

The following fields appear in the loop over NUM_DP, which describe the parameters associated with the DP carried in the current frame.

DP_ID: This 6-bit field indicates uniquely the DP within a PHY profile.

DP_START: This 15-bit (or 13-bit) field indicates the start position of the first of the DPs using the DPU addressing scheme. The DP_START field has differing length according to the PHY profile and FFT size as shown in the below table 27.

TABLE 27

| PHY profile | DP_START field size | |
|---|---|---|
| | 64K | 16K |
| Base | 13 bit | 15 bit |
| Handheld | — | 13 bit |
| Advanced | 13 bit | 15 bit |

DP_NUM_BLOCK: This 10-bit field indicates the number of FEC blocks in the current TI group for the current DP. The value of DP_NUM_BLOCK ranges from 0 to 1023

RESERVED: This 8-bit field is reserved for future use.

The following fields indicate the FIC parameters associated with the EAC.

EAC_FLAG: This 1-bit field indicates the existence of the EAC in the current frame. This bit is the same value as the EAC_FLAG in the preamble.

EAS_WAKE_UP_VERSION_NUM: This 8-bit field indicates the version number of a wake-up indication.

If the EAC_FLAG field is equal to '1', the following 12 bits are allocated for EAC_LENGTH_BYTE field. If the EAC_FLAG field is equal to '0', the following 12 bits are allocated for EAC_COUNTER.

EAC_LENGTH_BYTE: This 12-bit field indicates the length, in byte, of the EAC.

EAC_COUNTER: This 12-bit field indicates the number of the frames before the frame where the EAC arrives.

The following field appears only if the AUX_FLAG field is equal to '1':

AUX_PRIVATE_DYN: This 48-bit field is reserved for future use for signaling auxiliary streams. The meaning of this field depends on the value of AUX_STREAM_TYPE in the configurable PLS2-STAT.

CRC_32: A 32-bit error detection code, which is applied to the entire PLS2.

FIG. 16 illustrates a logical structure of a frame according to an embodiment of the present invention.

As above mentioned, the PLS, EAC, FIC, DPs, auxiliary streams and dummy cells are mapped into the active carriers of the OFDM symbols in the frame. The PLS1 and PLS2 are first mapped into one or more FSS(s). After that, EAC cells, if any, are mapped immediately following the PLS field, followed next by FIC cells, if any. The DPs are mapped next after the PLS or EAC, FIC, if any. Type 1 DPs follows first, and Type 2 DPs next. The details of a type of the DP will be described later. In some case, DPs may carry some special data for EAS or service signaling data. The auxiliary stream or streams, if any, follow the DPs, which in turn are followed by dummy cells. Mapping them all together in the above mentioned order, i.e. PLS, EAC, FIC, DPs, auxiliary streams and dummy data cells exactly fill the cell capacity in the frame.

Figure 17:
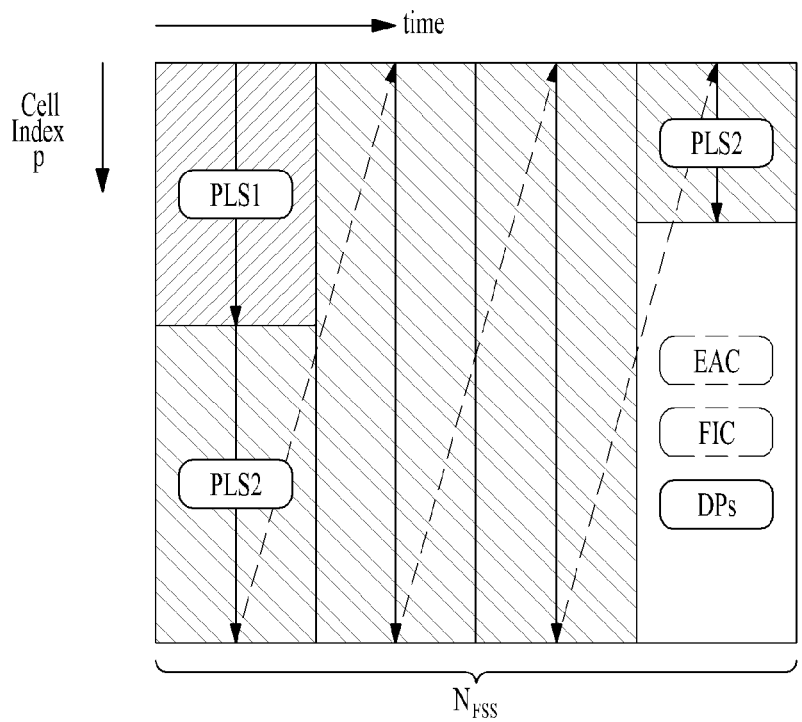
FIG. 17 illustrates PLS mapping according to an embodiment of the present invention.

FIG. 17 illustrates PLS mapping according to an embodiment of the present invention.

PLS cells are mapped to the active carriers of FSS(s). Depending on the number of cells occupied by PLS, one or more symbols are designated as FSS(s), and the number of FSS(s) $N_{FSS}$ is signaled by NUM_FSS in PLS1. The FSS is a special symbol for carrying PLS cells. Since robustness and latency are critical issues in the PLS, the FSS(s) has higher density of pilots allowing fast synchronization and frequency-only interpolation within the FSS.

PLS cells are mapped to active carriers of the $N_{FSS}$ FSS(s) in a top-down manner as shown in an example in FIG. 17. The PLS1 cells are mapped first from the first cell of the first FSS in an increasing order of the cell index. The PLS2 cells follow immediately after the last cell of the PLS1 and mapping continues downward until the last cell index of the first FSS. If the total number of required PLS cells exceeds the number of active carriers of one FSS, mapping proceeds to the next FSS and continues in exactly the same manner as the first FSS.

After PLS mapping is completed, DPs are carried next. If EAC, FIC or both are present in the current frame, they are placed between PLS and "normal" DPs.

Figure 18:
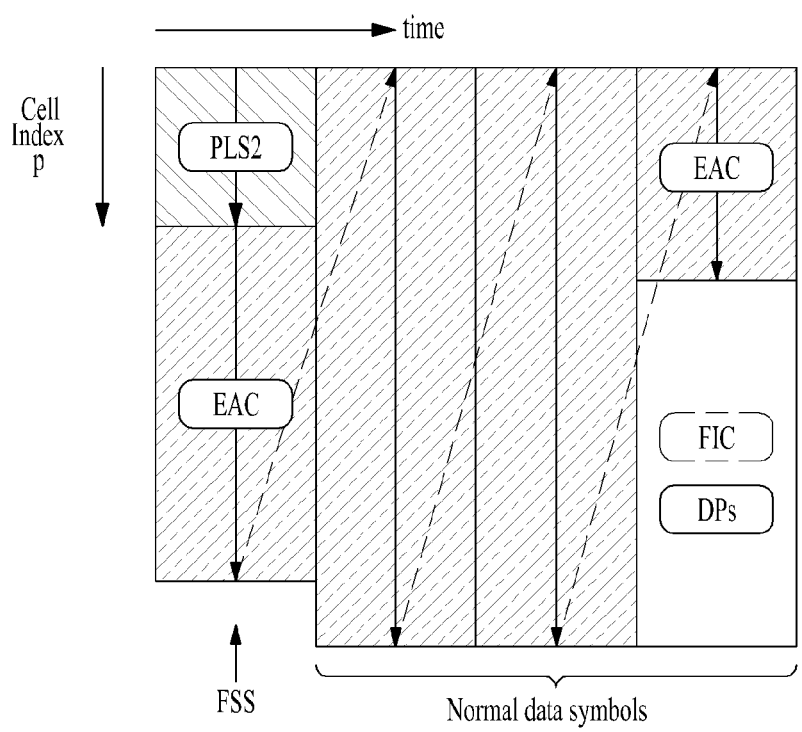
FIG. 18 illustrates EAC mapping according to an embodiment of the present invention.

FIG. 18 illustrates EAC mapping according to an embodiment of the present invention.

EAC is a dedicated channel for carrying EAS messages and links to the DPs for EAS. EAS support is provided but EAC itself may or may not be present in every frame. EAC, if any, is mapped immediately after the PLS2 cells. EAC is not preceded by any of the FIC, DPs, auxiliary streams or dummy cells other than the PLS cells. The procedure of mapping the EAC cells is exactly the same as that of the PLS.

The EAC cells are mapped from the next cell of the PLS2 in increasing order of the cell index as shown in the example in FIG. 18. Depending on the EAS message size, EAC cells may occupy a few symbols, as shown in FIG. 18.

EAC cells follow immediately after the last cell of the PLS2, and mapping continues downward until the last cell index of the last FSS. If the total number of required EAC cells exceeds the number of remaining active carriers of the last FSS mapping proceeds to the next symbol and continues in exactly the same manner as FSS(s). The next symbol for mapping in this case is the normal data symbol, which has more active carriers than a FSS.

After EAC mapping is completed, the FIC is carried next, if any exists. If FIC is not transmitted (as signaled in the PLS2 field), DPs follow immediately after the last cell of the EAC.

Figure 19:
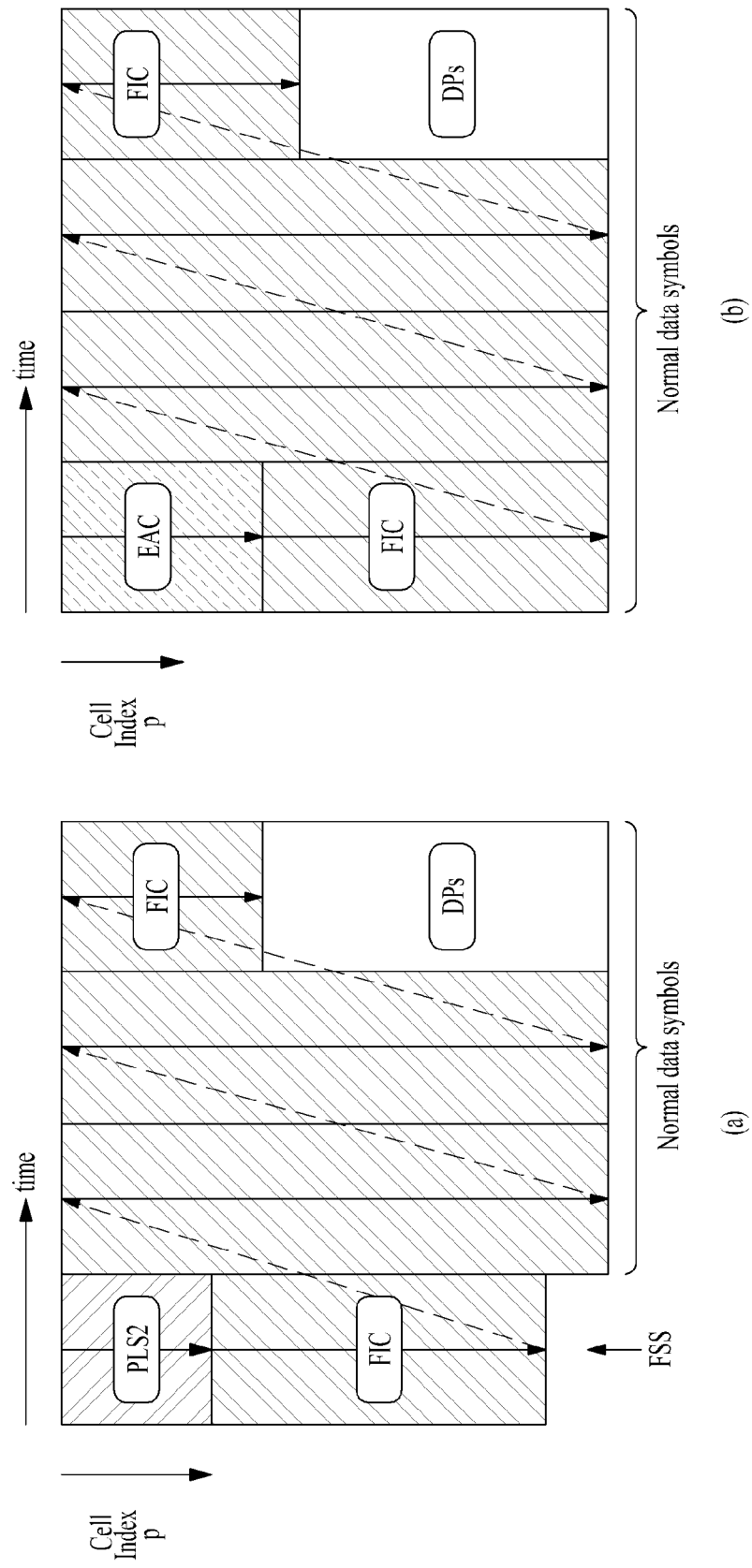
FIG. 19 illustrates FIC mapping according to an embodiment of the present invention.

FIG. 19 illustrates FIC mapping according to an embodiment of the present invention.

(a) shows an example mapping of FIC cell without EAC and (b) shows an example mapping of FIC cell with EAC.

FIC is a dedicated channel for carrying cross-layer information to enable fast service acquisition and channel scanning. This information primarily includes channel binding information between DPs and the services of each broadcaster. For fast scan, a receiver can decode FIC and obtain information such as broadcaster ID, number of services, and BASE_DP_ID. For fast service acquisition, in addition to FIC, base DP can be decoded using BASE_DP_ID. Other than the content it carries, a base DP is encoded and mapped to a frame in exactly the same way as a normal DP. Therefore, no additional description is required for a base DP. The FIC data is generated and consumed in the Management Layer. The content of FIC data is as described in the Management Layer specification.

The FIC data is optional and the use of FIC is signaled by the FIC_FLAG parameter in the static part of the PLS2. If FIC is used, FIC_FLAG is set to '1' and the signaling field for FIC is defined in the static part of PLS2. Signaled in this field are FIC_VERSION, and FIC_LENGTH_BYTE. FIC uses the same modulation, coding and time interleaving parameters as PLS2. FIC shares the same signaling parameters such as PLS2_MOD and PLS2_FEC. FIC data, if any, is mapped immediately after PLS2 or EAC if any. FIC is not preceded by any normal DPs, auxiliary streams or dummy cells. The method of mapping FIC cells is exactly the same as that of EAC which is again the same as PLS.

Without EAC after PLS, FIC cells are mapped from the next cell of the PLS2 in an increasing order of the cell index as shown in an example in (a). Depending on the FIC data size, FIC cells may be mapped over a few symbols, as shown in (b).

FIC cells follow immediately after the last cell of the PLS2, and mapping continues downward until the last cell index of the last FSS. If the total number of required FIC cells exceeds the number of remaining active carriers of the last FSS, mapping proceeds to the next symbol and continues in exactly the same manner as FSS(s). The next symbol for mapping in this case is the normal data symbol which has more active carriers than a FSS.

If EAS messages are transmitted in the current frame, EAC precedes FIC, and FIC cells are mapped from the next cell of the EAC in an increasing order of the cell index as shown in (b).

After FIC mapping is completed, one or more DPs are mapped, followed by auxiliary streams, if any, and dummy cells.

Figure 20:
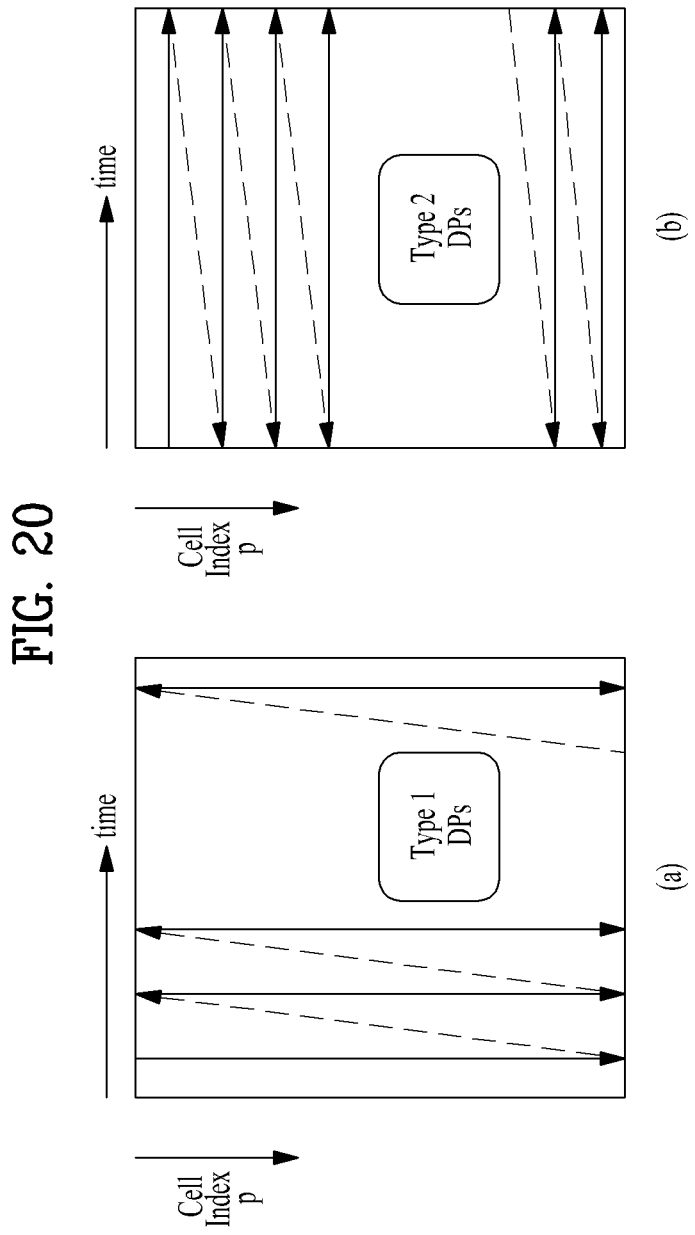
FIG. 20 illustrates a type of DP according to an embodiment of the present invention.

FIG. 20 illustrates a type of DP according to an embodiment of the present invention.

(a) shows type 1 DP and (b) shows type 2 DP.

After the preceding channels, i.e., PLS, EAC and FIC, are mapped, cells of the DPs are mapped. A DP is categorized into one of two types according to mapping method:

Type 1 DP: DP is mapped by TDM
Type 2 DP: DP is mapped by FDM

The type of DP is indicated by DP_TYPE field in the static part of PLS2. FIG. 20 illustrates the mapping orders of Type 1 DPs and Type 2 DPs. Type 1 DPs are first mapped in the increasing order of cell index, and then after reaching the last cell index, the symbol index is increased by one. Within the next symbol, the DP continues to be mapped in the increasing order of cell index starting from p=0. With a number of DPs mapped together in one frame, each of the Type 1 DPs are grouped in time, similar to TDM multiplexing of DPs.

Type 2 DPs are first mapped in the increasing order of symbol index, and then after reaching the last OFDM symbol of the frame, the cell index increases by one and the symbol index rolls back to the first available symbol and then increases from that symbol index. After mapping a number of DPs together in one frame, each of the Type 2 DPs are grouped in frequency together, similar to FDM multiplexing of DPs.

Type 1 DPs and Type 2 DPs can coexist in a frame if needed with one restriction; Type 1 DPs always precede Type 2 DPs. The total number of OFDM cells carrying Type 1 and Type 2 DPs cannot exceed the total number of OFDM cells available for transmission of DPs:

$$D_{DP1}+D_{DP2} \leq D_{DP} \qquad \text{[Expression 2]}$$

where $D_{DP1}$ is the number of OFDM cells occupied by Type 1 DPs, $D_{DP2}$ is the number of cells occupied by Type 2 DPs. Since PLS, EAC, FIC are all mapped in the same way as Type 1 DP, they all follow "Type 1 mapping rule". Hence, overall, Type 1 mapping always precedes Type 2 mapping.

Figure 21:
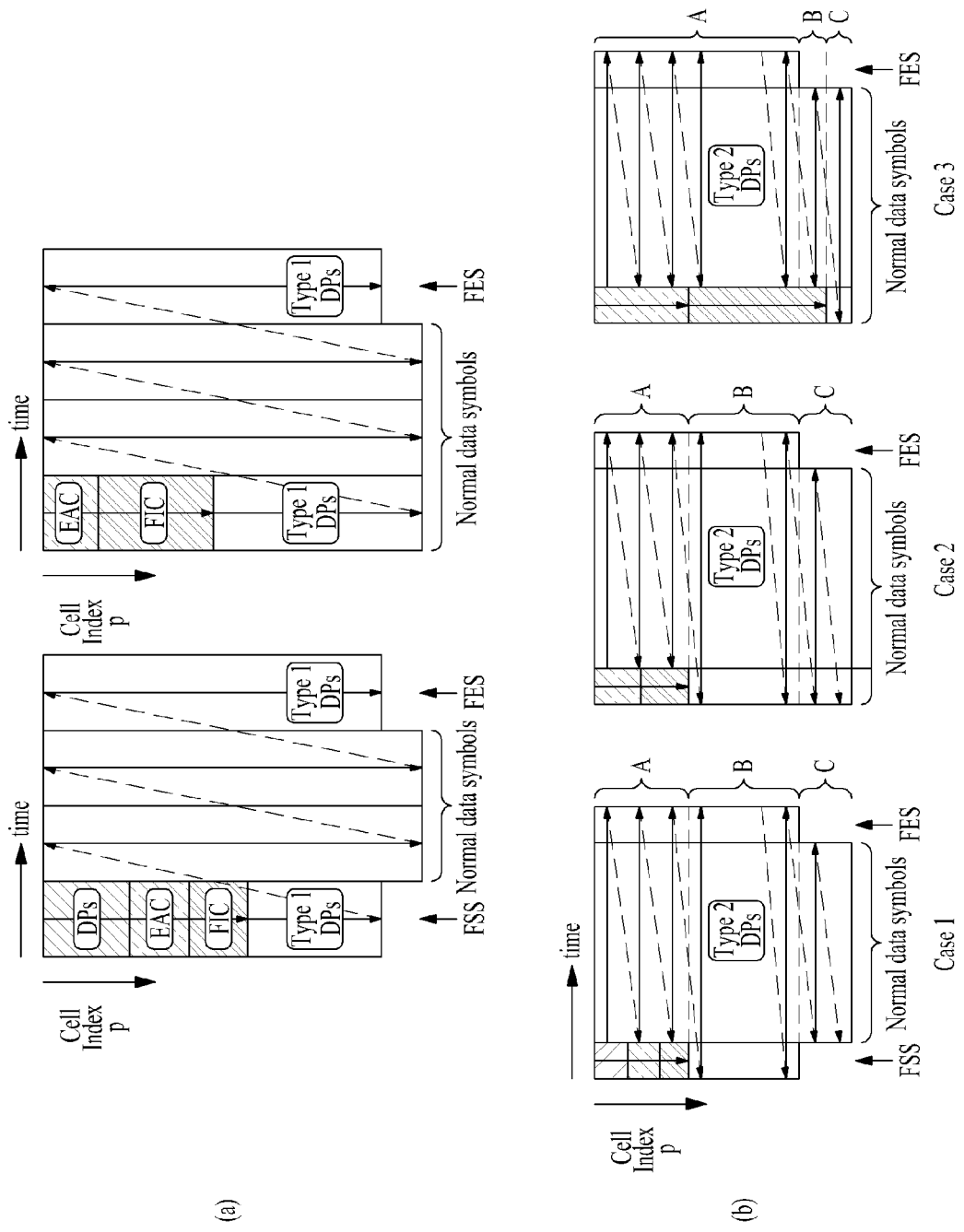
FIG. 21 illustrates DP mapping according to an embodiment of the present invention.

FIG. 21 illustrates DP mapping according to an embodiment of the present invention.

(a) shows an addressing of OFDM cells for mapping type 1 DPs and (b) shows an an addressing of OFDM cells for mapping for type 2 DPs.

Addressing of OFDM cells for mapping Type 1 DPs (0, . . . , $D_{DP1}$−1) is defined for the active data cells of Type 1 DPs. The addressing scheme defines the order in which the cells from the TIs for each of the Type 1 DPs are allocated to the active data cells. It is also used to signal the locations of the DPs in the dynamic part of the PLS2.

Without EAC and FIC, address 0 refers to the cell immediately following the last cell carrying PLS in the last FSS. If EAC is transmitted and FIC is not in the corresponding frame, address 0 refers to the cell immediately following the last cell carrying EAC. If FIC is transmitted in the corresponding frame, address 0 refers to the cell immediately following the last cell carrying FIC. Address 0 for Type 1 DPs can be calculated considering two different cases as shown in (a). In the example in (a), PLS, EAC and FIC are assumed to be all transmitted. Extension to the cases where either or both of EAC and FIC are omitted is straightforward. If there are remaining cells in the FSS after mapping all the cells up to FIC as shown on the left side of (a).

Addressing of OFDM cells for mapping Type 2 DPs $(0, \ldots, D_{DP2}-1)$ is defined for the active data cells of Type 2 DPs. The addressing scheme defines the order in which the cells from the TIs for each of the Type 2 DPs are allocated to the active data cells. It is also used to signal the locations of the DPs in the dynamic part of the PLS2.

Three slightly different cases are possible as shown in (b). For the first case shown on the left side of (b), cells in the last FSS are available for Type 2 DP mapping. For the second case shown in the middle, FIC occupies cells of a normal symbol, but the number of FIC cells on that symbol is not larger than $C_{FSS}$. The third case, shown on the right side in (b), is the same as the second case except that the number of FIC cells mapped on that symbol exceeds $C_{FSS}$.

The extension to the case where Type 1 DP(s) precede Type 2 DP(s) is straightforward since PLS, EAC and FIC follow the same "Type 1 mapping rule" as the Type 1 DP(s).

A data pipe unit (DPU) is a basic unit for allocating data cells to a DP in a frame.

A DPU is defined as a signaling unit for locating DPs in a frame. A Cell Mapper 7010 may map the cells produced by the TIs for each of the DPs. A Time interleaver 5050 outputs a series of TI-blocks and each TI-block comprises a variable number of XFECBLOCKs which is in turn composed of a set of cells. The number of cells in an XFECBLOCK, $N_{cells}$, is dependent on the FECBLOCK size, $N_{ldpc}$, and the number of transmitted bits per constellation symbol. A DPU is defined as the greatest common divisor of all possible values of the number of cells in a XFECBLOCK, $N_{cells}$, supported in a given PHY profile. The length of a DPU in cells is defined as $L_{DPU}$. Since each PHY profile supports different combinations of FECBLOCK size and a different number of bits per constellation symbol, $L_{DPU}$ is defined on a PHY profile basis.

Figure 22:
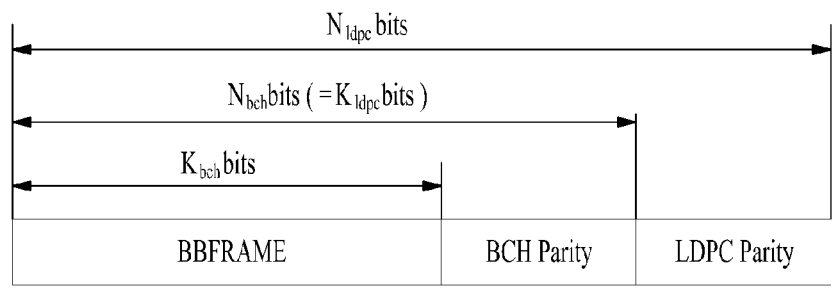
FIG. 22 illustrates an FEC structure according to an embodiment of the present invention.

FIG. 22 illustrates an FEC structure according to an embodiment of the present invention.

FIG. 22 illustrates an FEC structure according to an embodiment of the present invention before bit interleaving. As above mentioned, Data FEC encoder may perform the FEC encoding on the input BBF to generate FECBLOCK procedure using outer coding (BCH), and inner coding (LDPC). The illustrated FEC structure corresponds to the FECBLOCK. Also, the FECBLOCK and the FEC structure have same value corresponding to a length of LDPC codeword.

The BCH encoding is applied to each BBF ($K_{bch}$ bits), and then LDPC encoding is applied to BCH-encoded BBF ($K_{ldpc}$ bits=$N_{bch}$ bits) as illustrated in FIG. 22.

The value of $N_{ldpc}$ is either 64800 bits (long FECBLOCK) or 16200 bits (short FECBLOCK).

The below table 28 and table 29 show FEC encoding parameters for a long FECBLOCK and a short FECBLOCK, respectively.

TABLE 28

| LDPC Rate | $N_{ldpc}$ | $K_{ldpc}$ | $K_{bch}$ | BCH error correction capability | $N_{bch}$-$K_{bch}$ |
|---|---|---|---|---|---|
| 5/15 | 64800 | 21600 | 21408 | 12 | 192 |
| 6/15 | | 25920 | 25728 | | |
| 7/15 | | 30240 | 30048 | | |
| 8/15 | | 34560 | 34368 | | |
| 9/15 | | 38880 | 38688 | | |
| 10/15 | | 43200 | 43008 | | |
| 11/15 | | 47520 | 47328 | | |
| 12/15 | | 51840 | 51648 | | |
| 13/15 | | 56160 | 55968 | | |

TABLE 29

| LDPC Rate | $N_{ldpc}$ | $K_{ldpc}$ | $K_{bch}$ | BCH error correction capability | $N_{bch}$-$K_{bch}$ |
|---|---|---|---|---|---|
| 5/15 | 16200 | 5400 | 5232 | 12 | 168 |
| 6/15 | | 6480 | 6312 | | |
| 7/15 | | 7560 | 7392 | | |
| 8/15 | | 8640 | 8472 | | |
| 9/15 | | 9720 | 9552 | | |
| 10/15 | | 10800 | 10632 | | |
| 11/15 | | 11880 | 11712 | | |
| 12/15 | | 12960 | 12792 | | |
| 13/15 | | 14040 | 13872 | | |

The details of operations of the BCH encoding and LDPC encoding are as follows:

A 12-error correcting BCH code is used for outer encoding of the BBF. The BCH generator polynomial for short FECBLOCK and long FECBLOCK are obtained by multiplying together all polynomials.

LDPC code is used to encode the output of the outer BCH encoding. To generate a completed $B_{ldpc}$ (FECBLOCK), $P_{ldpc}$ (parity bits) is encoded systematically from each $I_{ldpc}$ (BCH-encoded BBF), and appended to $I_{ldpc}$. The completed $B_{ldpc}$ (FECBLOCK) are expressed as follow Expression.

$$B_{ldpc} = [I_{ldpc} P_{ldpc}] = [i_0, i_1, \ldots, i_{K_{ldpc}-1}, P_0, P_1, \ldots, P_{N_{ldpc}-K_{ldpc}-1}] \quad \text{[Expression 3]}$$

The parameters for long FECBLOCK and short FECBLOCK are given in the above table 28 and 29, respectively.

The detailed procedure to calculate $N_{ldpc}$-$K_{ldpc}$ parity bits for long FECBLOCK, is as follows:

1) Initialize the parity bits, $$P_0 = P_1 = P_2 = \ldots = P_{N_{ldpc}-K_{ldpc}-1} = 0 \quad \text{[Expression 4]}$$

2) Accumulate the first information bit -$i_0$, at parity bit addresses specified in the first row of an addresses of parity check matrix. The details of addresses of parity check matrix will be described later. For example, for rate 13/15:

$$P_{983} = P_{983} \oplus i_0 \quad P_{2815} = P_{2815} \oplus i_0$$

$$P_{4837} = P_{4837} \oplus i_0 \quad P_{4989} = P_{4989} \oplus i_0$$

$$P_{6138} = P_{6138} \oplus i_0 \quad P_{6458} = P_{6453} \oplus i_0$$

$$P_{6921} = P_{6921} \oplus i_0 \quad P_{6974} = P_{6974} \oplus i_0$$

$$P_{7572} = P_{7572} \oplus i_0 \quad P_{8260} = P_{8260} \oplus i_0$$

$$P_{8496} = P_{8496} \oplus i_0 \quad \text{[Expression 5]}$$

3) For the next 359 information bits, $i_s$, s=1, 2, ..., 359 accumulate $i_s$ at parity bit addresses using following Expression.

$$\{x+(s \bmod 360) \times Q_{ldpc}\} \bmod(N_{ldpc}-K_{ldpc}) \quad \text{[Expression 6]}$$

where x denotes the address of the parity bit accumulator corresponding to the first bit $i_0$, and $Q_{ldpc}$ is a code rate dependent constant specified in the addresses of parity check matrix. Continuing with the example, $Q_{ldpc}$=24 for rate 13/15, so for information bit $i_1$, the following operations are performed:

$$P_{1007}=P_{1007} \oplus i_1 \quad P_{2839}=P_{2839} \oplus i_1$$

$$P_{4861}=P_{4861} \oplus i_1 \quad P_{5013}=P_{5013} \oplus i_1$$

$$P_{6162}=P_{6162} \oplus i_1 \quad P_{6487}=P_{6482} \oplus i_1$$

$$P_{6945}=P_{6945} \oplus i_1 \quad P_{6998}=P_{6998} \oplus i_1$$

$$P_{7596}=P_{7596} \oplus i_1 \quad P_{8784}=P_{8284} \oplus i_1$$

$$P_{8520}=P_{8520} \oplus i_1 \quad \text{[Expression 7]}$$

4) For the 361st information bit $i_{360}$, the addresses of the parity bit accumulators are given in the second row of the addresses of parity check matrix. In a similar manner the addresses of the parity bit accumulators for the following 359 information bits $i_s$, s=361, 362, ..., 719 are obtained using the Expression 6, where x denotes the address of the parity bit accumulator corresponding to the information bit $i_{360}$, i.e., the entries in the second row of the addresses of parity check matrix.

5) In a similar manner, for every group of 360 new information bits, a new row from addresses of parity check matrixes used to find the addresses of the parity bit accumulators.

After all of the information bits are exhausted, the final parity bits are obtained as follows:

6) Sequentially perform the following operations starting with i=1

$$P_i=P_i \oplus P_{i-1}, i=1,2,\ldots,N_{ldpc}-K_{ldpc}-1 \quad \text{[Expression 8]}$$

where final content of $p_i$, i=0, 1, ... $N_{ldpc}-K_{ldpc}-1$ is equal to the parity bit $p_i$.

TABLE 30

| Code Rate | $Q_{idpc}$ |
|---|---|
| 5/15 | 120 |
| 6/15 | 108 |
| 7/15 | 96 |
| 8/15 | 84 |
| 9/15 | 72 |
| 10/15 | 60 |
| 11/15 | 48 |
| 12/15 | 36 |
| 13/15 | 24 |

This LDPC encoding procedure for a short FECBLOCK is in accordance with t LDPC encoding procedure for the long FECBLOCK, except replacing the table 30 with table 31, and replacing the addresses of parity check matrix for the long FECBLOCK with the addresses of parity check matrix for the short FECBLOCK.

TABLE 31

| Code Rate | $Q_{idpc}$ |
|---|---|
| 5/15 | 30 |
| 6/15 | 27 |
| 7/15 | 24 |
| 8/15 | 21 |
| 9/15 | 18 |
| 10/15 | 15 |
| 11/15 | 12 |
| 12/15 | 9 |
| 13/15 | 6 |

Figure 23:
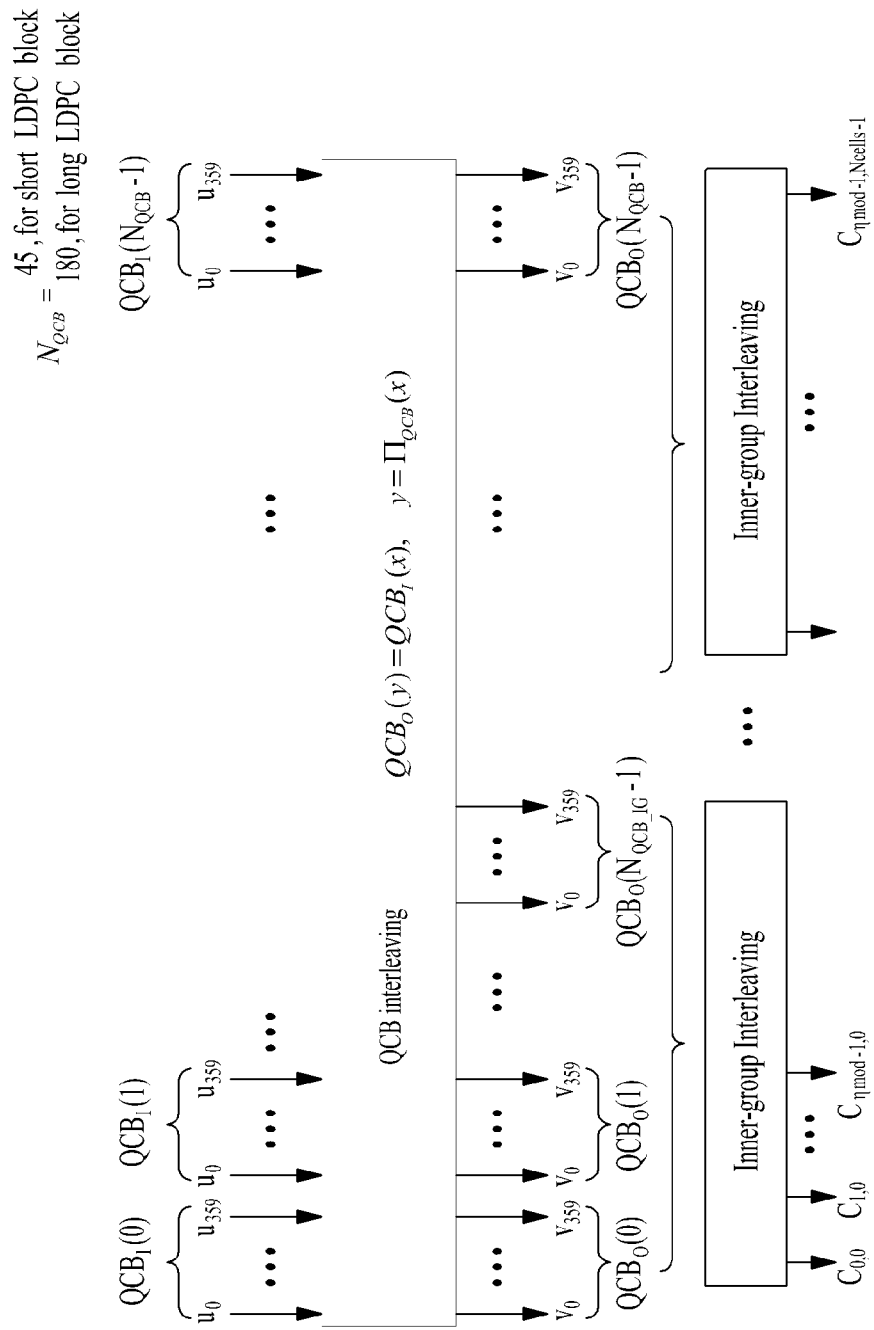
FIG. 23 illustrates a bit interleaving according to an embodiment of the present invention.

FIG. 23 illustrates a bit interleaving according to an embodiment of the present invention.

The outputs of the LDPC encoder are bit-interleaved, which consists of parity interleaving followed by Quasi-Cyclic Block (QCB) interleaving and inner-group interleaving.

(a) shows Quasi-Cyclic Block (QCB) interleaving and (b) shows inner-group interleaving.

The FECBLOCK may be parity interleaved. At the output of the parity interleaving, the LDPC codeword consists of 180 adjacent QC blocks in a long FECBLOCK and 45 adjacent QC blocks in a short FECBLOCK. Each QC block in either a long or short FECBLOCK consists of 360 bits. The parity interleaved LDPC codeword is interleaved by QCB interleaving. The unit of QCB interleaving is a QC block. The QC blocks at the output of parity interleaving are permutated by QCB interleaving as illustrated in FIG. 23, where $N_{cells}$=64800/$\eta_{mod}$ or 16200/$\eta_{mod}$ according to the FECBLOCK length. The QCB interleaving pattern is unique to each combination of modulation type and LDPC code rate.

After QCB interleaving, inner-group interleaving is performed according to modulation type and order ($\eta_{mod}$) which is defined in the below table 32. The number of QC blocks for one inner-group, $N_{QCB\_IG}$, is also defined.

TABLE 32

| Modulation type | $\eta_{mod}$ | $N_{QCB\_IG}$ |
|---|---|---|
| QAM-16 | 4 | 2 |
| NUC-16 | 4 | 4 |
| NUQ-64 | 6 | 3 |
| NUC-64 | 6 | 6 |
| NUQ-256 | 8 | 4 |
| NUC-256 | 8 | 8 |
| NUQ-1024 | 10 | 5 |
| NUC-1024 | 10 | 10 |

The inner-group interleaving process is performed with $N_{QCB\_IG}$ QC blocks of the QCB interleaving output. Inner-group interleaving has a process of writing and reading the bits of the inner-group using 360 columns and $N_{QCB\_IG}$ rows. In the write operation, the bits from the QCB interleaving output are written row-wise. The read operation is performed column-wise to read out m bits from each row, where m is equal to 1 for NUC and 2 for NUQ.

Figure 24:
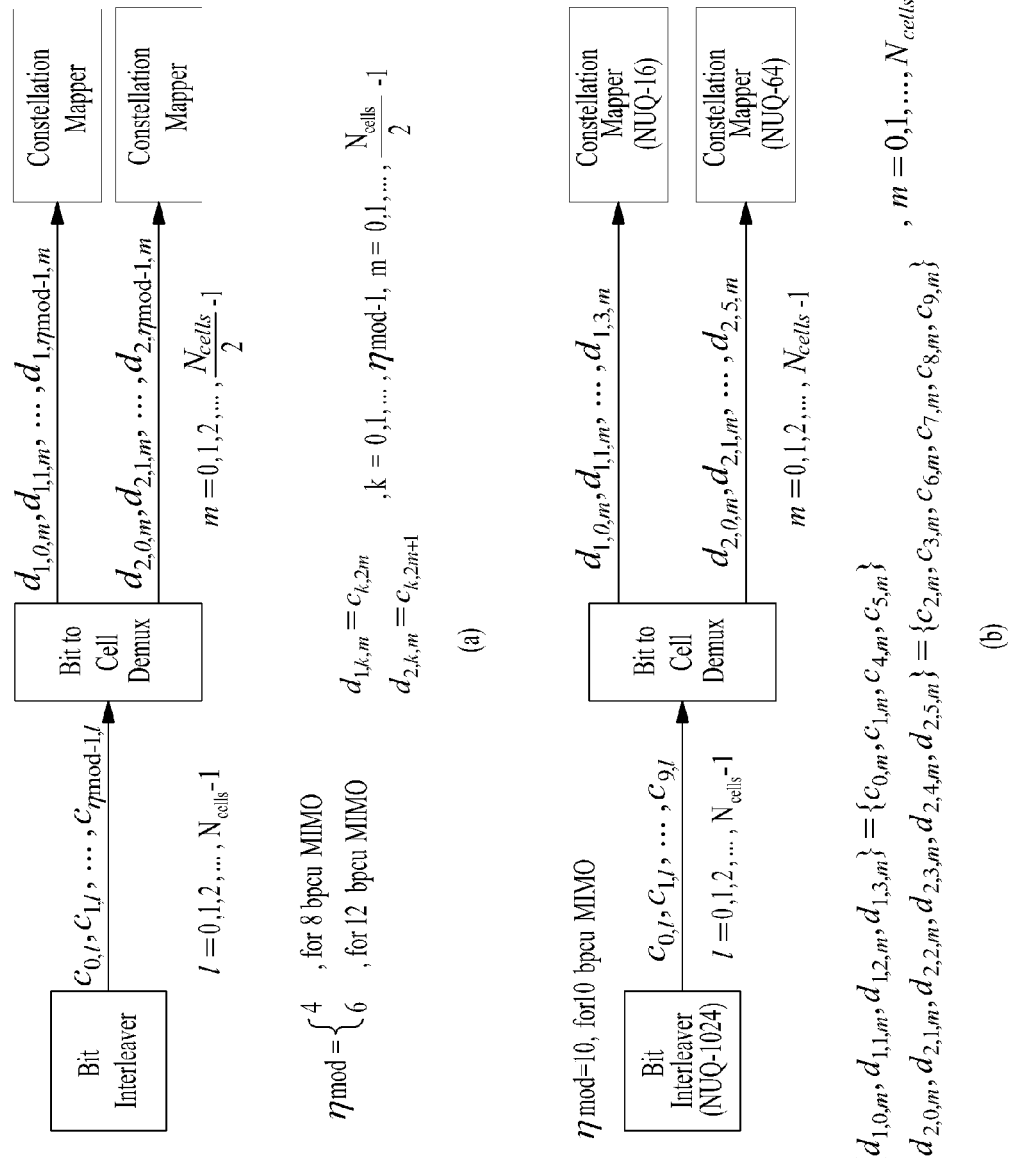
FIG. 24 illustrates a cell-word demultiplexing according to an embodiment of the present invention.

FIG. 24 illustrates a cell-word demultiplexing according to an embodiment of the present invention.

(a) shows a cell-word demultiplexing for 8 and 12 bpcu MIMO and (b) shows a cell-word demultiplexing for 10 bpcu MIMO.

Each cell word $(c_{0,l}, c_{1,l} \ldots, c_{\eta_{mod}-1,l})$ of the bit interleaving output is demultiplexed into $(d_{1,0,m}, d_{1,1,m} \ldots, d_{1,\eta_{mod}-1,m})$ and $(d_{2,0,m}, d_{2,1,m} \ldots, d_{2,\eta_{mod}-1,m})$ as shown in (a), which describes the cell-word demultiplexing process for one XFECBLOCK.

For the 10 bpcu MIMO case using different types of NUQ for MIMO encoding, the Bit Interleaver for NUQ-1024 is re-used. Each cell word $(c_{0,l}, c_{1,l}, \ldots, c_{9,l})$ of the Bit Interleaver output is demultiplexed into $(d_{1,0,m}, d_{1,1,m} \ldots, d_{1,3,m})$ and $(d_{2,0,m}, d_{2,1,m} \ldots, d_{2,5,m})$, as shown in (b).

Figure 25:
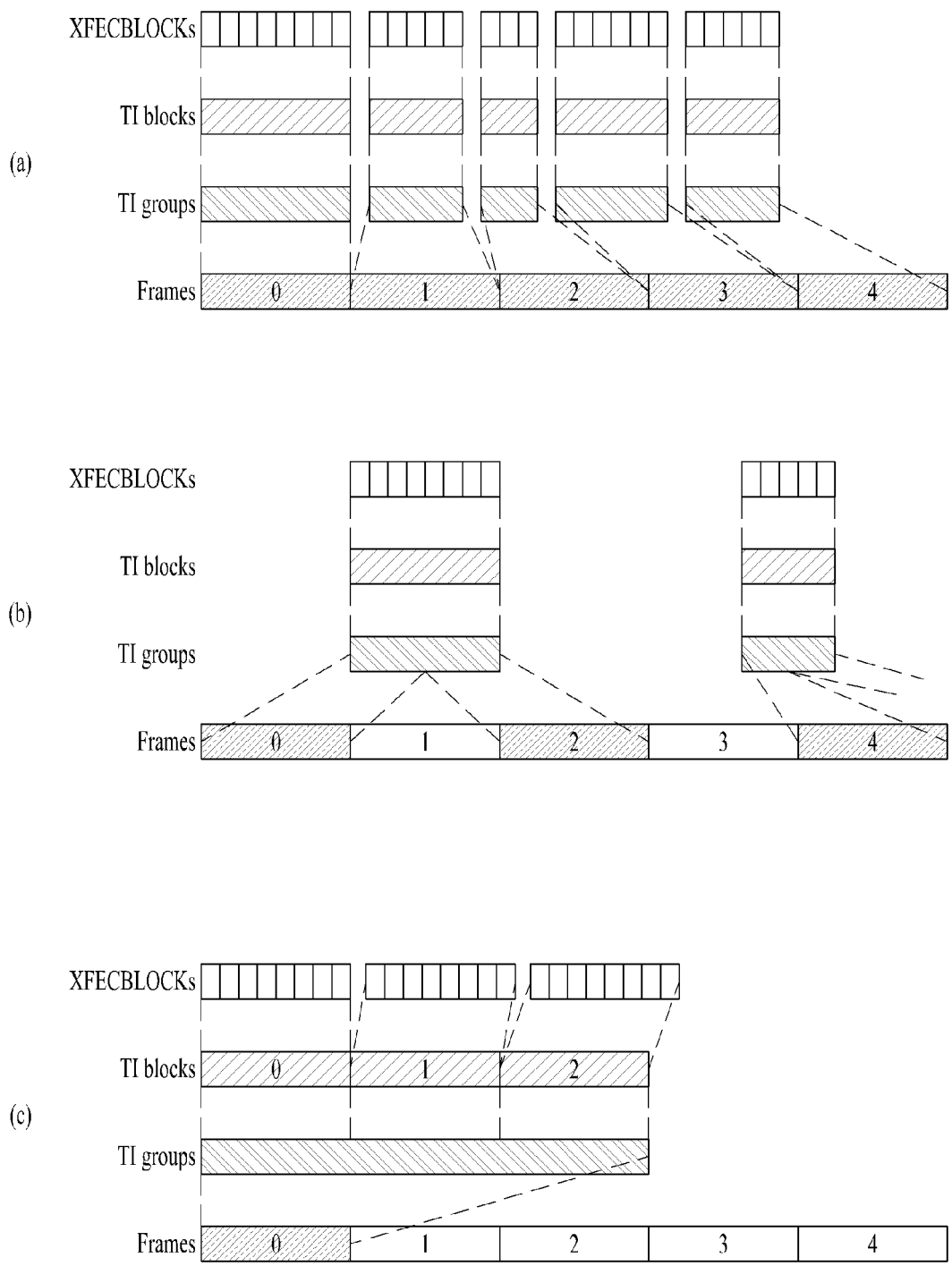
FIG. 25 illustrates a time interleaving according to an embodiment of the present invention.

FIG. 25 illustrates a time interleaving according to an embodiment of the present invention.

(a) to (c) show examples of TI mode.

The time interleaver operates at the DP level. The parameters of time interleaving (TI) may be set differently for each DP.

The following parameters, which appear in part of the PLS2-STAT data, configure the TI:

DP_TI_TYPE (allowed values: 0 or 1): Represents the TI mode; '0' indicates the mode with multiple TI blocks (more than one TI block) per TI group. In this case, one TI group is directly mapped to one frame (no inter-frame interleaving). '1' indicates the mode with only one TI block per TI group. In this case, the TI block may be spread over more than one frame (inter-frame interleaving).

DP_TI_LENGTH: If DP_TI_TYPE='0', this parameter is the number of TI blocks $N_{TI}$ per TI group. For DP_TI_TYPE='1', this parameter is the number of frames $P_I$ spread from one TI group.

DP_NUM_BLOCK_MAX (allowed values: 0 to 1023): Represents the maximum number of XFECBLOCKs per TI group.

DP_FRAME_INTERVAL (allowed values: 1, 2, 4, 8): Represents the number of the frames $I_{JUMP}$ between two successive frames carrying the same DP of a given PHY profile.

DP_TI_BYPASS (allowed values: 0 or 1): If time interleaving is not used for a DP, this parameter is set to '1'. It is set to '0' if time interleaving is used.

Additionally, the parameter DP_NUM_BLOCK from the PLS2-DYN data is used to represent the number of XFECBLOCKs carried by one TI group of the DP.

When time interleaving is not used for a DP, the following TI group, time interleaving operation, and TI mode are not considered. However, the Delay Compensation block for the dynamic configuration information from the scheduler will still be required. In each DP, the XFECBLOCKs received from the SSD/MIMO encoding are grouped into TI groups. That is, each TI group is a set of an integer number of XFECBLOCKs and will contain a dynamically variable number of XFECBLOCKs. The number of XFECBLOCKs in the TI group of index n is denoted by $N_{xBLOCK\_Group}(n)$ and is signaled as DP_NUM_BLOCK in the PLS2-DYN data. Note that $N_{xBLOCK\_Group}(n)$ may vary from the minimum value of 0 to the maximum value $N_{xBLOCK\_Group\_MAX}$ (corresponding to DP_NUM_BLOCK_MAX) of which the largest value is 1023.

Each TI group is either mapped directly onto one frame or spread over $P_I$ frames. Each TI group is also divided into more than one TI blocks ($N_{TI}$), where each TI block corresponds to one usage of time interleaver memory. The TI blocks within the TI group may contain slightly different numbers of XFECBLOCKs. If the TI group is divided into multiple TI blocks, it is directly mapped to only one frame. There are three options for time interleaving (except the extra option of skipping the time interleaving) as shown in the below table 33.

TABLE 33

| Modes | Descriptions |
|---|---|
| Option-1 | Each TI group contains one TI block and is mapped directly to one frame as shown in (a). This option is signaled in the PLS2-STAT by DP_TI_TYPE = '0' and DP_TI_LENGTH = '1' ($N_{TI}$ = 1). |
| Option-2 | Each TI group contains one TI block and is mapped to more than one frame. (b) shows an example, where one TI group is mapped to two frames, i.e., DP_TI_LENGTH = '2' ($P_I$ = 2) and DP_FRAME_INTERVAL ($I_{JUMP}$ = 2). This provides greater time diversity for low data-rate services. This option is signaled in the PLS2-STAT by DP_TI_TYPE = '1'. |
| Option-3 | Each TI group is divided into multiple TI blocks and is mapped directly to one frame as shown in (c). Each TI block may use full TI memory, so as to provide the maximum bit-rate for a DP. This option is signaled in the PLS2-STAT signaling by DP_TI_TYPE = '0' and DP_TI_LENGTH = $N_{TI}$, while $P_I$ = 1. |

In each DP, the TI memory stores the input XFECBLOCKs (output XFECBLOCKs from the SSD/MIMO encoding block). Assume that input XFECBLOCKs are defined as $$(d_{n,s,0,0}, d_{n,s,0,1}, \ldots, d_{n,s,0,N_{cells}-1}, d_{n,s,1,0}, \ldots, d_{n,s,1,N_{cells}-1}, \ldots,$$
$$d_{n,s,N_{xBLOCK\_TI}(n,s)-1,0}, \ldots, d_{n,s,N_{xBLOCK\_TI}(n,s)-1,N_{cells}-1}),$$

where $d_{n,s,r,q}$ is the qth cell of the rth XFECBLOCK in the sth TI block of the nth TI group and represents the outputs of SSD and MIMO encodings as follows $$d_{n,s,r,q} = \begin{cases} f_{n,s,r,q}, & \text{the output of } SSD \ldots \text{encoding} \\ g_{n,s,r,q}, & \text{the output of } MIMO \text{ encoding} \end{cases}$$

In addition, assume that output XFECBLOCKs from the time interleaver are defined as $$(h_{n,s,0}, h_{n,s,1}, \ldots, h_{n,s,i}, \ldots, h_{n,s,N_{xBLOCK\_TI}(n,s) \times N_{cells}-1}),$$

where $h_{n,s,i}$ is the ith output cell (for i=0, ..., $N_{xBLOCK\_TI}$ (n,s)×$N_{cells}$-1) in the sth TI block of the nth TI group.

Typically, the time interleaver will also act as a buffer for DP data prior to the process of frame building. This is achieved by means of two memory banks for each DP. The first TI-block is written to the first bank. The second TI-block is written to the second bank while the first bank is being read from and so on.

The TI is a twisted row-column block interleaver. For the sth TI block of the nth TI group, the number of rows $N_r$ of a TI memory is equal to the number of cells $N_{cells}$, i.e., $N_r=N_{cells}$ while the number of columns $N_c$ is equal to the number $N_{xBLOCK\_TI}(n,s)$.

Figure 26:
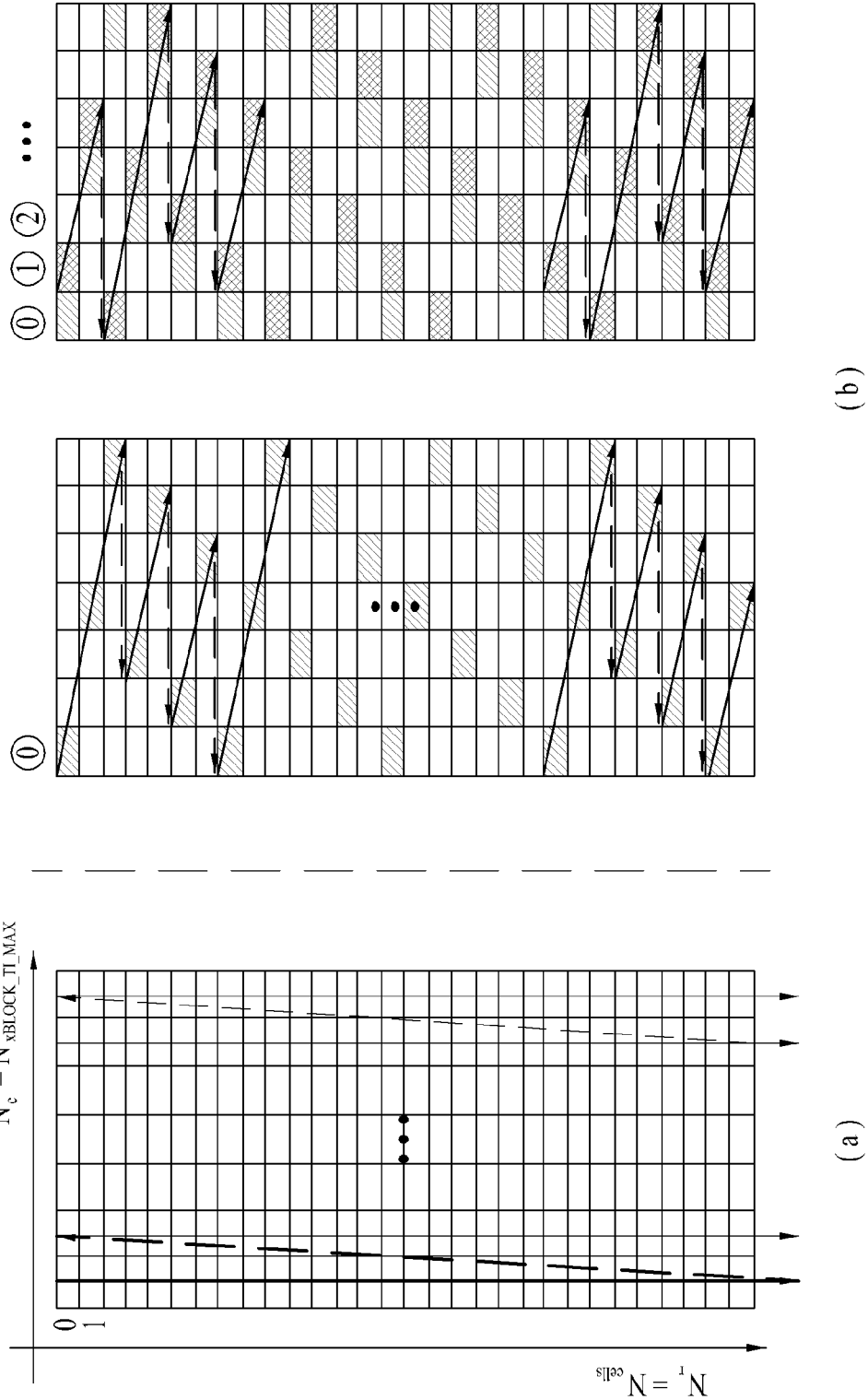
FIG. 26 illustrates the basic operation of a twisted row-column block interleaver according to an embodiment of the present invention.

FIG. 26 illustrates the basic operation of a twisted row-column block interleaver according to an embodiment of the present invention.

shows a writing operation in the time interleaver and (b) shows a reading operation in the time interleaver The first XFECBLOCK is written column-wise into the first column of the TI memory, and the second XFECBLOCK is written into the next column, and so on as shown in (a). Then, in the interleaving array, cells are read out diagonal-wise. During diagonal-wise reading from the first row (rightwards along the row beginning with the left-most column) to the last row, $N_r$ cells are read out as shown in (b). In detail, assuming $z_{n,s,i}$ (i=0, . . . ,$N_rN_c$) as the TI memory cell position to be read sequentially, the reading process in such an interleaving array is performed by calculating the row index $R_{n,s,i}$, the column index $C_{n,s,i}$, and the associated twisting parameter $T_{n,s,i}$ as follows expression.

[Expression 9]
$$\text{GENERATE}(R_{n,s,i}, C_{n,s,i}) =$$
$$\begin{cases} R_{n,s,i} = \mod(i, N_r), \ T_{n,s,i} = \mod(S_{shift} \times R_{n,s,i}, N_c), \\ C_{n,s,i} = \mod\left(T_{n,s,i} + \left\lfloor \frac{i}{N_r} \right\rfloor, N_c\right) \end{cases}$$

where $S_{shift}$ is a common shift value for the diagonal-wise reading process regardless of $N_{xBLOCK\_TI}(n,s)$, and it is determined by $N_{xBLOCK\_TI\_MAX}$ given in the PLS2-STAT as follows expression.

[Expression 10]
for
$$\begin{cases} N'_{xBLOCK\_TI\_MAX} = N_{xBLOCK\_TI\_MAX} + 1, & \text{if } N_{xBLOCK\_TI\_MAX} \bmod 2 = 0 \\ N'_{xBLOCK\_TI\_MAX} = N_{xBLOCK\_TI\_MAX}, & \text{if } N_{xBLOCK\_TI\_MAX} \bmod 2 = 1 \end{cases}$$

$$S_{shift} = \frac{N'_{xBLOCK\_TI\_MAX} - 1}{2}$$

As a result, the cell positions to be read are calculated by a coordinate as $z_{n,s,i} = N_r C_{n,s,i} + R_{n,s,i}$.

Figure 27:
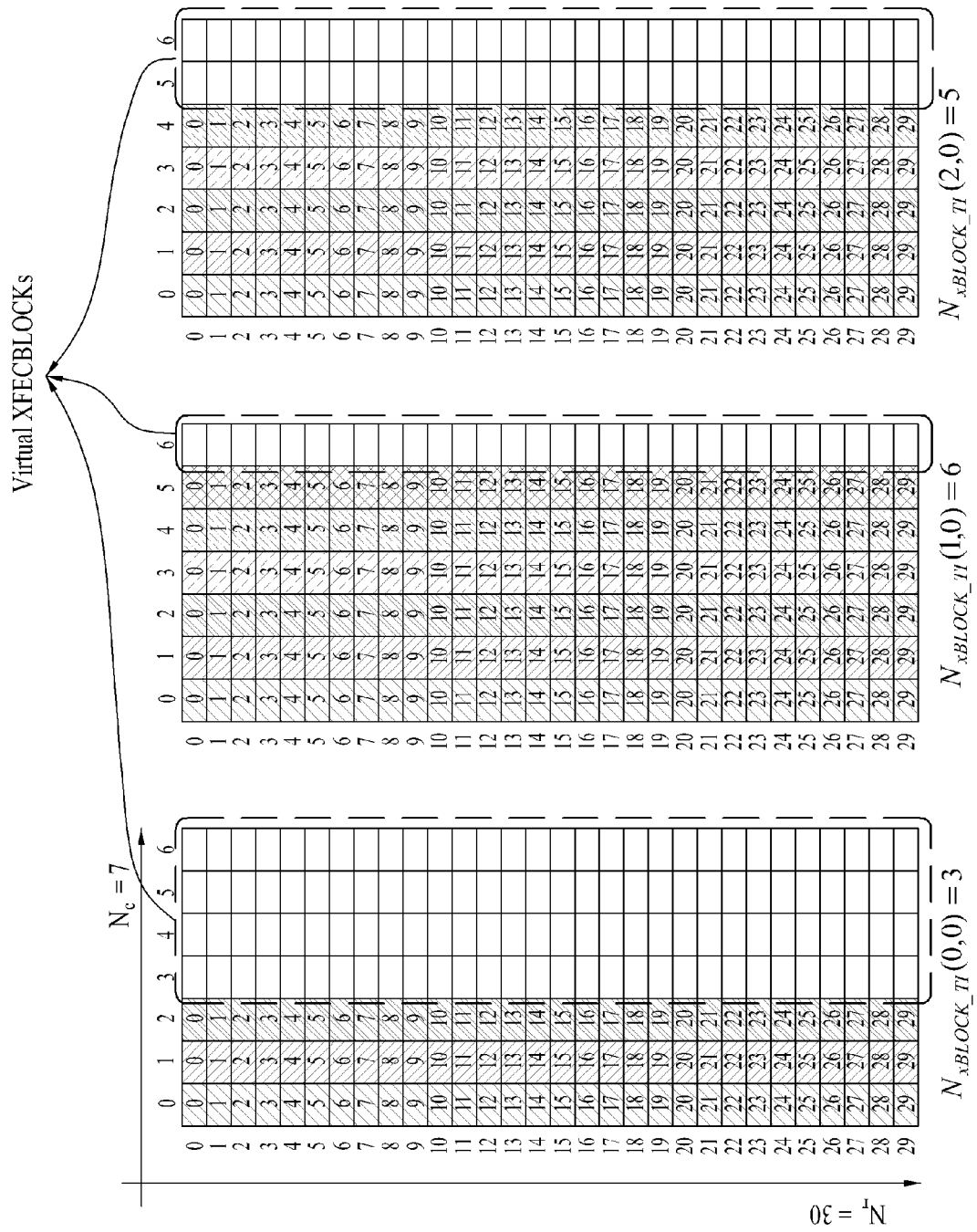
FIG. 27 illustrates an operation of a twisted row-column block interleaver according to another embodiment of the present invention.

FIG. 27 illustrates an operation of a twisted row-column block interleaver according to another embodiment of the present invention.

More specifically, FIG. 27 illustrates the interleaving array in the TI memory for each TI group, including virtual XFECBLOCKs when $N_{xBLOCK\_TI}(0,0)=3$, $N_{xBLOCK\_TI}(1,0)=6$, $N_{xBLOCK\_TI}(2,0)=5$.

The variable number $N_{xBLOCK\_TI}(n,s)=N_r$ will be less than or equal to $N'_{xBLOCK\_TI\_MAX}$. Thus, in order to achieve a single-memory deinterleaving at the receiver side, regardless of $N_{xBLOCK\_TI}(n,s)$ the interleaving array for use in a twisted row-column block interleaver is set to the size of $N_r \times N_c = N_{cells} \times N'_{xBLOCK\_TI\_MAX}$ by inserting the virtual XFECBLOCKs into the TI memory and the reading process is accomplished as follow expression.

[Expression 11]

p=0;

for i=0;i<$N_{cells}N'_{xBLOCK\_TI\_MAX}$;i=i+1

{GENERATE($R_{n,s,i}, C_{n,s,i}$);

$V_i = N_r C_{n,s,j} + R_{n,s,j}$ if $V_i < N_{cells} N_{xBLOCK\_TI}(n,s)$

{

$Z_{n,s,p} = V_i$; p=p+1;

}

}

The number of TI groups is set to 3. The option of time interleaver is signaled in the PLS2-STAT data by DP_TI_TYPE='0', DP_FRAME_INTERVAL='1', and DP_TI_LENGTH='1', i.e., $N_{TI}=1$, $I_{JUMP}=1$, and $P_I=1$. The number of XFECBLOCKs, each of which has $N_{cells}=30$ cells, per TI group is signaled in the PLS2-DYN data by $N_{xBLOCK\_TI}(0,0)=3$, $N_{xBLOCK\_TI}(1,0)=6$, and $N_{xBLOCK\_TI}(2,0)=5$, respectively. The maximum number of XFECBLOCK is signaled in the PLS2-STAT data by $N_{xBLOCK\_Group\_MAX}$, which leads to $\lfloor N_{xBLOCK\_Group\_MAX}/N_{TI} \rfloor = N_{xBLOCK\_TI\_MAX}=6$.

Figure 28:
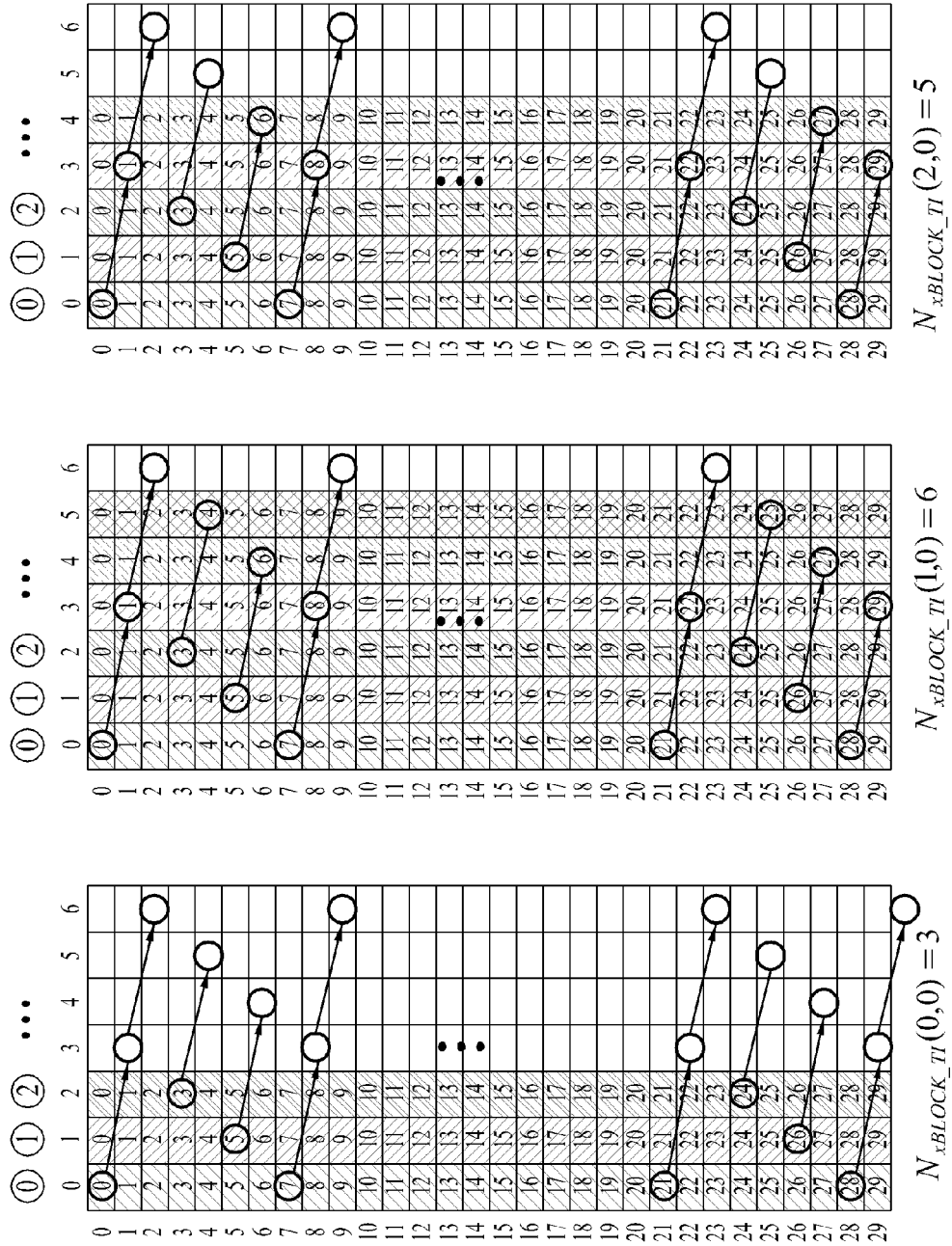
FIG. 28 illustrates a diagonal-wise reading pattern of a twisted row-column block interleaver according to an embodiment of the present invention.

FIG. 28 illustrates a diagonal-wise reading pattern of a twisted row-column block interleaver according to an embodiment of the present invention.

More specifically FIG. 28 shows a diagonal-wise reading pattern from each interleaving array with parameters of $N'_{xBLOCK\_TI\_MAX}$ and $S_{shift}=(7-1)/2=3$. Note that in the reading process shown as pseudocode above, if $V_i \geq N_{cells}N_{xBLOCK\_TI}(n,s)$, the value of $V_i$ is skipped and the next calculated value of $V_i$ is used.

Figure 29:
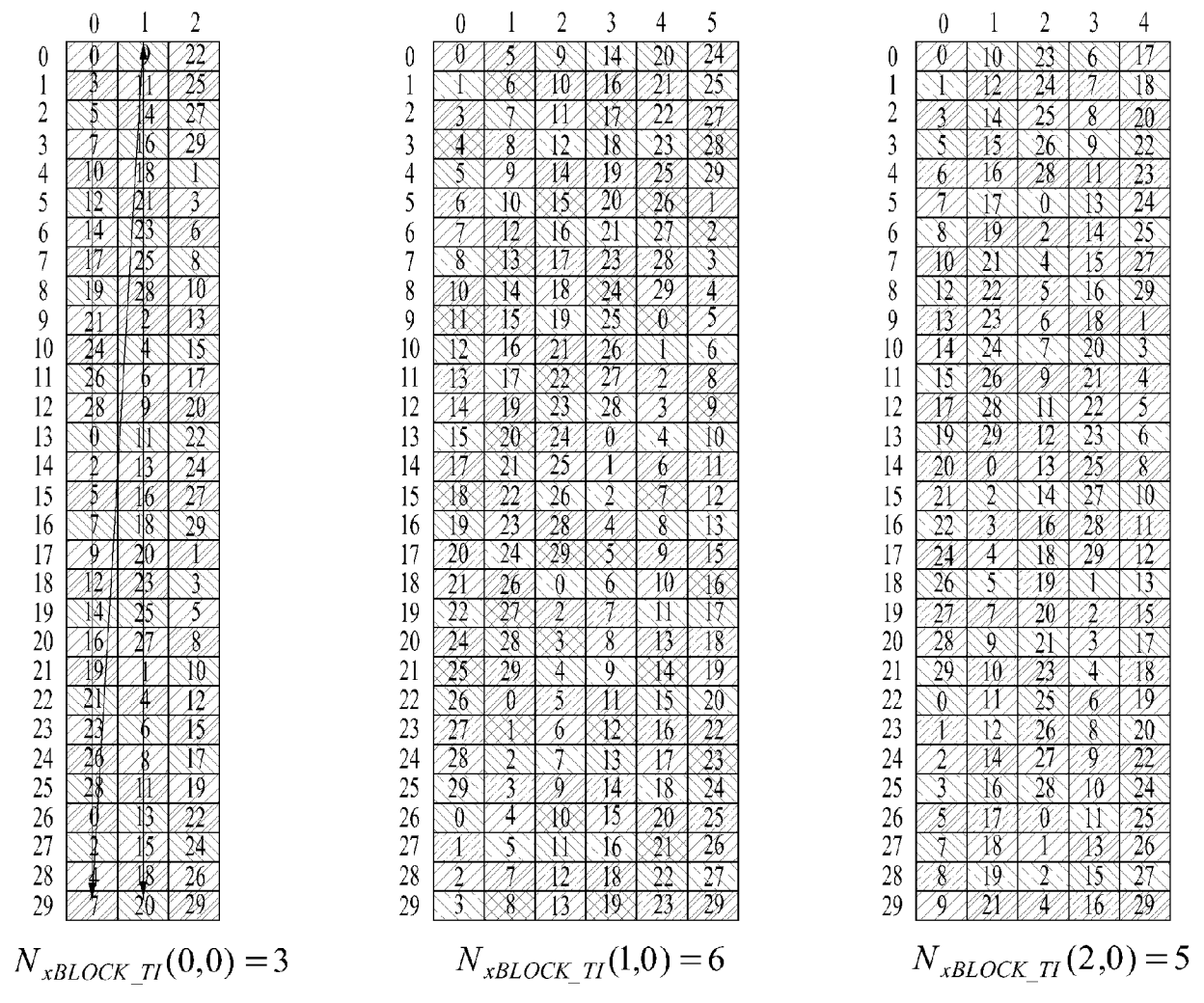

FIG. 29 illustrates interlaved XFECBLOCKs from each interleaving array according to an embodiment of the present invention.

FIG. 29 illustrates the interleaved XFECBLOCKs from each interleaving array with parameters of $N'_{xBLOCK\_TI\_MAX}=7$ and $S_{shift}=3$.

Figure 30:
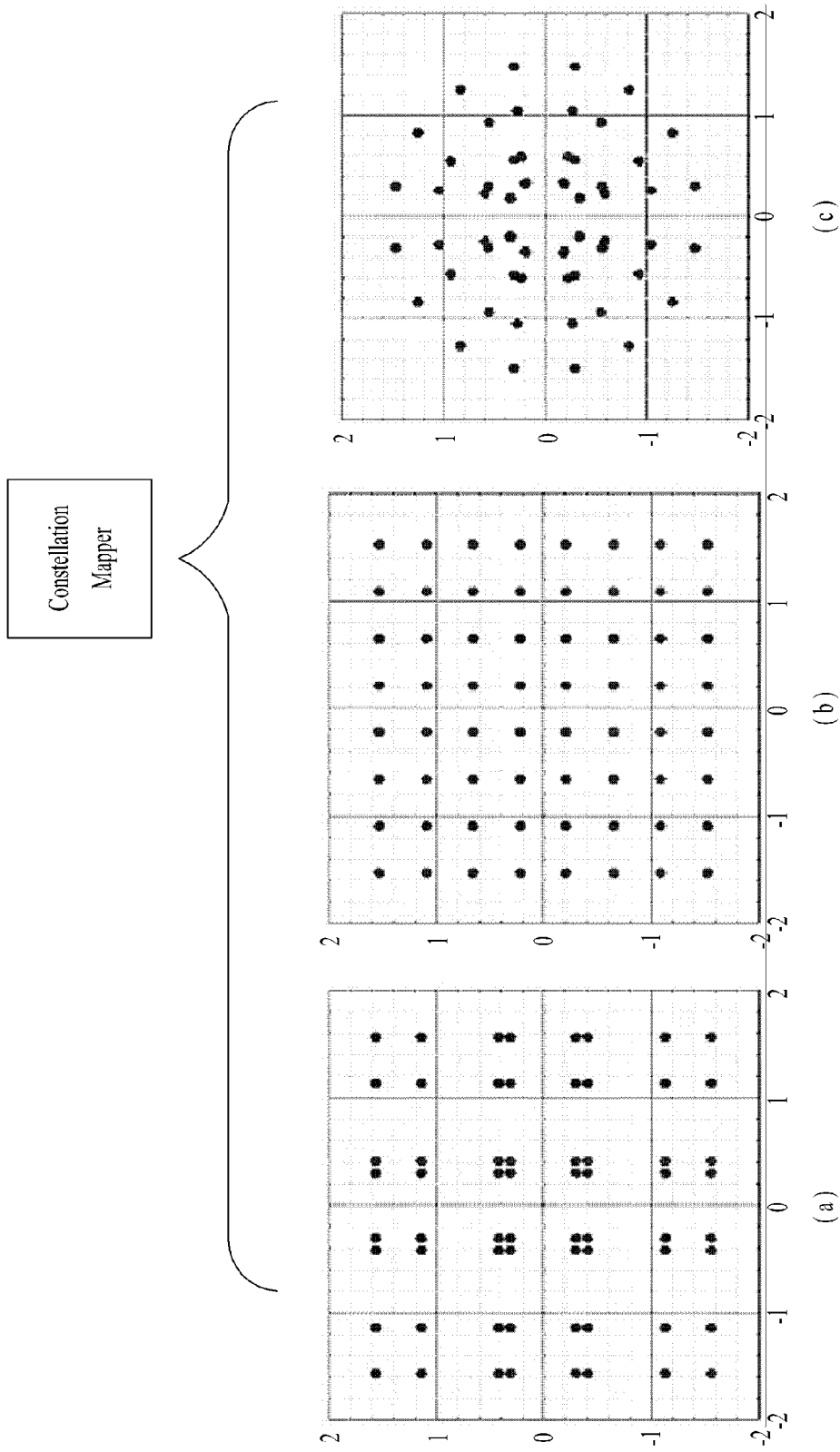
FIG. 30 illustrates a constellation mapper according to one embodiment of the present invention.

FIG. 30 illustrates a constellation mapper according to one embodiment of the present invention.

The constellation mapper according to one embodiment of the present invention performs the same operation as the constellation mapper of the BICM block described above.

The data received from the input formatting block described above may be transformed into a bit stream through FEC encoding. In the bit stream, multiple bits constitute a cell, and the cells may be mapped to one of the constellations in the complex plane by the constellation mapper. Herein, for N bits to be transmitted in one cell, 2^N constellation points may be needed.

Herein, a constellation point may represent one constellation. The constellation point may be referred to as a constellation. 64-QAM, which is a set of constellations, may be called a constellation set, a constellation, and the like.

A constellation may be created using various methods. Depending on the method used to arrange constellation points in a constellation, the probability of errors occurring when the receiver decodes the constellation into a bit stream may vary.

Types of constellations that the constellation mapper uses are as shown in FIGS. 30(a), 30(b) and 30(c). The constellations shown in the figures are exemplary constellations of the respective types. Constellations of FIGS. 30(a) and 30(b) are all square QAMs. In the case of FIG. 30(a), distances between constellation points are non-uniform. In the case of FIG. 30(b), distances between constellation points are uniform. The constellation of FIG. 30(a) may correspond to a non-uniform QAM, and the constellation of FIG. 30(b) may correspond to a normal QAM. The constellation of FIG. 30(b) may be a special case of FIG. 30(a).

The present invention proposes constellations as shown in FIG. 30(c) and a method for finding such constellations. According to the proposed method of the present invention, a lower probability of error, i.e., a higher channel capacity, may be obtained at a given signal-to-noise ratio (SNR) than when the conventional method is used. Hereinafter, the present invention will be described in detail.

Figure 31:
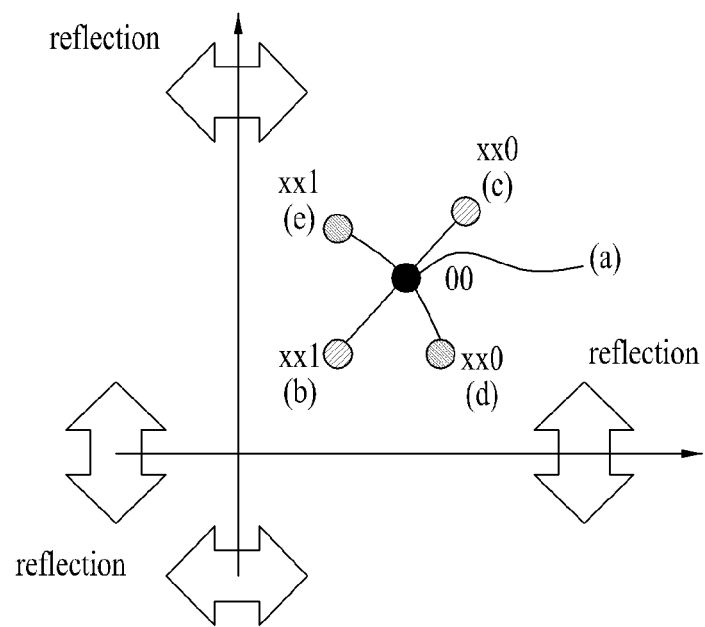
FIG. 31 illustrates a method for configuring an optimum constellation according to one embodiment of the present invention.

FIG. 31 illustrates a method for configuring an optimum constellation according to one embodiment of the present invention.

The present invention proposes a method of configuring an optimum constellation based on Amplitude and Phase-Shift Keying (APSK). To obtain a shaping gain, a constellation of a round shape needs to be configured. Accordingly, a modified APSK type constellation, i.e., non-uniform APSK, may be utilized. With the non-uniform APSK, the distance/angle between constellation points arranged on concentric circles may not be uniform. Herein, the non-uniform APSK may be referred to as a non-uniform constellation (NUC).

To find positions of optimum constellation points, constellation-splitting and bit-allocation methods are proposed in the present invention.

Constellation splitting refers to creating constellations by dividing constellation points. Starting with QPSK, each constellation point may be split into two to create 8 constellation points. In a similar manner, 16, 32, 64, ... constellation points may be created. Bit allocation refers to allocating 1 bit to each constellation every time the number of constellation points doubles in each step.

Now, radius-angle splitting will be described below.

FIG. 31(a) shows one constellation point of QPSK. The labeling of this constellation point is 00. The constellation point of FIG. 31(a) may be split in the radial direction to create two constellation points of FIGS. 31(b) and 31(c). In addition, the constellation point of FIG. 31(a) may be split in the angular direction to create two constellation points of FIGS. 31(d) and 31(e).

Thereafter, the third bit may be allocated to each constellation. As shown in the figures, the respective constellation points may be assigned bits in the form of xx0 or xx1. Herein, xx may denote the labeling of a constellation point before the constellation point is split, in which case the bits may be allocated as 000 or 001.

Similarly, splitting and bit allocation may also be implemented in the other quadrants of the complex plane as in the case of the first quadrant. Before being split, the constellation points of FIG. 31(a) are symmetrical about the x-axis and the y-axis. Therefore, the positions and labels of the constellation points in the other quadrants may be estimated through reflection. In this case, GRAY labeling for the third bit allocated to the constellation points in the other quadrants may be maintained through reflection of the first quadrant.

Figure 32:
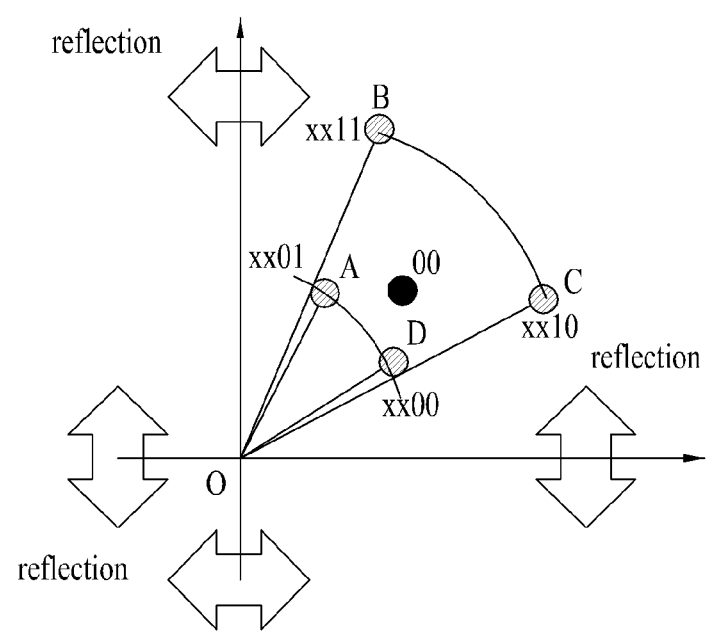
FIG. 32 illustrates a method for configuring an optimum constellation according to another embodiment of the present invention.

FIG. 32 illustrates a method for configuring an optimum constellation according to another embodiment of the present invention.

Hereinafter, joint radius-angle splitting will be described.

The two methods of splitting (radial splitting and angular splitting) can be applied at the same time. In this case, four constellations of A, B, C and D may be created. 2 bits may be allocated to each of the created constellations such that GRAY labeling is implemented. As shown in FIG. 32, two bits may be allocated to allow each constellation to maintain GRAY labeling in terms of radius and angle. Herein, GRAY labeling may refer to allocating bits such that the difference between bits of neighboring constellations is 1 bit.

A and D, and B and C need not be disposed at the same radial position. Similarly, A and B, and C and D need not be disposed at the same angular position. In the case of disposition at the same radial position or angular position, the number of parameters to be found later is reduced. Accordingly, the search time may be reduced, and the degree of freedom of the constellations may be correspondingly reduced as the constellations are disposed at the same radial position or angular position. That is, there may be a trade-off between the search time and the capacity (performance) of the constellations.

In this embodiment, a case in which the constellations have the same radius (OA=OD, OB=OC) may be considered to ensure short searching time. In addition, the size of a constellation, i.e. the number of constellation points, may be assumed to be $2^m$ (m: even integer). However, this is simply illustrative, and the embodiments of the present invention are not limited thereto.

Similarly, labeling of constellations in the second, third and fourth quadrants is determined through reflection. As reflection is implemented, GRAY labeling of each constellation may be maintained in terms of radius and angle.

Figure 33:
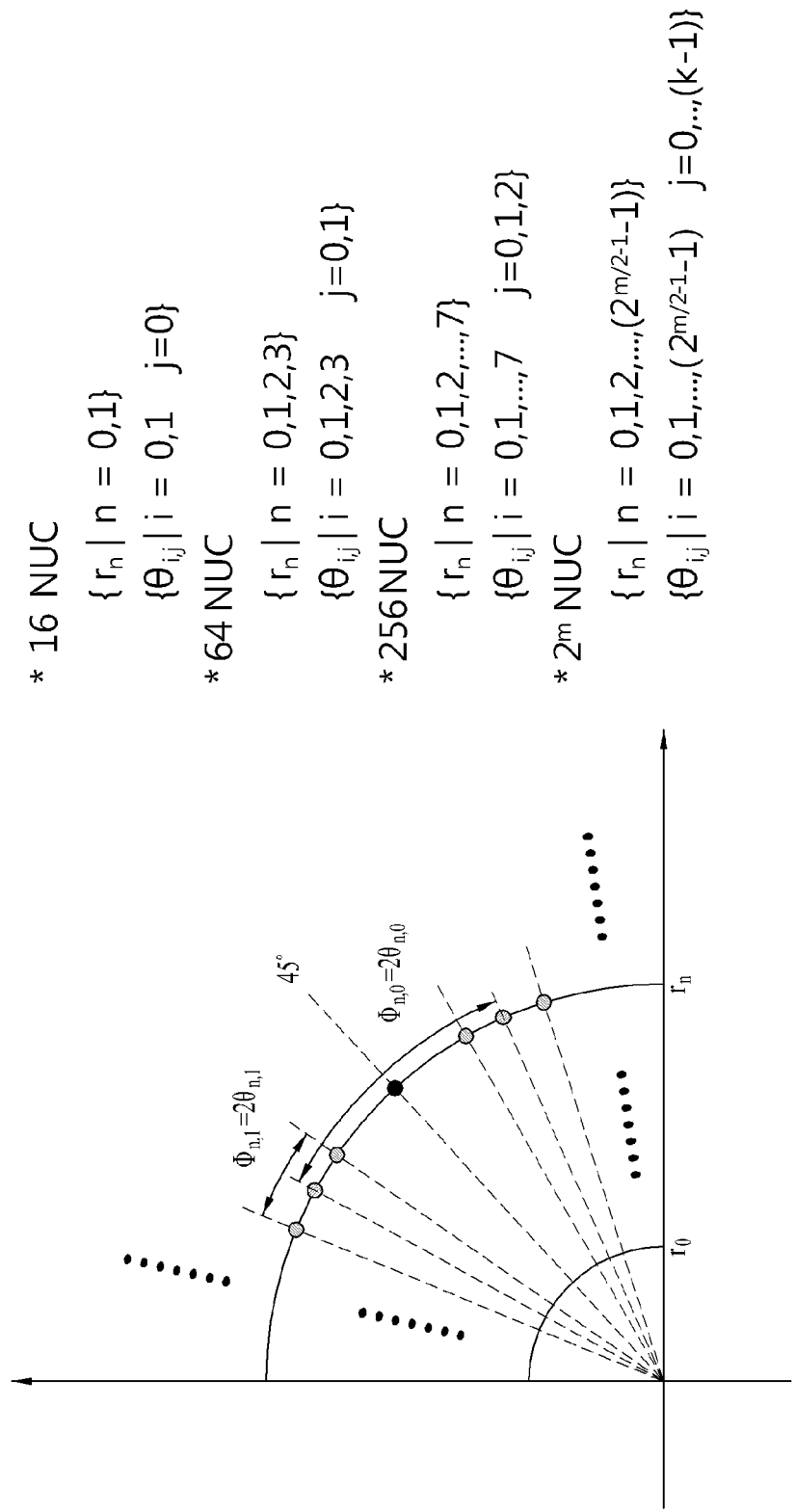
FIG. 33 illustrates creation of non-uniform constellations (NUCs) according to one embodiment of the present invention.

FIG. 33 illustrates creation of non-uniform constellations (NUCs) according to one embodiment of the present invention.

$2^m$ NUCs may be created using $2^{(m-2)}$ NUCs. That is, the joint radius-angle splitting method described above may be used. Accordingly, 16 NUCs may also be created using QPSK.

16 NUCs may have two rings. In each quadrant, two constellation points per quadrant may be present on each ring. Accordingly, all 16 constellations may be included in the 16 NUCs. Herein, the rings may represent concentric circles having the center thereof at the origin in the complex plane.

In the equation shown in FIG. 33, $r_n$ may denote the radius of each ring. Herein, n may denote the index of a ring and $\theta_{i,j}$ may represent an angle by which constellation splitting is performed at the same radius. Accordingly, the difference in angle between two constellations which are split along the same radius may be $2\theta_{i,j}$. Herein, i may denote the index of a ring, and j may denote a splitting index. As described above, the rings need not have the same distribution of constellations, and accordingly $\theta$ may have ring index i.

Accordingly, the coordinates of each constellation of 16 NUCs may be indicated by $r_0$, $r_1$, $\theta_{0,0}$, and $\theta_{1,0}$. Similarly, in the case of 64 NUCs, the index n may range from 0 to 3, the index i may range from 0 and 3, and the index j may range from 0 to 1. In the case of 256 NUCs, the index n may range from 0 to 7, the index i may range from 0 to 7, and the index j may range from 0 to 2. Each index has an integer value.

To generalize these cases, $2^m$ NUCs may have $2^{(m/2-1)}$ rings, and each ring may have k constellation points per quadrant. Herein, the value of k may be m/2−1.

When $r_n$ and $\theta_{i,j}$ that maximize the BICM capacity are found, a constellation having the highest capacity may be obtained. It may be assumed that $r_0$ is set to 1. After $r_n$ (n≠0) is found, it may not be necessary to separately determine $r_0$ since the average power can be assumed to be 1.

Figures 34, 35:
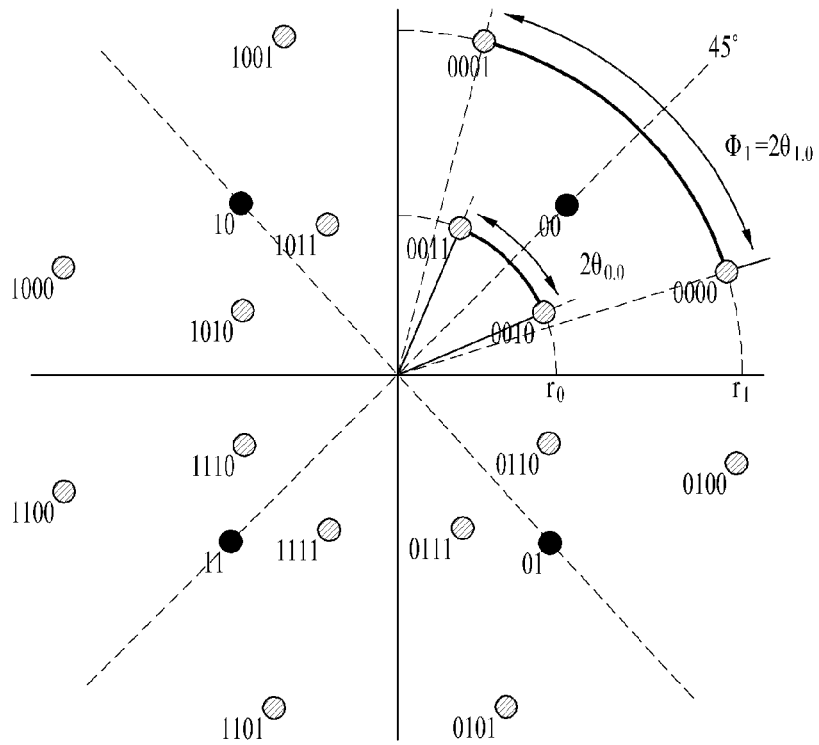
FIG. 34 shows an equation for bit allocation according to one embodiment of the present invention.
FIG. 35 illustrates created 16 NUCs and the bits allocated thereto according to one embodiment of the present invention.

FIG. 34 shows an equation for bit allocation according to one embodiment of the present invention.

Hereinafter, a method of bit allocation will be described. Bits may need to be allocated such that the bits conform to the GRAY rule in terms of radius and angle.

One constellation point of $2^m$ constellations may transmit m bits. m bits may be named $b_0 b_1 \ldots b_{m-1}$. In this case, 2 bits may be determined depending on the quadrant in which the corresponding constellation point is positioned. Half of the other m−2 bits may be determined by the ring index, and the other half may be determined by the angular position on the ring. For simplicity of description, it may be assumed in this embodiment that $b_0 b_1$ is determined by the quadrant, $b_2 b_4 \ldots b_{m-2}$ is determined by the ring index, and $b_3 b_5 \ldots b_{m-1}$ is determined by the angle.

The coordinates of each constellation may be determined by the LOC equation shown in FIG. 34. For the constellations determined in this way, the GRAY rule may be maintained between neighboring constellation points in terms of radius and angle.

Herein, the allocated bits may be exchanged with each other. This exchange may be performed with the GRAY rule maintained. In this case, even if the bits are exchanged, the overall BICM capacity may not change. A function for such exchange may be referred to as ConvGRAY For example, when ConvGRAY is applied to 2 bits (m=2), one-to-one exchange may be performed between {00, 01, 10, 11} and {00, 01, 11, 10}. Similarly, when ConvGRAY is applied to 3 bits (m=3), one-to-one exchange may be performed between {000, 001, 010, 011, 100, 101, 110, 111} and {000, 001, 011, 010, 110, 111, 101, 100}.

In the case of 3 bits, six values are obtained after exchange. These values are defined as values 1, 2, 3, . . . , 6 for description. The first bit of each of values 1, 2 and 3 is set to 0. The second and third bits of each of values 1, 2 and 3 are equal to the values obtained through exchange in the case of 2 bits. The first bit of values 4, 5 and 6 is set to 1. The second and third bits of each of values 4, 5 and 6 are reverse arrangement of the values obtained through exchange in the case of 2 bits.

When values obtained through exchange in the case of n−1 bits are found, the values obtained through exchange in the case of n bits can be estimated. When this method is applied to n bits, the equation shown in FIG. 34 may be obtained.

Inv_ConvGRAY may represent an inverse function of ConvGRAY. As described above, ConvGRAY function may determine $b_2 b_4 \ldots b_{m-2}$ using a ring index, or may determine $b_3 b_5 \ldots b_{m-1}$ based on an angle. The reverse function Inv_ConvGRAY may receive each bit value as an input and obtain a ring index and an angle. That is, the ring index may be determined using $b_2 b_4 \ldots b_{m-2}$, and the angles may be determined using $b_3 b_5 \ldots b_{m-1}$.

To measure the performance of the determined constellation, BICM capacities of the determined constellation may be calculated and compared. For the BICM capacities, Additive White Gaussian Noise (AWGN) and Individually Identical Distributed (IID) input may be assumed. AWGN may represent a basic noise model that is basically used. IID may represent that inputs are independently and equally/uniformly distributed.

$$BICMcap. = \sum_i \left( \int_Y p(b_i = 0, y) \log_2 \frac{p(b_i = 0, y)}{p(b_i = 0)p(y)} dy + \int_Y p(b_i = 1, y) \log_2 \frac{p(b_i = 1, y)}{p(b_i = 1)p(y)} dy \right)$$ [Equation 12]

$$p(b_i = j, y) = p(y \mid b_i = j) \cdot p(b_i = j)$$ [Equation 13]

$$= \sum_{M_i} p(y \mid x = M_j) \cdot \frac{1}{M}$$

$$= \sum_{M_i} \frac{1}{\pi\sigma^2} e^{\frac{-|y-M_j|^2}{\sigma^2}} \cdot \frac{1}{M}$$

$$\frac{p(b_i = j, y)}{p(b_i = j)p(y)} = \frac{p(y \mid b_i = j)}{p(y)}$$ [Equation 14]

$$= \frac{p(y \mid b_i = j)}{\sum_j p(b_i = j, y)}$$

-continued $$= \frac{\sum_{M_i} \frac{1}{\pi\sigma^2} e^{\frac{-|y-M_j|^3}{\sigma}} \cdot \frac{2}{M}}{\sum_j \sum_{M_i} \frac{1}{\pi\sigma^2} e^{\frac{-|y-M_j|^2}{\sigma^2}} \cdot \frac{1}{M}}$$

The BICM capacity may be calculated using the equation above. Using this equation, values of r and θ that maximize the BICM capacity may be found. Since the AWGN and IID inputs are assumed, it may be expected that y=x+n. Herein, n may denote AWGN. It may be assumed that $p(b_i=0)=p(b_i=1)=1/2$. That is, when x is a constellation, and M is a constellation size, it may be possible that $p(x=M_j)=1/M$. Herein, $M_j$ may be a constellation when $b_i = j$. As shown in FIG. 34, the BICM capacity function may be represented as an integral of a Gaussian function.

Specifically, methods which can be used to find parameters r and θ ma include algorithm A and algorithm B.

Hereinafter, algorithm A will be described.

First, $\Delta_r$ and $\Delta_\theta$ may be selected. Thereafter, BICM capacities may be calculated for all combinations of $r_i$, and $\theta_{i,j}$ from $r_i \in \{r_i\_init - \Delta_r, r_i\_init, r_i\_init + \Delta_r\}$ and $\theta_{i,j} \in \{\theta_{i,j}\_init - \Delta_\theta, \theta_{i,j}\_init, \theta_{i,j}\_init + \Delta_\theta\}$. Herein, initial values $r_i\_init$ and $\theta_{i,j}\_init$ may change to more optimum values for the algorithm.

For example, when the constellation size is 16, one r and two θ's are given, and therefore 3^(1+2) BICM capacities may be calculated. Since $r_0$ is assumed to be 1, there is one r.

After the calculated BICM capacities are compared, $r_i\_init$ and $\theta_{i,j}\_init$ may be updated according to a parameter combination having the highest BICM capacity. If the parameter combination having the highest BICM capacity is $\{r_i\_init, \theta_{i,j}\_init\}$, execution of the algorithm may be stopped. Otherwise, the parameter combination having the highest BICM capacity is taken as a new $\{r_i\_init, \theta_{i,j}\_init\}$ and the algorithm continues to be executed. As the algorithm is executed, the values of $\{r_i\_init, \theta_{i,j}\_init\}$ may continue to be updated.

Thereafter, the aforementioned algorithm may be executed by decreasing $\Delta_r$ and $\Delta_\theta$ by half (binary search). That is, BICM capacities may be calculated and compared using $\Delta_r$ and $\Delta_\theta$ decreased by half. Then, $\{r_i\_init, \theta_{i,j}\_init\}$ may be updated with a parameter combination having the highest capacity. In this example, BICM capacities may be calculated with $r_i$ satisfying $r_i \in \{r_i\_init - 2\Delta_r, r_i\_init - \Delta_r, r_i\_init, r_i\_init + \Delta_r, r_i\_init + 2\Delta_r\}$ and $\theta_{i,j}$ satisfying $\theta_{i,j} \in \{\theta_{i,j}\_init - 2\Delta_\theta, \theta_{i,j}\_init - \Delta_\theta, \theta_{i,j}\_init, \theta_{i,j}\_init + \Delta_\theta, \theta_{i,j}\_init + 2\Delta_\theta\}$.

Thereafter, execution of the algorithm may be stopped if the combination having the highest capacity is $\{r_i\_init, \theta_{i,j}\_init\}$, and otherwise, the algorithm may continue to be executed with the parameter combination having the capacity taken as a new $\{r_i\_init, \theta_{i,j}\_init\}$.

By repeating the algorithm in this way, $\Delta_r$ and $\Delta_\theta$ may be sufficiently reduced. When it is determined that the BICM capacities are saturated according to sufficient reduction of $\Delta_r$ and $\Delta_\theta$, execution of the algorithm may be stopped.

In the case of algorithm A described above, if the number of parameters to be found is large, it may take a lot of time for the capacities to be finally saturated. In the case in which the number of parameters is large, algorithm B, which is described below, may be used.

Algorithm B may be independently used. If necessary, however, algorithm B may be used based on the result obtained from algorithm A.

Hereafter, algorithm B will be described.

First, an initial constellation may be configured. For example, the initial constellation may be configured such that $r_n$=n+1 (n=0, 1, . . . ). θ may be determined such that constellation points are distributed uniformly in the range between 0 and 2π, namely determined by equally dividing 2π. The initial constellation may converge on an optimum constellation through this algorithm.

Indexes of two r parameters, i.e. $r_i$ and $r_j$, may be randomly and uniformly selected. For simplicity of illustration, it may be assumed that i≤j. Since the overall average power is invariable, it may be expected that $|r_i|^2 + |r_j|^2 = C$. Herein, C is a constant. Accordingly, the following condition may be established. $0 \le |r_i|^2 \le C/2$. Under this condition, all values of $r_i$, and $r_j$ may be checked for BICM capacities. In this case, the binary search described above may be used in checking. $r_i$, and $r_j$ may be updated with a parameter combination having the highest BICM capacity among the calculated BICM capacities.

Herein, binary search may refer to a scheme in which the algorithm continues to be executed by updating parameter a with (a+b)/2 when performance with parameter a is lower than performance with parameter b.

Similarly, a ring index i may be randomly and uniformly selected. Thereby, $\theta_{i,j}$, which determines a constellation point positioned on a ring corresponding to the ring index, may be optimized. This optimization process may also employ the binary search. Herein, j may have values as j=0, 1, . . . , and $\theta_{i,n} \le \theta_{i,m}$ may be assumed when n is less than or equal to m. Similarly, when $\theta_{i,n}$ is optimized using the binary search, optimum $\theta_{i,j}$ may be determined.

When it is determined that the BICM capacity has saturated, the algorithm may be stopped. Otherwise, the algorithm may be repeated by reselecting indexes i and j of parameters $r_i$, and $r_j$.

In the case of algorithm B, it may be important to randomly and uniformly select parameters. Otherwise, it may take a long time for the BICM capacity to be saturated, or the BICM capacity may converge on a local minima.

In the case in which algorithm A is executed first and then the result from algorithm A is used as an initial value for algorithm B, the time taken for the BICM capacity to be saturated may be significantly shortened.

FIG. 35 illustrates created 16 NUCs and the bits allocated thereto according to one embodiment of the present invention.

Each constellation point may be represented as 4 bits ($b_0 b_1 b_2 b_3$). $b_0 b_1$ may represent a label of QPSK prior to extension. $b_2$ may be a bit allocated when the point is split according to radius splitting. $b_3$ may be a bit allocated when the point is split according to angle splitting.

The bits other than the first two bits $b_0 b_1$ may be symmetric with respect to the X-axis and Y-axis. As described above, $b_0 b_1$ may determine the quadrant in which the constellation point is placed, and each bit may satisfy the GREY rule in terms of radius and angle.

The receiver may demap the bits from the constellation. This may be a process reverse to the process of mapping the bits to the constellations described above. LLR may be estimated through demapping. The estimated LLR may be used in the form of a soft input in FEC decoding. In demapping, the process of estimating LLR may be expressed in the following equation.

$$Pr(b_i = j) = \sum_{s_k \in \Lambda_j} Pr(s = s_k) \frac{\exp\left(\frac{|r - Hs_k|^2}{\sigma^2}\right)}{\sum_{m=0}^{M-1} \exp\left(\frac{|r - Hs_m|^2}{\sigma^2}\right)} = \sum_{s_k \in \Lambda_j} CPr(s = s_k) \exp\left(\frac{|r - Hs_k|^2}{\sigma^2}\right)$$ [Equation 15]

$$LLR(b_i) = \log\left(\frac{Pr(b_i = 1)}{Pr(b_i = 0)}\right)$$ [Equation 16]
$$= \log\left(\frac{\sum_{s_k \in \Lambda_1} Pr(s = s_k) \exp\left(\frac{-|r - Hs_k|^2}{\sigma^2}\right)}{\sum_{s_k \in \Lambda_0} Pr(s = s_k) \exp\left(\frac{-|r - Hs_k|^2}{\sigma^2}\right)}\right)$$
$$= \log\left(\frac{\sum_{s_k \in \Lambda_1} \exp\left(\frac{-|r - Hs_k|^2}{\sigma^2}\right)}{\sum_{s_k \in \Lambda_0} \exp\left(\frac{-|r - Hs_k|^2}{\sigma^2}\right)}\right)$$

$$LLR(b_i) \cong \frac{|r - Hs_0|^2}{\sigma^2} - \frac{|r - Hs_1|^2}{\sigma^2} = \frac{|H|^2 (2Re\{t * s_1\} - 2Re\{t * s_0\} + |s_0|^2 - |s_1|^2)}{\sigma^2}$$ [Equation 17]

Herein, C may be a constant, $\sigma^2$ may be a complex noise power, $\Lambda_j$ may denote a set of constellation points where the i-th bit is j. Herein, j may be 0 or 1. In addition, $Pr(s=s_k)$ may denote a priori probability. Here, it may be assumed that $b_i$ satisfies equi-probability bit by bit. If iterative decoding is used, the assumption that $b_i$ is equi-probable may not be valid, and a priori probability may need to change according to external information from FEC. In addition, when max-log LLR is assumed, it may be possible that t=r/H. s1 may be a constellation that is closest to t for which the i-th bit is 1, and s0 may be a constellation that is closest to t for which the i-th bit is 0.

FIG. 36 shows the parameters of 16 NUCs created according to one embodiment of the present invention.

The parameters may be determined using the method described above. Referring to FIG. 36, r and θ values providing an optimum capacity for each SNR (dB) are listed. The optimum BICM capacity values calculated for the corresponding parameters are also listed. In the cases where $r_0$ is not 1, the average power is normalized to 1.

FIG. 37 shows constellations for the respective SNRs based on the parameters of the 16 NUCs created according to one embodiment of the present invention.

In FIG. 37, the values of r and θ that provide optimum capacities for the respective SNRs as determined according to the method described above are indicated by constellations in the complex plane.

Figure 38:
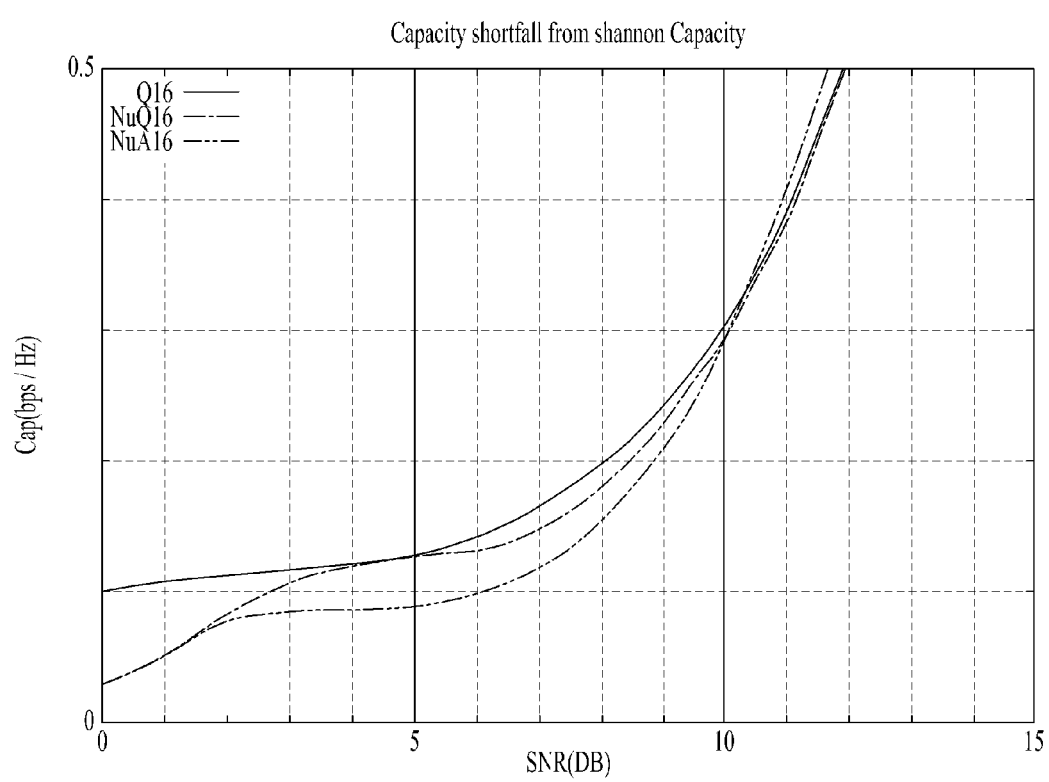
FIG. 38 shows graphs for comparing the BICM capacities of 16 NUCs created according to one embodiment of the present invention.

FIG. 38 shows graphs for comparing the BICM capacities of 16 NUCs created according to one embodiment of the present invention.

In FIG. 38, X-axis may represent SNR(dB), and Y-axis may represent BICM capacity.

The graphs may depict a difference (y value) between a Shannon capacity and the capacity of the constellation at a given SNR (x value). Herein, the Shannon capacity may indicate the greatest BICM capacity in BICM theory. Accordingly, this may mean performance improves as the y value decreases.

Q16 may represent uniform 16-QAM, NuQ16 may represent non-uniform 16-QAM, and NuA16 may represent NUC-16. As shown in FIG. 38, NUC-16 according to the present invention may exhibit the best performance.

FIG. 39 shows some of 64 NUCs created according to one embodiment of the present invention and bits allocated thereto.

FIG. 40 shows the others of 64 NUCs created according to one embodiment of the present invention and bits allocated thereto.

The tables shown in FIGS. 39 and 40 list values of r and θ, indicated by constellations in the complex plane, providing optimum capacities for the respective SNRs determined according to the method described above. Herein, in cases where $r_0$ is not 1, the average power is normalized to 1.

These two tables, which are separately shown in FIGS. 39 and 40 due to space constraints, constitute one table.

FIG. 41 shows constellations for the respective SNRs based on the parameters of the 64 NUCs created according to one embodiment of the present invention.

In FIG. 41, the values of r and θ that provide optimum capacities for the respective SNRs as determined according to the method described above are indicated by constellations in the complex plane.

Figure 42:
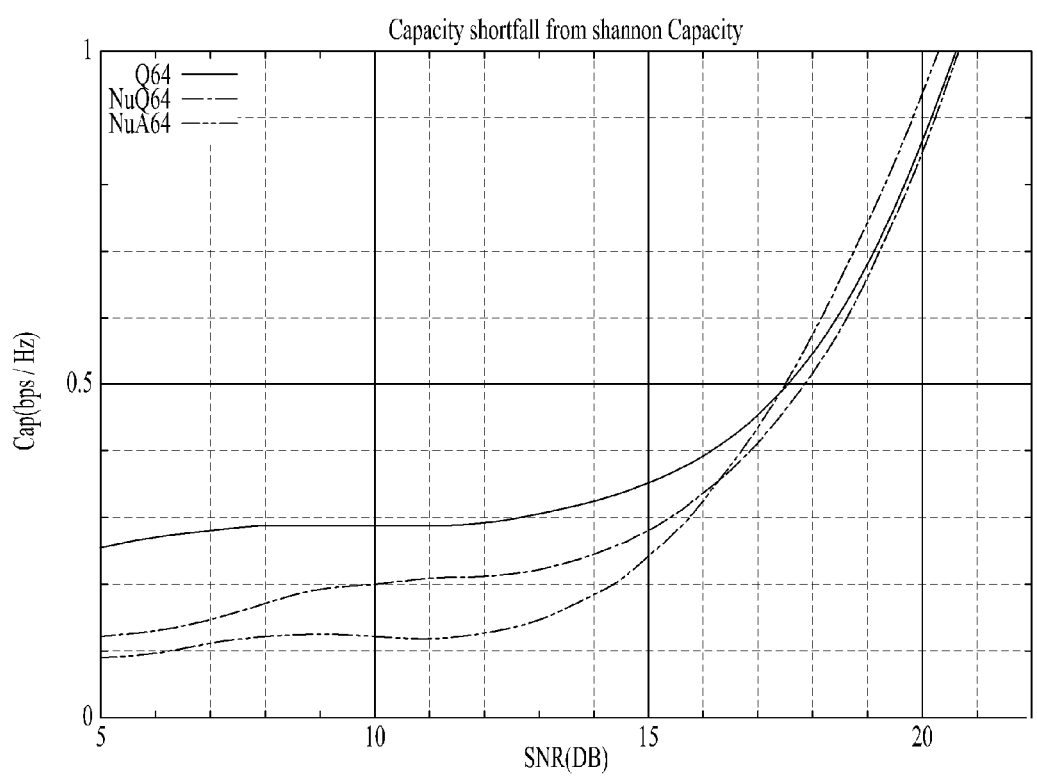
FIG. 42 shows graphs for comparing the BICM capacities of 64 NUCs created according to one embodiment of the present invention.

FIG. 42 shows graphs for comparing the BICM capacities of 64 NUCs created according to one embodiment of the present invention.

In FIG. 42, X-axis may represent SNR (dB), and the Y-axis may represent BICM capacity. The graphs may depict a difference (y value) between a Shannon capacity and the capacity of the constellation at a given SNR (x value). Herein, the Shannon capacity may indicate the greatest BICM capacity in BICM theory. Accordingly, this may mean that performance improves as the y value decreases.

Q64 may represent uniform 64-QAM, NuQ64 may represent non-uniform 64-QAM, and NuA64 may represent NUC-64. As shown in FIG. 42, NUC-64 according to the present invention may exhibit the best performance.

FIG. 43 shows some of 256 NUCs created according to one embodiment of the present invention and bits allocated thereto.

FIG. 44 shows others of 256 NUCs created according to one embodiment of the present invention and bits allocated thereto.

FIG. 45 shows others of 256 NUCs created according to one embodiment of the present invention and bits allocated thereto.

FIG. 46 shows the others of 256 NUCs created according to one embodiment of the present invention and bits allocated thereto.

The tables shown in FIGS. 43 to 46 list values of r and θ, indicated by constellations in the complex plane, providing the optimum capacities for the respective SNRs determined according to the method described above. Herein, in cases where $r_0$ is not 1, the average power is normalized to 1.

These four tables, which are separately shown in FIGS. 43 to 46 due to space constraints, constitute one table.

Figure 47:
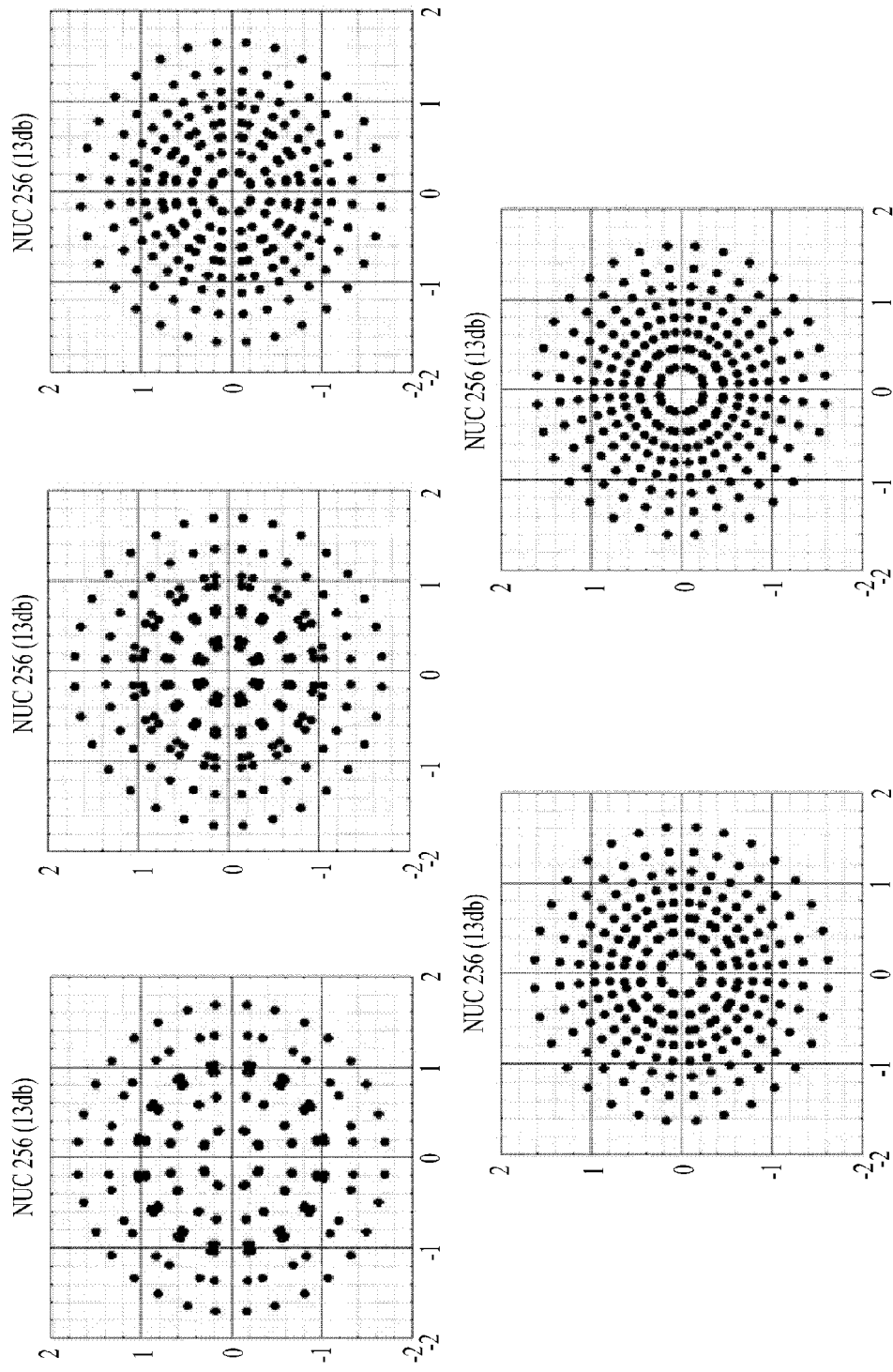
FIG. 47 shows constellations for the respective SNRs based on the parameters of the 256 NUCs created according to one embodiment of the present invention.

FIG. 47 shows constellations for the respective SNRs based on the parameters of the 256 NUCs created according to one embodiment of the present invention.

In FIG. 47, the values of r and θ that provide optimum capacities for the respective SNRs as determined according to the method described above are indicated by constellations in the complex plane.

Figure 48:
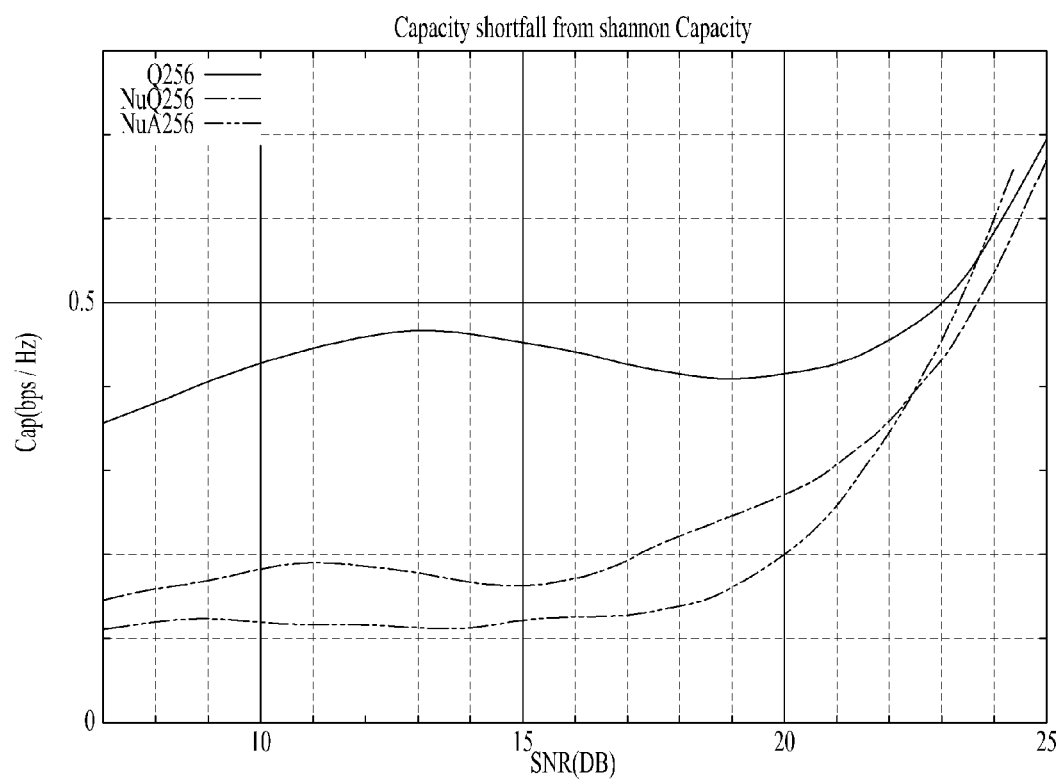
FIG. 48 shows graphs for comparing the BICM capacities of 256 NUCs created according to one embodiment of the present invention.

FIG. 48 shows graphs for comparing the BICM capacities of 256 NUCs created according to one embodiment of the present invention.

In FIG. 48, X-axis may represent SNR (dB), and Y-axis may represent BICM capacity. The graphs may depict a difference (y value) between a Shannon capacity and the capacity of the constellation at a given SNR (x value). Herein, the Shannon capacity may indicate the greatest BICM capacity in BICM theory. Accordingly, this may mean that performance improves as the y value decreases.

Q256 may represent uniform 256-QAM, NuQ256 may represent non-uniform 256-QAM, and NuA256 may represent NUC-256. As shown in FIG. 48, NUC-256 according to the present invention may exhibit the best performance.

FIG. 49 shows some of 1024 NUCs created according to one embodiment of the present invention and bits allocated thereto.

FIG. 50 shows others of 1024 NUCs created according to one embodiment of the present invention and bits allocated thereto.

FIG. 51 shows others of 1024 NUCs created according to one embodiment of the present invention and bits allocated thereto.

FIG. 52 shows others of 1024 NUCs created according to one embodiment of the present invention and bits allocated thereto.

FIG. 53 shows others of 1024 NUCs created according to one embodiment of the present invention and bits allocated thereto.

FIG. 54 shows others of 1024 NUCs created according to one embodiment of the present invention and bits allocated thereto.

FIG. 55 shows others of 1024 NUCs created according to one embodiment of the present invention and bits allocated thereto.

FIG. 56 shows others of 1024 NUCs created according to one embodiment of the present invention and bits allocated thereto.

FIG. 57 shows others of 1024 NUCs created according to one embodiment of the present invention and bits allocated thereto.

FIG. 58 shows the others of 1024 NUCs created according to one embodiment of the present invention and bits allocated thereto.

The tables shown in FIGS. 49 to 58 list values of r and θ, indicated by constellations in the complex plane, providing the optimum capacities for the respective SNRs determined according to the method described above. Herein, in cases where $r_0$ is not 1, the average power is normalized to 1.

These ten tables, which are separately shown in FIGS. 43 to 46 due to space constraints, constitute one table.

Figure 59:
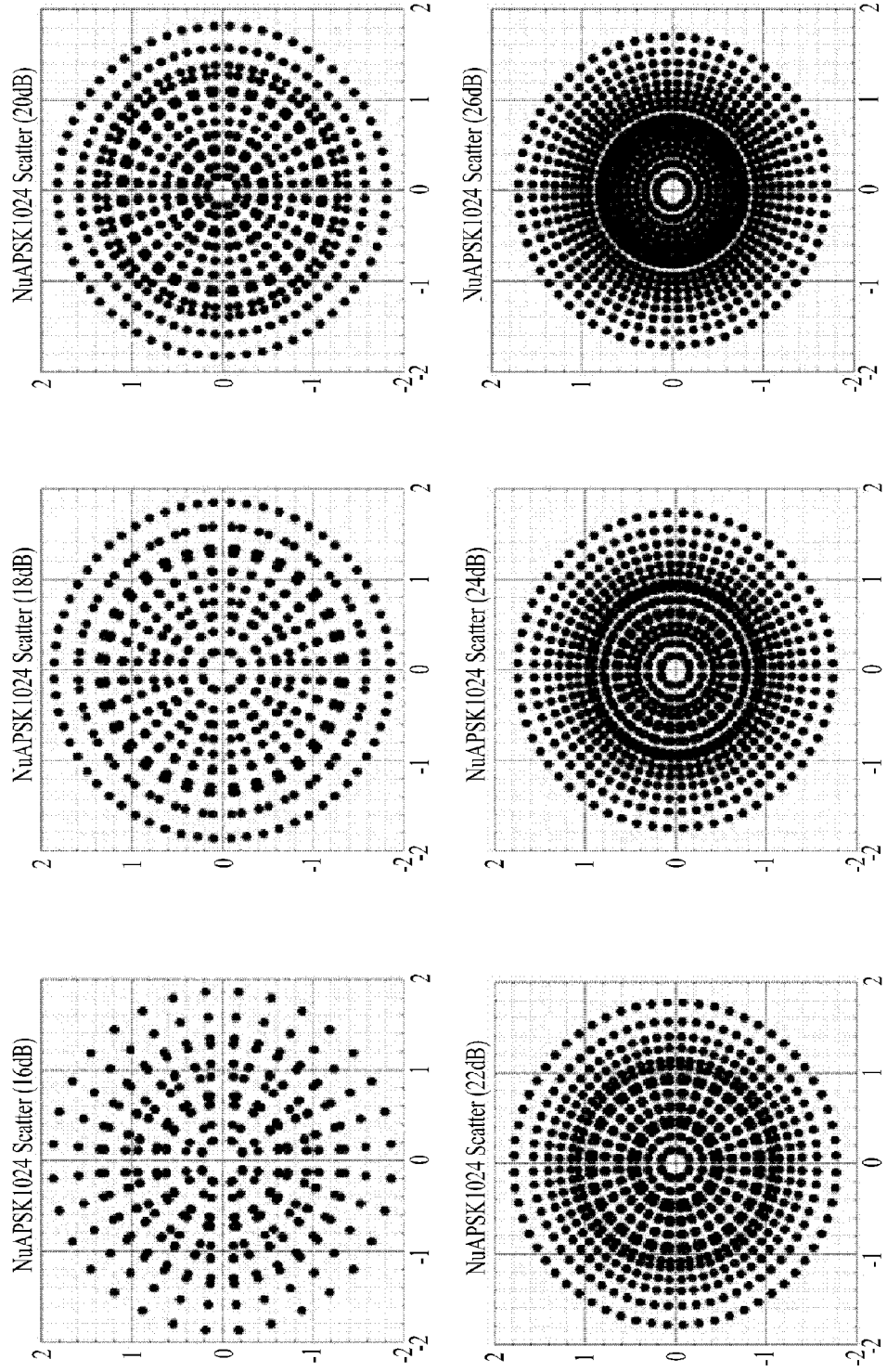
FIG. 59 shows constellations for the respective SNRs based on the parameters of the 1024 NUCs created according to one embodiment of the present invention.

FIG. 59 shows constellations for the respective SNRs based on the parameters of the 1024 NUCs created according to one embodiment of the present invention.

In FIG. 59, the values of r and θ that provide optimum capacities for the respective SNRs as determined according to the method described above are indicated by constellations in the complex plane.

Figure 60:
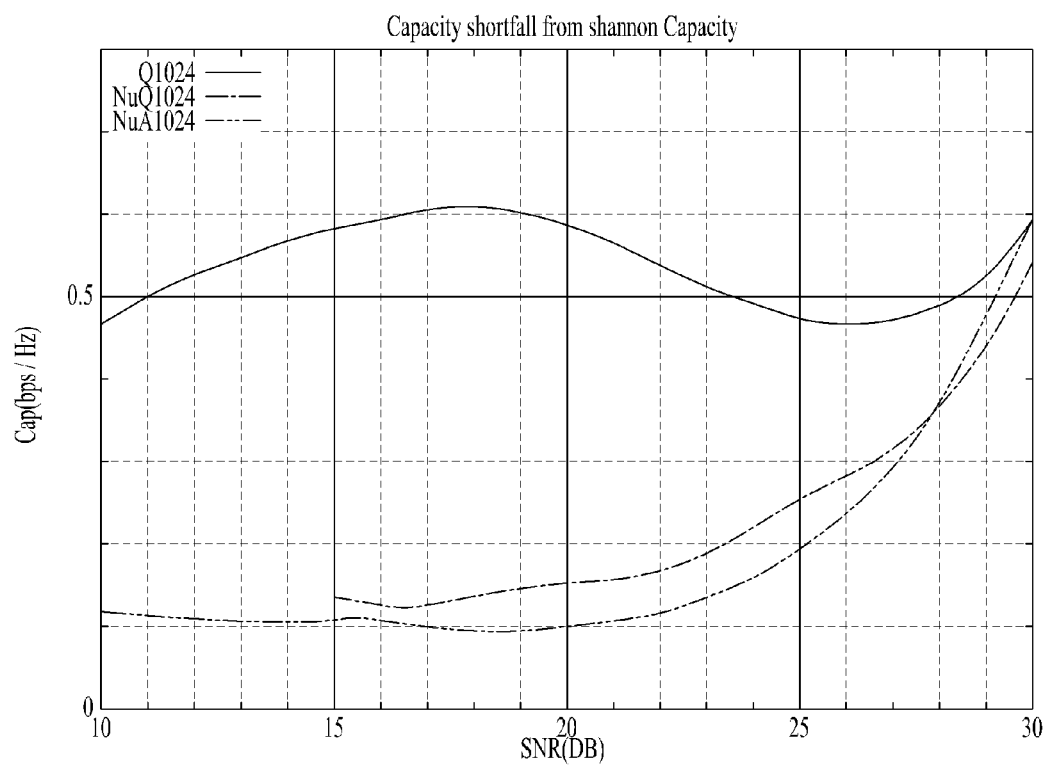
FIG. 60 shows graphs for comparing the BICM capacities of 1024 NUCs created according to one embodiment of the present invention.

FIG. 60 shows graphs for comparing the BICM capacities of 1024 NUCs created according to one embodiment of the present invention.

In FIG. 60, the X-axis may represent SNR (dB), and the Y-axis may represent BICM capacity. The graphs may show a different (y value) between a Shannon capacity and the capacity of the constellation at a given SNR (x value). Herein, the Shannon capacity may indicate the greatest BICM capacity in BICM theory. Accordingly, this may mean that performance improves as the y value decreases.

Q1024 may represent uniform 1024-QAM, NuQ1024 may represent non-uniform 1024-QAM, and NuA1024 may represent NUC-1024. As shown in FIG. 60, NUC-1024 according to the present invention may exhibit the best performance.

Figure 61:
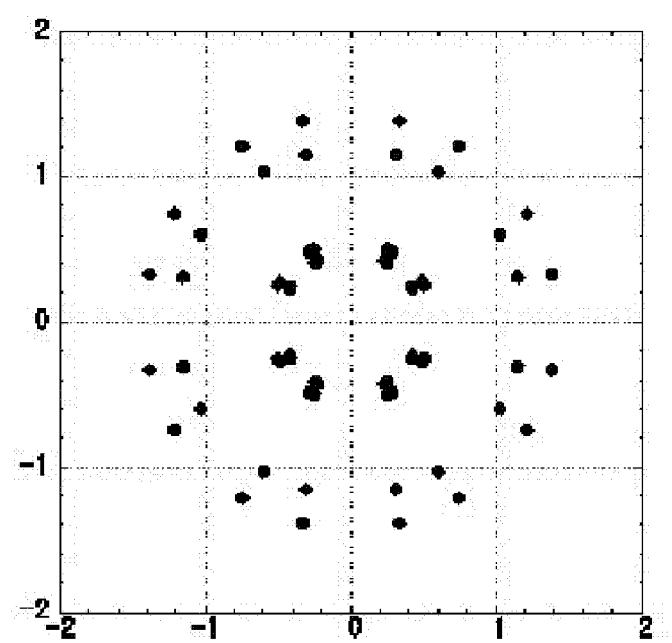
FIG. 61 shows a constellation of 64 NUCs for 5/15 code rate according to one embodiment of the present invention.

FIG. 61 shows a constellation of 64 NUCs for 5/15 code rate according to one embodiment of the present invention.

This constellation may be obtained using the parameters for the SNR of 7.5 dB from the table listing the optimum parameters for the respective SNRs of the 64 NUCs described above.

FIG. 62 shows coordinates of the respective constellations of 64 NUCs for 5/15 code rate according to one embodiment of the present invention.

These coordinates represent the constellation points to which the respective bit values are allocated. These coordinates may be obtained by converting the parameters for the SNR of 7.5 dB from the table of optimum parameters described above to x and y values.

Figure 63:
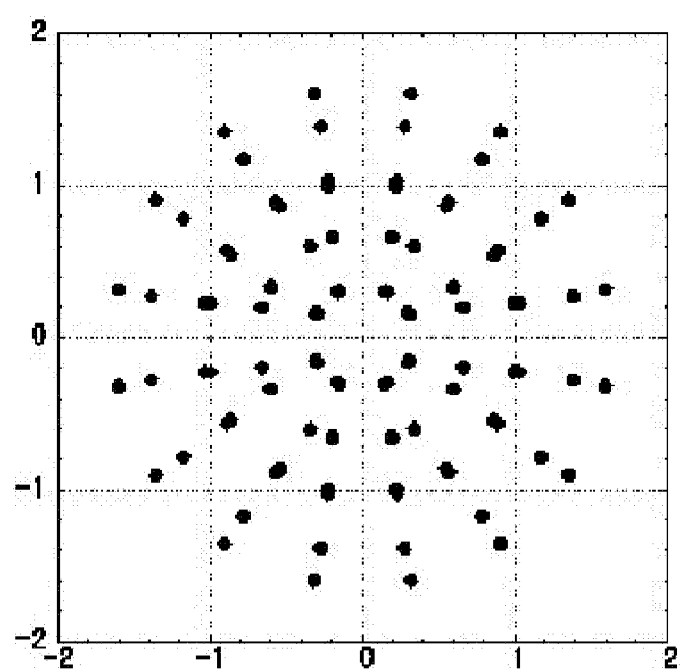
FIG. 63 shows a constellation of 256 NUCs for 5/15 code rate according to one embodiment of the present invention.

FIG. 63 shows a constellation of 256 NUCs for 5/15 code rate according to one embodiment of the present invention.

This constellation may be obtained using the parameters for the SNR of 11 dB from the table listing the optimum parameters for the respective SNRs of the 256 NUCs described above.

FIG. 64 shows a part of the coordinates of the respective constellations of 256 NUCs for 5/15 code rate according to one embodiment of the present invention.

FIG. 65 shows the other part of the coordinates of the respective constellations of 256 NUCs for 5/15 code rate according to one embodiment of the present invention.

These coordinates represent the constellation points to which the respective bit values are allocated. These coordinates may be obtained by converting the parameters for the SNR of 11 dB from the table of optimum parameters described above to x and y values.

These two coordinate tables, which are separately shown in FIGS. 64 and 65 due to space constraints, constitute one table.

Figure 66:
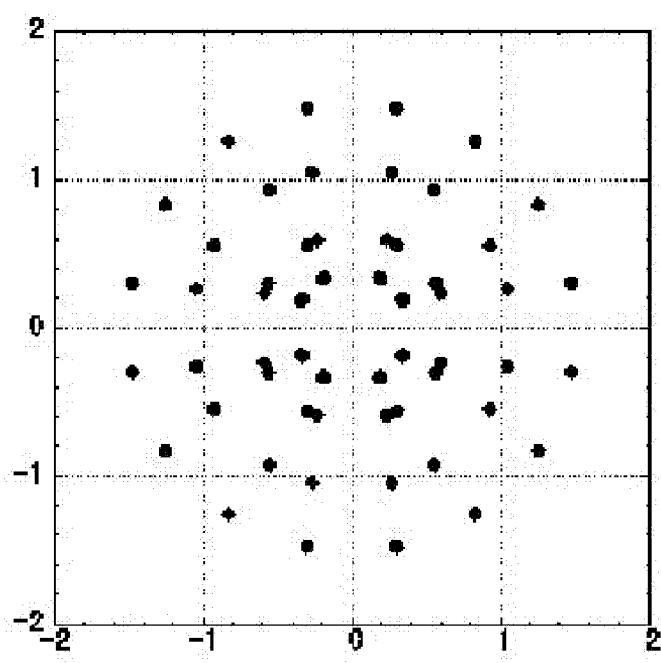
FIG. 66 shows a constellation of 64 NUCs for 6/15 code rate according to one embodiment of the present invention.

FIG. 66 shows a constellation of 64 NUCs for 6/15 code rate according to one embodiment of the present invention.

This constellation may be obtained using the parameters for the SNR of 9 dB from the table listing the optimum parameters for the respective SNRs of the 64 NUCs described above.

FIG. 67 shows coordinates of the respective constellations of 64 NUCs for 6/15 code rate according to one embodiment of the present invention.

These coordinates represent the constellation points to which the respective bit values are allocated. These coordinates may be obtained by converting the parameters for the SNR of 9 dB from the table of optimum parameters described above into x and y values.

Figure 68:
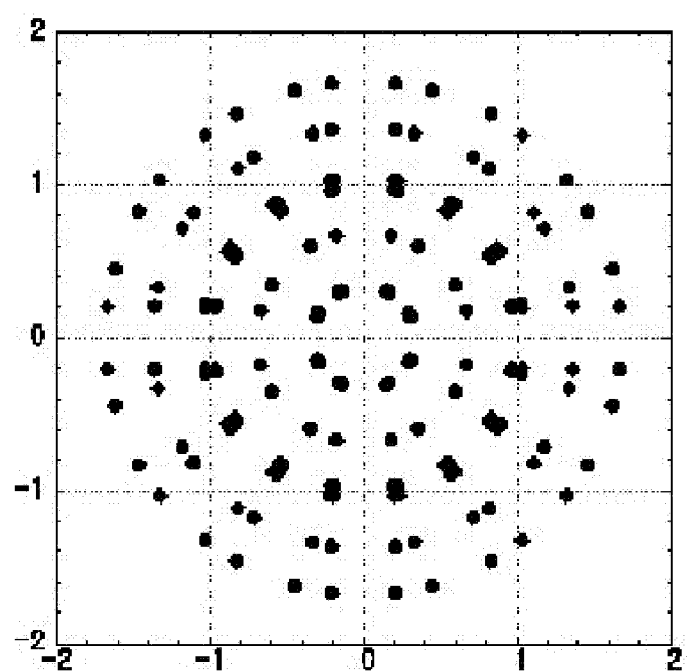
FIG. 68 shows a constellation of 256 NUCs for 6/15 code rate according to one embodiment of the present invention.

FIG. 68 shows a constellation of 256 NUCs for 6/15 code rate according to one embodiment of the present invention.

This constellation may be obtained using the parameters for the SNR of 12 dB from the table listing the optimum parameters for the respective SNRs of the 256 NUCs described above.

FIG. 69 shows a part of the coordinates of the respective constellations of 256 NUCs for 6/15 code rate according to one embodiment of the present invention.

FIG. 70 shows the other part of the coordinates of the respective constellations of 256 NUCs for 6/15 code rate according to one embodiment of the present invention.

These coordinates represent the constellation points to which the respective bit values are allocated. These coordinates may be obtained by converting the parameters for the SNR of 12 dB from the table of optimum parameters described above into x and y values.

These two coordinate tables, which are separately shown in FIGS. 69 and 70 due to space constraints, constitute one table.

Figure 71:
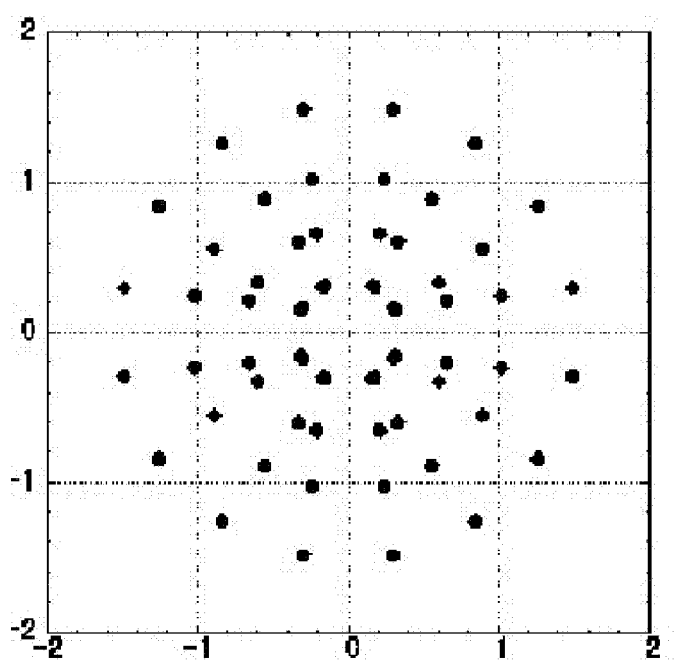
FIG. 71 shows a constellation of 64 NUCs for 7/15 code rate according to one embodiment of the present invention.

FIG. 71 shows a constellation of 64 NUCs for 7/15 code rate according to one embodiment of the present invention.

This constellation may be obtained using the parameters for the SNR of 10.5 dB from the table listing the optimum parameters for the respective SNRs of the 64 NUCs described above.

FIG. 72 shows coordinates of the respective constellations of 64 NUCs for 7/15 code rate according to one embodiment of the present invention.

These coordinates represent the constellation points to which the respective bit values are allocated. These coordinates may be obtained by converting the parameters for the SNR of 10.5 dB from the table of optimum parameters described above into x and y values.

Figure 73:
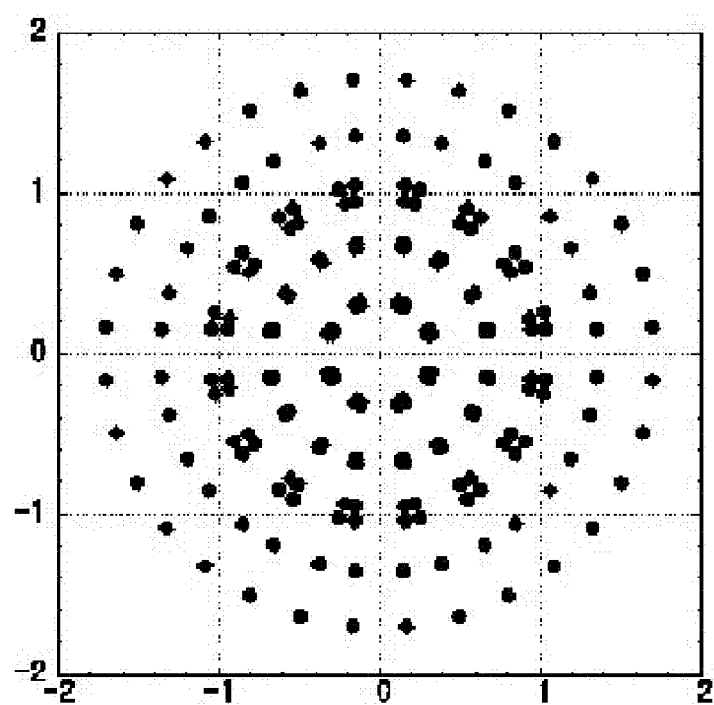
FIG. 73 shows a constellation of 256 NUCs for 7/15 code rate according to one embodiment of the present invention.

FIG. 73 shows a constellation of 256 NUCs for 7/15 code rate according to one embodiment of the present invention.

This constellation may be obtained using the parameters for the SNR of 14.5 dB from the table listing the optimum parameters for the respective SNRs of the 256 NUCs described above.

FIG. 74 shows a part of the coordinates of the respective constellations of 256 NUCs for 7/15 code rate according to one embodiment of the present invention.

FIG. 75 shows the other part of the coordinates of the respective constellations of 256 NUCs for 7/15 code rate according to one embodiment of the present invention.

These coordinates represent the constellation points to which the respective bit values are allocated. These coordinates may be obtained by converting the parameters for the SNR of 14.5 dB from the table of optimum parameters described above into x and y values.

These two coordinate tables, which are separately shown in FIGS. 74 and 75 due to space constraints, constitute one table.

Figure 76:
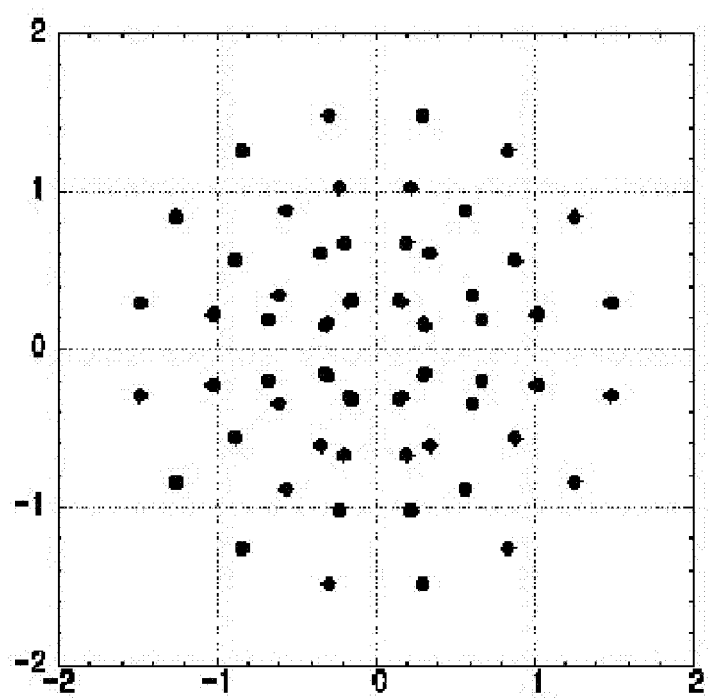
FIG. 76 shows a constellation of 64 NUCs for 8/15 code rate according to one embodiment of the present invention.

FIG. 76 shows a constellation of 64 NUCs for 8/15 code rate according to one embodiment of the present invention.

This constellation may be obtained using the parameters for the SNR of 11 dB from the table listing the optimum parameters for the respective SNRs of the 64 NUCs described above.

FIG. 77 shows coordinates of the respective constellations of 64 NUCs for 8/15 code rate according to one embodiment of the present invention.

These coordinates represent the constellation points to which the respective bit values are allocated. These coordinates may be obtained by converting the parameters for the SNR of 11 dB from the table of optimum parameters described above into x and y values.

Figure 78:
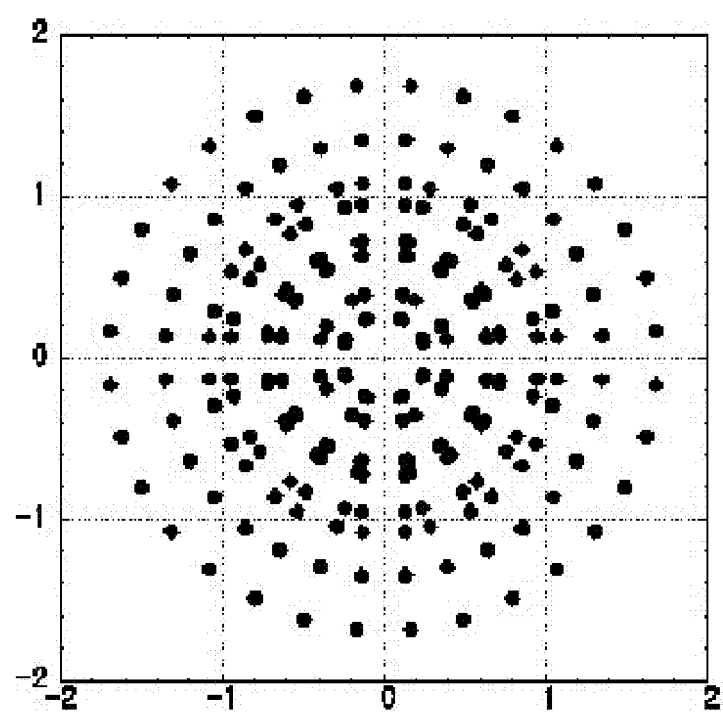
FIG. 78 shows a constellation of 256 NUCs for 8/15 code rate according to one embodiment of the present invention.

FIG. 78 shows a constellation of 256 NUCs for 8/15 code rate according to one embodiment of the present invention.

This constellation may be obtained using the parameters for the SNR of 15.5 dB from the table listing the optimum parameters for the respective SNRs of the 256 NUCs described above.

FIG. 79 shows a part of the coordinates of the respective constellations of 256 NUCs for 8/15 code rate according to one embodiment of the present invention.

FIG. 80 shows the other part of the coordinates of the respective constellations of 256 NUCs for 8/15 code rate according to one embodiment of the present invention.

These coordinates represent the constellation points to which the respective bit values are allocated. These coordinates may be obtained by converting the parameters for the SNR of 15.5 dB from the table of optimum parameters described above into x and y values.

These two coordinate tables, which are separately shown in FIGS. 79 and 80 due to space constraints, constitute one table.

Figure 81:
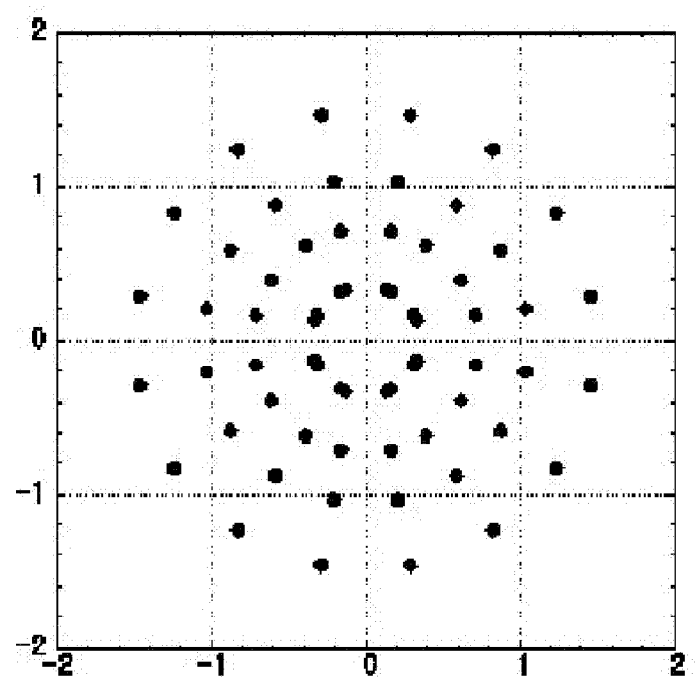
FIG. 81 shows a constellation of 64 NUCs for 9/15 code rate according to one embodiment of the present invention.

FIG. 81 shows a constellation of 64 NUCs for 9/15 code rate according to one embodiment of the present invention.

This constellation may be obtained using the parameters for the SNR of 13.5 dB from the table listing the optimum parameters for the respective SNRs of the 64 NUCs described above.

FIG. 82 shows coordinates of the respective constellations of 64 NUCs for 9/15 code rate according to one embodiment of the present invention.

These coordinates represent the constellation points to which the respective bit values are allocated. These coordinates may be obtained by converting the parameters for the SNR of 13.5 dB from the table of optimum parameters described above into x and y values.

Figure 83:
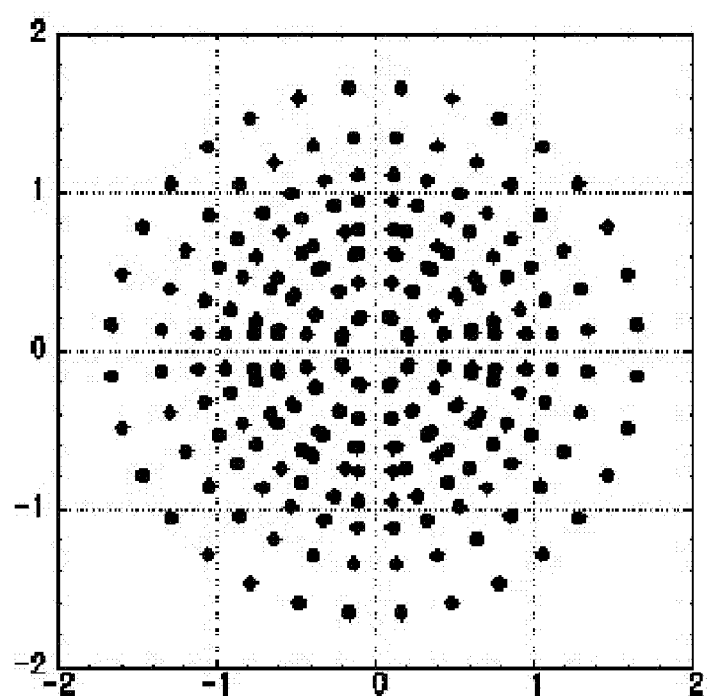
FIG. 83 shows a constellation of 256 NUCs for 9/15 code rate according to one embodiment of the present invention.

FIG. 83 shows a constellation of 256 NUCs for 9/15 code rate according to one embodiment of the present invention.

This constellation may be obtained using the parameters for the SNR of 17 dB from the table listing the optimum parameters for the respective SNRs of the 256 NUCs described above.

FIG. 84 shows a part of the coordinates of the respective constellations of 256 NUCs for 9/15 code rate according to one embodiment of the present invention.

FIG. 85 shows the other part of the coordinates of the respective constellations of 256 NUCs for 9/15 code rate according to one embodiment of the present invention.

These coordinates represent the constellation points to which the respective bit values are allocated. These coordinates may be obtained by converting the parameters for the SNR of 17 dB from the table of optimum parameters described above into x and y values.

These two coordinate tables, which are separately shown in FIGS. 84 and 85 due to space constraints, constitute one table.

Figure 86:
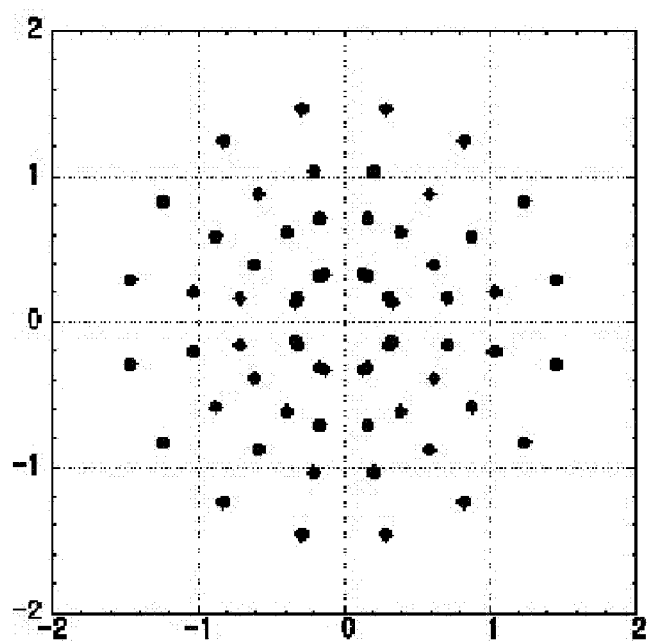
FIG. 86 shows a constellation of 64 NUCs for 10/15 code rate according to one embodiment of the present invention.

FIG. 86 shows a constellation of 64 NUCs for 10/15 code rate according to one embodiment of the present invention.

This constellation may be obtained using the parameters for the SNR of 13.5 dB from the table listing the optimum parameters for the respective SNRs of the 64 NUCs described above.

FIG. 87 shows coordinates of the respective constellations of 64 NUCs for 10/15 code rate according to one embodiment of the present invention.

These coordinates represent the constellation points to which the respective bit values are allocated. These coordinates may be obtained by converting the parameters for the SNR of 13.5 dB from the table of optimum parameters described above into x and y values.

Figure 88:
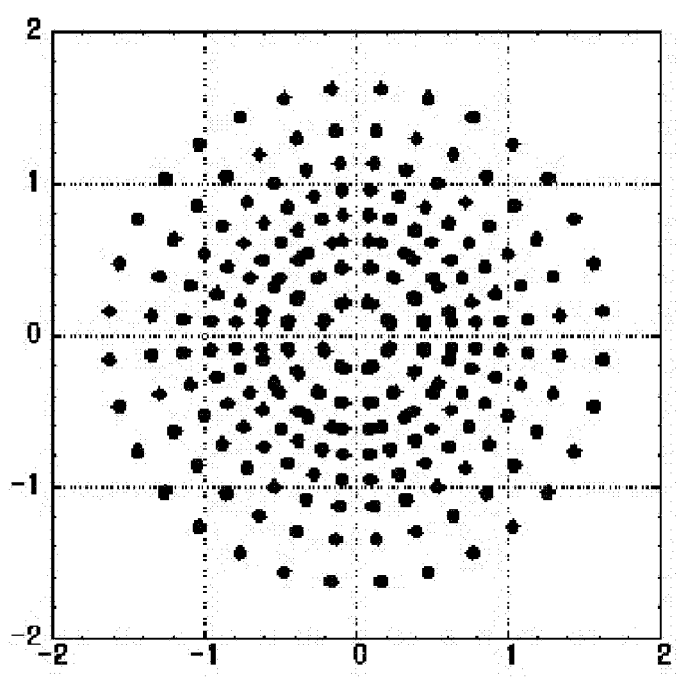
FIG. 88 shows a constellation of 256 NUCs for 10/15 code rate according to one embodiment of the present invention.

FIG. 88 shows a constellation of 256 NUCs for 10/15 code rate according to one embodiment of the present invention.

This constellation may be obtained using the parameters for the SNR of 19 dB from the table listing the optimum parameters for the respective SNRs of the 256 NUCs described above.

FIG. 89 shows a part of the coordinates of the respective constellations of 256 NUCs for 10/15 code rate according to one embodiment of the present invention.

FIG. 90 shows the other part of the coordinates of the respective constellations of 256 NUCs for 10/15 code rate according to one embodiment of the present invention.

These coordinates represent the constellation points to which the respective bit values are allocated. These coordinates may be obtained by converting the parameters for the SNR of 19 dB from the table of optimum parameters described above into x and y values.

These two coordinate tables, which are separately shown in FIGS. 89 and 90 due to space constraints, constitute one table.

FIG. 91 describes a process of mapping IQ-balanced/IQ-symmetric non-uniform constellations according to one embodiment of the present invention.

As another constellation creation method for obtaining the optimum BICM capacities, IQ-balanced/IQ-symmetric non-uniform constellation mapping is proposed.

To find constellation points that maximize the BICM capacity, some assumptions and restraints are needed. Hereinafter, some restraints will be described.

Restraint 1. All constellation points are generated with the same probability. The probabilities of the constellation points may be equal to each other.

Restraint 2. Constellation points do not have a bias. That is, the average of all the constellation points may be 0. In addition, when Restraint 1 is applied, the total sum of the constellation points may be 0.

Restraint 3. The average power of the constellations is a constant. That is, the average power may be invariably set to a constant P.

Restraint 4-1. To implement IQ-balanced mapping, the BICM capacity on the I-axis needs to be equal to the BICM capacity on the Q-axis. For example, if a constellation rotated by a multiple of 90 degrees such as 90, 180 and 270 degrees coincides with the original constellation, this constellation may be viewed as being IQ-balanced. That is, if a constellation point rotated by a multiple of 90 degrees overlaps one of constellation points from an original constellation set, the constellation may be viewed as being IQ-balanced.

Hereinafter, a case in which a constellation rotated by a multiple of 90 degrees coincides with the original constellation will be considered as an IQ-balanced mapping scheme.

Restraint 4-2. To implement IQ-symmetric mapping, the BICM capacity in the I-axis should not be equal to the BICM capacity in the Q-axis. To implement IQ-symmetric mapping, constellations should be symmetric with respect to I-axis and Q-axis. For example, when $s_i$ is a constellation point of a constellation, $conj(s_i)$, $-conj(s_i)$, and $-s_i$ may also need to be constellation points of the constellation.

Restraint 4-1 and Restraint 4-2 may not be simultaneously met. To implement IQ-balanced mapping, Restraint 4-1 may need to be met. To implement IQ-symmetric mapping, Restraint 4-2 may need to be met. To implement both IQ-balanced mapping and IQ-symmetric mapping, these two restraints need to be met.

Hereinafter, a description will be given of a method of creating non-uniformly distributed constellation points according to IQ-balanced/IQ-symmetric non-uniform constellation mapping.

According to one embodiment, constellation points may be moved in the two-dimensional complex plane to find a constellation providing the optimum capacity. By moving the constellation points, a constellation providing the optimum BICM capacity may be found.

However, moving only one constellation point may not satisfy Restraint 1 and/or Restraint 2 described above. Accordingly, to satisfy the restraints by moving this constellation point, another constellation point may also need to be moved. In this embodiment, the i-th and j-th constellation points are moved.

It is assumed that the constellation prior to moving the constellation points is subject to IQ-balanced mapping. To maintain IQ-balancing, not only the i-th and j-th constellation point pairs but also three other constellation point pairs corresponding thereto may need to be moved. The three corresponding constellation point pairs may refer to constellation points obtained by rotating the i-th and j-th constellation points by 90, 180 and 270 degrees. That is, 8 constellation points may need to be moved together.

The i-th and j-th constellation points to be moved may be defined as $s_{0,i}$ and $s_{0,j}$, and the corresponding constellation points to be moved may be defined as $s_{k,i}$ and $s_{k,j}$. Herein, k=1, 2, 3, and the pairs may respectively represent rotation of $s_{0,i}$ and $s_{0,j}$ by 90, 180 and 270 degrees.

For constellation point $s_{0,i}$, $s_{0,j}$, a and b may be defined as Equations (1) and (2) shown in FIG. 91. Herein, Equations (1) and (2) may respectively mean that Restraint 1 and Restraint 2 are met while the constellations are moved. That is, a and b may be constants. In addition, when $s_{0,i}$ and a are expressed as Equation (3) shown in FIG. 91, Equation (4) may be obtained. Then, Equation (5) may be derived from these equations. It can be seen from Equation (5) that movement of two constellation points can be controlled using one variable θ. Since the other constellation point pairs can be described with $s_{0,i}$, and $s_{0,j}$ as in Equation (6), all the constellation points may be controlled by one variable.

Since movement is implemented with IQ-balancing maintained, the characteristic of IQ-balancing may be maintained even after movement. In this way, a constellation having the optimum capacity may be found with IQ-balancing maintained. When movement is implemented to find the constellation, θ may be split into several parts to calculate the BICM capacity for each split θ to find θ that maximizes the BICM capacity. Using this process, all four sets of $s_i$ and $s_j$ may be updated.

Hereinafter, specific steps of constructing a constellation having non-uniformly distributed constellation points will be described. Each step may be omitted or replaced with another step, or the sequential order of these steps may change. These steps are intended to describe the spirit of the present invention, not to limit the present invention.

First, an initial constellation may be configured. This initial constellation may be an IQ-balanced or IQ-symmetric constellation. For example, the initial constellation may be a uniform QAM, a non-uniform QAM, or a non-uniform constellation (NUC). Herein, the NUC may be the NUC described above.

Two constellation points ($s_{0,i}$, $s_{0,j}$) of the initial constellation may be randomly and uniformly selected. The two constellation points should be different from each other. The constellation points may be selected in the first quadrant.

Once the two constellation points are selected, the other constellation points in the second, third and fourth quadrants may also be naturally selected. Accordingly, all eight constellation points may be selected. If the initial constellation is an IQ-balanced constellation, each of the selected constellations may be represented as $e^{jk\pi/2} \cdot s_{0,i}$. Here, k=0, 1, 2, 3, and i may be replaced with j. If the initial constellation is an IQ-symmetric constellation, each of the selected constellations may be represented as $conj(s_{0,i})$, $-conj(s_{0,i})$ and $-s_{0,i}$. i may be replaced with j. As described above, if the initial constellation is an IQ-balanced or IQ-symmetric constellation, the average of the constellation may be 0.

Thereafter, $|S_{0,i}|^2 + |S_{0,j}|^2$ and the BICM capacity may be calculated. The constellation points may be respectively moved such that the BICM capacity is maximized. There may be two methods for finding the optimum constellation position.

One method is to utilize $\Delta_i$. $s_{0,i}$ may be moved by $\pm \Delta_i$ vertically or horizontally. Accordingly, $s_{0,j}$ may also need to be moved by $\pm \Delta_j$ vertically or horizontally. Herein, $\Delta_j$ and $\Delta_i$ may be determined using $|S_{0,i}|^2 + |S_{0,j}|^2$. Accordingly, there may be four cases of movement such as $(+\Delta_i, +\Delta_j)$, $(+\Delta_i, -\Delta_j)$, $(-\Delta_i, +\Delta_j)$, $(-\Delta_i, -\Delta_j)$. This method may be used for IQ-symmetric non-uniform constellation mapping.

The other method is to utilize θ. As described, movement of constellations may be controlled by θ. Accordingly, by changing θ by a properly small angle each time, a constellation having the optimum capacity may be found. According to an embodiment, the properly small angle may be 1 degree in an embodiment. In addition, the angle may range from 0 degree to 360 degrees. In addition, this range of angle may cover $s_{0,i}$–a/2 and $s_{0,j}$–a/2. This is intended to set the optimum capacity within the search range. That is, this is intended to prevent the capacity from being reduced in the search process. This method may be used for IQ-balanced non-uniform constellation mapping.

According to the two methods described above, the BICM capacity may be calculated at constellation positions to which the constellations are respectively moved. If the BICM capacity for the moved constellation is greater than the BICM capacity calculated at first, $s_{0,i}$ and $s_{0,j}$ may be updated with this constellation.

Thereafter, constellations may continue to be searched by reducing $\Delta_i$ and θ. When these two parameters are sufficiently reduced, two other constellation points of the initial constellation may be selected anew. Then, the optimum position may be found for the newly selected constellation points through the process described above.

When all the BICM capacities are saturated, the algorithm may be stopped and the final constellation set may be obtained. Herein, saturation of the capacities may refer to a case in which great increase in the BICM capacity does not occur in the above algorithm. Saturation of the BICM capacity may be checked every time $s_i$ and $s_j$ change, or may be checked when all M constellation points are checked.

According to one embodiment, a constellation exhibiting the best performance may be selected after the algorithm is executed for all the seed constellations described above. The seed constellations, namely the initial constellations, may include a uniform QAM, a non-uniform QAM, and a non-uniform constellation (NUC). For example, NUC-64 at the SNR of 10 dB may be obtained by executing the algorithm for the QAM, NUQ and NUC. According to one embodiment, a constellation obtained through the aforementioned algorithm at 9.5 dB or 10.5 dB may be taken as a seed constellation for the algorithm to be executed.

FIG. 92 shows constellations of 64 NUCs at the SNR of 18 dB using the method of IQ-balanced non-uniform constellation mapping according to one embodiment of the present invention.

In this embodiment, uniform-64-QAM having the average power of 1 is taken as a seed constellation, and a desired constellation is found through θ. In addition, the angular increment is set to 1 degree, saturation of the capacity is checked after all M constellation points are updated with $s_i$ and $s_j$ once. Saturation checking may be performed by checking whether the BICM capacity increases by 1.0e-5 or more. This constellation may remain in the IQ-balanced state and satisfy the n*pi/2-symmetric condition.

Figure 93:
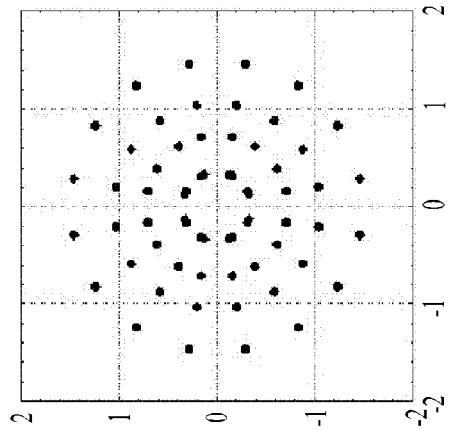
FIG. 93 shows a constellation of 64 NUCs for 10/15 code rate based on the IQ-balanced non-uniform constellation mapping method according to one embodiment of the present invention.

FIG. 93 shows a constellation of 64 NUCs for 10/15 code rate based on the IQ-balanced non-uniform constellation mapping method according to one embodiment of the present invention.

Coordinates of the constellation points are listed on the right side of the constellation. The respective coordinates represent the coordinates of the constellation points to which bit values are respectively allocated. Each coordinate may be expressed in x and y values for each bit value.

Figure 94:
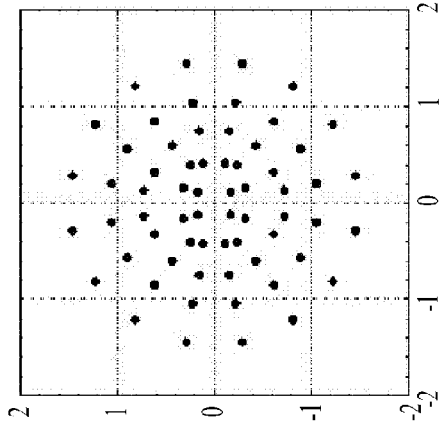
FIG. 94 shows a constellation of 64 NUCs for 10/15 code rate based on the IQ-symmetric non-uniform constellation mapping method according to one embodiment of the present invention.

FIG. 94 shows a constellation of 64 NUCs for 10/15 code rate based on the IQ-symmetric non-uniform constellation mapping method according to one embodiment of the present invention.

Coordinates of the constellation points are listed on the right side of the constellation. The respective coordinates represent the coordinates of constellation points to which bit values are respectively allocated. Each coordinate may be expressed in x and y values for each bit value.

Figure 95:
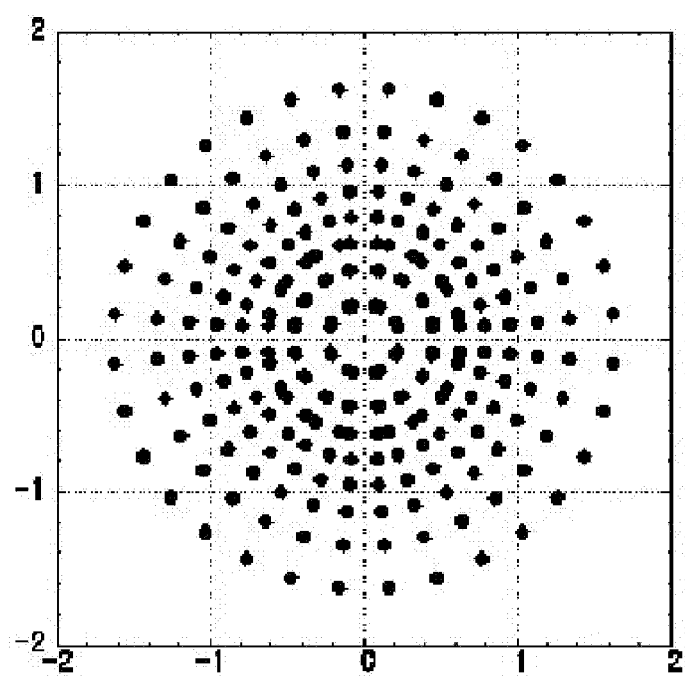
FIG. 95 shows a constellation of 256 NUCs for 10/15 code rate based on the IQ-balanced non-uniform constellation mapping method according to one embodiment of the present invention.

FIG. 95 shows a constellation of 256 NUCs for 10/15 code rate based on the IQ-balanced non-uniform constellation mapping method according to one embodiment of the present invention.

FIG. 96 shows a part of the coordinates of the constellations of 256 NUCs for 10/15 code rate based on the IQ-balanced non-uniform constellation mapping method according to one embodiment of the present invention.

FIG. 97 shows another part of the coordinates of the constellations of 256 NUCs for 10/15 code rate based on the IQ-balanced non-uniform constellation mapping method according to one embodiment of the present invention.

FIG. 98 shows the other part of the coordinates of the constellations of 256 NUCs for 10/15 code rate based on the IQ-balanced non-uniform constellation mapping method according to one embodiment of the present invention.

The coordinates represent the coordinates of the constellation points to which bit values are respectively allocated. Each coordinate may be expressed in x and y values for each bit value.

These three coordinate tables, which are separately shown in FIGS. 96 to 98 due to space constraints, constitute one table.

Figure 99:
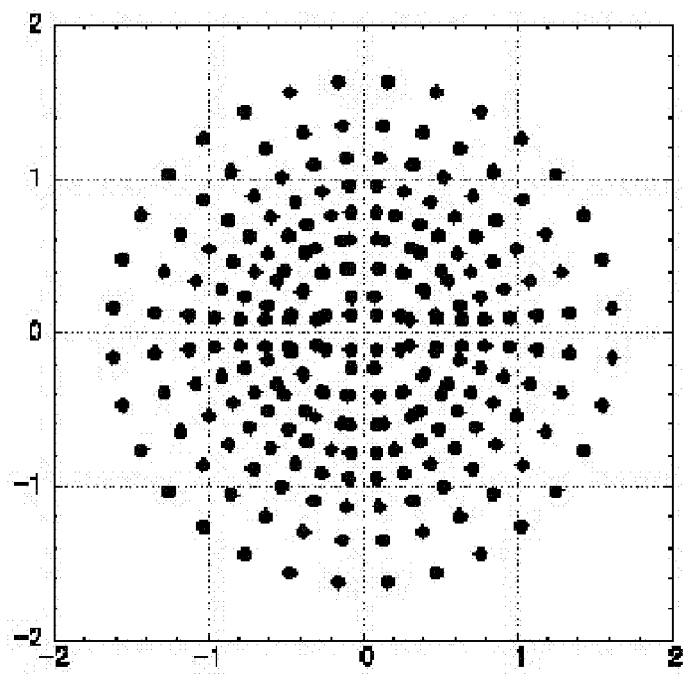
FIG. 99 shows a constellation of 256 NUCs for 10/15 code rate based on the IQ-symmetric non-uniform constellation mapping method according to one embodiment of the present invention.

FIG. 99 shows a constellation of 256 NUCs for 10/15 code rate based on the IQ-symmetric non-uniform constellation mapping method according to one embodiment of the present invention.

FIG. 100 shows a part of the coordinates of the constellations of 256 NUCs for 10/15 code rate based on the IQ-symmetric non-uniform constellation mapping method according to one embodiment of the present invention.

FIG. 101 shows another part of the coordinates of the constellations of 256 NUCs for 10/15 code rate based on the IQ-symmetric non-uniform constellation mapping method according to one embodiment of the present invention.

FIG. 102 shows the other part of the coordinates of the constellations of 256 NUCs for 10/15 code rate based on the IQ-symmetric non-uniform constellation mapping method according to one embodiment of the present invention.

The coordinates represent the coordinates of the constellation points to which bit values are respectively allocated. Each coordinate may be expressed in x and y values for each bit value.

These three coordinate tables, which are separately shown in FIGS. 100 and 102 due to space constraints, constitute one table.

Figure 103:
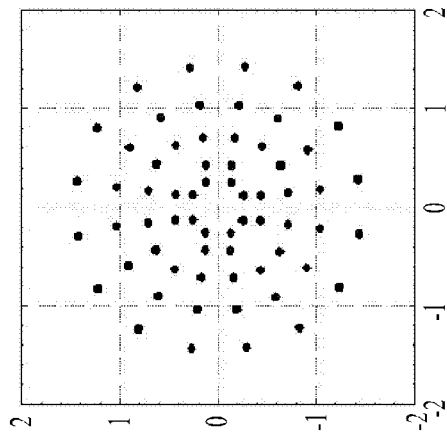
FIG. 103 shows a constellation of 64 NUCs for 11/15 code rate based on the IQ-balanced non-uniform constellation mapping method according to one embodiment of the present invention.

FIG. 103 shows a constellation of 64 NUCs for 11/15 code rate based on the IQ-balanced non-uniform constellation mapping method according to one embodiment of the present invention.

Coordinates of the constellation points are listed on the right side of the constellation. The respective coordinates represent the coordinates of the constellation points to which bit values are respectively allocated. Each coordinate may be expressed in x and y values for each bit value.

Figure 104:
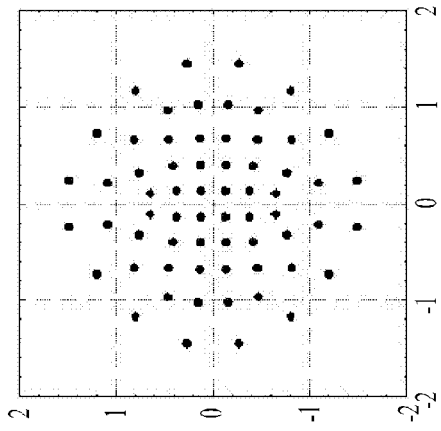
FIG. 104 shows a constellation of 64 NUCs for 11/15 code rate based on the IQ-symmetric non-uniform constellation mapping method according to one embodiment of the present invention.

FIG. 104 shows a constellation of 64 NUCs for 11/15 code rate based on the IQ-symmetric non-uniform constellation mapping method according to one embodiment of the present invention.

Coordinates of the constellation points are listed on the right side of the constellation. The respective coordinates represent the coordinates of constellation points to which bit values are respectively allocated. Each coordinate may be expressed in x and y values for each bit value.

Figure 105:
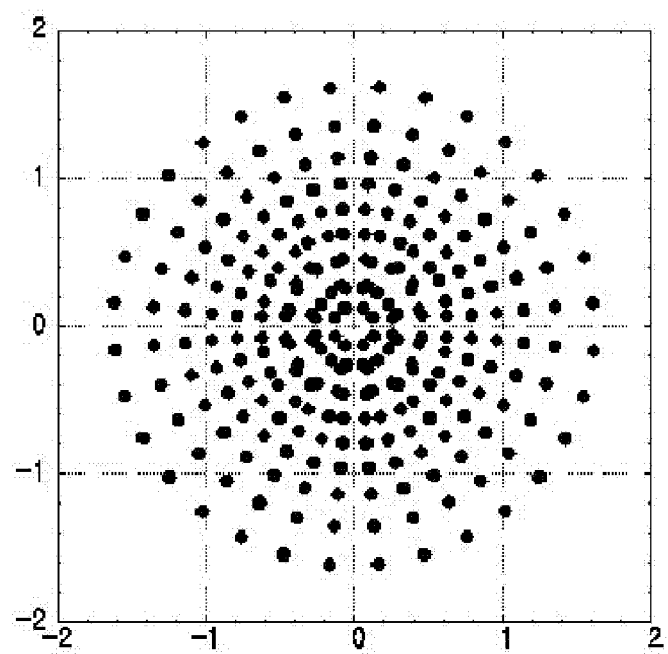
FIG. 105 shows a constellation of 256 NUCs for 11/15 code rate based on the IQ-balanced non-uniform constellation mapping method according to one embodiment of the present invention.

FIG. 105 shows a constellation of 256 NUCs for 11/15 code rate based on the IQ-balanced non-uniform constellation mapping method according to one embodiment of the present invention.

FIG. 106 shows a part of the coordinates of the constellations of 256 NUCs for 11/15 code rate based on the IQ-balanced non-uniform constellation mapping method according to one embodiment of the present invention.

FIG. 107 shows another part of the coordinates of the constellations of 256 NUCs for 11/15 code rate based on the IQ-balanced non-uniform constellation mapping method according to one embodiment of the present invention.

FIG. 108 shows the other part of the coordinates of the constellations of 256 NUCs for 11/15 code rate based on the IQ-balanced non-uniform constellation mapping method according to one embodiment of the present invention.

The coordinates represent the coordinates of the constellation points to which bit values are respectively allocated. Each coordinate may be expressed in x and y values for each bit value.

These three coordinate tables, which are separately shown in FIGS. 106 to 108 due to space constraints, constitute one table.

Figure 109:
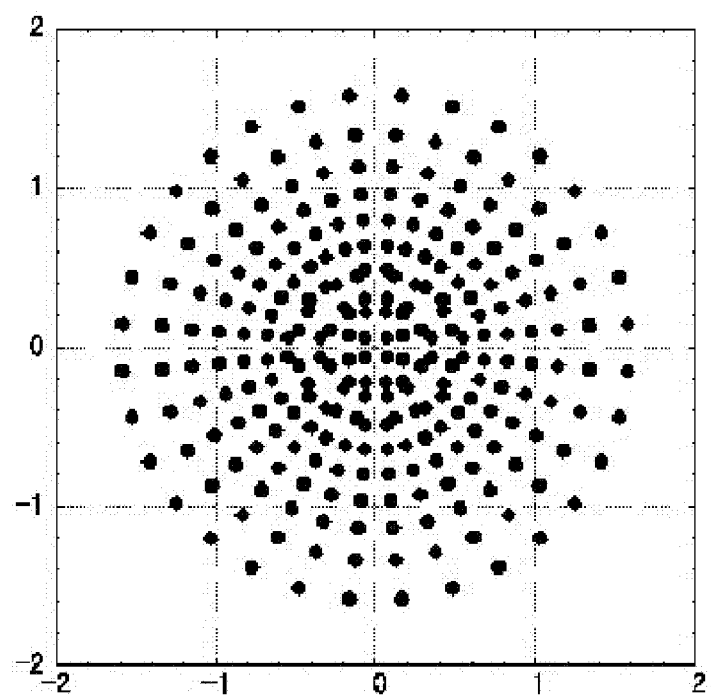
FIG. 109 shows a constellation of 256 NUCs for 11/15 code rate based on the IQ-symmetric non-uniform constellation mapping method according to one embodiment of the present invention.

FIG. 109 shows a constellation of 256 NUCs for 11/15 code rate based on the IQ-symmetric non-uniform constellation mapping method according to one embodiment of the present invention.

FIG. 110 shows a part of the coordinates of the constellations of 256 NUCs for 11/15 code rate based on the IQ-symmetric non-uniform constellation mapping method according to one embodiment of the present invention.

FIG. 111 shows another part of the coordinates of the constellations of 256 NUCs for 11/15 code rate based on the IQ-symmetric non-uniform constellation mapping method according to one embodiment of the present invention.

FIG. 112 shows the other part of the coordinates of the constellations of 256 NUCs for 11/15 code rate based on the IQ-symmetric non-uniform constellation mapping method according to one embodiment of the present invention.

The coordinates represent the coordinates of the constellation points to which bit values are respectively allocated. Each coordinate may be expressed in x and y values for each bit value.

These three coordinate tables, which are separately shown in FIGS. 110 and 112 due to space constraints, constitute one table.

Figure 113:
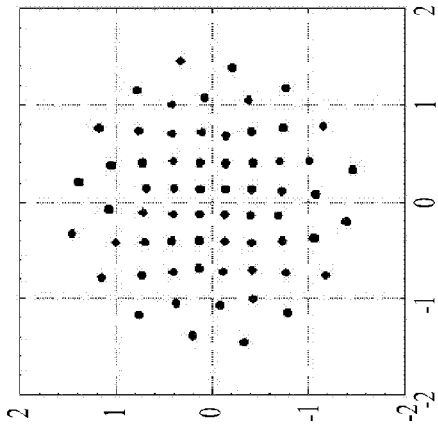
FIG. 113 shows a constellation of 64 NUCs for 12/15 code rate based on the IQ-balanced non-uniform constellation mapping method according to one embodiment of the present invention.

FIG. 113 shows a constellation of 64 NUCs for 12/15 code rate based on the IQ-balanced non-uniform constellation mapping method according to one embodiment of the present invention.

Coordinates of the constellation points are listed on the right side of the constellation. The respective coordinates represent the coordinates of the constellation points to which bit values are respectively allocated. Each coordinate may be expressed in x and y values for each bit value.

Figure 114:
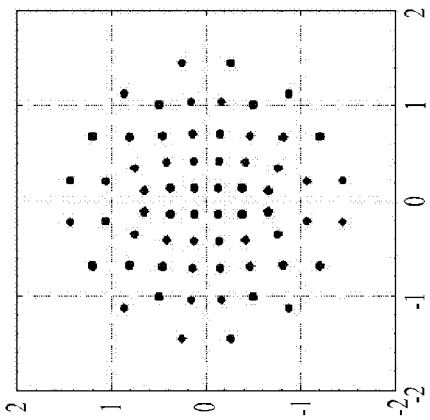
FIG. 114 shows a constellation of 64 NUCs for 12/15 code rate based on the IQ-symmetric non-uniform constellation mapping method according to one embodiment of the present invention.

FIG. 114 shows a constellation of 64 NUCs for 12/15 code rate based on the IQ-symmetric non-uniform constellation mapping method according to one embodiment of the present invention.

Coordinates of the constellation points are listed on the right side of the constellation. The respective coordinates represent the coordinates of constellation points to which bit values are respectively allocated. Each coordinate may be expressed in x and y values for each bit value.

Figure 115:
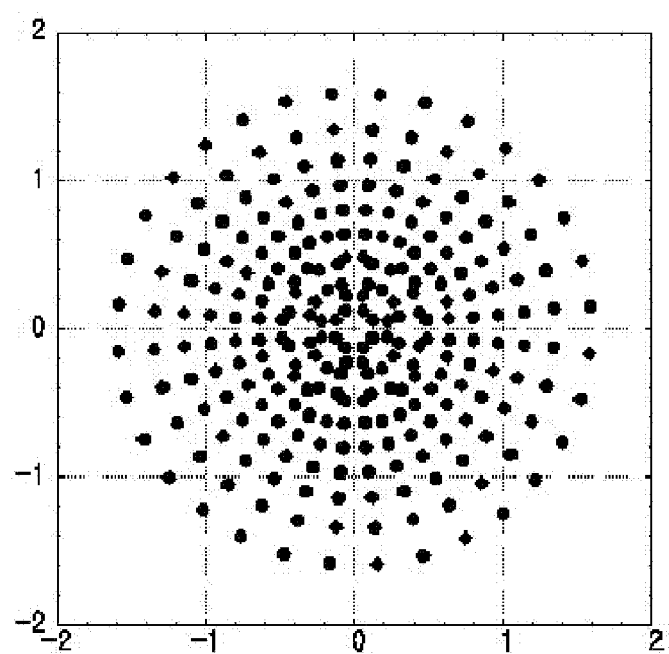
FIG. 115 shows a constellation of 256 NUCs for 12/15 code rate based on the IQ-balanced non-uniform constellation mapping method according to one embodiment of the present invention.

FIG. 115 shows a constellation of 256 NUCs for 12/15 code rate based on the IQ-balanced non-uniform constellation mapping method according to one embodiment of the present invention.

FIG. 116 shows a part of the coordinates of the constellations of 256 NUCs for 12/15 code rate based on the IQ-balanced non-uniform constellation mapping method according to one embodiment of the present invention.

FIG. 117 shows another part of the coordinates of the constellations of 256 NUCs for 12/15 code rate based on the IQ-balanced non-uniform constellation mapping method according to one embodiment of the present invention.

FIG. 118 shows the other part of the coordinates of the constellations of 256 NUCs for 12/15 code rate based on the IQ-balanced non-uniform constellation mapping method according to one embodiment of the present invention.

The coordinates represent the coordinates of the constellation points to which bit values are respectively allocated. Each coordinate may be expressed in x and y values for each bit value.

These three coordinate tables, which are separately shown in FIGS. 116 to 118 due to space constraints, constitute one table.

Figure 119:
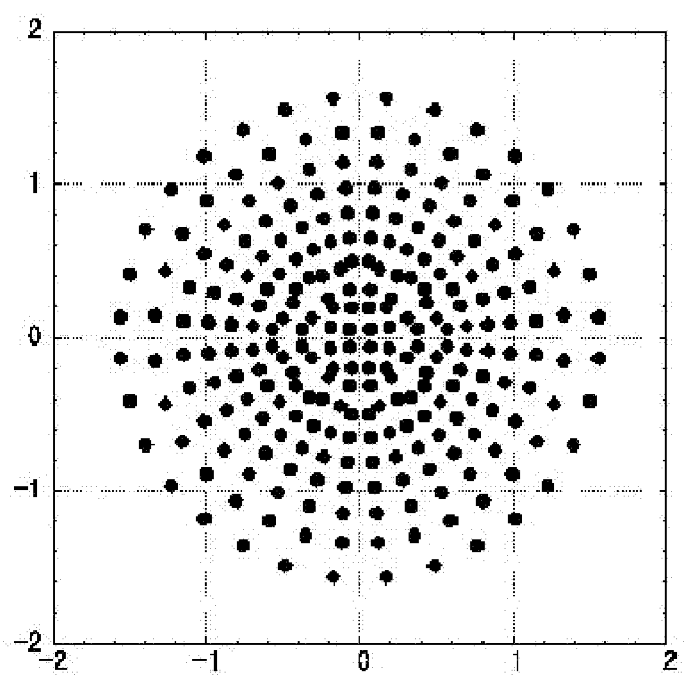

FIG. 119 shows a constellation of 256 NUCs for 12/15 code rate based on the IQ-symmetric non-uniform constellation mapping method according to one embodiment of the present invention.

FIG. 120 shows a part of the coordinates of the constellations of 256 NUCs for 12/15 code rate based on the IQ-symmetric non-uniform constellation mapping method according to one embodiment of the present invention.

FIG. 121 shows another part of the coordinates of the constellations of 256 NUCs for 12/15 code rate based on the IQ-symmetric non-uniform constellation mapping method according to one embodiment of the present invention.

FIG. 122 shows the other part of the coordinates of the constellations of 256 NUCs for 12/15 code rate based on the IQ-symmetric non-uniform constellation mapping method according to one embodiment of the present invention.

The coordinates represent the coordinates of the constellation points to which bit values are respectively allocated. Each coordinate may be expressed in x and y values for each bit value.

These three coordinate tables, which are separately shown in FIGS. 120 and 122 due to space constraints, constitute one table.

Figure 123:
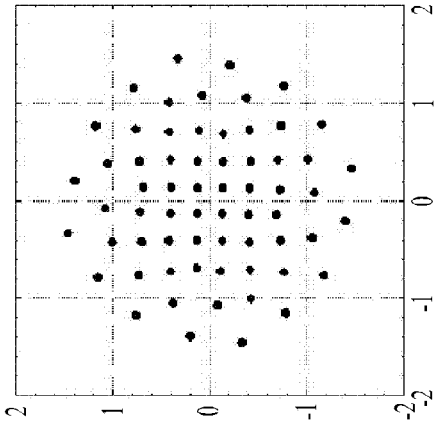

FIG. 123 shows a constellation of 64 NUCs for 13/15 code rate based on the IQ-balanced non-uniform constellation mapping method according to one embodiment of the present invention.

Coordinates of the constellation points are listed on the right side of the constellation. The respective coordinates represent the coordinates of the constellation points to which bit values are respectively allocated. Each coordinate may be expressed in x and y values for each bit value.

Figure 124:
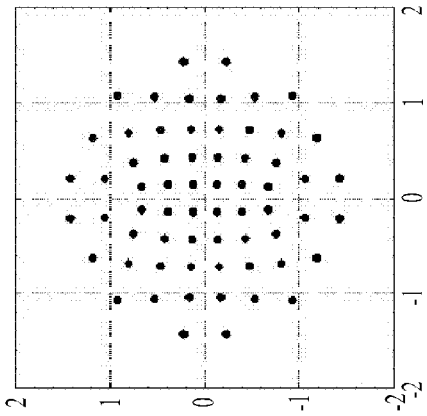

FIG. 124 shows a constellation of 64 NUCs for 13/15 code rate based on the IQ-symmetric non-uniform constellation mapping method according to one embodiment of the present invention.

Coordinates of the constellation points are listed on the right side of the constellation. The respective coordinates represent the coordinates of constellation points to which bit values are respectively allocated. Each coordinate may be expressed in x and y values for each bit value.

Figure 125:
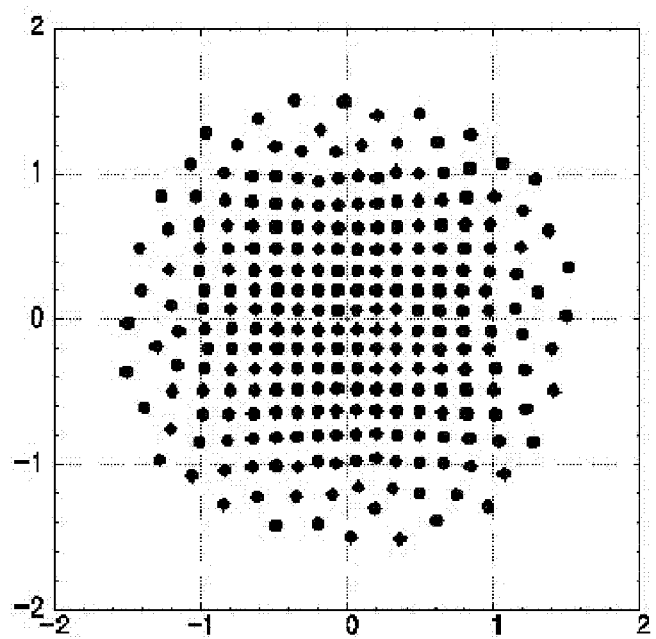

FIG. 125 shows a constellation of 256 NUCs for 13/15 code rate based on the IQ-balanced non-uniform constellation mapping method according to one embodiment of the present invention.

FIG. 126 shows a part of the coordinates of the constellations of 256 NUCs for 13/15 code rate based on the IQ-balanced non-uniform constellation mapping method according to one embodiment of the present invention.

FIG. 127 shows another part of the coordinates of the constellations of 256 NUCs for 13/15 code rate based on the IQ-balanced non-uniform constellation mapping method according to one embodiment of the present invention.

FIG. 128 shows the other part of the coordinates of the constellations of 256 NUCs for 13/15 code rate based on the IQ-balanced non-uniform constellation mapping method according to one embodiment of the present invention.

The coordinates represent the coordinates of the constellation points to which bit values are respectively allocated. Each coordinate may be expressed in x and y values for each bit value.

These three coordinate tables, which are separately shown in FIGS. 126 to 128 due to space constraints, constitute one table.

Figure 129:
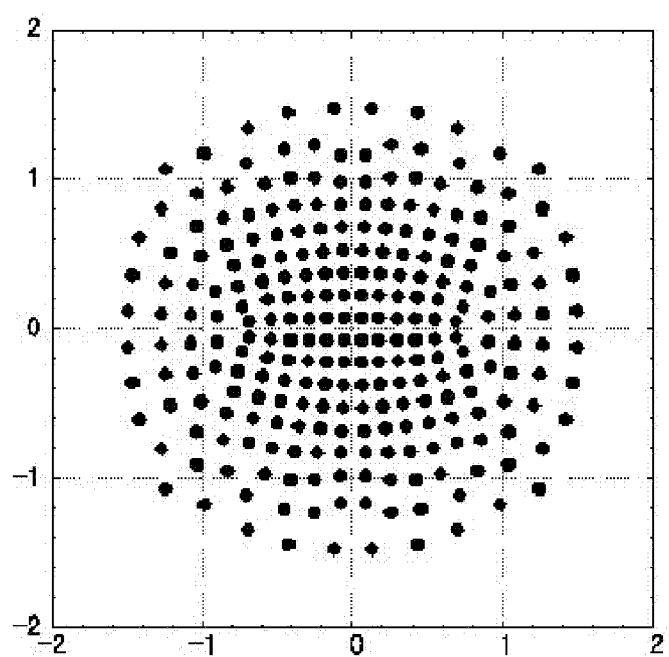

FIG. 129 shows a constellation of 256 NUCs for 13/15 code rate based on the IQ-symmetric non-uniform constellation mapping method according to one embodiment of the present invention.

FIG. 130 shows a part of the coordinates of the constellations of 256 NUCs for 13/15 code rate based on the IQ-symmetric non-uniform constellation mapping method according to one embodiment of the present invention.

FIG. 131 shows another part of the coordinates of the constellations of 256 NUCs for 13/15 code rate based on the IQ-symmetric non-uniform constellation mapping method according to one embodiment of the present invention.

FIG. 132 shows the other part of the coordinates of the constellations of 256 NUCs for 13/15 code rate based on the IQ-symmetric non-uniform constellation mapping method according to one embodiment of the present invention.

The coordinates represent the coordinates of the constellation points to which bit values are respectively allocated. Each coordinate may be expressed in x and y values for each bit value.

These three coordinate tables, which are separately shown in FIGS. 130 and 132 due to space constraints, constitute one table.

FIG. 133 illustrates a method of transmitting broadcast signal according to an embodiment of the present invention.

The method includes processing input streams into plural PLPs, encoding data of the each PLPs (Physical Layer Pipes), building at least one signal frame, and/or modulating data by OFDM method & transmitting broadcast signals.

In step of processing input streams into plural PLPs, the above described input formatting module may process input streams. The input formatting module can process input streams into BB (Base Band) frames of PLPs. The input formatting module can demultiplex input streams into PLPs.

In step of encoding data of the PLPs, the above described coding & modulation module may encode data of the each PLPs. The PLP can be also referred to as DP. The data in in each data path can be encoded based on a code rate. This step may include LDPC (Low Density Parity Check) encoding, bit interleaving, constellation mapping, MIMO encoding and/or time interleaving. The encoding with LDPC codes may correspond to LDPC encoding by LDPC encoder. The LDPC encoder may encode BB frames in the PLPs with LDPC codes. Bit interleaving may correspond to bit interleaving by bit interleaver. Constellation mapping may correspond to the constellation mapping conducted by constellation mapper. MIMO encoding can refer to MIMO encoding performed by above described MIMO encoder. Time interleaving can correspond to time interleaving by time interleaver.

In step of building at least one signal frame, the above-described frame structure module can build signal frames by mapping the encoded data of the PLPs.

In step of modulating data by OFDM method & transmitting broadcast signals, the above-described waveform generation module can modulate data in OFDM method, and transmit the broadcast signals.

In this embodiment, the bit interelaved data of each PLPs are mapped by using either QAM (Quadrature Amplitude Modulation), NUQ (Non Uniform QAM), or NUC (Non Uniform Constellation). That means, the constellation mapping can be conducted by using QAM, NUQ, or NUC modulation type. Each PLP path can be using different constellation mapping modulation. Such as, a PLP path can be using QAM while other PLP path is using NUC.

In a method of transmitting broadcast signals according to other embodiment of the present invention, the constellations are arranged symmetrically to In-phase axis of complex plane, and also arranged symmetrically to Quadrature axis of complex plane. Each constellation points are arranged symmetrically to I and Q axis of complex plane.

In a method of transmitting broadcast signals according to another embodiment of the present invention, each of the constellations are rotated by multiple of 90 degrees in complex plane, the roated constellations overlap with the original constellations.

In a method of transmitting broadcast signals according to another embodiment of the present invention, the set of the constellations has arbitrary shape, when the bit interleaved data are mapped by using the NUC. The constellation of NUC can have arbitrary shape. The constellation of NUC can have concentric circle shape, based on some embodiment.

In a method of transmitting broadcast signals according to another embodiment of the present invention, the constellations are arranged as shown in FIG. 66.

when the bit interleaved data are mapped by using the NUC, number of the constellations are 64, and the code rate is 6/15.

In a method of transmitting broadcast signals according to another embodiment of the present invention, values of real and imaginary components of the each constellations are expressed as:

| $d_{0,i} d_{1,i} \ldots d_{5,i}$ | $Re(e_i)$ | $Im(e_i)$ |
|---|---|---|
| 000000 | 0.1818 | 0.3417 |
| 000001 | 0.1932 | 0.3354 |
| 000010 | 0.2339 | 0.5929 |
| 000011 | 0.3030 | 0.5607 |
| 000100 | 0.3417 | 0.1818 |
| 000101 | 0.3354 | 0.1932 |
| 000110 | 0.5929 | 0.2339 |
| 000111 | 0.5607 | 0.3030 |
| 001000 | 0.3007 | 1.4778 |
| 001001 | 0.8324 | 1.2575 |
| 001010 | 0.2662 | 1.0483 |
| 001011 | 0.5530 | 0.9295 |
| 001100 | 1.4778 | 0.3007 |
| 001101 | 1.2575 | 0.8324 |
| 001110 | 1.0483 | 0.2662 |
| 001111 | 0.9295 | 0.5530 |
| 010000 | −0.1818 | 0.3417 |
| 010001 | −0.1932 | 0.3354 |
| 010010 | −0.2339 | 0.5929 |
| 010011 | −0.3030 | 0.5607 |
| 010100 | −0.3417 | 0.1818 |
| 010101 | −0.3354 | 0.1932 |
| 010110 | −0.5929 | 0.2339 |
| 010111 | −0.5607 | 0.3030 |
| 011000 | −0.3007 | 1.4778 |
| 011001 | −0.8324 | 1.2575 |
| 011010 | −0.2662 | 1.0483 |
| 011011 | −0.5530 | 0.9295 |
| 011100 | −1.4778 | 0.3007 |
| 011101 | −1.2575 | 0.8324 |
| 011110 | −1.0483 | 0.2662 |
| 011111 | −0.9295 | 0.5530 |
| 100000 | 0.1818 | −0.3417 |
| 100001 | 0.1932 | −0.3354 |
| 100010 | 0.2339 | −0.5929 |
| 100011 | 0.3030 | −0.5607 |
| 100100 | 0.3417 | −0.1818 |
| 100101 | 0.3354 | −0.1932 |
| 100110 | 0.5929 | −0.2339 |
| 100111 | 0.5607 | −0.3030 |
| 101000 | 0.3007 | −1.4778 |
| 101001 | 0.8324 | −1.2575 |
| 101010 | 0.2662 | −1.0483 |
| 101011 | 0.5530 | −0.9295 |
| 101100 | 1.4778 | −0.3007 |
| 101101 | 1.2575 | −0.8324 |
| 101110 | 1.0483 | −0.2662 |
| 101111 | 0.9295 | −0.5530 |
| 110000 | −0.1818 | −0.3417 |
| 110001 | −0.1932 | −0.3354 |
| 110010 | −0.2339 | −0.5929 |
| 110011 | −0.3030 | −0.5607 |
| 110100 | −0.3417 | −0.1818 |
| 110101 | −0.3354 | −0.1932 |
| 110110 | −0.5929 | −0.2339 |
| 110111 | −0.5607 | −0.3030 |
| 111000 | −0.3007 | −1.4778 |
| 111001 | −0.8324 | −1.2575 |
| 111010 | −0.2662 | −1.0483 |
| 111011 | −0.5530 | −0.9295 |
| 111100 | −1.4778 | −0.3007 |
| 111101 | −1.2575 | −0.8324 |
| 111110 | −1.0483 | −0.2662 |
| 111111 | −0.9295 | −0.5530, | wherein the constellations are listed in first column, wherein the values of real components are listed in second column, and wherein the values of imaginary components are listed in third column.

In a method of transmitting broadcast signals according to another embodiment of the present invention, the set of constellations used by an associated PLP is signaled by a PLP modulation parameter in the signal frame. The PLP modulation parameter may located in either PLS1 or PLS2.

The above-described steps can be omitted or replaced by steps executing similar or identical functions according to design.

FIG. 134 illustrates a method of receiving broadcast signal according to an embodiment of the present invention.

The method includes receiving broadcast signals & demodulating data by OFDM method, parsing the at least one signal frame, decoding the data of the each PLPs, and/or processing the decoded data of the each PLPs to output output streams.

In step of receiving broadcast signals & demodulating data by OFDM method, the above-described synchronization & demodulation module receives broadcast signals, and demodulates data by OFDM method.

In step of parsing the at least one signal frame, the above-described frame parsing module parses the signal frame by demapping data of the PLPs.

In step of decoding the data of the PLPs, the above-described demapping & decoding module decodes the PLP data. Step of the decoding the data of the PLPs further includes, time deinterleaving data of at least one PLP, MIMO (Multi Input Multi Output) decoding the time deinterleaved data of the PLP, demapping the MIMO decoded data from a set of constellations according to the code rate, bit deinterleaving the demapped data, and decoding the bit deinterleaved data with LDPC (Low Density Parity Check) codes.

In step of time deinterleaving, the above-described time deinterleaver can conduct time deinterleaving PLP data. In step of MIMO decoding, the above-described MIMO decoder can conduct MIMO decoding PLP data. MIMO decoding can be conducted by using MIMO matrix including MIMO coefficient. MIMO coefficient can be used for adjusting power imbalance. In step of demapping from constellations, the above-described constellation demapper can conduct demapping. The demapping can be conducted on PLP data. In step of bit deinterleaving, the above-described bit deinterleaver can conduct bit deinterleaving. In step of LDPC decoding. the above-described LDPC decoder (or FEC decoder) can decode PLP data according to LDPC code, to output BB frames.

In step of processing the decoded data of the each PLPs to output output streams, the above described output processor may conduct output processing on the BB frames of the PLPs. The output processor may output output streams.

In this embodiment, the MIMO decoded data of the each PLPs are demapped by using either QAM (Quadrature Amplitude Modulation), NUQ (Non Uniform QAM), or NUC (Non Uniform Constellation). That means, the constellation demapping can be conducted by using QAM, NUQ, or NUC modulation type. Each PLP path can be using different constellation demapping modulation. Such as, a PLP path can be using QAM while other PLP path is using NUC.

In a method of receiving broadcast signals according to other embodiment of the present invention, the constellations are arranged symmetrically to In-phase axis of complex plane, and also arranged symmetrically to Quadrature axis of complex plane. Each constellation points are arranged symmetrically to I and Q axis of complex plane.

In a method of receiving broadcast signals according to another embodiment of the present invention, each of the constellations are rotated by multiple of 90 degrees in complex plane, the roated constellations overlap with the original constellations.

In a method of receiving broadcast signals according to another embodiment of the present invention, the set of the constellations has arbitrary shape, when the MIMO decoded data are demapped by using the NUC. The constellation of NUC can have arbitrary shape. The constellation of NUC can have concentric circle shape, based on some embodiment.

In a method of receiving broadcast signals according to another embodiment of the present invention, the constellations are arranged as shown in FIG. 66.

when the MIMO decoded data are demapped by using the NUC, number of the constellations are 64, and the code rate is 6/15.

In a method of receiving broadcast signals according to another embodiment of the present invention, values of real and imaginary components of the each constellations are expressed as:

| $d_{0,i}d_{1,i} \ldots d_{5,i}$ | $Re(e_i)$ | $Im(e_i)$ |
|---|---|---|
| 000000 | 0.1818 | 0.3417 |
| 000001 | 0.1932 | 0.3354 |
| 000010 | 0.2339 | 0.5929 |
| 000011 | 0.3030 | 0.5607 |
| 000100 | 0.3417 | 0.1818 |
| 000101 | 0.3354 | 0.1932 |
| 000110 | 0.5929 | 0.2339 |
| 000111 | 0.5607 | 0.3030 |
| 001000 | 0.3007 | 1.4778 |
| 001001 | 0.8324 | 1.2575 |
| 001010 | 0.2662 | 1.0483 |
| 001011 | 0.5530 | 0.9295 |
| 001100 | 1.4778 | 0.3007 |
| 001101 | 1.2575 | 0.8324 |
| 001110 | 1.0483 | 0.2662 |
| 001111 | 0.9295 | 0.5530 |
| 010000 | −0.1818 | 0.3417 |
| 010001 | −0.1932 | 0.3354 |
| 010010 | −0.2339 | 0.5929 |
| 010011 | −0.3030 | 0.5607 |
| 010100 | −0.3417 | 0.1818 |
| 010101 | −0.3354 | 0.1932 |
| 010110 | −0.5929 | 0.2339 |
| 010111 | −0.5607 | 0.3030 |
| 011000 | −0.3007 | 1.4778 |
| 011001 | −0.8324 | 1.2575 |
| 011010 | −0.2662 | 1.0483 |
| 011011 | −0.5530 | 0.9295 |
| 011100 | −1.4778 | 0.3007 |
| 011101 | −1.2575 | 0.8324 |
| 011110 | −1.0483 | 0.2662 |
| 011111 | −0.9295 | 0.5530 |
| 100000 | 0.1818 | −0.3417 |
| 100001 | 0.1932 | −0.3354 |
| 100010 | 0.2339 | −0.5929 |
| 100011 | 0.3030 | −0.5607 |
| 100100 | 0.3417 | −0.1818 |
| 100101 | 0.3354 | −0.1932 |
| 100110 | 0.5929 | −0.2339 |
| 100111 | 0.5607 | −0.3030 |
| 101000 | 0.3007 | −1.4778 |
| 101001 | 0.8324 | −1.2575 |
| 101010 | 0.2662 | −1.0483 |
| 101011 | 0.5530 | −0.9295 |
| 101100 | 1.4778 | −0.3007 |
| 101101 | 1.2575 | −0.8324 |
| 101110 | 1.0483 | −0.2662 |
| 101111 | 0.9295 | −0.5530 |
| 110000 | −0.1818 | −0.3417 |
| 110001 | −0.1932 | −0.3354 |
| 110010 | −0.2339 | −0.5929 |
| 110011 | −0.3030 | −0.5607 |
| 110100 | −0.3417 | −0.1818 |
| 110101 | −0.3354 | −0.1932 |
| 110110 | −0.5929 | −0.2339 |
| 110111 | −0.5607 | −0.3030 |
| 111000 | −0.3007 | −1.4778 |
| 111001 | −0.8324 | −1.2575 |
| 111010 | −0.2662 | −1.0483 |
| 111011 | −0.5530 | −0.9295 |
| 111100 | −1.4778 | −0.3007 |
| 111101 | −1.2575 | −0.8324 |
| 111110 | −1.0483 | −0.2662 |
| 111111 | −0.9295 | −0.5530, | wherein the constellations are listed in first column, wherein the values of real components are listed in second column, and wherein the values of imaginary components are listed in third column.

In a method of receiving broadcast signals according to another embodiment of the present invention, the set of constellations used by an associated PLP is signaled by a PLP modulation parameter in the signal frame. The PLP modulation parameter may located in either PLS1 or PLS2.

The above-described steps can be omitted or replaced by steps executing similar or identical functions according to design.

Although the description of the present invention is explained with reference to each of the accompanying drawings for clarity, it is possible to design new embodiment(s) by merging the embodiments shown in the accompanying drawings with each other. And, if a recording medium readable by a computer, in which programs for executing the embodiments mentioned in the foregoing description are recorded, is designed in necessity of those skilled in the art, it may belong to the scope of the appended claims and their equivalents.

An apparatus and method according to the present invention may be non-limited by the configurations and methods of the embodiments mentioned in the foregoing description. And, the embodiments mentioned in the foregoing description can be configured in a manner of being selectively combined with one another entirely or in part to enable various modifications.

In addition, a method according to the present invention can be implemented with processor-readable codes in a processor-readable recording medium provided to a network device. The processor-readable medium may include all kinds of recording devices capable of storing data readable by a processor. The processor-readable medium may include one of ROM, RAM, CD-ROM, magnetic tapes, floppy discs, optical data storage devices, and the like for example and also include such a carrier-wave type implementation as a transmission via Internet. Furthermore, as the processor-readable recording medium is distributed to a computer system connected via network, processor-readable codes can be saved and executed according to a distributive system.

It will be appreciated by those skilled in the art that various modifications and variations can be made in the present invention without departing from the spirit or scope of the inventions. Thus, it is intended that the present invention covers the modifications and variations of this invention provided they come within the scope of the appended claims and their equivalents.

Both apparatus and method inventions are mentioned in this specification and descriptions of both of the apparatus and method inventions may be complementarily applicable to each other.

Various embodiments have been described in the best mode for carrying out the invention.

The present invention is available in a series of broadcast signal provision fields.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of transmitting broadcast signals, the method including:

processing input streams into at least one Physical Layer Pipe (PLP);

encoding data of the at least one PLP with LDPC (Low Density Parity Check) codes;

bit interleaving the LDPC encoded data of the at least one PLP;

mapping the bit interleaved data by using Non-Uniform Constellation (NUC) scheme, wherein a number of constellation points of the NUC scheme are 256, and a code rate is 5/15;

time interleaving the mapped data;

building at least one signal frame including the time interleaved data of the at least one PLP; and modulating data in the at least one built signal frame by OFDM (Orthogonal Frequency Division Multiplexing) method and transmitting the broadcast signals having the modulated data, wherein values of real and imaginary components of the constellation points included in the NUC scheme are expressed as:

| $b_{0,i}b_{1,i}\ldots b_{7,i}$ | $Re(e_i)$ | $Im(e_i)$ |
|---|---|---|
| 00000000 | 0.1524 | 0.3087 |
| 00000001 | 0.1525 | 0.3087 |
| 00000010 | 0.1513 | 0.3043 |
| 00000011 | 0.1513 | 0.3043 |
| 00000100 | 0.1682 | 0.3004 |
| 00000101 | 0.1682 | 0.3005 |
| 00000110 | 0.1663 | 0.2964 |
| 00000111 | 0.1663 | 0.2964 |
| 00001000 | 0.1964 | 0.6584 |
| 00001001 | 0.1965 | 0.6583 |
| 00001010 | 0.1967 | 0.6652 |
| 00001011 | 0.1968 | 0.6652 |
| 00001100 | 0.3371 | 0.5987 |
| 00001101 | 0.3370 | 0.5987 |
| 00001110 | 0.3414 | 0.6039 |
| 00001111 | 0.3413 | 0.6039 |
| 00010000 | 0.3087 | 0.1524 |
| 00010001 | 0.3087 | 0.1525 |
| 00010010 | 0.3043 | 0.1513 |
| 00010011 | 0.3043 | 0.1513 |
| 00010100 | 0.3004 | 0.1682 |
| 00010101 | 0.3005 | 0.1682 |
| 00010110 | 0.2964 | 0.1663 |
| 00010111 | 0.2964 | 0.1663 |
| 00011000 | 0.6584 | 0.1964 |
| 00011001 | 0.6583 | 0.1965 |
| 00011010 | 0.6652 | 0.1967 |
| 00011011 | 0.6652 | 0.1968 |
| 00011100 | 0.5987 | 0.3371 |
| 00011101 | 0.5987 | 0.3370 |
| 00011110 | 0.6039 | 0.3414 |
| 00011111 | 0.6039 | 0.3413 |
| 00100000 | 0.3183 | 1.5992 |
| 00100001 | 0.3186 | 1.5991 |
| 00100010 | 0.2756 | 1.3848 |
| 00100011 | 0.2759 | 1.3847 |
| 00100100 | 0.9060 | 1.3557 |
| 00100101 | 0.9058 | 1.3559 |
| 00100110 | 0.7846 | 1.1739 |
| 00100111 | 0.7843 | 1.1741 |
| 00101000 | 0.2257 | 0.9956 |
| 00101001 | 0.2259 | 0.9956 |
| 00101010 | 0.2276 | 1.0326 |
| 00101011 | 0.2278 | 1.0326 |
| 00101100 | 0.5446 | 0.8635 |
| 00101101 | 0.5445 | 0.8636 |
| 00101110 | 0.5694 | 0.8910 |
| 00101111 | 0.5692 | 0.8911 |
| 00110000 | 1.5992 | 0.3183 |
| 00110001 | 1.5991 | 0.3186 |
| 00110010 | 1.3848 | 0.2756 |
| 00110011 | 1.3847 | 0.2759 |
| 00110100 | 1.3557 | 0.9060 |

-continued

| $b_{0,i}b_{1,i}\ldots b_{7,i}$ | $Re(e_i)$ | $Im(e_i)$ |
|---|---|---|
| 00110101 | 1.3559 | 0.9058 |
| 00110110 | 1.1739 | 0.7846 |
| 00110111 | 1.1741 | 0.7843 |
| 00111000 | 0.9956 | 0.2257 |
| 00111001 | 0.9956 | 0.2259 |
| 00111010 | 1.0326 | 0.2276 |
| 00111011 | 1.0326 | 0.2278 |
| 00111100 | 0.8635 | 0.5446 |
| 00111101 | 0.8636 | 0.5445 |
| 00111110 | 0.8910 | 0.5694 |
| 00111111 | 0.8911 | 0.5692 |
| 01000000 | −0.1524 | 0.3087 |
| 01000001 | −0.1525 | 0.3087 |
| 01000010 | −0.1513 | 0.3043 |
| 01000011 | −0.1513 | 0.3043 |
| 01000100 | −0.1682 | 0.3004 |
| 01000101 | −0.1682 | 0.3005 |
| 01000110 | −0.1663 | 0.2964 |
| 01000111 | −0.1663 | 0.2964 |
| 01001000 | −0.1964 | 0.6584 |
| 01001001 | −0.1965 | 0.6583 |
| 01001010 | −0.1967 | 0.6652 |
| 01001011 | −0.1968 | 0.6652 |
| 01001100 | −0.3371 | 0.5987 |
| 01001101 | −0.3370 | 0.5987 |
| 01001110 | −0.3414 | 0.6039 |
| 01001111 | −0.3413 | 0.6039 |
| 01010000 | −0.3087 | 0.1524 |
| 01010001 | −0.3087 | 0.1525 |
| 01010010 | −0.3043 | 0.1513 |
| 01010011 | −0.3043 | 0.1513 |
| 01010100 | −0.3004 | 0.1682 |
| 01010101 | −0.3005 | 0.1682 |
| 01010110 | −0.2964 | 0.1663 |
| 01010111 | −0.2964 | 0.1663 |
| 01011000 | −0.6584 | 0.1964 |
| 01011001 | −0.6583 | 0.1965 |
| 01011010 | −0.6652 | 0.1967 |
| 01011011 | −0.6652 | 0.1968 |
| 01011100 | −0.5987 | 0.3371 |
| 01011101 | −0.5987 | 0.3370 |
| 01011110 | −0.6039 | 0.3414 |
| 01011111 | −0.6039 | 0.3413 |
| 01100000 | −0.3183 | 1.5992 |
| 01100001 | −0.3186 | 1.5991 |
| 01100010 | −0.2756 | 1.3848 |
| 01100011 | −0.2759 | 1.3847 |
| 01100100 | −0.9060 | 1.3557 |
| 01100101 | −0.9058 | 1.3559 |
| 01100110 | −0.7846 | 1.1739 |
| 01100111 | −0.7843 | 1.1741 |
| 01101000 | −0.2257 | 0.9956 |
| 01101001 | −0.2259 | 0.9956 |
| 01101010 | −0.2276 | 1.0326 |
| 01101011 | −0.2278 | 1.0326 |
| 01101100 | −0.5446 | 0.8635 |
| 01101101 | −0.5445 | 0.8636 |
| 01101110 | −0.5694 | 0.8910 |
| 01101111 | −0.5692 | 0.8911 |
| 01110000 | −1.5992 | 0.3183 |
| 01110001 | −1.5991 | 0.3186 |
| 01110010 | −1.3848 | 0.2756 |
| 01110011 | −1.3847 | 0.2759 |
| 01110100 | −1.3557 | 0.9060 |
| 01110101 | −1.3559 | 0.9058 |
| 01110110 | −1.1739 | 0.7846 |
| 01110111 | −1.1741 | 0.7843 |
| 01111000 | −0.9956 | 0.2257 |
| 01111001 | −0.9956 | 0.2259 |
| 01111010 | −1.0326 | 0.2276 |
| 01111011 | −1.0326 | 0.2278 |
| 01111100 | −0.8635 | 0.5446 |
| 01111101 | −0.8636 | 0.5445 |
| 01111110 | −0.8910 | 0.5694 |
| 01111111 | −0.8911 | 0.5692 |
| 10000000 | 0.1524 | −0.3087 |
| 10000001 | 0.1525 | −0.3087 |

-continued

| $b_{0,i}b_{1,i}\ldots b_{7,i}$ | $Re(e_i)$ | $Im(e_i)$ |
|---|---|---|
| 10000010 | 0.1513 | −0.3043 |
| 10000011 | 0.1513 | −0.3043 |
| 10000100 | 0.1682 | −0.3004 |
| 10000101 | 0.1682 | −0.3005 |
| 10000110 | 0.1663 | −0.2964 |
| 10000111 | 0.1663 | −0.2964 |
| 10001000 | 0.1964 | −0.6584 |
| 10001001 | 0.1965 | −0.6583 |
| 10001010 | 0.1967 | −0.6652 |
| 10001011 | 0.1968 | −0.6652 |
| 10001100 | 0.3371 | −0.5987 |
| 10001101 | 0.3370 | −0.5987 |
| 10001110 | 0.3414 | −0.6039 |
| 10001111 | 0.3413 | −0.6039 |
| 10010000 | 0.3087 | −0.1524 |
| 10010001 | 0.3087 | −0.1525 |
| 10010010 | 0.3043 | −0.1513 |
| 10010011 | 0.3043 | −0.1513 |
| 10010100 | 0.3004 | −0.1682 |
| 10010101 | 0.3005 | −0.1682 |
| 10010110 | 0.2964 | −0.1663 |
| 10010111 | 0.2964 | −0.1663 |
| 10011000 | 0.6584 | −0.1964 |
| 10011001 | 0.6583 | −0.1965 |
| 10011010 | 0.6652 | −0.1967 |
| 10011011 | 0.6652 | −0.1968 |
| 10011100 | 0.5987 | −0.3371 |
| 10011101 | 0.5987 | −0.3370 |
| 10011110 | 0.6039 | −0.3414 |
| 10011111 | 0.6039 | −0.3413 |
| 10100000 | 0.3183 | −1.5992 |
| 10100001 | 0.3186 | −1.5991 |
| 10100010 | 0.2756 | −1.3848 |
| 10100011 | 0.2759 | −1.3847 |
| 10100100 | 0.9060 | −1.3557 |
| 10100101 | 0.9058 | −1.3559 |
| 10100110 | 0.7846 | −1.1739 |
| 10100111 | 0.7843 | −1.1741 |
| 10101000 | 0.2257 | −0.9956 |
| 10101001 | 0.2259 | −0.9956 |
| 10101010 | 0.2276 | −1.0326 |
| 10101011 | 0.2278 | −1.0326 |
| 10101100 | 0.5446 | −0.8635 |
| 10101101 | 0.5445 | −0.8636 |
| 10101110 | 0.5694 | −0.8910 |
| 10101111 | 0.5692 | −0.8911 |
| 10110000 | 1.5992 | −0.3183 |
| 10110001 | 1.5991 | −0.3186 |
| 10110010 | 1.3848 | −0.2756 |
| 10110011 | 1.3847 | −0.2759 |
| 10110100 | 1.3557 | −0.9060 |
| 10110101 | 1.3559 | −0.9058 |
| 10110110 | 1.1739 | −0.7846 |
| 10110111 | 1.1741 | −0.7843 |
| 10111000 | 0.9956 | −0.2257 |
| 10111001 | 0.9956 | −0.2259 |
| 10111010 | 1.0326 | −0.2276 |
| 10111011 | 1.0326 | −0.2278 |
| 10111100 | 0.8635 | −0.5446 |
| 10111101 | 0.8636 | −0.5445 |
| 10111110 | 0.8910 | −0.5694 |
| 10111111 | 0.8911 | −0.5692 |
| 11000000 | −0.1524 | −0.3087 |
| 11000001 | −0.1525 | −0.3087 |
| 11000010 | −0.1513 | −0.3043 |
| 11000011 | −0.1513 | −0.3043 |
| 11000100 | −0.1682 | −0.3004 |
| 11000101 | −0.1682 | −0.3005 |
| 11000110 | −0.1663 | −0.2964 |
| 11000111 | −0.1663 | −0.2964 |
| 11001000 | −0.1964 | −0.6584 |
| 11001001 | −0.1965 | −0.6583 |
| 11001010 | −0.1967 | −0.6652 |
| 11001011 | −0.1968 | −0.6652 |
| 11001100 | −0.3371 | −0.5987 |
| 11001101 | −0.3370 | −0.5987 |
| 11001110 | −0.3414 | −0.6039 |

-continued

| $b_{0,i}b_{1,i}\ldots b_{7,i}$ | $Re(e_i)$ | $Im(e_i)$ |
|---|---|---|
| 11001111 | −0.3413 | −0.6039 |
| 11010000 | −0.3087 | −0.1524 |
| 11010001 | −0.3087 | −0.1525 |
| 11010010 | −0.3043 | −0.1513 |
| 11010011 | −0.3043 | −0.1513 |
| 11010100 | −0.3004 | −0.1682 |
| 11010101 | −0.3005 | −0.1682 |
| 11010110 | −0.2964 | −0.1663 |
| 11010111 | −0.2964 | −0.1663 |
| 11011000 | −0.6584 | −0.1964 |
| 11011001 | −0.6583 | −0.1965 |
| 11011010 | −0.6652 | −0.1967 |
| 11011011 | −0.6652 | −0.1968 |
| 11011100 | −0.5987 | −0.3371 |
| 11011101 | −0.5987 | −0.3370 |
| 11011110 | −0.6039 | −0.3414 |
| 11011111 | −0.6039 | −0.3413 |
| 11100000 | −0.3183 | −1.5992 |
| 11100001 | −0.3186 | −1.5991 |
| 11100010 | −0.2756 | −1.3848 |
| 11100011 | −0.2759 | −1.3847 |
| 11100100 | −0.9060 | −1.3557 |
| 11100101 | −0.9058 | −1.3559 |
| 11100110 | −0.7846 | −1.1739 |
| 11100111 | −0.7843 | −1.1741 |
| 11101000 | −0.2257 | −0.9956 |
| 11101001 | −0.2259 | −0.9956 |
| 11101010 | −0.2276 | −1.0326 |
| 11101011 | −0.2278 | −1.0326 |
| 11101100 | −0.5446 | −0.8635 |
| 11101101 | −0.5445 | −0.8636 |
| 11101110 | −0.5694 | −0.8910 |
| 11101111 | −0.5692 | −0.8911 |
| 11110000 | −1.5992 | −0.3183 |
| 11110001 | −1.5991 | −0.3186 |
| 11110010 | −1.3848 | −0.2756 |
| 11110011 | −1.3847 | −0.2759 |
| 11110100 | −1.3557 | −0.9060 |
| 11110101 | −1.3559 | −0.9058 |
| 11110110 | −1.1739 | −0.7846 |
| 11110111 | −1.1741 | −0.7843 |
| 11111000 | −0.9956 | −0.2257 |
| 11111001 | −0.9956 | −0.2259 |
| 11111010 | −1.0326 | −0.2276 |
| 11111011 | −1.0326 | −0.2278 |
| 11111100 | −0.8635 | −0.5446 |
| 11111101 | −0.8636 | −0.5445 |
| 11111110 | −0.8910 | −0.5694 |
| 11111111 | −0.8911 | −0.5692 | wherein the constellation points are listed in a column labeled $b_{0,i}$, $b_{1,i}$, . . . , $b_{7,i}$, wherein the values of real components are listed in a column labeled $Re(e_i)$, and wherein the values of imaginary components are listed in a column labeled $Im(e_i)$.

2. The method of claim 1, wherein the constellation points are arranged symmetrically to In-phase axis of complex plane, and
wherein the constellation points are arranged symmetrically to Quadrature axis of complex plane.

3. The method of claim 1, when each of the constellation points are rotated by multiple of 90 degrees in complex plane, the rotated constellation points overlap with the original constellations.

4. The method of claim 1, wherein a set of the constellation points has arbitrary shape, when the bit interleaved data are mapped by using the NUC scheme.

5. The method of claim 1, wherein the constellation points are arranged according to FIG. 63
when the bit interleaved data are mapped by using the NUC scheme, the number of the constellation points are 256, and the code rate is 5/15.

6. The method of claim 1, wherein the constellation points of the NUC scheme used by an associated PLP is signaled by a PLP modulation parameter in the at least one built signal frame.

7. A method of receiving broadcast signals, the method including:
receiving the broadcast signals having at least one signal frame and demodulating data in the at least one signal frame by OFDM (Orthogonal Frequency Division Multiplexing) method;
parsing the at least one signal frame by demapping demodulated data of at least one Physical Layer Pipe (PLP);
time deinterleaving demapped data of the at least one PLP;
demapping the time deinterleaved data by using Non-Uniform Constellation (NUC) scheme, wherein a number of constellation points of the NUC scheme are 256, and a code rate is 5/15;
bit deinterleaving the demapped deinterleaved data;
decoding the bit deinterleaved data with LDPC (Low Density Parity Check) codes; and
processing the decoded data of the at least one PLP to generate output streams, wherein values of real and imaginary components of the constellation points included in the NUC scheme are expressed as:

| $b_{0,i}b_{1,i}\ldots b_{7,i}$ | $Re(e_i)$ | $Im(e_i)$ |
|---|---|---|
| 00000000 | 0.1524 | 0.3087 |
| 00000001 | 0.1525 | 0.3087 |
| 00000010 | 0.1513 | 0.3043 |
| 00000011 | 0.1513 | 0.3043 |
| 00000100 | 0.1682 | 0.3004 |
| 00000101 | 0.1682 | 0.3005 |
| 00000110 | 0.1663 | 0.2964 |
| 00000111 | 0.1663 | 0.2964 |
| 00001000 | 0.1964 | 0.6584 |
| 00001001 | 0.1965 | 0.6583 |
| 00001010 | 0.1967 | 0.6652 |
| 00001011 | 0.1968 | 0.6652 |
| 00001100 | 0.3371 | 0.5987 |
| 00001101 | 0.3370 | 0.5987 |
| 00001110 | 0.3414 | 0.6039 |
| 00001111 | 0.3413 | 0.6039 |
| 00010000 | 0.3087 | 0.1524 |
| 00010001 | 0.3087 | 0.1525 |
| 00010010 | 0.3043 | 0.1513 |
| 00010011 | 0.3043 | 0.1513 |
| 00010100 | 0.3004 | 0.1682 |
| 00010101 | 0.3005 | 0.1682 |
| 00010110 | 0.2964 | 0.1663 |
| 00010111 | 0.2964 | 0.1663 |
| 00011000 | 0.6584 | 0.1964 |
| 00011001 | 0.6583 | 0.1965 |
| 00011010 | 0.6652 | 0.1967 |
| 00011011 | 0.6652 | 0.1968 |
| 00011100 | 0.5987 | 0.3371 |
| 00011101 | 0.5987 | 0.3370 |
| 00011110 | 0.6039 | 0.3414 |
| 00011111 | 0.6039 | 0.3413 |
| 00100000 | 0.3183 | 1.5992 |
| 00100001 | 0.3186 | 1.5991 |
| 00100010 | 0.2756 | 1.3848 |
| 00100011 | 0.2759 | 1.3847 |
| 00100100 | 0.9060 | 1.3557 |
| 00100101 | 0.9058 | 1.3559 |
| 00100110 | 0.7846 | 1.1739 |
| 00100111 | 0.7843 | 1.1741 |
| 00101000 | 0.2257 | 0.9956 |
| 00101001 | 0.2259 | 0.9956 |
| 00101010 | 0.2276 | 1.0326 |
| 00101011 | 0.2278 | 1.0326 |
| 00101100 | 0.5446 | 0.8635 |
| 00101101 | 0.5445 | 0.8636 |

-continued

| $b_{0,i}b_{1,i}\ldots b_{7,i}$ | $Re(e_i)$ | $Im(e_i)$ |
|---|---|---|
| 00101110 | 0.5694 | 0.8910 |
| 00101111 | 0.5692 | 0.8911 |
| 00110000 | 1.5992 | 0.3183 |
| 00110001 | 1.5991 | 0.3186 |
| 00110010 | 1.3848 | 0.2756 |
| 00110011 | 1.3847 | 0.2759 |
| 00110100 | 1.3557 | 0.9060 |
| 00110101 | 1.3559 | 0.9058 |
| 00110110 | 1.1739 | 0.7846 |
| 00110111 | 1.1741 | 0.7843 |
| 00111000 | 0.9956 | 0.2257 |
| 00111001 | 0.9956 | 0.2259 |
| 00111010 | 1.0326 | 0.2276 |
| 00111011 | 1.0326 | 0.2278 |
| 00111100 | 0.8635 | 0.5446 |
| 00111101 | 0.8636 | 0.5445 |
| 00111110 | 0.8910 | 0.5694 |
| 00111111 | 0.8911 | 0.5692 |
| 01000000 | −0.1524 | 0.3087 |
| 01000001 | −0.1525 | 0.3087 |
| 01000010 | −0.1513 | 0.3043 |
| 01000011 | −0.1513 | 0.3043 |
| 01000100 | −0.1682 | 0.3004 |
| 01000101 | −0.1682 | 0.3005 |
| 01000110 | −0.1663 | 0.2964 |
| 01000111 | −0.1663 | 0.2964 |
| 01001000 | −0.1964 | 0.6584 |
| 01001001 | −0.1965 | 0.6583 |
| 01001010 | −0.1967 | 0.6652 |
| 01001011 | −0.1968 | 0.6652 |
| 01001100 | −0.3371 | 0.5987 |
| 01001101 | −0.3370 | 0.5987 |
| 01001110 | −0.3414 | 0.6039 |
| 01001111 | −0.3413 | 0.6039 |
| 01010000 | −0.3087 | 0.1524 |
| 01010001 | −0.3087 | 0.1525 |
| 01010010 | −0.3043 | 0.1513 |
| 01010011 | −0.3043 | 0.1513 |
| 01010100 | −0.3004 | 0.1682 |
| 01010101 | −0.3005 | 0.1682 |
| 01010110 | −0.2964 | 0.1663 |
| 01010111 | −0.2964 | 0.1663 |
| 01011000 | −0.6584 | 0.1964 |
| 01011001 | −0.6583 | 0.1965 |
| 01011010 | −0.6652 | 0.1967 |
| 01011011 | −0.6652 | 0.1968 |
| 01011100 | −0.5987 | 0.3371 |
| 01011101 | −0.5987 | 0.3370 |
| 01011110 | −0.6039 | 0.3414 |
| 01011111 | −0.6039 | 0.3413 |
| 01100000 | −0.3183 | 1.5992 |
| 01100001 | −0.3186 | 1.5991 |
| 01100010 | −0.2756 | 1.3848 |
| 01100011 | −0.2759 | 1.3847 |
| 01100100 | −0.9060 | 1.3557 |
| 01100101 | −0.9058 | 1.3559 |
| 01100110 | −0.7846 | 1.1739 |
| 01100111 | −0.7843 | 1.1741 |
| 01101000 | −0.2257 | 0.9956 |
| 01101001 | −0.2259 | 0.9956 |
| 01101010 | −0.2276 | 1.0326 |
| 01101011 | −0.2278 | 1.0326 |
| 01101100 | −0.5446 | 0.8635 |
| 01101101 | −0.5445 | 0.8636 |
| 01101110 | −0.5694 | 0.8910 |
| 01101111 | −0.5692 | 0.8911 |
| 01110000 | −1.5992 | 0.3183 |
| 01110001 | −1.5991 | 0.3186 |
| 01110010 | −1.3848 | 0.2756 |
| 01110011 | −1.3847 | 0.2759 |
| 01110100 | −1.3557 | 0.9060 |
| 01110101 | −1.3559 | 0.9058 |
| 01110110 | −1.1739 | 0.7846 |
| 01110111 | −1.1741 | 0.7843 |
| 01111000 | −0.9956 | 0.2257 |
| 01111001 | −0.9956 | 0.2259 |
| 01111010 | −1.0326 | 0.2276 |
| 01111011 | −1.0326 | 0.2278 |
| 01111100 | −0.8635 | 0.5446 |
| 01111101 | −0.8636 | 0.5445 |
| 01111110 | −0.8910 | 0.5694 |
| 01111111 | −0.8911 | 0.5692 |
| 10000000 | 0.1524 | −0.3087 |
| 10000001 | 0.1525 | −0.3087 |
| 10000010 | 0.1513 | −0.3043 |
| 10000011 | 0.1513 | −0.3043 |
| 10000100 | 0.1682 | −0.3004 |
| 10000101 | 0.1682 | −0.3005 |
| 10000110 | 0.1663 | −0.2964 |
| 10000111 | 0.1663 | −0.2964 |
| 10001000 | 0.1964 | −0.6584 |
| 10001001 | 0.1965 | −0.6583 |
| 10001010 | 0.1967 | −0.6652 |
| 10001011 | 0.1968 | −0.6652 |
| 10001100 | 0.3371 | −0.5987 |
| 10001101 | 0.3370 | −0.5987 |
| 10001110 | 0.3414 | −0.6039 |
| 10001111 | 0.3413 | −0.6039 |
| 10010000 | 0.3087 | −0.1524 |
| 10010001 | 0.3087 | −0.1525 |
| 10010010 | 0.3043 | −0.1513 |
| 10010011 | 0.3043 | −0.1513 |
| 10010100 | 0.3004 | −0.1682 |
| 10010101 | 0.3005 | −0.1682 |
| 10010110 | 0.2964 | −0.1663 |
| 10010111 | 0.2964 | −0.1663 |
| 10011000 | 0.6584 | −0.1964 |
| 10011001 | 0.6583 | −0.1965 |
| 10011010 | 0.6652 | −0.1967 |
| 10011011 | 0.6652 | −0.1968 |
| 10011100 | 0.5987 | −0.3371 |
| 10011101 | 0.5987 | −0.3370 |
| 10011110 | 0.6039 | −0.3414 |
| 10011111 | 0.6039 | −0.3413 |
| 10100000 | 0.3183 | −1.5992 |
| 10100001 | 0.3186 | −1.5991 |
| 10100010 | 0.2756 | −1.3848 |
| 10100011 | 0.2759 | −1.3847 |
| 10100100 | 0.9060 | −1.3557 |
| 10100101 | 0.9058 | −1.3559 |
| 10100110 | 0.7846 | −1.1739 |
| 10100111 | 0.7843 | −1.1741 |
| 10101000 | 0.2257 | −0.9956 |
| 10101001 | 0.2259 | −0.9956 |
| 10101010 | 0.2276 | −1.0326 |
| 10101011 | 0.2278 | −1.0326 |
| 10101100 | 0.5446 | −0.8635 |
| 10101101 | 0.5445 | −0.8636 |
| 10101110 | 0.5694 | −0.8910 |
| 10101111 | 0.5692 | −0.8911 |
| 10110000 | 1.5992 | −0.3183 |
| 10110001 | 1.5991 | −0.3186 |
| 10110010 | 1.3848 | −0.2756 |
| 10110011 | 1.3847 | −0.2759 |
| 10110100 | 1.3557 | −0.9060 |
| 10110101 | 1.3559 | −0.9058 |
| 10110110 | 1.1739 | −0.7846 |
| 10110111 | 1.1741 | −0.7843 |
| 10111000 | 0.9956 | −0.2257 |
| 10111001 | 0.9956 | −0.2259 |
| 10111010 | 1.0326 | −0.2276 |
| 10111011 | 1.0326 | −0.2278 |
| 10111100 | 0.8635 | −0.5446 |
| 10111101 | 0.8636 | −0.5445 |
| 10111110 | 0.8910 | −0.5694 |
| 10111111 | 0.8911 | −0.5692 |
| 11000000 | −0.1524 | −0.3087 |
| 11000001 | −0.1525 | −0.3087 |
| 11000010 | −0.1513 | −0.3043 |
| 11000011 | −0.1513 | −0.3043 |
| 11000100 | −0.1682 | −0.3004 |
| 11000101 | −0.1682 | −0.3005 |
| 11000110 | −0.1663 | −0.2964 |
| 11000111 | −0.1663 | −0.2964 |

-continued

| $b_{0,i}b_{1,i}\ldots b_{7,i}$ | $Re(e_i)$ | $Im(e_i)$ |
|---|---|---|
| 11001000 | −0.1964 | −0.6584 |
| 11001001 | −0.1965 | −0.6583 |
| 11001010 | −0.1967 | −0.6652 |
| 11001011 | −0.1968 | −0.6652 |
| 11001100 | −0.3371 | −0.5987 |
| 11001101 | −0.3370 | −0.5987 |
| 11001110 | −0.3414 | −0.6039 |
| 11001111 | −0.3413 | −0.6039 |
| 11010000 | −0.3087 | −0.1524 |
| 11010001 | −0.3087 | −0.1525 |
| 11010010 | −0.3043 | −0.1513 |
| 11010011 | −0.3043 | −0.1513 |
| 11010100 | −0.3004 | −0.1682 |
| 11010101 | −0.3005 | −0.1682 |
| 11010110 | −0.2964 | −0.1663 |
| 11010111 | −0.2964 | −0.1663 |
| 11011000 | −0.6584 | −0.1964 |
| 11011001 | −0.6583 | −0.1965 |
| 11011010 | −0.6652 | −0.1967 |
| 11011011 | −0.6652 | −0.1968 |
| 11011100 | −0.5987 | −0.3371 |
| 11011101 | −0.5987 | −0.3370 |
| 11011110 | −0.6039 | −0.3414 |
| 11011111 | −0.6039 | −0.3413 |
| 11100000 | −0.3183 | −1.5992 |
| 11100001 | −0.3186 | −1.5991 |
| 11100010 | −0.2756 | −1.3848 |
| 11100011 | −0.2759 | −1.3847 |
| 11100100 | −0.9060 | −1.3557 |
| 11100101 | −0.9058 | −1.3559 |
| 11100110 | −0.7846 | −1.1739 |
| 11100111 | −0.7843 | −1.1741 |
| 11101000 | −0.2257 | −0.9956 |
| 11101001 | −0.2259 | −0.9956 |
| 11101010 | −0.2276 | −1.0326 |
| 11101011 | −0.2278 | −1.0326 |
| 11101100 | −0.5446 | −0.8635 |
| 11101101 | −0.5445 | −0.8636 |
| 11101110 | −0.5694 | −0.8910 |
| 11101111 | −0.5692 | −0.8911 |
| 11110000 | −1.5992 | −0.3183 |
| 11110001 | −1.5991 | −0.3186 |
| 11110010 | −1.3848 | −0.2756 |
| 11110011 | −1.3847 | −0.2759 |
| 11110100 | −1.3557 | −0.9060 |
| 11110101 | −1.3559 | −0.9058 |
| 11110110 | −1.1739 | −0.7846 |
| 11110111 | −1.1741 | −0.7843 |
| 11111000 | −0.9956 | −0.2257 |
| 11111001 | −0.9956 | −0.2259 |
| 11111010 | −1.0326 | −0.2276 |
| 11111011 | −1.0326 | −0.2278 |
| 11111100 | −0.8635 | −0.5446 |
| 11111101 | −0.8636 | −0.5445 |
| 11111110 | −0.8910 | −0.5694 |
| 11111111 | −0.8911 | −0.5692 | wherein the constellation points are listed in a column labeled $b_{0,i}, b_{1,i}, \ldots, b_{7,i}$, wherein the values of real components are listed in a column labeled $Re(e_i)$, and wherein the values of imaginary components are listed in a column labeled $Im(e_i)$.

8. The method of claim 7, wherein the constellation points are arranged symmetrically to In-phase axis of complex plane, and
wherein the constellation points are arranged symmetrically to Quadrature axis of complex plane.

9. The method of claim 7, when each of the constellation points are rotated by multiple of 90 degrees in complex plane, the rotated constellation points overlap with the original constellations.

10. The method of claim 7, wherein a set of the constellation points has arbitrary shape, when the MIMO decoded data are demapped by using the NUC scheme.

11. The method of claim 7, wherein the constellation points are arranged according to FIG. 63
when the time deinterleaved data are demapped by using the NUC scheme, the number of the constellation points are 256, and the code rate is 5/15.

12. The method of claim 7, wherein the constellation points of the NUC scheme used by an associated PLP is signaled by a PLP modulation parameter in the at least one built signal frame.

13. An apparatus for transmitting broadcast signals, the apparatus including:
an input processing module to process input streams into at least one Physical Layer Pipe (PLP);
an LDPC block to encode data of the at least one PLP with LDPC (Low Density Parity Check) codes;
a bit interleaving block to bit interleave the LDPC encoded data of the at least one PLP;
a mapping block to map the bit interleaved data by using Non-Uniform Constellation (NUC) scheme, wherein a number of constellation points of the NUC scheme are 256, and a code rate is 5/15;
a time interleaving block to time interleave the mapped data;
a frame building module to build at least one signal frame including the time interleaved data of the at least one PLP; and
an OFDM module to modulate data in the at least one built signal frame by OFDM (Orthogonal Frequency Division Multiplexing) method and to transmit the broadcast signals having the modulated data,
wherein values of real and imaginary components of the constellation points included in the NUC scheme are expressed as:

| $b_{0,i}b_{1,i}\ldots b_{7,i}$ | $Re(e_i)$ | $Im(e_i)$ |
|---|---|---|
| 00000000 | 0.1524 | 0.3087 |
| 00000001 | 0.1525 | 0.3087 |
| 00000010 | 0.1513 | 0.3043 |
| 00000011 | 0.1513 | 0.3043 |
| 00000100 | 0.1682 | 0.3004 |
| 00000101 | 0.1682 | 0.3005 |
| 00000110 | 0.1663 | 0.2964 |
| 00000111 | 0.1663 | 0.2964 |
| 00001000 | 0.1964 | 0.6584 |
| 00001001 | 0.1965 | 0.6583 |
| 00001010 | 0.1967 | 0.6652 |
| 00001011 | 0.1968 | 0.6652 |
| 00001100 | 0.3371 | 0.5987 |
| 00001101 | 0.3370 | 0.5987 |
| 00001110 | 0.3414 | 0.6039 |
| 00001111 | 0.3413 | 0.6039 |
| 00010000 | 0.3087 | 0.1524 |
| 00010001 | 0.3087 | 0.1525 |
| 00010010 | 0.3043 | 0.1513 |
| 00010011 | 0.3043 | 0.1513 |
| 00010100 | 0.3004 | 0.1682 |
| 00010101 | 0.3005 | 0.1682 |
| 00010110 | 0.2964 | 0.1663 |
| 00010111 | 0.2964 | 0.1663 |
| 00011000 | 0.6584 | 0.1964 |
| 00011001 | 0.6583 | 0.1965 |
| 00011010 | 0.6652 | 0.1967 |
| 00011011 | 0.6652 | 0.1968 |
| 00011100 | 0.5987 | 0.3371 |
| 00011101 | 0.5987 | 0.3370 |
| 00011110 | 0.6039 | 0.3414 |
| 00011111 | 0.6039 | 0.3413 |
| 00100000 | 0.3183 | 1.5992 |
| 00100001 | 0.3186 | 1.5991 |
| 00100010 | 0.2756 | 1.3848 |
| 00100011 | 0.2759 | 1.3847 |

| $b_{0,i}b_{1,i}\ldots b_{7,i}$ | $\mathrm{Re}(e_i)$ | $\mathrm{Im}(e_i)$ |
|---|---|---|
| 00100100 | 0.9060 | 1.3557 |
| 00100101 | 0.9058 | 1.3559 |
| 00100110 | 0.7846 | 1.1739 |
| 00100111 | 0.7843 | 1.1741 |
| 00101000 | 0.2257 | 0.9956 |
| 00101001 | 0.2259 | 0.9956 |
| 00101010 | 0.2276 | 1.0326 |
| 00101011 | 0.2278 | 1.0326 |
| 00101100 | 0.5446 | 0.8635 |
| 00101101 | 0.5445 | 0.8636 |
| 00101110 | 0.5694 | 0.8910 |
| 00101111 | 0.5692 | 0.8911 |
| 00110000 | 1.5992 | 0.3183 |
| 00110001 | 1.5991 | 0.3186 |
| 00110010 | 1.3848 | 0.2756 |
| 00110011 | 1.3847 | 0.2759 |
| 00110100 | 1.3557 | 0.9060 |
| 00110101 | 1.3559 | 0.9058 |
| 00110110 | 1.1739 | 0.7846 |
| 00110111 | 1.1741 | 0.7843 |
| 00111000 | 0.9956 | 0.2257 |
| 00111001 | 0.9956 | 0.2259 |
| 00111010 | 1.0326 | 0.2276 |
| 00111011 | 1.0326 | 0.2278 |
| 00111100 | 0.8635 | 0.5446 |
| 00111101 | 0.8636 | 0.5445 |
| 00111110 | 0.8910 | 0.5694 |
| 00111111 | 0.8911 | 0.5692 |
| 01000000 | −0.1524 | 0.3087 |
| 01000001 | −0.1525 | 0.3087 |
| 01000010 | −0.1513 | 0.3043 |
| 01000011 | −0.1513 | 0.3043 |
| 01000100 | −0.1682 | 0.3004 |
| 01000101 | −0.1682 | 0.3005 |
| 01000110 | −0.1663 | 0.2964 |
| 01000111 | −0.1663 | 0.2964 |
| 01001000 | −0.1964 | 0.6584 |
| 01001001 | −0.1965 | 0.6583 |
| 01001010 | −0.1967 | 0.6652 |
| 01001011 | −0.1968 | 0.6652 |
| 01001100 | −0.3371 | 0.5987 |
| 01001101 | −0.3370 | 0.5987 |
| 01001110 | −0.3414 | 0.6039 |
| 01001111 | −0.3413 | 0.6039 |
| 01010000 | −0.3087 | 0.1524 |
| 01010001 | −0.3087 | 0.1525 |
| 01010010 | −0.3043 | 0.1513 |
| 01010011 | −0.3043 | 0.1513 |
| 01010100 | −0.3004 | 0.1682 |
| 01010101 | −0.3005 | 0.1682 |
| 01010110 | −0.2964 | 0.1663 |
| 01010111 | −0.2964 | 0.1663 |
| 01011000 | −0.6584 | 0.1964 |
| 01011001 | −0.6583 | 0.1965 |
| 01011010 | −0.6652 | 0.1967 |
| 01011011 | −0.6652 | 0.1968 |
| 01011100 | −0.5987 | 0.3371 |
| 01011101 | −0.5987 | 0.3370 |
| 01011110 | −0.6039 | 0.3414 |
| 01011111 | −0.6039 | 0.3413 |
| 01100000 | −0.3183 | 1.5992 |
| 01100001 | −0.3186 | 1.5991 |
| 01100010 | −0.2756 | 1.3848 |
| 01100011 | −0.2759 | 1.3847 |
| 01100100 | −0.9060 | 1.3557 |
| 01100101 | −0.9058 | 1.3559 |
| 01100110 | −0.7846 | 1.1739 |
| 01100111 | −0.7843 | 1.1741 |
| 01101000 | −0.2257 | 0.9956 |
| 01101001 | −0.2259 | 0.9956 |
| 01101010 | −0.2276 | 1.0326 |
| 01101011 | −0.2278 | 1.0326 |
| 01101100 | −0.5446 | 0.8635 |
| 01101101 | −0.5445 | 0.8636 |
| 01101110 | −0.5694 | 0.8910 |
| 01101111 | −0.5692 | 0.8911 |
| 01110000 | −1.5992 | 0.3183 |
| 01110001 | −1.5991 | 0.3186 |
| 01110010 | −1.3848 | 0.2756 |
| 01110011 | −1.3847 | 0.2759 |
| 01110100 | −1.3557 | 0.9060 |
| 01110101 | −1.3559 | 0.9058 |
| 01110110 | −1.1739 | 0.7846 |
| 01110111 | −1.1741 | 0.7843 |
| 01111000 | −0.9956 | 0.2257 |
| 01111001 | −0.9956 | 0.2259 |
| 01111010 | −1.0326 | 0.2276 |
| 01111011 | −1.0326 | 0.2278 |
| 01111100 | −0.8635 | 0.5446 |
| 01111101 | −0.8636 | 0.5445 |
| 01111110 | −0.8910 | 0.5694 |
| 01111111 | −0.8911 | 0.5692 |
| 10000000 | 0.1524 | −0.3087 |
| 10000001 | 0.1525 | −0.3087 |
| 10000010 | 0.1513 | −0.3043 |
| 10000011 | 0.1513 | −0.3043 |
| 10000100 | 0.1682 | −0.3004 |
| 10000101 | 0.1682 | −0.3005 |
| 10000110 | 0.1663 | −0.2964 |
| 10000111 | 0.1663 | −0.2964 |
| 10001000 | 0.1964 | −0.6584 |
| 10001001 | 0.1965 | −0.6583 |
| 10001010 | 0.1967 | −0.6652 |
| 10001011 | 0.1968 | −0.6652 |
| 10001100 | 0.3371 | −0.5987 |
| 10001101 | 0.3370 | −0.5987 |
| 10001110 | 0.3414 | −0.6039 |
| 10001111 | 0.3413 | −0.6039 |
| 10010000 | 0.3087 | −0.1524 |
| 10010001 | 0.3087 | −0.1525 |
| 10010010 | 0.3043 | −0.1513 |
| 10010011 | 0.3043 | −0.1513 |
| 10010100 | 0.3004 | −0.1682 |
| 10010101 | 0.3005 | −0.1682 |
| 10010110 | 0.2964 | −0.1663 |
| 10010111 | 0.2964 | −0.1663 |
| 10011000 | 0.6584 | −0.1964 |
| 10011001 | 0.6583 | −0.1965 |
| 10011010 | 0.6652 | −0.1967 |
| 10011011 | 0.6652 | −0.1968 |
| 10011100 | 0.5987 | −0.3371 |
| 10011101 | 0.5987 | −0.3370 |
| 10011110 | 0.6039 | −0.3414 |
| 10011111 | 0.6039 | −0.3413 |
| 10100000 | 0.3183 | −1.5992 |
| 10100001 | 0.3186 | −1.5991 |
| 10100010 | 0.2756 | −1.3848 |
| 10100011 | 0.2759 | −1.3847 |
| 10100100 | 0.9060 | −1.3557 |
| 10100101 | 0.9058 | −1.3559 |
| 10100110 | 0.7846 | −1.1739 |
| 10100111 | 0.7843 | −1.1741 |
| 10101000 | 0.2257 | −0.9956 |
| 10101001 | 0.2259 | −0.9956 |
| 10101010 | 0.2276 | −1.0326 |
| 10101011 | 0.2278 | −1.0326 |
| 10101100 | 0.5446 | −0.8635 |
| 10101101 | 0.5445 | −0.8636 |
| 10101110 | 0.5694 | −0.8910 |
| 10101111 | 0.5692 | −0.8911 |
| 10110000 | 1.5992 | −0.3183 |
| 10110001 | 1.5991 | −0.3186 |
| 10110010 | 1.3848 | −0.2756 |
| 10110011 | 1.3847 | −0.2759 |
| 10110100 | 1.3557 | −0.9060 |
| 10110101 | 1.3559 | −0.9058 |
| 10110110 | 1.1739 | −0.7846 |
| 10110111 | 1.1741 | −0.7843 |
| 10111000 | 0.9956 | −0.2257 |
| 10111001 | 0.9956 | −0.2259 |
| 10111010 | 1.0326 | −0.2276 |
| 10111011 | 1.0326 | −0.2278 |
| 10111100 | 0.8635 | −0.5446 |
| 10111101 | 0.8636 | −0.5445 |

-continued

| $b_{0,i}b_{1,i}\ldots b_{7,i}$ | $Re(e_i)$ | $Im(e_i)$ |
|---|---|---|
| 10111110 | 0.8910 | −0.5694 |
| 10111111 | 0.8911 | −0.5692 |
| 11000000 | −0.1524 | −0.3087 |
| 11000001 | −0.1525 | −0.3087 |
| 11000010 | −0.1513 | −0.3043 |
| 11000011 | −0.1513 | −0.3043 |
| 11000100 | −0.1682 | −0.3004 |
| 11000101 | −0.1682 | −0.3005 |
| 11000110 | −0.1663 | −0.2964 |
| 11000111 | −0.1663 | −0.2964 |
| 11001000 | −0.1964 | −0.6584 |
| 11001001 | −0.1965 | −0.6583 |
| 11001010 | −0.1967 | −0.6652 |
| 11001011 | −0.1968 | −0.6652 |
| 11001100 | −0.3371 | −0.5987 |
| 11001101 | −0.3370 | −0.5987 |
| 11001110 | −0.3414 | −0.6039 |
| 11001111 | −0.3413 | −0.6039 |
| 11010000 | −0.3087 | −0.1524 |
| 11010001 | −0.3087 | −0.1525 |
| 11010010 | −0.3043 | −0.1513 |
| 11010011 | −0.3043 | −0.1513 |
| 11010100 | −0.3004 | −0.1682 |
| 11010101 | −0.3005 | −0.1682 |
| 11010110 | −0.2964 | −0.1663 |
| 11010111 | −0.2964 | −0.1663 |
| 11011000 | −0.6584 | −0.1964 |
| 11011001 | −0.6583 | −0.1965 |
| 11011010 | −0.6652 | −0.1967 |
| 11011011 | −0.6652 | −0.1968 |
| 11011100 | −0.5987 | −0.3371 |
| 11011101 | −0.5987 | −0.3370 |
| 11011110 | −0.6039 | −0.3414 |
| 11011111 | −0.6039 | −0.3413 |
| 11100000 | −0.3183 | −1.5992 |
| 11100001 | −0.3186 | −1.5991 |
| 11100010 | −0.2756 | −1.3848 |
| 11100011 | −0.2759 | −1.3847 |
| 11100100 | −0.9060 | −1.3557 |
| 11100101 | −0.9058 | −1.3559 |
| 11100110 | −0.7846 | −1.1739 |
| 11100111 | −0.7843 | −1.1741 |
| 11101000 | −0.2257 | −0.9956 |
| 11101001 | −0.2259 | −0.9956 |
| 11101010 | −0.2276 | −1.0326 |
| 11101011 | −0.2278 | −1.0326 |
| 11101100 | −0.5446 | −0.8635 |
| 11101101 | −0.5445 | −0.8636 |
| 11101110 | −0.5694 | −0.8910 |
| 11101111 | −0.5692 | −0.8911 |
| 11110000 | −1.5992 | −0.3183 |
| 11110001 | −1.5991 | −0.3186 |
| 11110010 | −1.3848 | −0.2756 |
| 11110011 | −1.3847 | −0.2759 |
| 11110100 | −1.3557 | −0.9060 |
| 11110101 | −1.3559 | −0.9058 |
| 11110110 | −1.1739 | −0.7846 |
| 11110111 | −1.1741 | −0.7843 |
| 11111000 | −0.9956 | −0.2257 |
| 11111001 | −0.9956 | −0.2259 |
| 11111010 | −1.0326 | −0.2276 |
| 11111011 | −1.0326 | −0.2278 |
| 11111100 | −0.8635 | −0.5446 |
| 11111101 | −0.8636 | −0.5445 |
| 11111110 | −0.8910 | −0.5694 |
| 11111111 | −0.8911 | −0.5692 | wherein the constellation points are listed in a column labeled $b_{0,i}, b_{1,i}, \ldots, b_{7,i}$, wherein the values of real components are listed in a column labeled $Re(e_i)$, and wherein the values of imaginary components are listed in a column labeled $Im(e_i)$.

14. The apparatus of claim 13, wherein the constellation points are arranged symmetrically to In-phase axis of complex plane, and wherein the constellation points are arranged symmetrically to Quadrature axis of complex plane.

15. The apparatus of claim 13, when each of the constellation points are rotated by multiple of 90 degrees in complex plane, the rotated constellation points overlap with the original constellations.

16. The apparatus of claim 13, wherein a set of the constellation points has arbitrary shape, when the bit interleaved data are mapped by using the NUC scheme.

17. The apparatus of claim 13, wherein the constellation points are arranged according to FIG. 63 when the bit interleaved data are mapped by using the NUC scheme, the number of the constellation points are 256, and the code rate is 5/15.

18. The apparatus of claim 13, wherein the constellation points of the NUC scheme used by an associated PLP is signaled by a PLP modulation parameter in the at least one built signal frame.

19. An apparatus for receiving broadcast signals, the apparatus including:
a receiving module to receive the broadcast signals having at least one signal frame and to demodulate data in the at least one signal frame by OFDM (Orthogonal Frequency Division Multiplexing) method;
a parsing module to parse the at least one signal frame by demapping data of at least one Physical Layer Pipe (PLP);
a time deinterleaving block to time deinterleave data of the at least one PLP;
a demapping block to demap the time deinterleaved data by using Non-Uniform Constellation (NUC) scheme, wherein a number of constellation points of the NUC scheme are 256, and a code rate is 5/15;
a bit deinterleaving block to bit deinterleave the demapped data;
an LDPC block to decode the bit deinterleaved data with LDPC (Low Density Parity Check) codes; and
an output processing module to process the decoded data of the at least one PLP to output output streams,
wherein values of real and imaginary components of the constellation points included in the NUC scheme are expressed as:

| $b_{0,i}b_{1,i}\ldots b_{7,i}$ | $Re(e_i)$ | $Im(e_i)$ |
|---|---|---|
| 00000000 | 0.1524 | 0.3087 |
| 00000001 | 0.1525 | 0.3087 |
| 00000010 | 0.1513 | 0.3043 |
| 00000011 | 0.1513 | 0.3043 |
| 00000100 | 0.1682 | 0.3004 |
| 00000101 | 0.1682 | 0.3005 |
| 00000110 | 0.1663 | 0.2964 |
| 00000111 | 0.1663 | 0.2964 |
| 00001000 | 0.1964 | 0.6584 |
| 00001001 | 0.1965 | 0.6583 |
| 00001010 | 0.1967 | 0.6652 |
| 00001011 | 0.1968 | 0.6652 |
| 00001100 | 0.3371 | 0.5987 |
| 00001101 | 0.3370 | 0.5987 |
| 00001110 | 0.3414 | 0.6039 |
| 00001111 | 0.3413 | 0.6039 |
| 00010000 | 0.3087 | 0.1524 |
| 00010001 | 0.3087 | 0.1525 |
| 00010010 | 0.3043 | 0.1513 |
| 00010011 | 0.3043 | 0.1513 |
| 00010100 | 0.3004 | 0.1682 |
| 00010101 | 0.3005 | 0.1682 |
| 00010110 | 0.2964 | 0.1663 |
| 00010111 | 0.2964 | 0.1663 |
| 00011000 | 0.6584 | 0.1964 |

| $b_{0,i}b_{1,i}\ldots b_{7,i}$ | $\text{Re}(e_i)$ | $\text{Im}(e_i)$ |
|---|---|---|
| 00011001 | 0.6583 | 0.1965 |
| 00011010 | 0.6652 | 0.1967 |
| 00011011 | 0.6652 | 0.1968 |
| 00011100 | 0.5987 | 0.3371 |
| 00011101 | 0.5987 | 0.3370 |
| 00011110 | 0.6039 | 0.3414 |
| 00011111 | 0.6039 | 0.3413 |
| 00100000 | 0.3183 | 1.5992 |
| 00100001 | 0.3186 | 1.5991 |
| 00100010 | 0.2756 | 1.3848 |
| 00100011 | 0.2759 | 1.3847 |
| 00100100 | 0.9060 | 1.3557 |
| 00100101 | 0.9058 | 1.3559 |
| 00100110 | 0.7846 | 1.1739 |
| 00100111 | 0.7843 | 1.1741 |
| 00101000 | 0.2257 | 0.9956 |
| 00101001 | 0.2259 | 0.9956 |
| 00101010 | 0.2276 | 1.0326 |
| 00101011 | 0.2278 | 1.0326 |
| 00101100 | 0.5446 | 0.8635 |
| 00101101 | 0.5445 | 0.8636 |
| 00101110 | 0.5694 | 0.8910 |
| 00101111 | 0.5692 | 0.8911 |
| 00110000 | 1.5992 | 0.3183 |
| 00110001 | 1.5991 | 0.3186 |
| 00110010 | 1.3848 | 0.2756 |
| 00110011 | 1.3847 | 0.2759 |
| 00110100 | 1.3557 | 0.9060 |
| 00110101 | 1.3559 | 0.9058 |
| 00110110 | 1.1739 | 0.7846 |
| 00110111 | 1.1741 | 0.7843 |
| 00111000 | 0.9956 | 0.2257 |
| 00111001 | 0.9956 | 0.2259 |
| 00111010 | 1.0326 | 0.2276 |
| 00111011 | 1.0326 | 0.2278 |
| 00111100 | 0.8635 | 0.5446 |
| 00111101 | 0.8636 | 0.5445 |
| 00111110 | 0.8910 | 0.5694 |
| 00111111 | 0.8911 | 0.5692 |
| 01000000 | −0.1524 | 0.3087 |
| 01000001 | −0.1525 | 0.3087 |
| 01000010 | −0.1513 | 0.3043 |
| 01000011 | −0.1513 | 0.3043 |
| 01000100 | −0.1682 | 0.3004 |
| 01000101 | −0.1682 | 0.3005 |
| 01000110 | −0.1663 | 0.2964 |
| 01000111 | −0.1663 | 0.2964 |
| 01001000 | −0.1964 | 0.6584 |
| 01001001 | −0.1965 | 0.6583 |
| 01001010 | −0.1967 | 0.6652 |
| 01001011 | −0.1968 | 0.6652 |
| 01001100 | −0.3371 | 0.5987 |
| 01001101 | −0.3370 | 0.5987 |
| 01001110 | −0.3414 | 0.6039 |
| 01001111 | −0.3413 | 0.6039 |
| 01010000 | −0.3087 | 0.1524 |
| 01010001 | −0.3087 | 0.1525 |
| 01010010 | −0.3043 | 0.1513 |
| 01010011 | −0.3043 | 0.1513 |
| 01010100 | −0.3004 | 0.1682 |
| 01010101 | −0.3005 | 0.1682 |
| 01010110 | −0.2964 | 0.1663 |
| 01010111 | −0.2964 | 0.1663 |
| 01011000 | −0.6584 | 0.1964 |
| 01011001 | −0.6583 | 0.1965 |
| 01011010 | −0.6652 | 0.1967 |
| 01011011 | −0.6652 | 0.1968 |
| 01011100 | −0.5987 | 0.3371 |
| 01011101 | −0.5987 | 0.3370 |
| 01011110 | −0.6039 | 0.3414 |
| 01011111 | −0.6039 | 0.3413 |
| 01100000 | −0.3183 | 1.5992 |
| 01100001 | −0.3186 | 1.5991 |
| 01100010 | −0.2756 | 1.3848 |
| 01100011 | −0.2759 | 1.3847 |
| 01100100 | −0.9060 | 1.3557 |
| 01100101 | −0.9058 | 1.3559 |
| 01100110 | −0.7846 | 1.1739 |
| 01100111 | −0.7843 | 1.1741 |
| 01101000 | −0.2257 | 0.9956 |
| 01101001 | −0.2259 | 0.9956 |
| 01101010 | −0.2276 | 1.0326 |
| 01101011 | −0.2278 | 1.0326 |
| 01101100 | −0.5446 | 0.8635 |
| 01101101 | −0.5445 | 0.8636 |
| 01101110 | −0.5694 | 0.8910 |
| 01101111 | −0.5692 | 0.8911 |
| 01110000 | −1.5992 | 0.3183 |
| 01110001 | −1.5991 | 0.3186 |
| 01110010 | −1.3848 | 0.2756 |
| 01110011 | −1.3847 | 0.2759 |
| 01110100 | −1.3557 | 0.9060 |
| 01110101 | −1.3559 | 0.9058 |
| 01110110 | −1.1739 | 0.7846 |
| 01110111 | −1.1741 | 0.7843 |
| 01111000 | −0.9956 | 0.2257 |
| 01111001 | −0.9956 | 0.2259 |
| 01111010 | −1.0326 | 0.2276 |
| 01111011 | −1.0326 | 0.2278 |
| 01111100 | −0.8635 | 0.5446 |
| 01111101 | −0.8636 | 0.5445 |
| 01111110 | −0.8910 | 0.5694 |
| 01111111 | −0.8911 | 0.5692 |
| 10000000 | 0.1524 | −0.3087 |
| 10000001 | 0.1525 | −0.3087 |
| 10000010 | 0.1513 | −0.3043 |
| 10000011 | 0.1513 | −0.3043 |
| 10000100 | 0.1682 | −0.3004 |
| 10000101 | 0.1682 | −0.3005 |
| 10000110 | 0.1663 | −0.2964 |
| 10000111 | 0.1663 | −0.2964 |
| 10001000 | 0.1964 | −0.6584 |
| 10001001 | 0.1965 | −0.6583 |
| 10001010 | 0.1967 | −0.6652 |
| 10001011 | 0.1968 | −0.6652 |
| 10001100 | 0.3371 | −0.5987 |
| 10001101 | 0.3370 | −0.5987 |
| 10001110 | 0.3414 | −0.6039 |
| 10001111 | 0.3413 | −0.6039 |
| 10010000 | 0.3087 | −0.1524 |
| 10010001 | 0.3087 | −0.1525 |
| 10010010 | 0.3043 | −0.1513 |
| 10010011 | 0.3043 | −0.1513 |
| 10010100 | 0.3004 | −0.1682 |
| 10010101 | 0.3005 | −0.1682 |
| 10010110 | 0.2964 | −0.1663 |
| 10010111 | 0.2964 | −0.1663 |
| 10011000 | 0.6584 | −0.1964 |
| 10011001 | 0.6583 | −0.1965 |
| 10011010 | 0.6652 | −0.1967 |
| 10011011 | 0.6652 | −0.1968 |
| 10011100 | 0.5987 | −0.3371 |
| 10011101 | 0.5987 | −0.3370 |
| 10011110 | 0.6039 | −0.3414 |
| 10011111 | 0.6039 | −0.3413 |
| 10100000 | 0.3183 | −1.5992 |
| 10100001 | 0.3186 | −1.5991 |
| 10100010 | 0.2756 | −1.3848 |
| 10100011 | 0.2759 | −1.3847 |
| 10100100 | 0.9060 | −1.3557 |
| 10100101 | 0.9058 | −1.3559 |
| 10100110 | 0.7846 | −1.1739 |
| 10100111 | 0.7843 | −1.1741 |
| 10101000 | 0.2257 | −0.9956 |
| 10101001 | 0.2259 | −0.9956 |
| 10101010 | 0.2276 | −1.0326 |
| 10101011 | 0.2278 | −1.0326 |
| 10101100 | 0.5446 | −0.8635 |
| 10101101 | 0.5445 | −0.8636 |
| 10101110 | 0.5694 | −0.8910 |
| 10101111 | 0.5692 | −0.8911 |
| 10110000 | 1.5992 | −0.3183 |
| 10110001 | 1.5991 | −0.3186 |
| 10110010 | 1.3848 | −0.2756 |

| $b_{0,i}b_{1,i}\ldots b_{7,i}$ | $Re(e_i)$ | $Im(e_i)$ |
|---|---|---|
| 10110011 | 1.3847 | −0.2759 |
| 10110100 | 1.3557 | −0.9060 |
| 10110101 | 1.3559 | −0.9058 |
| 10110110 | 1.1739 | −0.7846 |
| 10110111 | 1.1741 | −0.7843 |
| 10111000 | 0.9956 | −0.2257 |
| 10111001 | 0.9956 | −0.2259 |
| 10111010 | 1.0326 | −0.2276 |
| 10111011 | 1.0326 | −0.2278 |
| 10111100 | 0.8635 | −0.5446 |
| 10111101 | 0.8636 | −0.5445 |
| 10111110 | 0.8910 | −0.5694 |
| 10111111 | 0.8911 | −0.5692 |
| 11000000 | −0.1524 | −0.3087 |
| 11000001 | −0.1525 | −0.3087 |
| 11000010 | −0.1513 | −0.3043 |
| 11000011 | −0.1513 | −0.3043 |
| 11000100 | −0.1682 | −0.3004 |
| 11000101 | −0.1682 | −0.3005 |
| 11000110 | −0.1663 | −0.2964 |
| 11000111 | −0.1663 | −0.2964 |
| 11001000 | −0.1964 | −0.6584 |
| 11001001 | −0.1965 | −0.6583 |
| 11001010 | −0.1967 | −0.6652 |
| 11001011 | −0.1968 | −0.6652 |
| 11001100 | −0.3371 | −0.5987 |
| 11001101 | −0.3370 | −0.5987 |
| 11001110 | −0.3414 | −0.6039 |
| 11001111 | −0.3413 | −0.6039 |
| 11010000 | −0.3087 | −0.1524 |
| 11010001 | −0.3087 | −0.1525 |
| 11010010 | −0.3043 | −0.1513 |
| 11010011 | −0.3043 | −0.1513 |
| 11010100 | −0.3004 | −0.1682 |
| 11010101 | −0.3005 | −0.1682 |
| 11010110 | −0.2964 | −0.1663 |
| 11010111 | −0.2964 | −0.1663 |
| 11011000 | −0.6584 | −0.1964 |
| 11011001 | −0.6583 | −0.1965 |
| 11011010 | −0.6652 | −0.1967 |
| 11011011 | −0.6652 | −0.1968 |
| 11011100 | −0.5987 | −0.3371 |
| 11011101 | −0.5987 | −0.3370 |
| 11011110 | −0.6039 | −0.3414 |
| 11011111 | −0.6039 | −0.3413 |
| 11100000 | −0.3183 | −1.5992 |
| 11100001 | −0.3186 | −1.5991 |
| 11100010 | −0.2756 | −1.3848 |
| 11100011 | −0.2759 | −1.3847 |
| 11100100 | −0.9060 | −1.3557 |
| 11100101 | −0.9058 | −1.3559 |
| 11100110 | −0.7846 | −1.1739 |
| 11100111 | −0.7843 | −1.1741 |
| 11101000 | −0.2257 | −0.9956 |
| 11101001 | −0.2259 | −0.9956 |
| 11101010 | −0.2276 | −1.0326 |
| 11101011 | −0.2278 | −1.0326 |
| 11101100 | −0.5446 | −0.8635 |
| 11101101 | −0.5445 | −0.8636 |
| 11101110 | −0.5694 | −0.8910 |
| 11101111 | −0.5692 | −0.8911 |
| 11110000 | −1.5992 | −0.3183 |
| 11110001 | −1.5991 | −0.3186 |
| 11110010 | −1.3848 | −0.2756 |
| 11110011 | −1.3847 | −0.2759 |
| 11110100 | −1.3557 | −0.9060 |
| 11110101 | −1.3559 | −0.9058 |
| 11110110 | −1.1739 | −0.7846 |
| 11110111 | −1.1741 | −0.7843 |
| 11111000 | −0.9956 | −0.2257 |
| 11111001 | −0.9956 | −0.2259 |
| 11111010 | −1.0326 | −0.2276 |
| 11111011 | −1.0326 | −0.2278 |
| 11111100 | −0.8635 | −0.5446 |
| 11111101 | −0.8636 | −0.5445 |
| 11111110 | −0.8910 | −0.5694 |
| 11111111 | −0.8911 | −0.5692 | wherein the constellation points are listed in a column labeled $b_{0,i}$, $b_{1,i}$, ..., $b_{7,i}$, wherein the values of real components are listed in a column labeled $Re(e_i)$, and wherein the values of imaginary components are listed in a column labeled $Im(e_i)$).

20. The apparatus of claim 19, wherein the constellation points are arranged symmetrically to In-phase axis of complex plane, and
wherein the constellation points are arranged symmetrically to Quadrature axis of complex plane.

21. The apparatus of claim 19, when each of the constellation points are rotated by multiple of 90 degrees in complex plane, the rotated constellation points overlap with the original constellations.

22. The apparatus of claim 19, wherein a set of the constellation points has arbitrary shape, when the MIMO decoded data are demapped by using the NUC scheme.

23. The apparatus of claim 19, wherein the constellation points are arranged according to FIG. 63
when the time deinterleaved data are demapped by using the NUC scheme, the number of constellation points are 256, and the code rate is 5/15.

24. The apparatus of claim 19, wherein the constellation points of the NUC scheme used by an associated PLP is signaled by a PLP modulation parameter in the at least one built signal frame.

* * * * *